United States Patent
Onga et al.

(10) Patent No.: US 6,185,472 B1
(45) Date of Patent: Feb. 6, 2001

(54) SEMICONDUCTOR DEVICE MANUFACTURING METHOD, MANUFACTURING APPARATUS, SIMULATION METHOD AND SIMULATOR

(75) Inventors: Shinji Onga, Kanagawa; Takako Okada, Tokyo; Hiroshi Tomita, Kanagawa; Kikuo Yamabe, Ibaraki; Haruo Okano, Chiba, all of (JP)

(73) Assignee: Kabushiki Kaisha Toshiba, Kawasaki (JP)

( * ) Notice: Under 35 U.S.C. 154(b), the term of this patent shall be extended for 0 days.

(21) Appl. No.: 08/777,189

(22) Filed: Dec. 27, 1996

(30) Foreign Application Priority Data

Dec. 28, 1995 (JP) .................................... 7-352154
Mar. 25, 1996 (JP) .................................... 8-124126

(51) Int. Cl.[7] .................................................. G06F 19/00
(52) U.S. Cl. ........................... 700/121; 700/96; 700/110; 700/117; 700/119; 438/62; 438/486; 438/490; 438/676
(58) Field of Search ............................... 700/95, 96, 110, 700/117, 119, 121, 214; 438/62, 485, 490, 676, 707, 907, 980

(56) References Cited

U.S. PATENT DOCUMENTS

| | | | |
|---|---|---|---|
| 4,827,423 | * 5/1989 | Beasley et al. | ........................ 364/468 |
| 5,105,362 | * 4/1992 | Kotani | ................................... 364/468 |
| 5,146,299 | * 9/1992 | Lampe et al. | ........................ 357/23.5 |
| 5,241,465 | * 8/1993 | Oba et al. | .............................. 364/401 |
| 5,479,343 | * 12/1995 | Matoba et al. | ........................ 364/401 |
| 5,550,372 | * 8/1996 | Yasue | ................................... 250/310 |
| 5,563,095 | * 10/1996 | Frey | ...................................... 437/141 |
| 5,580,419 | * 12/1996 | Berenz | .............................. 156/628.1 |
| 5,590,051 | * 12/1996 | Yokozawa | ............................. 364/496 |
| 5,810,923 | * 9/1998 | Uano et al. | ............................. 117/84 |

* cited by examiner

Primary Examiner—Paul P. Gordon
Assistant Examiner—Ramesh Patel
(74) Attorney, Agent, or Firm—Oblon, Spivak, McClelland, Maier & Neusadt, P.C.

(57) ABSTRACT

A semiconductor device manufacturing method capable of proceeding semiconductor device manufacturing processes according to predetermined schedules or while correcting them without testpieces is provided. The method includes the steps of collecting actually observed data during at least one of plural steps, obtaining prediction data in at least one of plural steps by using an ab initio molecular dynamics process simulator or a molecular dynamics simulator, comparing and verifying the prediction data and the actually observed data sequentially at real time, and correcting and processing the plural manufacturing process factors sequentially at real time if a difference in significance is recognized between set values for the plural manufacturing process factors and the plural manufacturing process factors estimated from the actually observed data according to comparison and verification.

120 Claims, 119 Drawing Sheets

FIG.9

- INTRODUCTION OF WAFER
- PREPROCESSING OF SUBSTRATE (CLUSTER TOOL A)
- OXIDATION PROCESS (CLUSTER TOOL B)
  GAS AMOUNT   Pox, ΔPox
  SEQUENCE OF
    TEMPERATURE RISE
                Pox, ΔPox
  VALUE SEQUENCE Pox, ΔPox
- ANNEALING CLUSTER TOOL C
  .
  .
  .

SiSiO$_2$

FIG.10

- INTRODUCTION OF WAFER
- PREPROCESSING OF SUBSTRATE (CLUSTER TOOL A)
- FERROELECTRIC SPUTTERING (CLUSTER TOOL B)
  POWER SUPPLY VOLTAGE
  TARGET VOLTAGE
  SPUTTERING TIME
  VALUE SEQUENCE
- ANNEALING CLUSTER TOOL C
  .
  .
  .

UNUSED MATERIAL

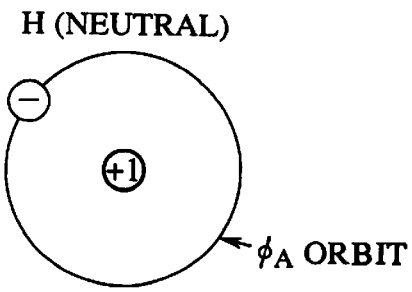
FIG. 12
BACKGROUND ART
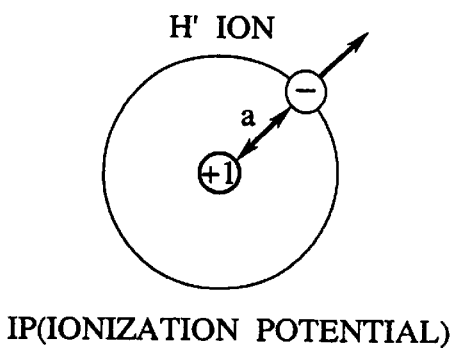
FIG. 13
BACKGROUND ART
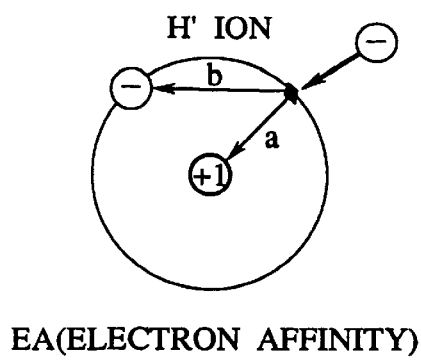
FIG. 14
BACKGROUND ART
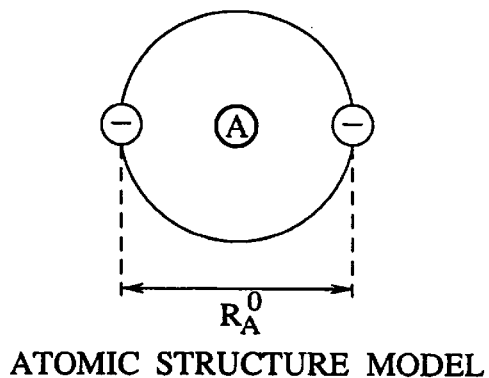
FIG. 15
BACKGROUND ART
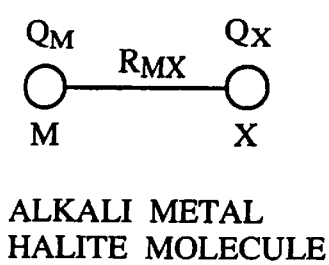
FIG. 16
BACKGROUND ART
FIG. 17
BACKGROUND ART
ELECTRONEGATIVITY
|   | Mullion | Pausing |
|---|---------|---------|
| H | 7.17ev  | 2.1eV   |
| B |         | 2.0     |
| C | 5.34    | 2.5     |
| N | 6.90    |         |

BOND ANGLES AT SI ATOM

| O – SI – O | (DEGREE) | O – SI – O | AT TIME (DEGREE) | O – SI – O | BOND ANGLE AT Tn (DEGREE) |
|---|---|---|---|---|---|
| 1– 1– 2 | 108.9349 | 1– 1– 28 | 108.5615 | 1– 1– 103 | 109.4750 |
| 2– 1– 28 | 110.2779 | 2– 1– 103 | 109.5298 | 28– 1– 103 | 110.0363 |
| 1– 2– 3 | 108.9505 | 1– 2– 4 | 110.6575 | 1– 2– 70 | 110.2105 |
| 2– 2– 4 | 108.8379 | 2– 2– 70 | 109.2018 | 4– 2– 70 | 108.9536 |
| 3– 3– 5 | 109.9244 | 3– 3– 6 | 109.6437 | 3– 3– 16 | 109.9806 |
| 3– 3– 6 | 110.0583 | 3– 3– 16 | 108.3414 | 6– 3– 16 | 108.8641 |
| 5– 4– 7 | 109.3194 | 5– 4– 8 | 110.0928 | 5– 4– 130 | 109.9225 |
| 5– 4– 8 | 109.7291 | 7– 4– 130 | 109.2644 | 8– 4– 130 | 108.4557 |
| 4– 5– 9 | 109.3677 | 4– 5– 10 | 110.5243 | 4– 5– 111 | 109.8644 |
| 9– 5– 10 | 110.9178 | 9– 5– 111 | 108.1002 | 10– 5– 111 | 108.0205 |
| 6– 9– 11 | 110.1572 | | | | |
| 11– 6– 12 | 110.2308 | | | | |
| 11– 7– 13 | 111.1628 | | | | |
| 13– 7– 14 | 108.8920 | | | | |
| 13– 8– 15 | 109.3806 | | | | |
| 15– 8– 16 | 109.6320 | | | | |
| 12– 9– 17 | 108.3242 | | | | |

BOND ANGLES AT SI ATOM

| O – SI | (ANGSTROM) | O – SI | BOND LENGTH AT Tn AT TIME (ANGSTROM) | O – SI | (FS) |
|---|---|---|---|---|---|
| 1– 1 | 1.6503 | 1– 2 | 1.5914 | | |
| 2– 1 | 1.6132 | 2– 84 | 1.6149 | | |
| 3– 2 | 1.5863 | 3– 3 | 1.6158 | | |

| SI-O-SI | Angle (degree) | | SI-O | Length |
|---|---|---|---|---|
| 17- 9- 18 | 108.6424 | | 4- 5 | 1.6175 |
| 17- 10- 19 | 107.7255 | | 5- 4 | 1.6088 |
| 19- 10- 20 | 110.5358 | | 6- 18 | 1.6093 |
| 19- 11- 21 | 108.8805 | | 7- 49 | 1.6241 |
| 21- 11- 22 | 110.1516 | | 8- 15 | 1.6303 |
| 21- 12- 23 | 110.0312 | | 9- 1 | 1.5924 |
| 23- 12- 24 | 109.5848 | | 10- 2 | 1.5842 |
| 20- 13- 25 | 110.5169 | | 11- 3 | 1.5857 |
| 25- 13- 26 | 110.3303 | | 12- 3 | 1.6054 |
| 25- 14- 27 | 109.1309 | | 13- 4 | 1.6014 |
| 27- 14- 28 | 109.2992 | | 14- 4 | 1.6182 |
| 8- 15- 27 | 110.1251 | | 15- 5 | 1.5887 |
| 27- 15- 29 | 110.7322 | | 16- 5 | 1.6306 |
| 29- 16- 31 | 109.6533 | | 17- 3 | 1.6182 |
| 31- 16- 32 | 108.5453 | | 18- 9 | 1.6174 |
| 33- 17- 34 | 109.8139 | | 19- 9 | 1.6056 |
| 34- 17- 60 | 110.1016 | | 20- 10 | 1.6132 |
| 6- 18- 33 | 109.3102 | | 21- 11 | 1.5974 |
| 33- 18- 35 | 110.2591 | | | |

BOND LENGTH AT Tn+1

| SI-O | Length |
|---|---|
| 4- 5 | 1.5837 |
| 5- 4 | 1.6121 |
| 6- 18 | 1.6181 |
| 7- 49 | 1.5875 |
| 8- 15 | 1.6090 |
| 9- 1 | 1.5555 |

BOND ANGLES AT SI ATOM (DEGREE)

| SI - O - SI | Angle |
|---|---|
| 1- 1- 2 | 141.9792 |
| 1- 2- 84 | 141.6846 |
| 2- 3- 3 | 143.3545 |
| 2- 4- 5 | 144.2273 |
| 3- 5- 4 | 141.0583 |
| 3- 6- 18 | 143.0912 |
| 4- 7- 49 | 142.8356 |
| 4- 8- 15 | 142.2639 |

BOND LEN

| O - SI | |
|---|---|
| 1- 1 | |
| 2- 1 | |
| 3- 2 | |

| | | | | | | | | | | | | |
|---|---|---|---|---|---|---|---|---|---|---|---|---|
| 35- | 19- | 37 | 108.9678 | 22- | 11 | | 5- | 9- | 6 | 1.6070 | 4- | 2 |
| 37- | 19- | 38 | 109.7983 | 23- | 12 | | 5- | 10- | 83 | 1.5951 | 5- | 3 |
| 37- | 20- | 39 | 109.8264 | 24- | 7  | | 6- | 11- | 7  | 1.6219 | 6- | 3 |
| 39- | 20- | 40 | 108.8545 | 25- | 13 | | 6- | 12- | 9  | 1.5883 | 7- | 4 |
| 36- | 21- | 41 | 109.0508 | 26- | 13 | | 7- | 13- | 8  | 1.6273 | 8- | 4 |
| 41- | 21- | 42 | 109.9605 | 27- | 14 | | 7- | 14- | 22 | 1.6136 | 9- | 5 |
| 14- | 22- | 41 | 110.3527 | 28- | 1  | | 8- | 15- | 53 | 1.5151 | 10- | 5 |
| 41- | 22- | 43 | 109.3678 | 29- | 15 | | 3- | 16- | 8  | 1.6091 | 11- | 6 |
| 43- | 23- | 45 | 110.8370 | 30- | 15 | | 9- | 17- | 10 | 1.6199 | 12- | 6 |
| 45- | 23- | 46 | 107.8368 | 31- | 16 | | 9- | 18- | 92 | 1.6161 | 13- | 7 |
| 45- | 24- | 47 | 110.7456 | 32- | 11 | | 10- | 19- | 11 | 1.5255 | 14- | 7 |
| 47- | 24- | 48 | 108.6719 | 33- | 17 | | 10- | 20- | 13 | 1.6316 | 15- | 8 |
| 44- | 25- | 49 | 110.6992 | 34- | 17 | | 11- | 21- | 12 | 1.5912 | 16- | 8 |
| 49- | 25- | 50 | 109.1146 | 35- | 18 | | 11- | 22- | 26 | 1.6193 | 17- | 9 |
| 22- | 26- | 49 | 110.3576 | 36- | 18 | | 12- | 23- | 57 | 1.5952 | 18- | 9 |
| 49- | 26- | 51 | 110.6860 | 37- | 19 | | 7- | 24- | 12 | 1.5452 | 19- | 10 |
| 51- | 27- | 53 | 111.4685 | 38- | 19 | | 13- | 25- | 14 | 1.5997 | 20- | 10 |
| 53- | 27- | 54 | 109.8225 | 39- | 20 | | 13- | 26- | 96 | 1.6350 | 21- | 11 |
| 53- | 28- | 55 | 109.2661 | 40- | 20 | | 14- | 27- | 15 | 1.6094 | 22- | 11 |
| 55- | 28- | 55 | 109.5974 | 41- | 21 | | 1- | 28- | 14 | 1.5020 | 23- | 12 |
|     |     |    |          | 42- | 21 | | 15- | 20- | 18 | 1.5000 | 24- | 7 |

Additional column (associated with right block):

| Value |
|---|
| 144.0091 |
| 141.1559 |
| 143.1985 |
| 143.4654 |
| 142.7547 |
| 143.7993 |
| 143.7927 |
| 142.6664 |
| 142.0174 |
| 143.2893 |
| 143.0853 |
| 140.8887 |
| 142.2522 |
| 143.9689 |
| 142.1776 |
| 142.7455 |
| 142.4813 |
| 141.4551 |
| 143.1551 |
| 142.8827 |
| 141.0870 |

| ···CONSENT. | BORON··· | | | | | | | | |
|---|---|---|---|---|---|---|---|---|---|
| | I=1 | 2 | 3 | 4 | 5 | 6 | 7 | 8 | 9 |
| k=1 | 1.000E+14 | 1.000E+14 | 1.000E+14 | 1.000E+14 | 1.000E+14 | 1.000E+14 | 1.000E+14 | 1.000E+14 | 1.000E+14 |
| 2 | 5.704E+14 | 5.704E+14 | 6.270E+14 | 6.894E+14 | 7.484E+14 | 8.005E+14 | 8.408E+14 | 8.549E+14 | 3.004E+14 |
| 3 | 5.704E+14 | 5.704E+14 | 6.270E+14 | 6.894E+14 | 7.484E+14 | 8.005E+14 | 8.408E+14 | 8.549E+14 | 8.004E+14 |
| 4 | 6.063E+14 | 6.063E+14 | 6.696E+14 | 7.390E+14 | 8.048E+14 | 8.632E+14 | 9.098E+14 | 9.334E+14 | 9.095E+14 |
| 5 | 6.844E+14 | 6.844E+14 | 7.621E+14 | 8.470E+14 | 9.274E+14 | 9.995E+14 | 1.060E+15 | 1.101E+15 | 1.112E+15 |
| 6 | 8.174E+14 | 8.174E+14 | 9.196E+14 | 1.031E+15 | 1.136E+15 | 1.231E+15 | 1.313E+15 | 1.379E+15 | 1.625E+15 |
| 7 | 1.028E+15 | 1.028E+15 | 1.169E+15 | 1.322E+15 | 1.467E+15 | 1.598E+15 | 1.715E+15 | 1.814E+15 | 1.896E+15 |
| 8 | 1.358E+15 | 1.358E+15 | 1.559E+15 | 1.776E+15 | 1.983E+15 | 2.171E+15 | 2.339E+15 | 2.486E+15 | 2.613E+1 |
| 9 | 1.874E+15 | 1.874E+15 | 2.170E+15 | 2.490E+15 | 2.792E+15 | 3.069E+15 | 3.316E+15 | 3.535E+15 | 3.728E+ |
| 10 | 2.697E+15 | 2.697E+15 | 3.143E+15 | 3.625E+15 | 4.082E+15 | 4.499E+15 | 4.872E+15 | 5.204E+15 | 5.487E |
| 11 | 4.030E+15 | 4.030E+15 | 4.722E+15 | 5.457E+15 | 6.173E+15 | 6.817E+15 | 7.395E+15 | 7.909E+15 | 8.361 |
| 12 | 6.231E+15 | 6.231E+15 | 7.323E+15 | 8.509E+15 | 9.625E+15 | 1.065E+16 | 1.156E+16 | 1.237E+16 | 1.30 |
| 13 | 9.922E+15 | 9.923E+15 | 1.170E+16 | 1.361E+16 | 1.542E+16 | 1.707E+16 | 1.855E+16 | 1.986E+16 | 2.10 |
| 14 | 1.619E+16 | 1.619E+16 | 1.913E+16 | 2.228E+16 | 2.526E+16 | 2.798E+16 | 3.042E+16 | 3.258E+16 | 3.6 |
| 15 | 2.690E+16 | 2.690E+16 | 3.183E+16 | 3.710E+16 | 4.208E+16 | 4.663E+16 | 5.071E+16 | 5.433E+16 | 5. |
| 16 | 4.518E+16 | 4.518E+16 | 5.351E+16 | 6.241E+16 | 7.032E+16 | 7.849E+16 | 8.537E+16 | 9.147E+16 | 6. |
| 17 | 7.602E+16 | 7.602E+16 | 9.010E+16 | 1.051E+17 | 1.193E+17 | 1.322E+17 | 1.438E+17 | 1.541E+17 | 1 |
| 18 | 1.266E+17 | 1.266E+17 | 1.502E+17 | 1.754E+17 | 1.959E+17 | 2.205E+17 | 2.399E+17 | 2.571E+17 | 2 |
| 19 | 2.053E+17 | 2.058E+17 | 2.442E+17 | 2.850E+17 | 3.235E+17 | 3.586E+17 | 3.901E+17 | 4.180E+17 | 4 |
| 20 | 3.201E+17 | 3.201E+17 | 3.793E+17 | 4.434E+17 | 5.063E+17 | 5.579E+17 | 6.069E+17 | 6.503E+17 | 6 |
| 21 | 4.649E+17 | 4.649E+17 | 5.519E+17 | 6.442E+17 | 7.312E+17 | 8.105E+17 | 8.817E+17 | 9.448E+17 | 1 |
| 22 | 6.115E+17 | 6.115E+17 | 7.260E+17 | 8.474E+17 | 9.618E+17 | 1.066E+18 | 1.160E+18 | 1.243E+18 | 1 |
| 23 | 7.004E+17 | 7.004E+17 | 8.316E+17 | 9.707E+17 | 1.102E+18 | 1.221E+18 | 1.328E+18 | 1.423E+18 | 1 |
| 24 | 6.651E+17 | 6.651E+17 | 7.396E+17 | 9.217E+17 | 1.046E+18 | 1.160E+18 | 1.261E+18 | 1.352E+18 | 1 |
| 25 | 4.921E+17 | 4.921E+17 | 5.842E+17 | 6.820E+17 | 7.741E+17 | 8.581E+17 | 8.334E+17 | 1.000E+18 | 1. |
| 26 | 2.539E+17 | 2.539E+17 | 3.073E+17 | 3.588E+17 | 4.072E+17 | 4.514E+17 | 4.910E+17 | 5.262E+17 | 5. |
| 27 | 2.500E+14 | 2.500E+14 | 2.500E+14 | 2.500E+14 | 2.500E+14 | 2.500E+14 | 2.500E+14 | 2.500E+14 | 2. |

...CONSENT. BORON...

| k\i | 1 | 2 | 3 | 4 | 5 | 6 | 7 | 8 | 9 |
|---|---|---|---|---|---|---|---|---|---|
| 1 | 1.000E+14 | 1.000E+14 | 1.000E+14 | 1.000E+14 | 1.000E+14 | 1.000E+14 | 1.000E+14 | 1.000E+14 | 1.000E+14 |
| 2 | 5.745E+14 | 5.745E+14 | 6.316E+14 | 6.946E+14 | 7.542E+14 | 8.069E+14 | 8.473E+14 | 8.609E+14 | 8.061E+14 |
| 3 | 5.745E+14 | 5.745E+14 | 6.316E+14 | 6.946E+14 | 7.542E+14 | 8.069E+14 | 8.473E+14 | 8.609E+14 | 8.006E+14 |
| 4 | 6.105E+14 | 6.105E+14 | 6.742E+14 | 8.107E+14 | 8.697E+14 | 8.697E+14 | 9.165E+14 | 9.397E+14 | 9.145E+14 |
| 5 | 6.888E+14 | 6.888E+14 | 7.670E+14 | 8.526E+14 | 9.337E+15 | 1.006E+15 | 1.067E+15 | 1.107E+15 | 1.113E+15 |
| 6 | 8.225E+14 | 8.225E+14 | 9.251E+14 | 1.143E+15 | 1.239E+15 | 1.238E+15 | 1.322E+15 | 1.387E+15 | 1.432E+15 |
| 7 | 1.035E+15 | 1.035E+15 | 1.176E+15 | 1.330E+15 | 1.467E+15 | 1.608E+15 | 1.725E+15 | 1.824E+15 | 1.906E+15 |
| 8 | 1.366E+15 | 1.366E+15 | 1.567E+15 | 1.786E+15 | 1.994E+15 | 2.183E+15 | 2.352E+15 | 2.499E+15 | 2.627E+1 |
| 9 | 1.885E+15 | 1.885E+15 | 2.181E+15 | 2.502E+15 | 2.807E+15 | 3.085E+15 | 3.334E+15 | 3.554E+15 | 3.767E |
| 10 | 2.711E+15 | 2.713E+15 | 3.159E+15 | 3.643E+15 | 4.108E+15 | 4.520E+15 | 4.896E+15 | 5.230E+15 | 5.523E |
| 11 | 4.051E+15 | 4.057E+15 | 4.744E+15 | 5.492E+15 | 6.200E+15 | 6.847E+15 | 7.428E+15 | 7.944E+15 | 8.399 |
| 12 | 6.261E+15 | 6.261E+15 | 7.356E+15 | 8.544E+15 | 9.664E+15 | 1.069E+16 | 1.161E+16 | 1.242E+16 | 1.71 |
| 13 | 9.965E+15 | 9.935E+15 | 1.174E+16 | 1.366E+16 | 1.547E+16 | 1.713E+16 | 1.861E+16 | 1.993E+16 | 2.1 |
| 14 | 1.625E+16 | 1.625E+16 | 1.919E+16 | 2.235E+16 | 2.806E+16 | 2.806E+16 | 3.051E+16 | 3.268E+16 | 3.4 |
| 15 | 2.699E+16 | 2.699E+16 | 3.191E+16 | 3.720E+16 | 4.219E+16 | 4.675E+16 | 5.084E+16 | 5.447E+16 | 5. |
| 16 | 4.531E+16 | 4.531E+16 | 5.383E+16 | 6.254E+16 | 7.864E+16 | 7.864E+16 | 8.554E+16 | 9.166E+16 | 4. |
| 17 | 7.619E+16 | 7.619E+16 | 9.026E+16 | 1.053E+17 | 1.193E+17 | 1.324E+17 | 1.441E+17 | 1.544E+17 | 1 |
| 18 | 1.269E+17 | 1.269E+17 | 1.504E+17 | 1.755E+17 | 1.991E+17 | 2.207E+17 | 2.401E+17 | 2.573E+17 | 2 |
| 19 | 2.061E+17 | 2.061E+17 | 2.444E+17 | 2.852E+17 | 3.237E+17 | 3.588E+17 | 3.903E+17 | 4.183E+17 | 4 |
| 20 | 3.204E+17 | 3.204E+17 | 3.800E+17 | 4.435E+17 | 5.034E+17 | 5.580E+17 | 6.070E+17 | 6.505E+17 | 6 |
| 21 | 4.652E+17 | 4.652E+17 | 5.519E+17 | 6.442E+17 | 7.312E+17 | 8.105E+17 | 8.816E+17 | 9.447E+17 | 1 |
| 22 | 6.117E+17 | 6.117E+17 | 7.259E+17 | 8.472E+17 | 9.616E+17 | 1.066E+18 | 1.159E+18 | 1.242E+18 | 1 |
| 23 | 7.006E+17 | 7.006E+17 | 8.314E+17 | 9.704E+17 | 1.101E+18 | 1.221E+18 | 1.328E+18 | 1.423E+18 | 1 |
| 24 | 6.653E+17 | 5.653E+17 | 7.895E+17 | 9.215E+17 | 1.046E+18 | 1.159E+18 | 1.261E+18 | 1.351E+18 | 1 |
| 25 | 4.924E+17 | 4.924E+17 | 5.843E+17 | 6.820E+17 | 7.740E+17 | 8.580E+17 | 9.333E+17 | 1.000E+18 | 1. |
| 26 | 2.591E+17 | 2.591E+17 | 3.074E+17 | 3.588E+17 | 4.072E+17 | 4.514E+17 | 4.910E+17 | 5.262E+17 | 5. |
| 27 | 2.500E+14 | 2.500E+14 | 2.500E+14 | 2.500E+14 | 2.500E+14 | 2.500E+14 | 2.500E+14 | 2.500E+14 | 2. |

BORON -- DELTA T=1.000E+00

| ...EOCP X | | | | | | | | | |
|---|---|---|---|---|---|---|---|---|---|
| k=1 | i=1 | 2 | 3 | 4 | 5 | 6 | 7 | 8 | 9 |
| 1 | 0.000E+00 | 0.000E+00 | 0.000E+00 | 0.000E+00 | 0.000E+00 | 0.000E+100 | 0.000E+00 | 0.000E+00 | 0.000E+00 |
| 2 | 3.935E+12 | 3.935E+12 | 4.352E+12 | 4.965E+12 | 5.570E+12 | 6.056E+12 | 6.231E+12 | 6.035E+12 | 5.111E+12 |
| 3 | 3.935E+12 | 3.935E+12 | 4.352E+12 | 4.965E+12 | 5.570E+12 | 6.056E+12 | 6.281E+12 | 6.035E+12 | 5.111E+12 |
| 4 | 4.002E+12 | 4.002E+12 | 4.407E+12 | 5.022E+12 | 5.635E+12 | 6.132E+12 | 6.384E+12 | 6.206E+12 | 5.630E+12 |
| 5 | 4.271E+12 | 4.271E+12 | 4.674E+12 | 5.318E+12 | 5.967E+12 | 6.510E+12 | 6.833E+12 | 6.803E+12 | 6.366E+12 |
| 6 | 4.871E+12 | 4.871E+12 | 5.294E+12 | 6.012E+12 | 6.749E+12 | 7.389E+12 | 7.839E+12 | 8.017E+12 | 7.907E+12 |
| 7 | 5.937E+12 | 5.937E+12 | 6.410E+12 | 7.268E+12 | 8.164E+12 | 8.969E+12 | 9.610E+12 | 1.004E+13 | 1.023E+13 |
| 8 | 7.644E+12 | 7.644E+12 | 8.203E+12 | 9.286E+12 | 1.044E+13 | 1.149E+13 | 1.240E+13 | 1.313E+13 | 1.370E+1 |
| 9 | 1.024E+13 | 1.024E+13 | 1.092E+13 | 1.235E+13 | 1.388E+13 | 1.531E+13 | 1.658E+13 | 1.767E+13 | 1.867E |
| 10 | 1.411E+13 | 1.411E+13 | 1.495E+13 | 1.687E+13 | 1.895E+13 | 2.092E+13 | 2.269E+13 | 2.426E+13 | 2.564E |
| 11 | 1.984E+13 | 1.984E+13 | 2.085E+13 | 2.347E+13 | 2.653E+13 | 2.909E+13 | 3.157E+13 | 3.378E+13 | 3.576 |
| 12 | 2.827E+13 | 2.827E+13 | 2.942E+13 | 3.302E+13 | 3.704E+13 | 4.087E+13 | 4.435E+13 | 4.747E+13 | 5.02 |
| 13 | 4.064E+13 | 4.064E+13 | 4.175E+13 | 4.667E+13 | 5.229E+13 | 5.767E+13 | 6.257E+13 | 6.695E+13 | 7.08 |
| 14 | 5.857E+13 | 5.527E+13 | 5.916E+13 | 6.578E+13 | 7.358E+13 | 8.108E+13 | 8.792E+13 | 9.405E+13 | 9.9 |
| 15 | 8.396E+13 | 8.396E+13 | 5.288E+13 | 9.143E+13 | 1.021E+14 | 1.124E+14 | 1.217E+14 | 1.302E+14 | 13 |
| 16 | 1.185E+14 | 1.185E+14 | 1.132E+14 | 1.236E+14 | 1.374E+14 | 1.510E+14 | 1.635E+14 | 1.747E+14 | 1. |
| 17 | 1.623E+14 | 1.623E+14 | 1.478E+14 | 1.587E+14 | 1.754E+14 | 1.923E+14 | 2.078E+14 | 2.218E+14 | 2 |
| 18 | 2.120E+14 | 2.120E+14 | 1.789E+14 | 1.864E+14 | 2.040E+14 | 2.225E+14 | 2.398E+14 | 2.553E+14 | 2 |
| 19 | 2.573E+14 | 2.573E+14 | 1.902E+14 | 1.866E+14 | 1.998E+14 | 2.156E+14 | 2.307E+14 | 2.444E+14 | 2 |
| 20 | 2.818E+14 | 2.818E+14 | 1.591E+14 | 1.318E+14 | 1.309E+14 | 1.359E+14 | 1.146E+14 | 1.470E+14 | 1 |
| 21 | 2.698E+14 | 2.698E+14 | 6.975E+13 | 4.077E+12 | -2.260E+13 | -3.905E+13 | -5.211E+13 | -6.344E+13 | -7 |
| 22 | 2.261E+14 | 2.261E+14 | -5.723E+13 | -1.680E+14 | -2.270E+14 | -2.708E+14 | -3.082E+14 | -3.411E+14 | - |
| 23 | 1.914E+14 | 1.914E+14 | -1.439E+14 | -2.837E+14 | -3.641E+14 | -4.261E+14 | -4.797E+14 | -5.271E+14 | |
| 24 | 2.123E+14 | 2.123E+14 | -1.012E+14 | -2.281E+14 | -2.987E+14 | -3.523E+14 | -3.986E+14 | -4.391E+14 | |
| 25 | 2.598E+14 | 2.598E+14 | 4.421E+13 | -3.003E+13 | -6.297E+13 | -8479E+13 | -1.026E+14 | -1.182E+14 | |
| 26 | 1.690E+14 | 1.690E+14 | 6.087E+13 | 2.843E+13 | 1.762E+13 | 1.221E+13 | 8.363E+12 | 5.200E+12 | |
| 27 | 0.000E+00 | 0.000E+00 | 0.000E+00 | 0.000E+00 | 0.000E+00 | 0.000E+00 | 0.000E+00 | 0.000E+00 | |

UCC α β γ (0.0226)
CCU α β γ (0.0226)
CUC α β γ (0.0226)
CCC α β γ (0.8574)
CCL α β γ ( · )
CLC α β γ ( · )
LCC α β γ ( · )

U  Upper   FREQUENCY  0.025
C  Center  FREQUENCY  0.95
L  Lower   FREQUENCY  0.025

FIG. 46

```
tmp-PbTiO3

Cartesian coordinates (bohr)
  7.36991773809233E+00   3.68503830556782E+00   7.36999010703879E+00
  3.68492904917006E+00   7.36990675500488E+00   7.36998965539427E+00
  1.85344324959821E-05   1.45452209340920E-05   3.40147019434692E+00
  6.37215603348813E-05   7.36992081267651E+00   3.51659109214652E-05
  3.68493242800013E+00   3.68491260288479E+00   3.96842529600134E+00
Cartesian forces (hart/bohr); max,rms= 1.43767E-02 4.51782E-03 (unfixed atoms)
 -1.80940035404206E-04  -2.07537373211315E-04  -2.04964454194065E-03
  2.56880079450442E-04   4.07888591617262E-05  -2.14973113771572E-03
  2.24243540544528E-05   1.10425697382921E-04  -6.93585136915477E-04
 -2.24118747243653E-04  -2.11855686110157E-05  -9.48369575837913E-03
  1.25754349142964E-04   7.75083852776827E-05   1.43766565749510E-02

Cartesian coordinates (bohr)
  7.36973679805692E+00   3.68483076819461E+00   7.36794046249685E+00
  3.68518592924951E+00   7.36994754386404E+00   7.36783992425656E+00
  4.09587865504349E-05   1.24970918317013E-04   3.40077660921001E+00
 -1.60397186908771E-04   7.36989962710790E+00  -9.44852984745766E-03
  3.68505818234927E+00   3.68499011127006E+00   3.98280195257629E+00
Cartesian forces (hart/bohr); max,rms= 8.34605E-03 2.45956E-03 (unfixed atoms)
 -1.61895617366627E-05   3.09255883087009E-06  -1.19915787731153E-03
  7.34168075079671E-05   1.12756648306686E-04  -1.10022284067273E-03
 -2.24275552232517E-05  -2.41956035453473E-05  -3.24637418523411E-03
  1.06415727261410E-04  -2.44007083322998E-05  -2.80029696512406E-03
 -1.41215417809463E-04  -6.72528952599095E-05   8.34605186834244E-03

Cartesian coordinates (bohr)
  7.36967174041861E+00   3.68479961773717E+00   7.36516510152224E+00
  3.68537949760620E+00   7.37018116183304E+00   7.36524508710990E+00
 -1.16727938556601E-08   9.62925456708003E-05   3.39413705673712E+00
  1.28129761298314E-05   7.36984684725815E+00  -1.67751205094258E-02
  3.68479743192721E+00   3.68486910198090E+00   4.00213829383241E+00
Cartesian forces (hart/bohr); max,rms= 7.20602E-03 2.08967E-03 (unfixed atoms)
  1.28850801532736E-04   7.06412663058745E-05  -1.50295459585843E-03
 -1.58012861369054E-04  -1.74164668147622E-04  -1.46956505541997E-03
  7.08585971568290E-05   5.67021085975686E-06  -2.28610955944484E-03
 -1.73598433456127E-04   8.43701157472647E-05  -1.94739350275452E-03
  1.31901896135616E-04   1.34830752320297E-05   7.20602271347777E-03

Cartesian coordinates (bohr)
  7.37021318634145E+00   3.68505926267177E+00   7.34658602343312E+00
  3.68506431084086E+00   7.36978023696826E+00   7.34735839048843E+00
  3.39286295583846E-04   9.97498200251742E-05   3.35993819043655E+00
 -6.84291357691068E-04   7.37021688700809E+00  -5.49264155838585E-02
  3.68492897913516E+00   3.68463688488677E+00   4.11095422991800E+00
Cartesian forces (hart/bohr); max,rms= 1.40552E-02 5.32522E-03 (unfixed atoms)
 -1.54149077482324E-04  -1.38672668831043E-04   2.44677120516630E-03
  4.19884602629664E-04   1.54548773067693E-04   2.36496445003840E-03
 -2.41608460357061E-05  -2.57753838330758E-05  -5.07590096094921E-03
 -1.73065113649408E-04  -3.18303354074471E-05   1.40552397966281E-02
 -6.85095654622252E-05   4.17296150038733E-05  -1.37910744908836E-02 bravais matrix for conventional unit cell in Angstroms is:
         a1         a2         a3
      3.90000    0.00000    0.00000
      0.00000    3.90000    0.00000
      0.00000    0.00000    4.20000 rms force= 5.3252E-03 > tolerance ftoler= 2.0000E-03 hart/bohr (unfixed atoms)
```

RAMAN SPECTROM
(POLARIZATION)

FIG.73
BACKGROUND ART
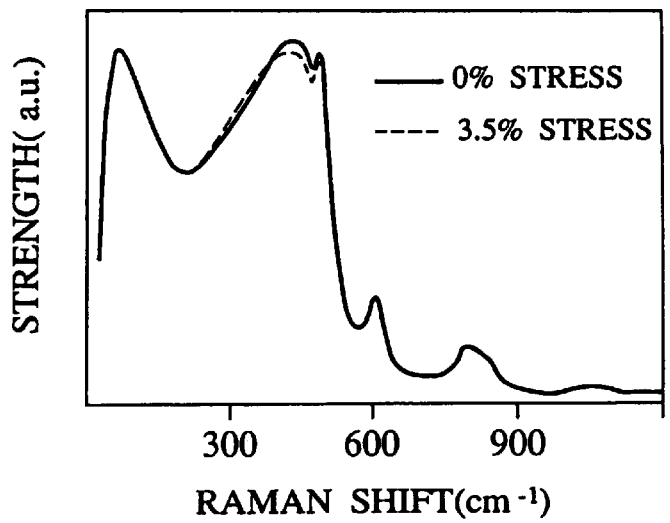
FIG.74a
BACKGROUND ART
WITHOUT STRESS
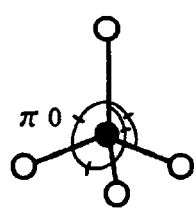
$\pi = 109.5°$
WITH STRESS
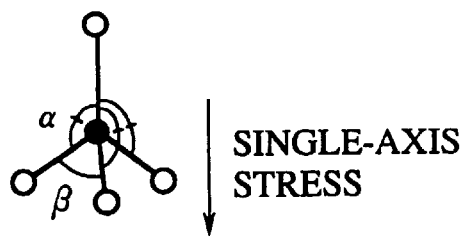
$\alpha > \pi > \beta$
↓ SINGLE-AXIS STRESS
FIG.74b
BACKGROUND ART

STRESS

FIG.100

FLOWCHART 1 IN CASE IR SPECTRUM IS CALCULATED USING CLASSICAL MD

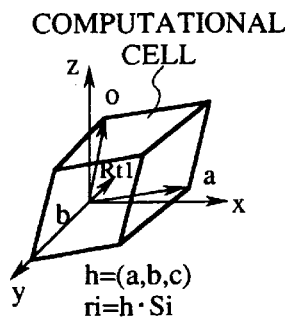

COMPUTATIONAL CELL
$h=(a,b,c)$
$r_i = h \cdot S_i$

EXPLANATION OF INPUT VALUES

FROM ATOM ALLOCATION OF ANALYSIS OBJECT MATERIAL AND INPUT $S_i0$, $\dot{S}_i0$, $h0$, $\dot{h}0$

- $S_i$ ; INITIAL POSITION VECTOR
- $\dot{S}_i^0$ ; INITIAL VELOCITY VECTOR
- $h0$ ; INITIAL CELL COORDINATE VECTOR
- $\dot{h}0$ ; INITIAL CELL COORDINATE CHANGE VECTOR

→ PREPARE VARIOUS CONSTANTS USED IN POTENTIAL CALCULATION $t = t + \Delta t$

Ⓐ SOLVE EQUATION OF MOTION OF EACH ATOM AND CELL DERIVED FROM LAGRANGIAN

① MOTION OF EACH ATOM $$\ddot{S}_i^n = -\sum_{j \ne i} \frac{1}{m_i} \left( \frac{1}{r_{ij}} \frac{d\phi}{dr_{ij}} \right) (S_i^n - S_j^n) - G^{-1} \dot{G} \dot{S}_i^n$$

$$\dddot{S}_i^n = -\sum_{j \ne i} \left\{ \frac{1}{m_i} \left( \frac{1}{r_{ij}} \frac{d\phi}{dr_{ij}} \right) (\dot{S}_i^n - \dot{S}_j^n) \right.$$

$$\left. + \frac{1}{m_i} (S_i^n - S_j^n) \frac{d}{dt} \left( \frac{1}{r_{ij}} \frac{d\phi}{dr_{ij}} \right) \right\}$$

$$- \dot{G}^{-1} \dot{G} \dot{S}_i^n - G^{-1} \ddot{G} \dot{S}_i^n - G^{-1} \dot{G} \ddot{S}_i^n$$

WHERE $G = {}^t h \cdot h$

② MOTION OF CELL $$\ddot{h}^n = \frac{\pi - PE}{W} \sigma$$

WHERE $\pi = \frac{1}{\Omega} \left\{ \sum_i m_i v_i v_i - \sum_i \sum_{j>i} \left( \frac{1}{r_{ij}} \frac{d\phi}{dr_{ij}} \right) r_{ij} r_{ij} \right\}$ $v_i = h \dot{S}_i^n$, $\sigma = {}^t h^{-1} \Omega$, $\Omega$ ; CELL VOLUME

Ⓑ CALCULATE POSITION VECTOR OF EACH ATOM, VELOCITY VECTOR CELL COORDINATE VECTOR AT $t = t_{p+1}$

① MOTION OF EACH ATOM $$S_i^{n+1} = S_i^n + \Delta t \dot{S}_i^n + \frac{1}{2} \Delta t^2 \ddot{S}_i^n + \frac{1}{6} \Delta t^3 \dddot{S}_i^n + A$$

$$\dot{S}_i^{n+1} = \dot{S}_i^n + \Delta t \ddot{S}_i^n + \frac{1}{2} \Delta t^2 \dddot{S}_i^n + B$$

② MOTION OF CELL $$h^{n+1} = h^n + \Delta t \dot{h}^n + \frac{1}{2} \Delta t^2 \ddot{h}^n$$

$$\dot{h}^{n+1} = \dot{h}_i^n + \Delta t \ddot{h}_i^n$$

◇ MOTION REACHES EQUILIBRIUM ? — NO ↑

YES SET $t = \phi$

FIG.108
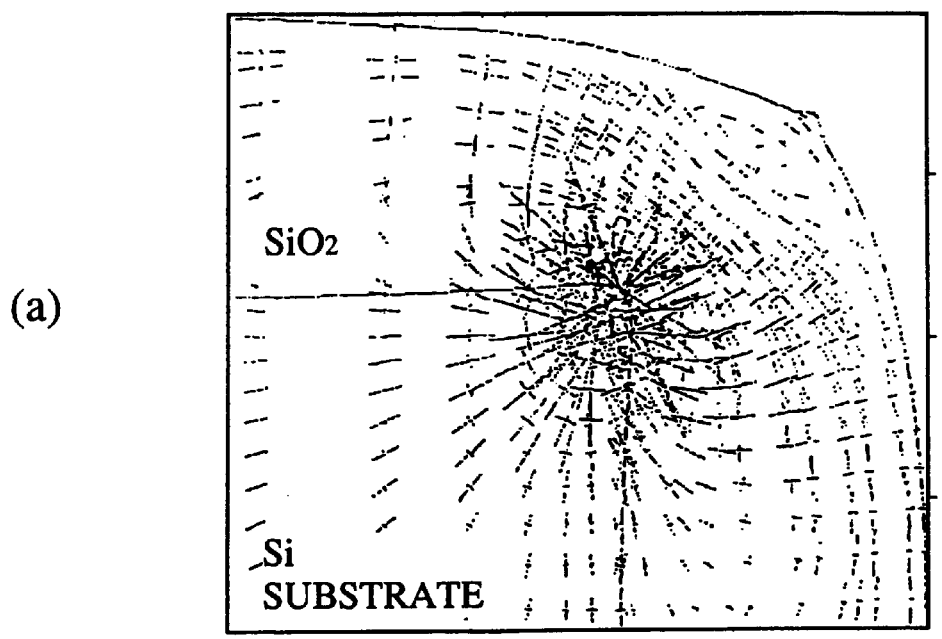
(a)
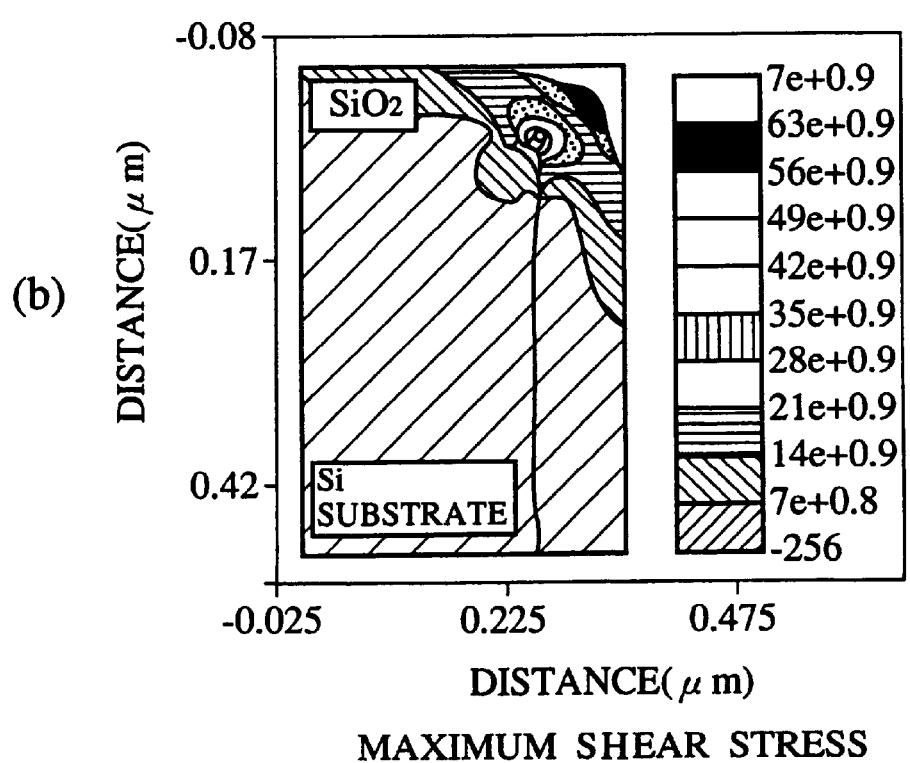
(b)
MAXIMUM SHEAR STRESS (a)

(b)

EMERGENCE SENSITIVITY OF BOND THAT
INTERVAL BETWEEN Si-O ATOMS OF FIRST
APPROACH IS NOT LESS THAN 1.8Å(%)

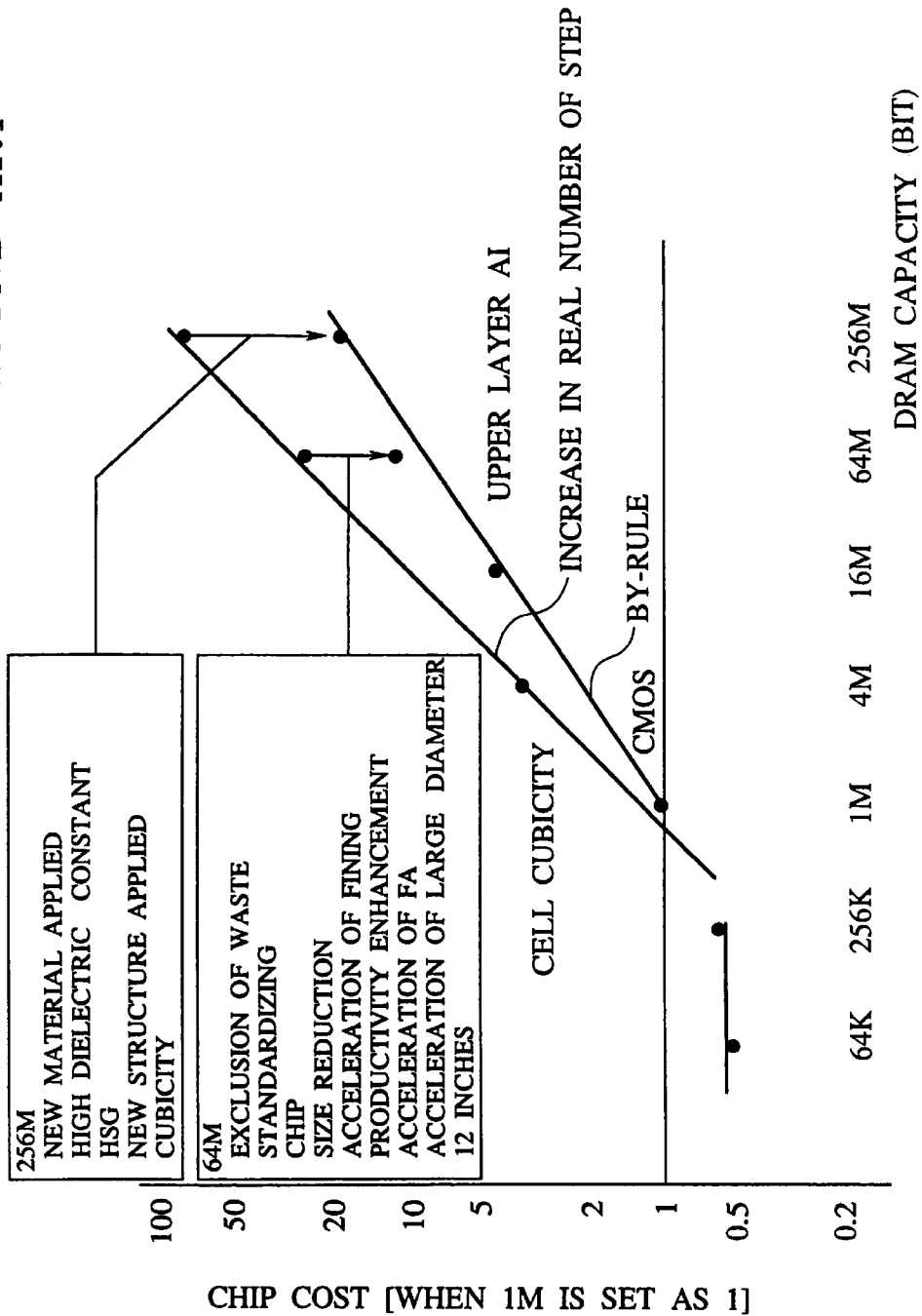

CLUSTER TOOL

SEMICONDUCTOR DEVICE MANUFACTURING METHOD, MANUFACTURING APPARATUS, SIMULATION METHOD AND SIMULATOR

BACKGROUND OF THE INVENTION

1. Field of the Invention

The present invention relates to a semiconductor device manufacturing method, a manufacturing apparatus, a simulation method and a simulator and, more particularly, to a semiconductor device manufacturing method capable of proceeding semiconductor device manufacturing processes according to predetermined schedules or while correcting them by expanding limited quantity or quality contents of "in situ" measured values at their maximum in a sheet type or clustered semiconductor device manufacturing apparatus without using testpieces, a manufacturing apparatus, a simulation method and a simulator.

2. Description of the Prior Art

Conventionally, semiconductor device manufacturing apparatuses have come to the present circumstance after following changes. If such manufacturing apparatus are considered along a series of respective generations, then a chip cost in the DRAM generation and respective generations is varied, as shown in FIG. 128, as capacity is increased from a 64K device to a 256 M device. In FIG. 128, the ordinate is represented by setting a chip cost in a 1 M device as 1. In FIG. 128, plotted points indicate chip cost and the abscissa denotes DRAM generations.

As shown in FIG. 128, from the 64K device to the 256K device, the number of steps is relatively stable and also the chip cost is stable. However, as generations are updated from a 4M device, the number of steps is increased and also the chip cost is increased correspondingly. In order to reduce increase in the cost due to the increase in the number of steps as much as possible, as shown in FIG. 128, reduction in cost has been intended by anticipating various countermeasures, e.g., 1) exclusion of waste, 2) standardization of operation, 3) reduction in chip size, 4) promotion of miniaturization, 5) improvement of productivity, 6) promotion of FA, 7) large bore size, etc. in the 64 M device, for instance.

In the 256 M device, by making use of application of new material, introduction of the dielectric substance with high dielectric constant, application of new structure, employment of the solid structure, etc., design has been made along a bi-rule. However, situation is changed completely in the 1G class device and it becomes unclear whether or not design can be made along the bi-rule. According to the conventional approach which pursues high performance of respective manufacturing apparatuses fabricating up to the conventional 256 class device to the limit, it becomes difficult to seek a solution to the enterprise yet. To pursue high performance of respective manufacturing apparatuses to the limit brings about directly high cost.

As shown in FIG. 129, high performance apparatus is used for every step in the sequence of steps A-B-C-D-E-F, for example. In this case, it is evident that increase in equipment area and increase in cost are brought: about.

In addition, one more condition to be kept: in mind is that various precise controls due to physical necessity are indispensable in respective steps to more than 1G class device. For example, there are cut-off of contamination, elimination of natural oxide film, pursuit of planarization at atomic level, etc. At present, a clustered manufacturing apparatus as shown in FIG. 130, though yet at a study stage, has been proposed as a new concept, with considering these circumstances. The clustered manufacturing apparatus (clustered tool) may be made up as a batch type one, but mainly as a sheet type one. As can be seen from FIG. 130, for example, a carrying system is installed in the middle and respective steps are advanced sequentially as shown by an arrow like A-B-C-D. At this time, in many cases the chamber is held at high vacuum at respective steps and in respective steps, so that deposition of natural oxide film can be decreased. In addition, cut-off of contamination and surface control at atomic level are enabled.

In the meanwhile, as for the field effect MIS device formed on the semiconductor, a ferroelectric substance is of necessity directed toward thin film in the course of recent technical development for the high speed and high integration density device. If the ferroelectric substance is formed as a thin film, then a threshold voltage is of course reduced small. As a result, main operation speed is accelerated correspondingly so that especially an AC characteristic can thus be remarkably improved. If EEPROM, etc. are considered, then working condition of the device becomes very severe with the progress of miniaturization. In such case, according to the ferroelectric film formed by the conventional ordinary manufacturing method, sufficient reliability cannot be achieved yet.

However, under such circumstance that, even if the MIS device is miniaturized, characteristic improving measures of the ferroelectric substance per se are not so regarded and as a result power supply voltage is not so reduced, high electric field would be applied to the gate ferroelectric film particularly upon main operation. Still further, electrons and holes generated from the channel region by impact ions are injected into the ferroelectric film according to boundary conditions such as polarity of gate electrodes, drain voltage, etc. These carriers are trapped by the ferroelectric film, so that not only long term reliability is lowered but also reduction in breakdown voltage, eta are caused.

Further, the device will be examined at atomic level. In a thermal ferroelectric film, if high electric field is applied to a silicon ferroelectric film, for example, then Si—O bonds constituting a network interact with high electric field which is applied externally. Then, the bonds are cut off and then trapping centers to trap electrons and holes are formed. Then, electrons and holes being passed subsequently are trapped by the trapping centers. Then, intensity distribution of electric field in the film thickness direction is increased locally rather than an average electric field. In the end, dielectric breakdown is brought out. In recent years, ideas to form the ferroelectric film as single crystal, although still yet at an academic society level, are begun to be proposed to improve such circumstance. For purposes of example, it has been reported in J. Appl. Phys., Vol.69(12), p.8313 (1991) that cerium oxide ($CeO_2$) is grown as a single crystal on a silicon (111) face. Otherwise, it has been reported in Japan, J. Appl. Phys. Suppl., Vol.21–1, p.187 (1982) that calcium fluoride ($CaF_2$) is grown as a single crystal on the silicon single crystal. These are merely several examples.

In addition, they still remain only in an idea stage and there are some doubts about calculation methods providing the base of guide. In the case that the ferroelectric film is taken as one example, a single crystal per se of the ferroelectric film is not sufficiently recognized. A report concerning the structure of this single crystal ferroelectric film will be checked. There is A. Miyamoto, K. Takeichi, T. Hattori, M. Kubo, and T. Inui, "Mechanism of Layer-Layer Homoopitaxial Growth of SrTiO~(100) as Investigated by Molecular Dynamics and Computer Graphics", Jpn. J. Appl. Phys.

Vol.31, (1992) 4463–4464. In this paper, when a perovskite as a single crystal ferroelectric film is adhered to an underlying Si substrate, a stable structure is calculated. However, initial alignment of angle and distance between Si—O—Ti or Ti—Si—Sr is used incorrectly. Since the structure of the single crystal ferromagnetic film is simplified in these papers, the guide is not always correct.

As understood from the above, it is the existent status that how to design the single crystal ferromagnetic film is scarcely correctly discussed. On the contrary, as for the ferromagnetic film itself, improvement of the characteristic yet remains in refinement of the forming process. For example, preparation of as clean surface as possible previously sputter temperature and sputter atmosphere to form the film, and the like are discussed all the time. We cannot but say that recognition as for the structures of the single crystal ferroelectric film and the ferroelectric film is yet at an extremely low level in these papers. Moreover, since reason for occurrence of spontaneous polarization in the ferroelectric substance and relationship between the spontaneous polarization and the crystal structure have not been analyzed in these papers, their discussions are concluded as mere phenomenal analyses.

However, the most significant difficulty confronted at present in the above new clustered tools is a circumstance observing approach. That is, in the case of the apparatus executing a single step, wafers each of which is called testpieces are first introduced into respective steps. Then, it is tested by measuring film thickness, refractive index, etc. with the use of such testpieces whether or not processes are advanced along predetermined conditions.

In monitoring conditions in respective clustered tools with the use of such testpieces, there are problems on quantitative and qualitative understanding. By way of example, usually an XPS equipment and an FT-IR equipment are used in film forming step or growth step of the oxide film. Even if such steps are monitored on an in-situ basis, meaning of such data is not sufficiently investigated at present. Judging from the location of peak wave number at best, it only can be determined whether or not predetermined substance is generated. Under such circumstance, most parts of determination rely upon judgement of the research worker. Still further, quantitative response cannot be taken and also quick response cannot be taken. If a new unknown substance which does not rely upon experience of the research worker is present, then no effective judgement can be done.

On the contrary, use of molecular dynamics simulator has been proposed. However, in the molecular dynamics simulator, it has been pointed out that in general 1) calculation speed is very slow, and 2) execution range of object material is very small compared to process variation calculation program. Therefore, combination of the molecular dynamics simulator with the process variation calculation program has in no way been thought out up to now. More particularly, since the molecular dynamics simulator executes calculation very slowly, an overall calculation speed of the combination is restricted by such slow calculation speed after all even if the molecular dynamics simulator is combined with the process variation calculation program. Consequently, such combination is believed not to be suitable for practical use. Further, in the molecular dynamics simulator, a calculation range is extremely small, e.g., about several tens Angstrom at best. Furthermore, it has been believed that, since a range on the order of several microns is calculated in the process variation calculation program, direct combination of the molecular dynamics simulator with the process variation calculation program is impossible from the viewpoint of deviation of the calculation range.

The inventors of the present invention have taken notice of free energy of overall system including the interface as installation condition of the single crystal ferroelectric film. Locations have been determined so as to minimize such free energy under applied condition, so that MIS devices with high reliability have been fabricated and levels have not been formed on the interface. In particular, upon calculating overall energy of the system, it is needed to reproduce firmly the structure of the single crystal ferroelectric film and to grasp strictly and precisely how respective atoms constituting the structure do move. The inventors of the present invention have completed ab initio molecular dynamics and have established an original potential integration method in the molecular dynamics to permit these calculations for the first time. In addition, in respect of ensuring sufficiently improvement of electric properties, etc., the inventors of the present invention have made clear up to the degree of quality of the single crystal ferroelectric film using this method.

By way of example, if a high electric field is applied to a tunneling insulating film, then it interacts with bonds constituting a basic structure of the tunneling insulating film (e.g., Si—O bonds in the case of the silicon ferroelectric film) to cut off the bonds. Subsequently, electrons and holes passing through the tunneling insulating film are trapped by the cut-off bonds and therefore the electric field exceeds an average electric field locally according to charge distribution in the insulating film to thus accelerate degradation of the insulating film. It has been found by the inventors of the present invention that cut-off of the bonds (e.g., Si—O bonds) in the insulating film because of this electric field should be suppressed to suppress the progress of degradation.

Interaction between the electric field and the bonds in the insulating film depends on the direction of the electric field and the direction of the bonds in the insulating film. Accordingly, in order to reduce interaction, the bonds in the insulating film which are directed to enhance such interaction must be reduced as much as possible. If the direction of the bonds are set completely at random like in amorphous films, then a part bonds in the insulating film is inevitably directed to enhance the interaction between the bonds and, the electric field.

SUMMARY OF THE INVENTION

An object of the present invention is to control the direction of bonds in ferroelectric insulating film and suppress interaction between the film and an electric field and suppress degradation in dielectric property caused by the electric field.

This is concerned with the technology of forming a reliability dielectric film. Such technology is produced by the inventors of the present invention based on calculation results obtained by a new ab initio molecular dynamics system and original experimental data. If the single crystal ferroelectric film is utilized as ferroelectric film, etc., then the performance becomes poor rather than the amorphous ferroelectric film unless positional relationship between the substrate and substrate electrodes are optimized as well as selection of material per se. At this time, criteria of material and crystal orientation would be provided by the inventors. As new guides given by the inventors, we would dare to say one word, i.e., "Crystal location has to be selected so as to minimize free energy of the system under the main applied electric field". Still further, as a matter of practice, "In addition to location permitting free energy of the system to minimize under the main applied electric field, a tolerance limit of unevenness of free energy distribution to suppress deterioration in trigger, if viewed locally" is also mentioned.

Considering the single crystal ferroelectric film only, the structure is very complicated such that the tetrasymmetric perovskite has a very complicated structure and characteristics are significantly different according to combination of the substrate and the junction surface. However, the inventors of the present invention intend to derive "advantage" under the main operating voltage although "disadvantage" is caused in respect of crystallography.

Another object of the present invention is to overcome the problems of monitoring function caused in clustering, and to provide a semiconductor device manufacturing method capable of proceeding semiconductor device manufacturing processes according to predetermined schedules or while correcting them by expanding limited quantity or quality contents of "in situ" measured values at their maximum in a sheet type or clustered semiconductor device manufacturing apparatus without using testpieces, a manufacturing apparatus, a simulation method and a simulator.

The inventors of the present invention have developed a new variation calculation method using ab initio molecular dynamics and have also developed a simulation system which makes it possible to i) diagnose a superposition phenomenon of fluctuation of respective process factors and deviation of respective factors, ii) check whether or not processes are executed along predetermined sequences, and iii) find variation factors. Furthermore, characterizing features of this system are iv) to enable variation in processes to be dealt with mathematically and statistically with good efficiency, v) to equip the present system with a new inference engine, and vi) to equip the present system with a new reciprocal system.

More particularly, according to an aspect of the present invention, there is provided a method of manufacturing a semiconductor device comprising the steps of: collecting at least one of actually observed data by measuring at least one of plural characteristics concerning at least one of a film formed in a manufacturing apparatus, a film formed on a semiconductor substrate, surface of said semiconductor substrate, and interior of said semiconductor substrate during at least one of a plurality of steps; obtaining at least one of prediction data of said plural characteristics by selecting at least one of set values for plural manufacturing process factors and fluctuation of this set value during said at least one of a plurality of steps as input values and then executing variation calculation based on said input values by using an ab initio molecular dynamics process simulator or a molecular dynamics simulator to which empirical potential is given; comparing and verifying said prediction data and said actually observed data sequentially at real time; and correcting and processing said plural manufacturing process factors sequentially at real time if a difference in significance is recognized between at least one of said set values for said plural manufacturing process factors and at least one of said plural manufacturing process factors estimated from said actually observed data according to comparison and verification.

In the preferred embodiment, said ab initio molecular dynamics process simulator or said molecular dynamics simulator to which empirical potential is given has functions of setting time to zero when motions of atoms constituting semiconductor material, insulating material, or conductive material being formed or processed during said plurality of steps reach equilibrium, then setting a time period from zero to time t as a sampling time, then calculating time correlation between polarizability, charge, and position vector, and then calculating optical spectrum within a predetermined time, and prediction data which are derived by said ab initio molecular dynamics process simulator or said molecular dynamics simulator to which empirical potential is given include information concerning oscillation behavior derived from momentary motion of individual atoms, natural frequency of oscillation, and distribution of said natural frequency.

In the preferred embodiment, said ab initio molecular dynamics process simulator or said molecular dynamics simulator to which empirical potential is given has functions of calculating strength constant of material sequentially based on motions of atoms constituting semiconductor material, insulating material, or conductive material being formed or processed during said plurality of steps, and then calculating stress induced in said material using said strength constant of material, and at least one of said manufacturing process factors is corrected sequentially if said stress exceeds a specified value.

In the preferred embodiment, said atoms constituting said semiconductor material, said insulating material, or said conductive material are made up of silicon atoms and oxygen atoms.

According to another aspect of the present invention, there is provided an apparatus for manufacturing a semiconductor device comprising: means for collecting at least one of actually observed data by measuring at least one of plural characteristics concerning at least one of a film formed in a manufacturing apparatus, a film formed on a semiconductor substrate, surface of said semiconductor substrate, and interior of said semiconductor substrate during at least one of a plurality of steps; means for obtaining at least one of prediction data of said plural characteristics by selecting at least one of set values for plural manufacturing process factors and fluctuation of this set value during at least one of said plural steps as input values and then executing variation calculation based on said input values by using an ab initio molecular dynamics process simulator or a molecular dynamics simulator to which empirical potential is given; means for comparing and verifying said prediction data and said actually observed data sequentially at real time; and means for correcting and processing said plural manufacturing process factors sequentially at real time if a difference significance is recognized between at least one of said set values for said plural manufacturing process factors and at least one of said plural manufacturing process factors estimated from said actually observed data according to comparison and verification.

According to still another aspect of the present invention, there is provided a simulation method comprising the steps of: obtaining at least one of prediction data of plural characteristics concerning at least one of a film formed in a manufacturing apparatus, a film formed on a semiconductor substrate, surface of said semiconductor substrate, and interior of said semiconductor substrate during at least one of a plurality of steps by selecting at least one of set values for plural manufacturing process factors and fluctuation of this set value during at least one of said plural steps as input values and then executing variation calculation based on said input values by using an ab initio molecular dynamics process simulator or a molecular dynamics simulator to which empirical potential is given; and diagnosing and determining said manufacturing process factors by comparing and verifying sequentially at real time said prediction data and actually observed data obtained by measuring at least one of said plural characteristics during at least one of said plural steps.

The preferred embodiment further comprises the step of calculating corrected values for said plural manufacturing process factors at real time if a difference in significance is recognized between at least one of said set values for said plural manufacturing process factors and at least one of said plural manufacturing process factors estimated from said actually observed data according to comparison and verification.

According to yet still another aspect of the present invention, there is provided a simulator for diagnosing and determining manufacturing process factors in a semiconductor device comprising: means for collecting actually observed data by measuring at least one of plural characteristics concerning at least one of interior of said manufacturing apparatus, surface of said semiconductor substrate, and/or a film formed on a semiconductor substrate during at least one of a plurality of steps of manufacturing process of said semiconductor device; means for obtaining at least one of prediction data of said plural characteristics by selecting at least one of set values for plural manufacturing process factors and fluctuation of this set value during at least one of said plural steps as input values and then executing variation calculation based on said input values by using an ab initio molecular dynamics process simulator or a molecular dynamics simulator to which empirical potential is given; and means for comparing and verifying said prediction data and said actually observed data sequentially at real time.

According to a further aspect of the present invention, there is provided a simulator for diagnosing and determining manufacturing process factors in a semiconductor device comprising: means for obtaining at least one of prediction data of plural characteristics concerning at least one of a film formed in a manufacturing apparatus, a film formed on a semiconductor substrate, surface of said semiconductor substrate, and interior of said semiconductor substrate during at least one of a plurality of steps by selecting at least one of set values for plural manufacturing process factors and fluctuation of this set value during at least one of said plural steps as input values and then executing variation calculation based on said input values by using an ab initio molecular dynamics process simulator or a molecular dynamics simulator to which empirical potential is given; and means for diagnosing and determining said manufacturing process factors by comparing and verifying sequentially at real time said prediction data and actually observed data obtained by measuring at least one of said plural characteristics during at least one of said plural steps.

According to a still further as aspect of the present invention, there is provided a simulation method for diagnosing and determining manufacturing process factors in a semiconductor device comprising: obtaining at least one of prediction data of plural characteristics concerning at least one of a film formed in a manufacturing apparatus, a film formed on a semiconductor substrate, surface of said semiconductor substrate, and interior of said semiconductor substrate during at least one of a plurality of steps by selecting at least one of set values for plural manufacturing process factors and fluctuation of this set value during at least one of said plural steps as input values and then executing variation calculation based on said input values by using an ab initio molecular dynamics process simulator or a molecular dynamics simulator to which empirical potential is given; and diagnosing and determining said manufacturing process factors by comparing and verifying sequentially at real time said prediction data and actually observed data obtained by measuring at least one of said plural characteristics during at least one of said plural steps.

According to a yet still further as aspect of the present invention, there is provided a method of manufacturing a field effect type MIS semiconductor device comprising the steps of: employing a single crystal ferroelectric film as a ferroelectric film of said MIS semiconductor device when said field effect type MIS semiconductor device is formed on a single crystal semiconductor substrate; introducing evaluation function based on ab initio molecular dynamics theory representing object characteristics into a system which includes said semiconductor substrate and said single crystal ferroelectric film; and designing said single crystal ferroelectric film and said semiconductor substrate according to optimal solution of said system under predetermined main operating conditions and then placing them.

According to an additional aspect of the present invention, there is provided a method of manufacturing a field effect type MIS semiconductor device comprising the steps of: employing a single crystal ferroelectric film as a ferroelectric film of said MIS semiconductor device when said field effect type MIS semiconductor device is formed on a single crystal semiconductor substrate; taking free energy of overall system as evaluation function based on ab initio molecular dynamics theory representing object characteristics into a system which includes said semiconductor substrate and said single crystal ferroelectric film; and placing said single crystal ferroelectric film so as to minimize free energy under main operating conditions.

According to a still additional aspect of the present invention, there is provided a method of manufacturing a field effect type SiMIS semiconductor device comprising the steps of: employing a single crystal film as a gate insulating oxide film of said MIS semiconductor device when said field effect type MIS semiconductor device is formed on an Si single crystal semiconductor substrate; taking free energy of overall system as evaluation function based on ab initio molecular dynamics theory representing object characteristics into a system which includes said semiconductor substrate and said single crystal ferroelectric film; and placing said single crystal ferroelectric film so as to minimize free energy under main operating conditions.

According to a yet still additional aspect of the present invention, there is provided a method of manufacturing a field effect type SiMIS semiconductor device comprising the steps of: employing a single crystal film as a gate insulating oxide film of said MIS semiconductor device when said field effect type MIS semiconductor device is formed on an Si single crystal semiconductor substrate; taking free energy of overall system as evaluation function based on ab initio molecular dynamics theory representing object characteristics into a system which includes said semiconductor substrate and said single crystal ferroelectric film; placing said single crystal ferroelectric film so as to minimize free energy under main operating conditions; and suppressing oxygen deficient density in said single crystal ferroelectric film less than 0.01%.

According to a subordinate aspect of the present invention, there is provided a method of manufacturing a field effect type SiMIS semiconductor device comprising the steps of: employing a single crystal film as a gate insulating oxide film of said MIS semiconductor device when said field effect type MIS semiconductor device is formed on an Si single crystal semiconductor substrate; taking free energy of overall system as evaluation function based on ab initio molecular dynamics theory representing characteristics into a system which includes said semiconductor substrate and said single crystal ferroelectric film; placing said single crystal ferroelectric film so as to minimize free energy under main operating conditions; suppressing unevenness of local energy within a deviation value 3σ; and suppressing oxygen deficient density in said single crystal ferroelectric film less than 0.01%.

According to a still subordinate aspect of the present invention, there is provided a method of manufacturing a semiconductor device comprising the steps of: collecting at least one of actually observed data by measuring at least one of plural characteristics concerning at least one of a film formed in a manufacturing apparatus, a film formed on a semiconductor substrate, surface of said semiconductor substrate, and interior of said semiconductor substrate during at least one of a plurality of steps; obtaining at least one of prediction data of said plural characteristics by selecting at least one of set values for plural manufacturing process factors and fluctuation of this set value during at least one of said plural steps as input values and then executing variation calculation based on said input values by using a molecular dynamics simulator to which empirical potential is given; comparing and verifying said prediction data and said actually observed data sequentially at real time; and correcting and processing said plural manufacturing process factors sequentially at real time if a difference in significance is recognized between at least one of said set values for said plural manufacturing process factors and at least one of said plural manufacturing process factors estimated from said actually observed data according to comparison and verification.

In the preferred embodiment, said molecular dynamics simulator to which empirical potential is given has functions of setting time to zero when motions of atoms constituting semiconductor material, insulating material, or conductive material being formed or processed during said plurality of steps reach equilibrium, then setting a time period from zero to time t as a sampling time, then calculating time correlation between charge and position vector, and then calculating optical spectrum within a predetermined time, and prediction data which are derived by said molecular dynamics simulator to which empirical potential is given include information concerning oscillation behavior derived from momentary motion of individual atoms, natural frequency of oscillation, and distribution of said natural frequency.

In the preferred embodiment, said molecular dynamics simulator to which empirical potential is given receives position vectors of atoms and electronegativity of respective elements, or ionization potential and electric affinity of respective elements, then calculates change in charge based on oscillation and variation of respective atoms from these data, and then calculates said potential with including such change in charge.

In the meanwhile, the inventors of the present invention can overcome the problems, in the molecular dynamics simulator, that a calculation speed is very slow as described above and that an executable range of object materials is very small, by introducing new ideas into the simulator, then provide a new approach to combine the molecular dynamics simulator with the process variation calculation program, and then derive new functions which being never achieved until now by using such combination. Such matters will be explained in sequence hereinbelow At first, the problem of calculation speed will be discussed in detail. In the molecular dynamics, an equation of motion for each atom is set up in compliance with Newtonian mechanics, so to speak, and then simultaneous equations of motion for all atoms, e.g., one hundred or one thousand atoms to be considered are solved. Calculation of force as the basis of equation of motion is most complicated. This is because the calculation speed was slow in the prior art calculation method. Each atom receives force from its surrounding atoms. Each atom receives force from near atoms and distant atoms. This fact should be considered. In general, potential energy Vij derived in compliance with Tersoff's equation is calculated and then force is calculated based on this energy. However, in the prior art, such an approach has in general been taken, upon calculating potential, that tables of force applied to respective atoms have been prepared in advance based on distance, direction, etc. in each direction. In this approach, as for the above one hundred or one thousand atoms, the magnitudes of potential are calculated with reference to the tables every time. This procedure requires an extraordinary amount of time. Force cannot be derived from potential itself, but a gradient of the magnitude of potential relative to each direction provides force (see FIG. 2). Therefore, it is, understood that an extreme amount of calculation time is required.

It is the reason why numerical tables are prepared in this manner that equations representing potential profiles are extremely complicated. As described above, upon calculating potential V, mutual angles θ, distances r, etc. between surrounding atoms are entangled complicatedly to calculate locations of the surrounding atoms. Hence, it is very difficult to prepare a function by differentiating them mathematically. For example, though the angle θ is a function of r, it becomes again a function of r after all.

In the event that calculations are in general very complicated in this manner and that factors in the equation representing potential are circulated as described above, the inventors of the present invention have prepared new higher order cyclic partial differential equations in the fields wherein partial differentiation has not been tried in the prior art. Thereby, though transformation of the equations per se becomes very complicated apparently, calculation of the equations can be executed very quickly. Hence, unlike the prior case, reference of the tables described above are not required.

Next, a most basic concept of the higher order cyclic partial differential equations will be discussed as follows. Under the assumption that three atoms are utilized, this concept will be discussed. In other words, if this concept can be described generally for three atoms, then this approach may be spread out to more generic cases. If there are three atoms, distances between atoms, angles between atoms to be concerned, etc. may be calculated. Accordingly, potential can be calculated uniquely, and thus "gradient" of the potential can be calculated readily based on such potential in any direction. By forming all partial differentiation equations as with variations cyclicly used and then solving simultaneous equations of such variations, the inventors of the present invention have confirmed that differentiation equations are properly prepared.

An outline of a system according to the present invention will be explained particularly hereinbelow. To begin with, actual application of the present invention will be explained with reference to FIG. 1. In other words, a process device V is a part of a semiconductor manufacturing system which being actually operated. Where optical absorption spectrum is observed by a spectral meter VI.

The optical absorption spectrum observed by the spectral meter VI is stored as a file 4 once and then sent to a scheduler VII. Prediction values according to the present invention, described later, are also input into the scheduler VII. The observed values and the prediction values are compared by a comparison diagnosing/verifying portion IV.

If the compared results obtained in the comparison diagnosing/verifying portion IV exceed a tolerance, then the results are removed from the line as the matters which do not satisfy the specification. Otherwise, if they satisfy the specification, their variations are sent to a process variation calculation unit 1 serving as an inference engine.

The process variation calculation unit I basically calculates macro quality without regard to atomic level and then stores the calculated results in a file 2. As the contents of the file 2, interatomic position vectors and bond angles are calculated by the molecular dynamics simulator II.

Then, interatomic position vectors and bond angles calculated by the molecular dynamics simulator II are input into a film characteristic calculation unit III, and basic film characteristics are calculated in the unit III and then sent back to a file 3. The basic film characteristics calculated by the film characteristic calculation unit III are also sent back to the process variation calculation unit I to use a part of parameters.

In this manner, according to the present invention, there can be achieved a semiconductor device manufacturing method capable of advancing semiconductor device manufacturing processes according to predetermined steps or while correcting them without testpieces.

In actuality, the contents of the molecular dynamics simulator II is especially important. In particular, as shown in a block diagram in FIG. 7, the molecular dynamics simulator II consists of two parts. The first part $II_1$ utilizes the higher order cyclic partial differential method introduced by the inventors of the present invention, while the second part $II_2$ executes analysis with regard to higher order term more than third order term. Subsequently, taking account of the higher order cyclic partial differentiation method and the higher order term more than third order term, details of above analyses will be explained in sequence hereinafter.

A basic configuration of a simulation system of the present invention is shown in FIG. 1. As evident from FIG. 1, this system is made up of several programs and devices. There are provided an inference engine 1 written by common LISP, for example, and a new type ab initio molecular dynamics process simulator 2 written by FORTRAN or C language, for example.

The inference engine 1 takes mainly charge of process diagnosis and the ab initio molecular dynamics process simulator 2 is mainly in charge of prediction. These two soft packages may be written by different languages respectively. However, if objects are prepared in a common image area, then the inference engine 1 written by common LISP may cause the process simulator 2 to execute and then the process simulator 2 may return the result to the inference engine 1.

Input data 3 for the overall system are, as shown in FIG. 1, variation amounts of process parameters (e.g., temperatures in FIG. 1) in a series of process sequences. Outputs from the system are process margin, documents included in the diagnosed results, and optimized process sequences.

Upon process diagnosis, variation widths of the process are predicted by making use of statistical analyzing function of the ab initio molecular dynamics process simulator 2 and subsequently predicted values and measured values obtained upon finishing all steps are compared with each other as inputs and then examined. If the result is outside the tolerance limit, then the cause can be automatically pursued. As apparent from FIG. 1, no knowledge base for diagnosis is provided in this system.

A basic portion of the ab initio molecular dynamics process simulator 2 is designed to deal with reaction prediction at atomic level.

Returning to the pure mathematical theory, inventors of the present invention have established a new calculus of variation and have developed a technique for predicting various spectra based on a new computational chemical theory. A new ab initio molecular dynamics employed in the present invention will be explained hereinbelow.

An overall configuration of a new simulation developed by the inventors of the present invention is shown in FIG. 8. A new approach in which a molecular dynamics (MD) method is combined with a density functional theory (DFT) method will be proposed. First, proper use of the molecular dynamics method and the density functional theory method will be discussed with reference to FIG. 8 hereinbelow.

As shown in FIG. 8, a molecular dynamics (MD) portion occupies the lower half of a flowchart while a density functional theory (DFT) portion occupies the upper half of the flowchart. The molecular dynamics (MD) method will deal with a slightly large system at a non-zero K temperature, i.e., finite temperature and such potential derived from the first principle in advance may be used as interatomic (inter-ion) potential. In contrast, the density functional theory (DFT) method will be used when a normal state of a small system is to be detected. The DFT portion is, of course, set at a zero K temperature. Potentials are detected from normal states of an electron system. In particular, wave function (KS (Kohn-Sham) equation) is solved and a local density functional theory is used together.

Total energy in normal states of non-degenerate electron system is calculated in the DFT portion. Total energy may be given by a functional E[n(r)] of electron density n(r) (not to go back to the wave function).

In other words, the functional E[n(r)] is expressed by $$E[n(r)] = \int n(r) \cdot V_2(r) dr + \frac{1}{2} \int \int \{2n(r) \cdot n(r')\} / \qquad (1201)$$
$$(|r - r'|) \cdot dr dr' + T_s[n(r)] + E_{xc}[n(r)]$$

In the right side of Eq.(1201), $V_z(r)$ in the first term is external field such as Coulomb field in kernel and the second term is Coulomb interaction energy between electrons. The third term is kinetic energy under the assumption that one-body approximation may be applied to electrons when no interaction exist between electrons. The kinetic energy is given by $$T_s[n(r)] = \sum_{i=1}^{N} \int \psi_i \cdot (r)(-\nabla^2)\psi_i(r) dr \qquad (1202)$$

The fourth term is exchange correlation energy, a profile of which depends upon local density approximation (LDA). Electron density n(r) is expressed as $$n(r) = \sum_{i=1}^{N} |\psi_i(r)|^2 = \sum_{i=1}^{N} \psi_i \cdot (r)\psi_i(r) dr \qquad (1203)$$

By solving the KS equation which is expressed in following Eqs.(1211) and (1212) which can be derived when variation in the functional E[n(r)] in Eq.(1201) is set to 0, N normal states having smaller eigenvalues may be adopted. Since n(r) is included in Eq.(1212), n(r), φ(r) and $V_{eff}(r)$ must be solved on a self-consistent basis.

$$[-\nabla^2 + V_{eff}(r)]\psi(r) = E\psi(r) \tag{1211}$$

$$V_{eff}(r) = V_z(r) + \int 2n(r')/(|r-r'|) \cdot dr' + \delta E_{xc}[n(r)]/\delta n(r) \tag{1212}$$

By multiplying energy $\epsilon_{xc}(n)$ per electron by the electron density n with the use of local density approximation (LDA) and integrating them, following Eq.(1213) can be derived as exchange correlation energy $E_{xc}[n(r)]$.

$$E_{xc} = [n(r)] = \int \epsilon_{xc}(n(r))n(r)dr \tag{1213}$$

A profile of energy $\epsilon_{xc}(n)$ has been proposed variously by Wigber's equation and others. In addition, if only valence electrons are considered without regard for inner-shell electrons, then Coulomb field in kernel is not used as $V_z(r)$ in Eq.(1212) as it is, but is replaced by norm-conservation pseudopotential in which singularity in kernel is removed. The number of components in Fourier expansion has been able to be suppressed by treating in this manner.

In order to ensure strictness, the inventors of the present invention have used energy including interatomic (inter-ion) Coulomb potential as total energy. In other words, following Eq.(1221) may be derived.

$$E = \sum_{i=1}^{N} \int \psi_i \cdot (r)(-\nabla^2)\psi_i(r)dr + U(n(r), \{R_1\}, \{\alpha v\}) \tag{1221}$$

Where |Rl| are coordinates of ion kernel, and |αv| are external conditions of constraint (volume Ω, distortion εLv, and the like). The first term in the right side in Eq.(1221) corresponds to $T_s[n(r)]$ in the right side in Eq.(1201) of DFT. Remaining in the right side in Eq.(1201) correspond to part of U in Eq.(1221). Such part may be represented by $V_{eff}(r)$ in Eq.(1212) giving one-body approximation, like the case of DFT, and may also be used by replacing $V_z(r)$ by pseudopotential.

A new approach is introduced now. In other words, if E is regarded as potential energy, then virtual kinetic energy given in following Eq.(1222) may be introduced further.

$$K = \sum_{i=1}^{N} \frac{1}{2}\mu \int |\psi_i|^2 dr + \sum_{i=1} \frac{1}{2}M_1 R_1^2 + \sum_{i=1} \frac{1}{2}\mu v \alpha v^2 \tag{1222}$$

Accordingly, Lagrangian may be expressed by $$L = K - E \tag{1223}$$

Although $M_1$ in Eq.(1222) is true mass of atom (ion), $\mu$ and $\mu v$ are virtual mass and are thus varied according to the object, as described later. Since an orthonormalization condition given in $$\int \psi(r,t)\psi_k(r,t)dr = \delta_{ik} \tag{1224}$$

is imposed as a restriction condition, variation of the equation which is prepared by introducing an undetermined multiplier $\Lambda_{ik}$ into Euler's equation and then adding following Eq.(1231) to L can be calculated. As a result, following Eqs.(1232), (1233) and (1234) can be obtained. Temperature T of kinetic energy in Eq.(1222) corresponds. Since each degree of freedom has its temperature according to equipartition law of energy in the classical statistical mechanics, the temperature is not virtual one but real one if it is considered in connection with $\Sigma \frac{1}{2}M_1 R_1^2$. In addition, $\phi_i$ and αv can be suppressed or reinforced according to dimension of $\mu$ and $\mu v$.

For instance, if the temperature T is decreased from high temperature to 0 for $\mu << M_1$, then $\phi_i$ varies while $R_1$ is kept constant so that the normal states of the electron system can be derived. At this time, according to Eq.(1221) and remarks made therebelow, the left side of Eq.(1232) becomes zero and the right side becomes $$[\nabla^2 - V_{eff}(r)]\psi_i(r) + \Sigma \psi_k(r) \tag{1235}$$

Hence, the matrix $\{\Lambda_{ik}\}$ which may form linear combination of $\phi_i$ appropriately is diagonalized to thus achieve the KS equation (1211).

In short the same result as solved by the KS equation in DFT can be obtained by simulated annealing. However, since movement of virtual dynamical system is pursued, instead of using Monte Carlo method, to detect a state of temperature T, this approach is called dynamically simulated annealing (DSA).

In the event that integration in Eq.(1232) is executed, $\phi_i$ is not always treated as variation as it is, but expansion coefficients (e.g., Fourier coefficients) which can be obtained by expanding $\phi_i$ by plane wave may be treated as variation. In order not to increase the number of the expansion coefficients imprudently, as in the case of DFT, there is necessity of removing singularity in kernel in pseudopotential. Particularly, when periodicity of crystal is usable, linear combination of $\phi_i$ to diagonalize the above matrix $\{\Lambda_{ik}\}$ is denoted by $\phi_{nk}$. Where k is wave number vector in the Brillouin zone and n is zone index.

Such $\phi_{nk}$ is to satisfy following Eq.(1241).

$$\mu S_{nk}(r,t) = [\nabla^2 - V_{eff}(r)]\Phi_{nk}(r) + \lambda_{nk}\Phi_{nk}(r,t) \tag{1241}$$

Where $\lambda_{nk}$ are eigenvalues of the matrix $\{\Lambda_{ik}\}$ to provide energy levels. Then, $$\Phi_{nk}(r,t) = \sum_G C_{n,K+G}(t) \cdot \exp[i(K+G)r] \tag{1242}$$

can be derived by expanding $\phi_{nk}(r, t)$.

If pseudopotential lies locally (in general this condition is not satisfied), then effective potential $V_{eff}$ may also be expanded to thus provide $$V_{eff}(r,t) = \sum_G V_G(t) \cdot \exp[iK \cdot r] \tag{1243}$$

Substituting Eqs.(1242) and (1243) into Eq.(1241) yields $$\mu \sum_G T_{n,K+G}(t) \cdot \exp[i(K+G)r] = \tag{1251}$$
$$\sum_G [-|K+G|^2 + \lambda_{nk}]C_{n,K+G}(t) \cdot \exp[i(K+G)r] -$$
$$\sum_{G'}\sum_{G''} V_{G''}(t)C_{n,K+G'}(t) \cdot \exp[i(K'' + K' + G)r]$$

If K=K'+K" is introduced into the last term in the right side of Eq.(1251), then $\Sigma \exp[i(K+G)r]$ becomes common to all terms and therefore is deleted from Eq.(1251) to give $$\mu T_{n,K+G}(t) = [-|K+G|^2 + \lambda_{nk}]C_{n,K+G}(t) - \qquad (1252)$$

$$\sum V_{G-G'}(t)C_{n,K+G'}(t)$$

$$= -[|K+G|^2 + V_0(t) - \lambda_{nx}]C_{n,K+G}(t) -$$

$$\sum V_{G-G'}(t)C_{n,K+G'}(t)$$

If frequency is defined as shown by $$\omega = ((|K+G|^2 + V_0(t) - \lambda_{nx})/\mu)^{1/2} \qquad (1253)$$

and the left side of Eq.(1251) is rewritten into difference, then $$C_{n,K+G}(t+\Delta t) = 2\cos(\omega\Delta t)C_{n,K+G}(t) - C_{n,K+G}(t-\Delta t) - 2[1-\cos(\omega\Delta t)]$$
$$\{\Sigma_G \cdot V_{G-G'}(t) \cdot C_{n,K+G'}(t)\} \qquad (1261)$$

can be obtained. Since integration of the oscillation portion is executed analytically in Eq.(1261), the computational quantity can be reduced if $\Delta t$ is set larger than that in a purely numerical method.

Coulomb potential will be discussed as follows. In other words, the inventors of the present invention have found that Coulomb potential, if resolved, is divided into four terms. Particularly, merely three terms exist in the prior art, but four terms have been confirmed newly in the present invention. Such approach will be explained in sequence.

First, as the start of deducing a strict equation, the inventors of the present invention begin to solve the fundamental equation including the dielectric constant. To begin with, following Eq.(1262) given as the fundamental equation is to be solved.

$$V_{(\varepsilon=\infty)} = V_{(\varepsilon=1)} - 2\pi/3L^3 \left|\sum_i Z_i r_i\right|^2 \qquad (1262)$$

Conductor $\varepsilon=\infty$ and vacuum $\varepsilon=1$ have different Coulomb potentials respectively. Where L is one edge of (cubic) unit crystal, $\Sigma$ is executed in the unit crystal, and $Z_i$ and ri are charge and position of the i-th particle respectively. This is because polarization occurs on the inner surface of the sphere due to charge in the sphere. Although a dipole layer is formed on the inner surface of the non-conductive sphere, the last term in Eq.(1262) operates just to cancel such effect. Because the Ewald's method gives the value V at $\varepsilon=\infty$ in the left side, the last term in Eq.(1262) must be added to obtain the value V at vacuum $\varepsilon=1$. Only the result is mentioned.

Assuming that Coulomb potentials is represented by $$\Phi = \frac{1}{2}\sum_{i=1}^{N}\sum_{j=1}^{N}\sum_n{}' Z_i Z_j / (|n + r_j - r_i|) \qquad (1271)$$

In Eq.(1271), N denotes the number of atoms in the unit crystal, $r_i$ and $Z_i$ denote charge and position of the first atom respectively, and n denotes vectors designating the unit crystal as well as periodically shifted unit crystals. Where n is expressed as $$n = n_x Z_x + n_y Z_y + n_z Z_z \qquad (1272)$$

In Eq.(1272), $Z_x$, $Z_y$, $Z_z$ are edge vectors in x, y, z directions respectively, and $n_x$, $n_y$, $n_z$ are integers spanning from $-\infty$ to $+\infty$ respectively (in the case of bulk crystal). Terminology "'" affixed to the upper right of $\Sigma$ means that J=i should be removed when n=0.

A new F function given as $$F(r) = \int_0^\infty 2/\sqrt{\pi} \sum_{j=1}^{N}\sum_n Z_j \exp[-|n+rj-r|^2 t^2]dt \int_0^\infty G(r,t)dt \qquad (1273)$$

is now introduced by the inventors of the present invention. In the above Eq.(1273), G(r, t) is a periodical function of t. It can be found that this can be expressed by Fourier series. Still further, G(r, t) can be transformed to $$G(r,t) = 2\pi/(L_x + L_y + L_z)\sum_{j=1}^{N}\sum_m \exp[-\pi^2|m|^2 + 2\pi i m(r-r_j)] \qquad (1281)$$

In the above Eq.(1281), m is reciprocal lattice vector which is represented by $$m = m_x \cdot (1/L_x, 0, 0) + m_y \cdot (0, 1/L_y, 0) + m_z \cdot (0, 0, 1/L_z) \qquad (1282)$$

Indices $m_x$, $m_y$, $m_z$ are integers ranging from $-\infty$ to $+\infty$ respectively. Since $\exp[\ldots]=1$ is satisfied when m=0, $\Sigma Z_i$ becomes zero and therefore, if total charge in the unit crystal is zero, the terms including m=0 can be eliminated from Eq.(1282). If the terms including m=0 are removed from Eq.(1282) in advance, then $$G(r,t) = 2\pi/(L_x + L_y + L_z)\sum_{j=1}^{N}\sum_m{}' Z_j/t^3 \cdot \qquad (1283)$$
$$\exp[-\pi^2|m|^2 + 2\pi i m(r-r_j)]$$

can be obtained. By dividing the integral range by virtue of k and using two types of G(r, t) properly, the inventors of the present invention can get $$F(r) = \int_0^K 2\pi/(L_x + L_y + L_z)\sum_{j=1}^{N}\sum_m{}' Z_j/t^3 \cdot \qquad (1291)$$
$$\exp[-\pi^2|m|^2 + 2\pi i m(r-r_j)]\int_k^\infty 2/\sqrt{\pi}\sum_{j=1}^{N}\sum_m{}' Z_j \cdot$$
$$\exp[-|n+r_j-r|t^2]dt$$

Where following Eq.(1292) is employed by the inventors of the present invention as formulae.

$$\int_0^K 1/t^3 \cdot \exp[-a^2/t^2]dt = 1/2a^2 \cdot \exp[-a^2/k^2] \qquad (1292)$$
$$\int_K^\infty 1/\sqrt{\pi} \cdot \exp[-b^2/t^2]dt = 1/b \cdot \text{erfc}(kb)$$

In this manner, initial Coulomb potential can be represented by $$\Phi = 1/(L_x + L_y + L_z)\sum_{j=1}^{N}\sum_m{}' Z_j/|m|^2 \cdot \qquad (1293)$$
$$\exp[-\pi^2|m|^2/\kappa^2]\cdot\cos[2\pi m(r-r_j)] +$$
$$1/2\sum_{j=1}^{N}\sum_n{}' Z_j Z_i/|n+r_j-r|\cdot\text{erfc}(\kappa|n+r_j-r|) +$$

-continued $$1/2\sum_{i=1}^{N} Z_i \lim\{Z_i/|r_i - r| \cdot \text{erfc}(\kappa|r_i - r|) - Z_i/|r_i - r|\}$$

Terminology "'" affixed to the upper right of Σ means that j=i is to be removed when n=0. Still further, $$1/2\sum_{i=1}^{N} Z_i \lim_{s\to 0} Z_i / s\left(2/\sqrt{\pi} \int \exp(-t^2)dt - 1\right) = \tag{1301}$$

$$1/2\sum_{i=1}^{N} Z_i^2 \lim_{s\to 0} (2/\sqrt{\pi} \kappa \exp(-\kappa^2 S^2)) = -\kappa/\sqrt{\pi} \sum_{i=1}^{N} Z_i^2$$

can be satisfied. Because Eq.(1301) does not include r, it has no relation with force. Eq.(1301) can be further transformed to $$\sum_{i}\sum_{j} Z_i \cdot Z_j \cdot \cos[2\pi m(r_i - r_j)] = \sum_{i=1}^{N} Z_i \cdot \cos[2\pi m r_i] \sum_{j=1}^{N} Z_j \cdot \cos[2\pi m r_j] + \tag{1302}$$

$$\sum_{i=1}^{N} Z_i \cdot \sin[2\pi m r_i] \sum_{j=1}^{N} Z_j \cdot \sin[2\pi m r_j]$$

$$= \left(\sum_{i=1}^{N} Z_i \cdot \cos[2\pi m r_i]\right)^2 + \left(\sum_{i=1}^{N} Z_i \cdot \sin[2\pi m r_i]\right)^2$$

$$= 1/(L_x + L_y + L_z)\sum_{j=1}^{N}\sum_{m}' Z_j/|L|^2 \cdot$$

$$\exp[-\pi^2|L|^2/\kappa^2] \cdot \left(\sum_{i=1}^{N} Z_i \cdot \cos[2\pi L r_i]\right)^2 +$$

$$\left(\sum_{i=1}^{N} Z_i \cdot \sin[2\pi L r_i]\right)^2$$

To summarize the above results, Coulomb potential can be represented by following Eqs.(1311) to (1315) in the end.

$$\Phi = 1/2 \sum_{i=1}^{N} \sum_{j=1}^{N} \sum_{n}' Z_j Z_i / |n + r_i - r_j|\Phi^{(1)} + \Phi^{(2)} + \Phi^{(3)} \tag{1311}$$

$$\Phi^{(1)} = 1/2 \sum_{i=1}^{N} \sum_{J=1}^{N} \sum_{n}' Z_j Z_i / |n + r_j - r_i| \cdot \text{erfc}(\kappa|n + r_j - r_i|) \tag{1312}$$

$$\Phi^{(2)} = 1/2(L_x + L_y + L_z)\sum_{m}^{N} '1/|L|^2 \cdot \exp[-\pi^2|L|^2/\kappa^2] \cdot \tag{1313}$$

$$\left(\left(\left(\sum Z_j \cos[2\pi L r_i]\right)\right)^2 + \left(\left(\sum Z_i \sin[2\pi L r_i]\right)\right)^2\right)$$

$$\Phi^{(3)} = -\kappa/\sqrt{\pi} \cdot \sum Z_i^2 \tag{1314}$$

$$\Phi^{(4)} = 2\pi/(3L_x L_y L_z)\left|\sum_{i=1}^{N} Z_i r_i\right|^2 \tag{1315}$$

Where n is given as $n = n_x \cdot (L_x, 0, 0) + n_y \cdot (0, L_y, 0) + n_z \cdot (0, 0, L_z)$, and m is given as $m = m_x \cdot (1/L_x, 0, 0) + m_y \cdot (0, 1/L_y, 0) + m_z \cdot (0, 0, 1/L_z)$. Advantageous respects in the above expressions are that original Σ terms attenuate only in the reciprocal order whereas Σ terms attenuate promptly because of the erfc-factor in $\Phi^{(1)}$ and also Σ terms attenuate promptly because of the exp-factor in $\Phi^{(2)}$. Since they effect oppositely to attenuation speed in $\Phi^{(3)}$, appropriate κ must be selected to conserve the balance between two parts. These are results that is obtained by calculating contribution of Coulomb force in the sequence of nearer distance under the assumption that the perimeter is made up of conductor.

If the perimeter is made up of vacuum, then one more term is added. Especially, this term has not been taken into account in the prior art.

In general, in the molecular dynamics, interatomic potential is the most important quantity. In present status, considerably number of the molecular dynamics have simply discussed interatomic potential between only two atoms. This is because calculation in the molecular dynamics takes a great deal of time and therefore simple potential is utilized to save time. In this manner, if potential is simplified, calculation can be made quickly but actual potential cannot be reflected.

As described above, important interatomic potential may generally be described as three-body problem. This meaning is as follows. That is, a third atom k affects an action between a first atom i and a second atom J via the second atom J. This is shown in FIG. 4. As shown in FIG. 4, r is a distance between particles, and θ is particle angle. Dependent relations between these various physical properties are shown in FIG. 5. Especially, as shown in FIG. 5, they are very complicated. Differentiation of potential can in general provide force, but calculation becomes very complicated. A relationship between the conventional calculation approach and the present invention is shown in FIG. 6.

The inventors have newly developed a higher order cyclic partial differentiation method to thus enable calculation at high speed and with high precision. It will be described below how fast the method developed by the inventors of the present invention is, with reference to actual compariaon example. First, simple two-body potential calculation shown in FIG. 6 is not mentioned here. This is because precision which is available to describe physical phenomenon in a semiconductor LSI is seldom achieved by such calculation. On the contrary, as the conventional method, the inventors have formed the program for the table referring method by virtue of potential acting as three-body problem. According to such program, a table is prepared for $r_{ij}$, $\theta_{ijk}$, and $r_{jk}$.

Actually, they are stored as block data in an alignment. To prepare the case where they are excluded from reference items, the supplement program has also prepared. Cubic spline method is used to supplement. The program by which the table can be referred to certain values, i.e., $r_{ij}$, $\theta_{ijk}$, and $r_{jk}$ has been formed. However, to which matrix in the alignment predetermined conditions ($r_{ij}$, $\theta_{ijk}$, and $r_{jk}$) belong must be searched. The inventors have formed the program while paying attention to operate at as high speed as possible, but there needed some parts to classify according to the magnitude of the figures and therefore "if then else" sentences are used therein. In this manner, it can be executed to find a certain frame of table into which desired conditions ($r_{ij}$, $\theta_{ijk}$, and $r_{jk}$) are put and also to supplement the contents therein. Thus, first potential under the desired conditions ($r_{ij}$, $\theta_{ijk}$, and $r_{jk}$) could be calculated, but actually force on this point is desired and must be calculated. The inventors have calculated potential on another point which is slightly deviated from the certain point according to similar procedures, and then force has been calculated from difference between them by making use of average rate of change, i.e., by differentiation.

As evident from this, a plenty of "if then else" procedures have been used. The computer is relatively weak in executing such "if then else" procedures and its operation speed is slow. Actually, in the event that the referring type program developed by the inventors is employed, only a force calculating portion has been examined in detail. As a result, it takes about 350 times as long by the referring type program under the conditions that the single crystal substrate consists of 1600 Si atoms, absolute temperature is 300 K, and external pressure is 1 atm. As may be appreciated from the above, the higher order cyclic partial differentiation method proposed by the inventors is advantageous. Also, in the referring type program, different data table must be prepared every time when different atoms are to be calculated.

In the next, "how material characteristic values, etc. are extracted from the molecular dynamics and how such values are input into the general-purpose simulator" will be explained briefly.

Usually, various evaluation techniques are used in the LSI process. There are physical property evaluation method of film by infrared absorption, stress evaluation method in film by Raman spectroscopy, structure analysis of film by X-ray, and others. Such evaluation techniques are not restricted to optical ones, but electric evaluation techniques such as dielectric constant of film may be used.

The inventors have decomposed eagerly and theoretically the principles of respective evaluation approaches up to motion of individual atoms once to pursue in detail. Then, using the molecular dynamics developed by the inventors, motion of individual atoms are pursued and thus evaluation amount may be calculated theoretically for the first time. Hence, they can be directly displayed in a spectrum fashion, for example. Thereby, remarkable technical progress not yet achieved in the prior art, e.g., quantitative comparison with the measured values, has been achieved.

Procedures from pursuit of atomic motion by a theoretical means overcome firstly by the inventors to derivation of concrete measuring evaluation amount will be discussed hereinbelow. Though several kinds of concept being present, basic concepts derived by the inventors are as follows. That is, moment of the atoms to be noted is calculated. Then, such moment is accumulated within the time window to be noted and thereafter is Fourier-transformed to obtain natural spectrum. These are the main essentials.

Next, taking an example from Si, it will be discussed herein below how empirical potential is transformed to force by the inventors of the present invention. This discussion is only an example. Like the case of the problem of Si, higher order cyclic partial differentiation described herein may still be applied to potential of oxide film, for example, as three body problem unless effect generated by ionic bond is considered. It has also been investigated by the inventors which potential is suitable for Si.

Potential used here is Tersoff's potential (Phys. Rev. Lett. 56.632 (1986), Phys. Rev. B37,6991 (1988)).

According to Tersoff, total potential of i-th Si may be expressed by $$-\frac{1}{2}(V_{ij} + V_{ji}) \quad (0001)$$

Since this potential is expressed as three body matter, it is $V_{ij} \neq V_{ji}$ in Eq.(0001) that a point to which the inventors wish to call your attention is. Assuming that position number of Si atom concerned is i and the number of other particle around the Si atom is j, above $V_{ij}$ is given by $$V_{ij} = f_c(r_{ij})[a_{ij}f_R(r_{ij}) + b_{ij}f_A(r_{ij})] \quad (0002)$$

$$V_{ij} = f_c(r_{ij})[a_{ij}A\exp(-\lambda_1 r_{ij}) - b_{ij}B\exp(-\lambda_2 r_{ij})]$$

$$f_c(r) = 1 \quad (r \leq R - D)$$

Where r is a distance between particles, $f_c(r_{ij})$ is cut-off coefficient, $fR(r_{ij})$ is repulsive force, and $f_A(r_{ij})$ is attractive force. In addition, aij and bij are cut-off coefficients with regard to coordination number. This means that it becomes possible to represent three body matter by parameters used to represent coordination number. Since this representation is similar to others in fundamental form, potential will be described hereinbelow, with applying a cyclic approach developed first by the inventors together. $F_r(r_{ij})$ and $f_A(r_{ij})$ are modified Morse type potential, $f_R(r_{ij})=A\exp(-\lambda_1 r)$, and $f_A(r_{ij})=-B\exp(-\lambda_2 r)$. Where $\lambda_1$ and $\lambda_2$ are constants and their magnitude is a reciprocal of the value such as an interatomic distance.

Meanwhile, the cut-off function $f_c(r_{ij})$ is $$f_c(r) = 1/2 - 1/2\sin[\pi/2(r-R)/D](R-D < r < R+D) \quad (0003)$$

$$f_c(r) = 0 \quad (r \leq R+D)$$

Where usually a dimension of R is selected to include only the first neighboring zone of object structure. According to detailed investigation made by the inventors, the value is about 2 to 3 Å. Subsequently, although $b_{ij}$ denotes real coordination number, the cut-off function is also used here. According to Tersoff, definition of such cut-off function is given by $$b_{ij}=(1+\beta^n \zeta_{ij}^n)^{-1/2n} \quad (0004)$$

Where $$\zeta_{ij}=\Sigma f_c(r_{ik})g(\theta_{ijk})\exp[\lambda_3^3(r_{ij}-r_{ik})^3] \quad (0005)$$

$\Sigma$ symbol is used with respect to $k \neq i,j$. It is understood that, since $\zeta_{ij}$ means an environment factor including the third atom k, the magnitude is significantly different from each other if $\zeta_{ij}$ is considered in respects of i and j respectively. That is, $\zeta_{ij} \neq \zeta_{ji}$ and $V_{ij} \neq V_{ji}$, as discussed in Eq.(0001). Accordingly, $b_{ij} \neq b_{ji}$.

In addition, $g(\theta)$ is a bond angle factor and is represented by $$g(\theta)=1-(c^2/d^2)-c^2/(d^2+\cos\theta^2) \qquad (0006)$$

Where $\theta$ is set as shown in FIG. 4. Upon calculating $\theta$, it is expressed by actual orthogonal coordinate. That is, $$r_{ij}=\sqrt{\{(x_j-x_i)^2+(y_j-y_i)^2+(z_j-z_i)^2\}} \qquad (0007)$$

$r_{ik}$ may be calculated by similar procedure. If an inner product is $P_{ij}$, then $$P_{ijk}=(x_j-x_i)(x_k-x_i)+(y_j-y_i)(y_k-y_i)+(z_j-z_i)(z_k-z_i) \qquad (0008)$$

Using them, $$\cos\theta_{ijk}=P_{ijk}/(r_{ij}r_{ik}) \qquad (0009)$$

can be derived. Constants in the above equations used by the inventors are given below. Namely, $$\begin{aligned}&R=3.0\text{ Å}, D=0.2\text{ Å}, A=3264.7\text{ eV}, B=95.373\text{ eV}, C=4.8381,\\ &\lambda_1=3.2394\text{ Å}, \lambda_2=1.3258\text{ Å}, \lambda_3=\lambda_2, \beta=0.33675, n=22.956,\\ &d=2.0417 \end{aligned} \qquad (0010)$$

After these preparations, cyclic approach developed by the inventors will be discussed in detail. Calculation of force will be just made from here. Differentiation of potential Eq.(0002) with respect to position coordinate provides force. That is, $$-\frac{1}{2}(\partial V_{ij}/\partial x_i) \qquad (0011)$$

$$-\frac{1}{2}(\partial V_{ij}/\partial x_j) \qquad (0012)$$

are x components of force vectors affecting particles i, j respectively. However, to calculate them actually is not so easy, so that contrivance and invention made by the inventors which return to the mathematical theory are needed as mentioned below. So a higher order cyclic partial differentiation is employed.

The above Eqs.(0011) and (0012) may be partial-differentiated concretely. However, it would be understood immediately that the calculation is not so simple. That is, $$\begin{aligned}-\frac{1}{2}(\partial V_{ij}/\partial x_i) = -\frac{1}{2}\{&(\partial V_{ij}/\partial r_{ij})(\partial r_{ij}/\partial x_i)+\\ &(\partial V_{ij}/\partial \zeta_{ij})[(\partial \zeta_{ij}/\partial r_{ij})(\partial r_{ij}/\partial x_i)+\\ &\sum(\partial \zeta_{ij}/\partial r_{ik})(\partial r_{ik}/\partial x_i)+\\ &\sum(\partial \zeta_{ij}/\partial\cos\theta_{ijk})(\partial\cos\theta_{ijk}/\partial x_i)\}\end{aligned} \qquad (0013)$$

Still further, partial differential equations with respect to j and k may be transformed similarly as follows.

Although the discussion has been made with respect to x mainly in the above, y and z must also be discussed. Here blank portions are left as they are so as to make correspondence to the above clear. Such complicated transformation has not found insofar as the inventors have investigated. Conversely, in the prior art, calculation has run into the simple table reference scheme because such complicated transformation has not overcome yet until now. Since the inventors could overcome such complicated transformation, they have been able to combine molecular dynamics with a general-purpose liquid simulator.

$$\begin{aligned}-\frac{1}{2}(\partial V_{ij}/\partial x_j) = -\frac{1}{2}\{&(\partial V_{ij}/\partial r_{ij})(\partial r_{ij}/\partial x_j)+\\ &(\partial V_{ij}/\partial\zeta_{ij})[(\partial\zeta_{ij}/\partial r_{ij})(\partial r_{ij}/\partial x_i)+\\ &\partial\cos\theta_{ijk})(\partial\cos\theta_{ijk}/\partial x_j)\end{aligned} \qquad (0014)$$

$$\begin{aligned}-\frac{1}{2}(\partial V_{ij}/\partial x_k) = -\frac{1}{2}\{&(\partial V_{ij}/\partial\zeta_{ij})[(\partial\zeta_{ij}/\partial r_{ik})(\partial r_{ik}/\partial x_k)+\\ &\partial\cos\theta_{ijk})(\partial\cos\theta_{ijk}/\partial x_k)\end{aligned} \qquad (0015)$$

Respective terms in these Eqs. may be transformed as follows.

$$\begin{aligned}\partial V_{ij}/\partial r_{ij} =& \qquad(0016)\\ \partial f_c(r_{ij})/\partial r_{ij}\cdot[A&\exp(-\lambda_1/r_{ij})-(b_{ij}B\exp(-\lambda_2/r_{ij})]+f_c(r_{ij})[\\ &-\lambda_1 A\exp(-\lambda_1/r_{ij})+\lambda_2 b_{ij}B\exp(-\lambda_2/r_{ij})]\end{aligned}$$

$$\begin{aligned}\partial f_c(r_{ij})/\partial r_{ij} =& \qquad(0017)\\ &-\pi/4D\cdot\cos[\pi/2\cdot(r-R)/D] \quad (R-D<r<R+D)\\ \partial f_c(r_{ij})/\partial r_{ij} =& 0 \quad (r\geq R+\theta)\end{aligned}$$

$$\begin{aligned}\partial V_{ij}/\partial\zeta_{ij} &= (\partial V_{ij}/\partial b_{ij})\cdot(\partial b_{ij}/\partial\zeta_{ij}) \qquad (0018)\\ &= -Bfc(r_{ij})\exp-(\lambda_2 r_{ij})(-1/2n)(1+\beta^n\zeta_{ij}^n)^{-1/2n-1}\beta^n\zeta_{ij}^{n-1}\\ &= Bfc(r_{ij})\exp-(\lambda_2 r_{ij})b_{ij}(\beta\zeta_{ij})^n/[2\{(1+(\beta\zeta_{ij})^n\}\zeta_{ij}]\end{aligned}$$

$$\partial\zeta_{ij}/\partial r_{ij} = 3\lambda_3^3\sum f_c(r_{ik})g(\theta_{ijk})\exp(\lambda_3^3(r_{ij}-r_{ik})^3)(r_{ij}-r_{ik})^2 \qquad (0019)$$

$$\begin{aligned}\partial\zeta_{ij}/\partial r_{ik} =& d f_c(r_{ij})/d r_{ij}\cdot g(\theta_{ijk})\exp(\lambda_3^3(r_{ij}-r_{ik})^3)- \qquad(0020)\\ &3\lambda_3^3 f_c(r_{ik})f_c(r_{ij})(r_{ij}-r_{ik})^2\end{aligned}$$

$$\begin{aligned}\partial\zeta_{ij}/\partial\cos\theta_{ijk} =& f_c(r_{ik})\exp(\lambda_3^3(r_{ij}-r_{ik})^3)d g(\theta_{ijk}/d\cos\theta_{ijk} \qquad(0021)\\ f_c(r_{ik})&\exp(\lambda_3^3(r_{ij}-r_{ik})^3)[2c^2\cos\theta_{ijk}/\{d^2\cos^2\theta_{ijk}\}^2]\end{aligned}$$

$$\partial r_{ij}/\partial x_i = (x_i-x_j)/r_{ij} = \partial r_{ij}/\partial x_j \qquad (0022)$$

$$\partial r_{ik}/\partial x_i = (x_i-x_k)/r_{ik} = \partial r_{ij}/\partial x_k \qquad (0023)$$

$$\begin{aligned}\partial\cos\theta_{ijk}/\partial x_i =& 1/(r_{ij}r_{ik})\cdot\partial P_{ijk}/\partial x_i+ \qquad(0024)\\ &P_{ijk}\{1/(r_{ik})\partial/\partial x_i[1/(r_{ik})]+\\ &1/(r_{ij})\cdot\partial/\partial x_i[1/(r_{ik})]\}\\ =& 1/(r_{ij}r_{ik})\cdot(x_i-x_k+x_i+x_j)-\\ &P_{ijk}\{(x_ix_j)/(r_{ik}r_{ij}^3)+(x_i-x_k)/(r_{ik}r_{ij}^3)\}\\ =& 1/(r_{ik})\cdot\{(x_i-x_j)/(r_{ij})-(x_i-x_k)/(r_{ik})\cos\theta_{ij}\}\end{aligned}$$

$$\partial\cos\theta_{ijk}/\partial x_j = -1/(r_{ij})\cdot\{(x_i-x_k)/(r_{ik})-(x_i-x_j)/(r_{ik})\cos\theta_{ij}\} \qquad (0025)$$

$$\partial\cos\theta_{ijk}/\partial x_k = -1/(r_{ik})\cdot\{(x_i-x_j)/(r_{ij})-(x_i-x_k)/(r_{ik})\cos\theta_{ij}\} \qquad (0026)$$

$$\begin{aligned}L(r_i\partial r_i/\partial t, V, \partial V/\partial t) =& \qquad(0027)\\ 1/2\sum m(\partial r_i&/\partial t)^2-U(r_i)+1/2M(\partial V/\partial t)^2-\\ &P_E V(\partial L(q_j, q_j^1)/\partial q_j)-d(\partial L/\partial q_j^1)dt = 0\end{aligned}$$

Linking between a molecular dynamics simulator II and the process deviation calculation unit I will be explained with reference to FIGS. 7 and 8. In the molecular dynamics simulator II, inputs are transferred from files (22), (32), (42), (52), (62), (72), etc. shown in FIG. 8 as first inputs a. Contents of inputs are boundary conditions, size of region, stress, strain, temperature, etc. As second inputs, there are auxilliary inputs b, calculation time in the molecular dynamics, designation of ensemble, etc. as the case may be.

In contrast, position vectors r(t) are thought of as the first outputs, which are transferred to files (23), (33), (43), (53), (63), (73), (83), etc. shown in FIG. 8. A film characteristic calculation program III may calculate film characteristics such as optical/electrical/crystallography characteristics, and the like which are transferred to a file 3.

In addition, an example of input sequences for a general-purpose two/three-dimensional process simulator (Ia in FIG. 8) is shown in FIG. 9. Another example of input sequences for a general-purpose two/three-dimensional process simulator (10 in FIG. 8) is shown in FIG. 10. For example, the contents shown in FIG. 9 may designate clustered tools used respectively. For instance, details of oxidation process therein are an amount of gas, sequence of temperature rise, valve sequence, etc.

For contrast, input sequence in FIG. 10 corresponds to the case where unknown material shown in FIG. 8 is included. In the case of FIG. 10, for example, it is a ferroelectric film and sputter process of the film is included. In this event, since no detailed data of the ferroelectric film is provided, the process jumps to the molecular dynamics simulator II once to execute calculation therein.

The inventors have executed molecular dynamics simulation to which empirical potential is given, and have developed a simulation system capable of 1) diagnosing superposing phenomenon of fluctuation of respective process factors and deviation of respective factors, 2) checking whether or not the process is being carried out along predetermined sequence, and 3) finding variation factors.

In particular, the inventors have proposed positional relation between a single crystal ferroelectric film and an Si substrate and positional relation to metal electrodes, and have further proposed for the first time a guide to indicate a level of quality of the single crystal ferroelectric film which is prepared actually. Such single crystal ferroelectric film structure may be reproduced by strictly original calculation approach using a computer. Guides to indicate positional relation to the single crystal of substrate and tolerance limit of defect density in the substrate under the applied conditions are shown based on characteristic evaluation function.

The inventors have invented a method of calculating and predicting various phenomena in a system including various elements at high speed and with high precision according to new calculation chemical theory. Accordingly, characteristics of various materials used in semiconductor manufacturing processes can be calculated with high precision.

As a means for predicting structures and characteristics of crystal and molecule in which various elements are included, ab initio molecular dynamics method and first principle molecular orbit method have been employed. The ab initio molecular dynamics method has been mainly used to investigate crystal structure and electron state while the first principle molecular orbit method has been used to calculate the structure and electron state of usual molecule and a cluster which is a part of the crystal cut out. However, since Schrodinger's equation must be solved for respective electrons in the system in these methods, enormous calculation time is needed. For this reason, it is impossible actually to introduce the first principle approach into the approach, like the molecular dynamics method to which empirical potential is given, which requires calculation times such as several hundreds thousand steps. On the contrary, in the field of the molecular dynamics, a new charge calculation approach for multiple atom molecule has been proposed in the paper, A. K. Rappe and W. A. Goddard, "Charge Equilibration for Molecular Dynamics Simulations", 1991. The inventors have expanded the charge calculation approach for multiple atom molecule proposed by A. R. Rappe et al., and have widely modified the approach so as to be applied to various elements and crystal system, and have constructed a material design simulation approach which is applicable to Si and $SiO_2$ used in general as material for a semiconductor device, ferroelectric substance such as $PbTiO_3$ and PZT, and high dielectric substance. To begin with, Rappe et al.'s approach will be explained hereinbelow.

First of all, Rappe at al. have regarded energy E of the solitary atom as functions of ionization potential and elecron affinity. In other words, electrically neutral state is given by A0 in a certain atom A. If up to terms of second degree in Taylor expansion are picked up, then $$E_A(Q_A) = E_{A0} + Q_A\left(\frac{\partial E}{\partial Q}\right)_{A0} + \frac{1}{2}Q_A^2\left(\frac{\partial^2 E}{\partial Q^2}\right)_{A0} \quad (3031)$$

Substituting 0 into $Q_A$ n Eq.(3031) yields energy when atom is in its electrically neutral state.

$$E_A(0)=E_{A0} \quad (3041)$$

Similarly, substituting 1 into $Q_A$ in Eq.(3031) yields energy when atom is ionized to +1 value, and also substituting −1 into $Q_A$ in Eq.(3031) yields energy when atom is ionized to −1 value.

$$E_A(+1) = E_{A0} + \left(\frac{\partial E}{\partial Q}\right)_{A0} + \frac{1}{2}\left(\frac{\partial^2 E}{\partial Q^2}\right)_{A0} \quad (3042)$$

$$E_A(-1) = E_{A0} - \left(\frac{\partial E}{\partial Q}\right)_{A0} + \frac{1}{2}\left(\frac{\partial^2 E}{\partial Q^2}\right)_{A0} \quad (3043)$$

Difference between Eqs.(3042) and (3041) serves as ionization potential IP, and difference between Eqs.(3043) and (3041) serves as electron affinity $E_A$.

$$IP = E_A(+1) - E_A(0) = \left(\frac{\partial E}{\partial Q}\right)_{A0} + \frac{1}{2}\left(\frac{\partial^2 E}{\partial Q^2}\right)_{A0} \quad (3044)$$

$$-E_A = E_A(-1) - E_A(0) = -\left(\frac{\partial E}{\partial Q}\right)_{A0} + \frac{1}{2}\left(\frac{\partial^2 E}{\partial Q^2}\right)_{A0} \quad (3045)$$

A negative sign "−" of EA in Eq.(3045) is because to add an electron is negative work if to remove electron is considered as positive work. Difference between Eqs.(3044) and (3045) provides electronegativity $\chi_A^0$.

$$\left(\frac{\partial E}{\partial Q}\right)_{A0} = \frac{1}{2}(IP + EA) = X_A^0 \quad (3051)$$

Then sum of Eqs.(3044) and (3045) yields $$\left(\frac{\partial^2 E}{\partial Q^2}\right)_{A0} = IP - EA \quad (3052)$$

Where physical meaning of Eq.(3052) will be analyzed. Coulomb interaction in ionizing the hydrogen atom are schematically shown in FIGS. 12 to 14. As can be seen from the drawings, difference between IP and EA are Coulomb interaction b between electrons. Therefore, if a Coulomb repulsive force between two electrons on the $\phi_A$ orbit is represented by $J_{AA}^0$, then $$IP-EA=J_{AA}^0 \quad (3053)$$

may be given. JAA0 is called idempotential. Since orbit profile is varied by applying electron, $J_{AA}$ calculated based on the first principle calculation by Hartree-Fock et al.

becomes slightly different from the value of Eq.(3053). But $J_{AA}^0$ will be approximated by Eq.(3053) here.

A relationship between idempotential $J_{AA}^0$ and atomic diameter $R_A^0$ will be examined. To examine a simple atomic structure model shown in FIG. 15, Coulomb interaction JAA0 between electrons becomes as follows.

$$JAA = \frac{e^2}{4\pi\varepsilon_0 R_A^0} = \frac{14.4}{R_A^0} \quad (3054)$$

Where unit of JAA0 is eV and unit of R is A. In order to check propriety of Eq.(3053), relationship between J value and R has investigated and then summarized in Table 1. As shown in Table 1, it has been found that J is substantially inversely proportional to atomic size and atomic diameter calculated by Eq.(3054) substantially coincides with a distance of homopolar bond.

Using Eqs.(3051) and (3053), energy of solitary atom in Eq.(3031) may be written as $$E_A(Q_A) = E_{A0} + X_A^0 Q_A + \frac{1}{2} J_{AA}^0 Q_A^2 \quad (3055)$$

In the case of the multiple molecule, electrostatic energy between atoms must also be regarded. The electrostatic energy is given by $$\sum_{A<B} Q_A Q_B J_{AB} \quad (3056)$$

Where JAB is Coulomb interaction when one electron charge lies in the center of atoms A, B. JAB depends upon a distance between A and B. If Eq.(3055) is applied, then total electrostatic energy may be expressed by $$E(Q_1, \ldots, Q_N) = \sum_A \left( E_{A0} + X_A^0 Q_A + \frac{1}{2} Q_A^2 J_{AA}^0 \right) + \sum_{A<B} Q_A Q_B J_{AB} \quad (3057)$$

Chemical potential $\chi_i(Q_1, \ldots, Q_N)$ on an atomic scale may be expressed by $$X_i(Q_1, \ldots, Q_N) = \frac{\partial E}{\partial Q_i} = x_i^0 + \frac{1}{2}\sum_B^N Q_B J_{iB} + \frac{1}{2}\sum_A^N Q_A J_{Ai} \quad (3058)$$

$$= x_i^0 + \frac{1}{2}\sum_j^N Q_j J_{ij} + \frac{1}{2}\sum_j^N Q_j J_{ji}$$

$$= x_i^0 + \sum_j^N Q_j J_{ij}$$

N−1 simultaneous equations can be derived from the condition of charge equilibrium, i.e., $$x_1 = x_2 = \ldots = x_N \quad (3059)$$

That is, $$x_i^0 + \sum_j^N J_{ij} Q_j = x_1^0 + \sum_j^N J_{1j} Q_j \quad (3061)$$

can be derived in the end. By adding the condition of total charge, i.e., $$\sum_j^N Q_j = Q_{tot}. \quad (3062)$$

into Eq.(3061), N simultaneous equations are to be solved. If Eqs.(3061) and (3062) are transformed to a matrix form, then $CQ=-D$ $D_1=-Q_{tot}$ $D_i=x_i^0-x_1^0$ $C_{1j}=1$ $C_{ij}=J_{ij}-J_{1j} (i\geq 2) (N\geq j\geq 1) \quad (3063)$ is given. Upon solving Eq.(3063), since there exist upper and lower limits for available charges of each ion, the charge is fixed to a boundary value if the charge is out of the tolerance limits. By separating Eq.(3061) into charges fixed to the boundary value and charges not fixed and modifying Eq.(3063), the matrices are solved and then converged. At that time, variation of charge can be calculated.

The problem remaining in this method is to determine $J_{AB}$. When a distance RAB between atoms A and B is long, $J_{AB}$ may be given by $$J_{AB}(R_{AB}) = \frac{14.4}{R_{AB}} \quad (3064)$$

However, repulsive forces should be taken into account within the distance at which electron clouds are overlapped with each other. Electron density may be approximated by the term of one Slater orbit. In other words, assume that, in atoms wherein an outer valence orbit may be ns, np, or nd, in any case the orbit consists of normalized ns Slater orbit having following type.

$$\Phi_{n\zeta}^{slat} = \sqrt{\frac{(2\zeta)^{2n+1}}{4\pi(2n)!}} r^{n-1} e^{-\zeta r} \quad (3065)$$

If an average size of atoms is calculated using Eq.(3065), then $$\langle r \rangle = \int \Phi_{n\zeta}^{slat} \cdot r \Phi_{n\zeta}^{slat} dr = \frac{2n+1}{2\zeta} \quad (3066)$$

is given. According to following Eq.(3067), a valence orbit index $\zeta_A$ is selected.

$$\zeta_A = \lambda \frac{2n+1}{2R_A} \quad (3067)$$

Where $\lambda$ is an adjusting parameter which is included to calculate the difference between the average atom size given by Eq.(3066) and the radius $R_A$ of covalent bond in the crystal.

The scaling factor $\lambda$ is set with the use of alkali metal halite molecule shown in FIG. 16. Let the alkali metal halite molecule be MX, M be alkali metal (Na, K, Rb, Cs), X be halite (Cl, Br, I), and respective charges be QM, QX, then $$Q_{total} = Q_M + Q_X = 0 \therefore Q_X = -Q_M \quad (3068)$$

can be achieved from Eq.(3062). Then, $$X_M^0 + \sum_i J_{Mi}Q_i = X_X^0 + \sum_i J_{Xi}Q_i \quad (3069)$$

$$\therefore X_M^0 + J_{MM}Q_M + J_{MX}Q_X = X_X^0 + J_{XM}Q_M + J_{XX}Q_X$$

can be derived from Eq.(3061). Then, substituting Eq.(3068) into Eq.(3069) yields $$(J_{MM}-J_{MX}-J_{XM}+J_{XX})Q_M = X_X^0 - X_M^0 \quad (3071)$$

Meanwhile, since $$J_{MX}=J_{XM} \quad (3072)$$

is satified obviously, $$Q_M = \frac{X_x^0 - X_M^0}{J_{MM} + J_{XX} - 2J_{MX}} \quad (3073)$$

can be obtained. A variable in Eq.(3073) is only λ. A dipole moment $\mu_{MX}$ is detected from the calculated Q using Eq. (3074), and then compared with the experimental value to determine λ.

$$\mu_{MX}=4.80324 Q_M R_{MX} \quad (3074)$$

Where $R_{MX}$ is the experimental value of bond distance. In Eq.(3074), unit of Q is e, unit of R is Å, and unit of μ is Debye. From comparison with the experimental value of dipole moment, 0.4913 has been obtained as an optimal value of λ. If this λ is utilized, then valence orbit indexes ζ may be calculated from Eq.(3067) as shown in the Table in FIG. 17. Rappe et al. have dealt with hydrogen differently from other elements. If compared with each other, the electronegativity of hydrogen does not coincide with that of the experimental values obtained by Mulliken, and Pauling et al. On a Pauling scale, hydrogen is electrically positive rather than carbon and electrically negative rather than boron while, on a Mulliken scale, hydrogen is electically negative rather than carbon and nitrogen. The problem of electronegativity is that effective electron affinity EA becomes small rather than the value at the time of atom when since orbit of bonded hydrogens cannot be spread out like free hydrogen ion.

Accordingly, $\chi_{OH}$ and $J^0_{HH}$ of hydrogen are redefined using EAH as a variable.

$$\zeta_H(Q_H) = \zeta_H^0 + Q_H \quad (3075)$$

$$J_{HH}(Q_H) = \left(1 + \frac{Q_H}{\zeta_H^0}\right) J_{HH}^0$$

Charge obtained by solving Eq.(3063) in matrix form is judged whether or not it is in the range of inequality shown in FIGS. 18 to 20. If being out of the range, then the charge is fixed to the boundary value.

$$X_H^0 = 4.528 \text{ eV}$$

$$X_{HH}^0(0) = 13.8904 \text{ eV} \quad (3076)$$

Aboves are the outline of Rappe et al.'s approach. Rappe et al. have applied the above approach to organic system molecule. By applying the concept of chemical potential on atomic scale proposed by Rappe et al. only, the inventors have newly developed an atomic charge calculation approach in the crystal system. A charge calculation approach proposed by the inventors will be described hereinbelow.

$$X_H^0 = 4.717 \text{ eV}$$

$$X_{HH}^0(0) = 13.4725 \text{ eV} \quad (3077)$$

The second term of the right side in Eq.(3057) means sum of electrostatic energy in all bonds. The inventors have tried to expand molecule to crystal so as to enter periodic boundary conditions. Then, it has been found that, upon calculating electrostatic energy, not only several hundreds to several thousands atoms used in calculation but also electrostatic energy supplied from an infinite number of virtual atoms located in the outer side must be considered. In other words, the inventors have found out the fact that attenuation of electrostatic energy is small and therefore influence from distant atoms cannot be ignored. For this reason, assuming that a great number of cells are present on the outside of the cell used in calculation, electrostatic energy from virtual cells is to be regarded.

In this case, usually Rne becomes a large value more than ten Angstrom if a size of computation cell is taken into consideration, so that electrostatic energy $J_{AB}$ received from atoms in virtual cells in Eq.(3057) may be regarded to comprise Coulomb energy only. Hence, $J_{AB}=1/R_{AB}$ is applied uniformly. If virtual cells are expressed by ν, then Eq.(3051) is modified in the following.

$$E(Q_1 Q_2 \ldots Q_N) = \sum_A (E_{A0} + X_A^0 Q_A) + \frac{1}{2}\sum_{A,B} Q_A Q_B J_{AB} + \quad (3081)$$

$$\sum_{\nu \neq 0} \frac{1}{2}\sum_{A,B} Q_A Q_B J_{AB\nu}$$

$$= \sum_A (E_{A0} + X_A^0 Q_A) + \frac{1}{2}\sum_{A,B} Q_A Q_B J_{AB} +$$

$$\sum_{\nu \neq 0} \frac{1}{2}\sum_{A,B} Q_A Q_B \frac{1}{R_{AB\nu}}$$

$$= \sum_A (E_{A0} + X_A^0 Q_A) + \frac{1}{2}\sum_{A,B} Q_A Q_B J_{AB} +$$

$$\sum_{\nu} \frac{1}{2}\sum_{A,B} \frac{Q_A Q_B}{R_{AB\nu}} - \frac{1}{2}\sum_{A,B} \frac{Q_A Q_B}{R_{AB}}$$

Where ν=0 means the computational cell per se while ν≠0 means virtual cells. If the Ewald's method is applied to the third term of Eq.(3078), then the third term can be transformed as follows.

$$\frac{1}{2}\sum_A\sum_B\sum_\upsilon \frac{Q_A Q_B}{R_{AB\upsilon}} = \frac{1}{2}\sum_A\sum_B\sum_\upsilon \frac{Q_A Q_B}{R_{AB\upsilon}}\text{erfc}(\kappa R_{AB\upsilon}) + \quad (3082)$$

$$\frac{\pi}{2\Omega\kappa^2}\sum_A\sum_B\sum_G \frac{Q_A Q_B \exp(-|G|^2/4\kappa^2)}{|G|^2/4\kappa^2}\exp(iGR_{AB}) -$$

$$\frac{\kappa}{\sqrt{\pi}}\sum_A Q_A^2$$

Where $$R_{ij} = r_j - r$$

$$R_{ij\upsilon} = |\upsilon + r_j - r_i| \quad (3083)$$

Where G is reciprocal lattice vector, $\Omega$ is volume of the computational cell, and $\kappa$ is a parameter for adjusting convergence of Ewald's calculation. In addition, the first term of the right side in Eq.(3082) does not include $\upsilon=0$ and $A=B$, and the second term does not include $G=0$. If chemical potential $\chi_1$ on the atomic scale is calculated from these equations, then $$x_i(Q_1, Q_2 \ldots Q_N) \equiv \frac{\partial E}{\partial Q_i} = x_i^0 + \frac{1}{2}\sum_B Q_B J_{iB} + \frac{1}{2}\sum_A Q_A J_{Ai} - \frac{1}{2}\sum_B \frac{Q_B}{R_{iB}} - \quad (3091)$$

$$\frac{1}{2}\sum_A \frac{Q_A}{R_{Ai}} + \frac{1}{2}\sum_B\sum_\upsilon \text{erfc}(\kappa R_{iB\upsilon}) +$$

$$\frac{1}{2}\sum_A\sum_\upsilon \frac{Q_A}{R_{Ai\upsilon}}\text{erfc}(\kappa R_{Ai\upsilon}) +$$

$$\frac{\pi}{2\Omega\kappa^2}\sum_B\sum_G \frac{Q_B\exp(-|G|^2/4\kappa^2)}{|G|^2/4\kappa^2}\exp(iGR_{iB}) +$$

$$\frac{\pi}{2\Omega\kappa^2}\sum_A\sum_G \frac{Q_A\exp(-|G|^2/\kappa^2)}{|G|^2/4\kappa^2}\exp(iGR_{Ai}) - \frac{2\kappa}{\sqrt{\pi}}Q_1$$

$$= x_i^0 + \sum_j Q_j J_{ij} - \sum_j \frac{Q_j}{R_{ij}} + \sum_j\sum_\upsilon \frac{Q_i}{R_{ij\upsilon}}\text{erfc}(\kappa R_{ij\upsilon}) +$$

$$\frac{\pi}{\Omega\kappa^2}\sum_j\sum_G \frac{Q_j\exp(-|G|^2/4\kappa^2)}{|G|^2/4\kappa^2}\exp(iGR_{ij}) - \frac{2\kappa}{\sqrt{\pi}}Q_i$$

-continued $$\frac{2\kappa}{\sqrt{\pi}}Q_1\sum_j^N\left(J_{ij} - \frac{1}{R_{ij}} - J_{1j} + \frac{1}{R_{ij}} + \right.$$

$$\sum_\upsilon \frac{\text{erfc}(\kappa R_{ij\upsilon})}{R_{ij\upsilon}} - \sum_\upsilon \frac{\text{erfc}(\kappa R_{1j\upsilon})}{R_{1j\upsilon}} +$$

$$\frac{\pi}{2\Omega\kappa^2}\sum_G \frac{\exp(-|G|^2/4\kappa^2)}{|G|^2/4\kappa^2}[\exp(iGR_{ij}) -$$

Based on the condition of charge equbilium, N–1 equations may be derived.

$$X_1 = X_2 = X_3 = \ldots = X_N \quad (3092)$$

Substituting Eq.(3092) into Eq.(3091) yields;

$$x_i^0 + \sum_j Q_j J_{ij} - \sum_j \frac{Q_j}{R_{ij}} + \sum_j\sum_\upsilon \frac{Q_j}{R_{ij\upsilon}}\text{erfc}(\kappa R_{ij\upsilon}) + \quad (3093)$$

$$\frac{\pi}{\Omega\kappa^2}\sum_j\sum_G \frac{Q_j\exp(-|G|^2/4\kappa^2)}{|G|^2/4\kappa^2}\exp(iGR_{ij}) - \frac{2\kappa}{\sqrt{\pi}}Q_i =$$

$$x_1^0 + \sum_j Q_j J_{1j} - \sum_j \frac{Q_j}{R_{1j}} + \sum_j\sum_\upsilon \frac{Q_j}{R_{1j\upsilon}}\text{erfc}(\kappa R_{1j\upsilon}) +$$

$$\frac{\pi}{\Omega\kappa^2}\sum_j\sum_G \frac{Q_j\exp(-|G|^2/4\kappa^2)}{|G|^2/4\kappa^2}\exp(iGR_{1j}) -$$

-continued $$\exp(iGR_{1j})]Q_j = -(x_i^0 - x_1^0) + \frac{2\kappa}{\sqrt{\pi}}(Q_i - Q_1)\sum_j^N Q_j = Q_{tot}$$

N simultaneous equations represented by Eq.(3093) are to be solved. If a matrix of CQ=–D is prepared from Eq.(3093), then $$CQ = -D \quad (3094)$$

$$D_1 = -Q_{tot}$$

$$D_i = -(X_i^0 - X_1^0) + \frac{2\kappa}{\sqrt{\pi}}(Q_i - Q_1)$$

$$C_{1j} = 1$$

-continued $$C_{ij} = J_{ij} - J_{1j} - \frac{1}{R_{ij}} + \frac{1}{R_{1j}} +$$

$$\sum_v \left( \frac{\text{erfc}(\kappa R_{ijv})}{R_{ijv}} - \frac{\text{erfc}(\kappa R_{1jv})}{R_{1jv}} \right) +$$

$$\frac{\pi}{\Omega \kappa^2} \sum_G \frac{\exp(-|G|^2/4\kappa^2)}{|G|^2/4\kappa^2} [\exp(iGR_{ij}) - \exp(iGR_{1j})]$$

can be derived.

In case crystal or amorphous such as $SiO_2$ is dealt with, the inventors have found that Eq.(3094) must be solved with considering the periodic boundary conditions. Since Eq. (3094) is non-linear with respect to charge Q, a loop to converge Q is provided in the calculation program.

Further, the inventors have paid their attention to modeling of Coulomb integral in real calculation. $J_{AB}$ has been calculated as two-atom Coulomb integral of Slater function with respect to $\zeta_A$ and $\zeta_B$. Coulomb integral Jae has been calculated with the use of Rootherri's method. Roothern et al. have labeled a sign [ ] to Coulomb integral $J_{AB}$. Using the parameter defined in $$\bar{\zeta}_a = \frac{1}{2}(\zeta_a + \zeta'_a)$$ (3101)

$$\bar{\zeta}_b = \frac{1}{2}(\zeta_b + \zeta'_b)$$

$$\tau_a = \frac{(\zeta_a - \zeta'_a)}{(\zeta_a + \zeta'_a)}$$

$$\tau_b = \frac{(\zeta_b - \zeta'_b)}{(\zeta_b + \zeta'_b)}$$

$$\rho = \zeta R$$

$$\tau = \frac{\bar{\zeta}_a - \bar{\zeta}_b}{\bar{\zeta}_a + \bar{\zeta}_b}$$

$$\kappa = \frac{\rho_a^2 + \rho_b^2}{\rho_a^2 - \rho_b^2}$$

Coulomb integral is given by $$[1s_a 1s'_a | 1s_b 1s_b] = \left(\frac{3}{2}, \frac{3}{2}, \frac{3}{2}, \frac{3}{2}\right)[1S_a | 1S_b]$$ (3102)

$$[1s_a 1s'_a | 2s_b 2s_b] = \left(\frac{3}{2}, \frac{3}{2}, \frac{5}{2}, \frac{5}{2}\right)[1S_a | 3S_b]$$

$$[2s_a 2s'_a | 2s_b 2s_b] = \left(\frac{5}{2}, \frac{5}{2}, \frac{5}{2}, \frac{5}{2}\right)[3S_a | 3S_b]$$

Where $$(\alpha,\alpha',\beta,\beta') = (1+\tau_a)^{\alpha'}(1-\tau_a)^{\alpha'}(1+\tau_b)^{\beta'}(1-\tau_b)^{\beta'}$$ (3103)

Furthermore, if $$[1S_a | 1S_b] = (\zeta/\rho)\left\{1 - (1-\kappa)^2 + \frac{1}{4}(2+\kappa) + \frac{1}{4}\rho_a\right\}e^{-2\rho a} -$$ (3104)

$$(1+\kappa)^2\left[\frac{1}{4}(2-\kappa) + \frac{1}{4}\rho_b\right]e^{-2\rho ba}\right\}$$

$$[1S_a | 3S_b] = (\zeta/\rho)\left\{1 - (1-\kappa)^3\left[\frac{1}{16}(1 - 5\kappa - 4\kappa^2) - \frac{1}{8}\kappa\rho_a\right]e^{-2\rho a} -\right.$$

$$(1+\kappa)^2\left[\frac{1}{16}(15 - 22\kappa + 15\kappa^2 - 4\kappa^3) + \frac{3}{8}(3 - 3\kappa + \kappa^2)\rho_b + \right.$$

$$\left.\frac{1}{4}(2-\kappa)\rho_b^2 + \frac{1}{12}\rho_b^3\right]e^{-2\rho b}\right\}$$

$$[3S_a | 3S_b] = (\zeta/\rho)\left\{1 - (1-\kappa)^3\left[\frac{1}{16}(8 - \kappa - 27\kappa^2 - 30\kappa^3 - 10\kappa^4) +\right.\right.$$

$$\left.\frac{1}{32}(11 - 19\kappa - 44\kappa^2 - 20\kappa^3)\rho_a\right]e^{-2\rho a} -$$

$$(1+\kappa)^3\left[\frac{1}{16}(15 - 22\kappa + 15\kappa^2 - 4\kappa^3) + \frac{3}{8}(3 - 3\kappa + \kappa^2)\rho_b + \right.$$

$$\left.\frac{1}{4}(2-\kappa)\rho_b^2 + \frac{1}{12}\rho_b^3\right]e^{-2\rho b}\right\}$$

is satisfied, then Eq.(3104) is rewritten as follows.

$$[1S_a | 1S_b] = \frac{\zeta}{\rho}\left\{1 - \left(1 + \frac{11}{8}\rho + \frac{3}{4}\rho^2 + \frac{1}{6}\rho^3\right)e^{-2\rho}\right\},$$ (3111)

$$[1S_a | 3S_b] = \frac{\zeta}{\rho}\left\{1 - \left(1 + \frac{25}{16}\rho + \frac{9}{8}\rho^2 + \frac{23}{48}\rho^3 + \frac{1}{8}\rho^4 + \right.\right.$$

$$\left.\frac{1}{60}\rho^5\right)e^{-2\rho}\right\},$$

$$[3S_a | 3S_b] = \frac{\zeta}{\rho}\left\{1 - \left(1 + \frac{419}{256}\rho + \frac{163}{128}\rho^2 + \frac{119}{192}\rho^3 + \right.\right.$$

$$\left.\frac{5}{24}\rho^4 + \frac{1}{20}\rho^5 + \frac{1}{120}\rho^6 + \frac{1}{1260}\rho^7\right)e^{-2\rho}\right\}$$

Where the unit system in the above equation is the atomic unit system, wherein the distance is expressed by bohr and the energy is expressed by Hartree.

Although Roothern et al. have provided an analytic expression of Coulomb integral with respect to 1s, 2s, 2p, the inventors have calculated Coulomb integral with respect to atomic orbit more than 3s and selected an optimal orbit such that Si and $SiO_2$ used generally in the semiconductor device may be dealt with.

Charge calculation is largely influenced by the value of JAB. Therefore, setting of the Slater orbit and the valence orbit index $\zeta$ used in calculating J is important. For this reason, the inventors have investigated the value of J when Si—O and Si—Si are dealt with. Although Rappe et al. have assumed that "polarized charge is on the ns orbit", it is not clear that which orbits are optimal to be considered with respect to various elements. Since the major quantum number n of Si is 3, calculations are executed and the results are compared with each other in both cases where charges of Si are on 3s and they are on 2s. At this time, analytic expression of J at n=3 is prepared separately by the inventors in compliance with the Roothern's method. For instance, $$J_{Si,Si} = \frac{\zeta}{\rho}\left\{1 - \left(1 + \frac{5351}{3072}\rho + \frac{2279}{1536}\rho^2 + \frac{631}{768}\rho^3 + \frac{191}{576}\rho^4 + \frac{179}{1728}\rho^5 + \frac{7}{270}\rho^6 + \frac{1}{189}\rho^7 + \frac{1}{1134}\rho^8 + \frac{1}{8505}\rho^9 + \frac{1}{85050}\rho^{10} + \frac{1}{1403325}\rho^{11}\right)e^{-2\rho}\right\}$$ (3112)

is employed for Si—Si.

FIG. 21 shows calculation results of Coulomb interaction J between Si—Si. In this event, it is understood that the value of J is seldom varied if either of 2s and 3s is used. However, Coulomb interaction J between Si—O is largely varied according to 2s or 3s. Calculation results of JAB is shown in FIG. 22 in case a model is supposed wherein 0 charge is put on 2s and Si is located on 2s or 3s. If charge of Si is put on 3s only, then a minimal value of the value J appears near r=1.6 because 3s orbit is spread very widely. Since the Si—O bond distance Just locates there, J is estimated very small. As a result, it has been detected that either charge of Si and O has been underestimated extremely. It is true of Si—H, similarly. Accordingly, if the 3s orbit is assumed boldly as the charge model of Si, then estimation of J has lost precision completely. According to the above, it has been confirmed that Slator orbit may be used only to consider spread of the charge and the Slator orbit of 1s or 2s may be used optimally as the model. It also has been found that this may be similarly applied to elements having atomic number succeeding to Si, and that Coulomb force at near interatomic distance may be calculated with very poor precision if the spread orbit after 3s is used as the model.

The inventors have paid attention on the program to correction for hydrogen. From Eq.(3031), $$E_H(Q_H) = E_{H0} + X_H^0 Q_H + \frac{1}{2}\left(1 + \frac{Q_H}{\zeta_H^0}\right)J_{HH}^0 Q_H$$ (3113)

can be derived. chemical potential $\chi_{H1}$ at atomic scale is calculated when hydrogen correction is executed. First, if the number of hydrogen included in total atom number N is M, then an equation energy of multiple atom molecule corresponding to Eq.(3057) is given by $$E(Q_1 \ldots Q_{HI} \ldots Q_{HM} \ldots Q_N) =$$ (3114)

$$\sum_{A=1}^{N}\left(E_{A0} + X_A^0 Q_A + \frac{1}{2}Q_A^2 J_{AA}\right) + \sum_{A<B} Q_A Q_B J_{AB} +$$

$$\sum_i^M \left\{E_{Hi0} + X_{Hi}^0 Q_{Hi} + \frac{1}{2}J_{HiHi}^0 Q_{Hi}^2\left(1 + \frac{Q_{Hi}}{\zeta_H^0}\right)\right\} +$$

$$\sum_{i<j}^M Q_{Hi}Q_{Hj}J_{HiHj} + \sum_i^M \sum_A^N {'}Q_{Hi}Q_A J_{HiA}$$

Where symbol $\Sigma'$ in the first, second, and fifth terms of the right side in Eq.(3114) means that H is removed when respective sums are calculated. Chemical potential $\chi_{H1}$ on atomic scale is given by $$\chi_{HI}(Q_1 \ldots Q_{HI} \ldots Q_{HM} \ldots Q_N) =$$ (3121)

$$\frac{\partial E}{\partial Q_{HI}} = X_{HI}^0 + J_{HIHI}^0\left(1 + \frac{Q_{HI}}{\zeta_H^0}\right) + \frac{1}{2\zeta_H^0}J_{HIHI}^0 Q_{HI}^2 +$$

$$\frac{\partial}{\partial Q_{HI}}\sum_{i<j}^M Q_{Hi}Q_{Hj}J_{HiHj} + \sum_A^N {'}Q_A J_{HIA}$$

The fourth term of the right in Eq.(3121) may be analyzed in the following.

$$\frac{\partial}{\partial Q_{HI}}\sum_{i<j}^M Q_{Hi}Q_{Hj}J_{HiHj} =$$ (3122)

$$\frac{\partial}{\partial Q_{HI}}\frac{1}{2}\left(\sum_i^M \sum_j^M Q_{Hi}Q_{Hj}J_{HiHj} - \sum_i^M Q_{Hi}^2 J_{HiHi}\right) =$$

$$\frac{1}{2}\left(\sum_j^M Q_{Hj}J_{HIHj} + \sum_i^M Q_{Hi}J_{HiHI} - 2Q_{HI}J_{HIHI}\right) =$$

$$\sum_j^M Q_{Hj}J_{HIHj} - Q_{HI}J_{HIHI} = \sum_{j\neq I}^M Q_{Hj}J_{HIHj}$$

It can be seen from Eq.(3122) that sum of the fourth term and the fifth term in Eq.(27) means interatomic Coulomb interaction among all atoms other than HI. Accordingly, chemical potential is $$\chi_{HI} = X_{HI}^0 + \left(1 + \frac{3}{2\zeta_H^0}Q_{HI}\right)J_{HIHI}^0 Q_H + \sum_{j\neq HI}^N J_{HI,j}Q_j$$ (3123)

Modification is made to the matrix (3063) obtained at the time of hydrogen correction by Eq.(3123). If $\chi_1$ is an atom other than hydrogen, then $$X_{Hi}^0 + \left(1 + \frac{3}{2\zeta_H^0}Q_{Hi}\right)J_{HiHi}^0 Q_{Hi} + \sum_{j\neq Hi}^N J_{Hi,j}Q_j = X_1^0 + \sum_B^N J_{1B}Q_B$$ (3124)

$$\therefore \left\{\left(1 + \frac{3}{2\zeta_H^0}Q_{Hi}\right)J_{HiHi}^0 - J_{1Hi}\right\} + \sum_{j\neq Hi}^N (J_{Hi,j} - J_{1,j})Q_j = -(X_{Hi}^0 - X_1^0)$$

can be formulated by substituting Eq.(3123) into Eq.(3059). Comparing with the matrix (3063), Jii0 of hydrogen is modified to $$1 = >\left(1 + \frac{3}{2\zeta_H^0}Q_{Hi}\right)$$ (3125)

Next, hydrogen correction for interatomic Coulomb potential $J_{AH}$ will be discussed. In the case of hydrogen, the Slater orbit function is given by Eq.(2075) like $$\Phi_{1\zeta H}^{slat} = N_1 e^{-\zeta_H r}$$ (3126)

$$= \sqrt{\frac{(\zeta_H^0 + Q_H)^3}{\pi}}\exp[-(\zeta_H^0 + Q_H)r]$$

If hydrogen is included, then $J_{AH}$ is corrected by Eq.(3126) after charges have been calculated and then charges are calculated again. Until the value of charge converges, such correction is repeated. At this time, the inventors have prepared the algorithm such that, if a row of I=1 is hydrogen, then the matrix is formed by replacing the row with another row without hydrogen.

For the charge boundary conditions, the inventors have taken account of a concrete modifying method of the matrix. Consideration will be made by classifying Eq.(3061) into charge $Q_B$ fixed to the boundary and charge $Q_C$ not fixed.

$$X_i = X_i^0 + \sum_{Bfix}^{fix} J_{iB} Q_B + \sum_{CNonfix}^{N-fix} J_{iC} Q_C \tag{3127}$$

From the equilibrium condition, $$X_i = X_1, (2 \leq i \leq N) \tag{3131}$$

$$X_i^0 + \sum_{Bfix}^{fix} J_{iB} Q_B + \sum_{CNonfix}^{N-fix} J_{iC} Q_C = X_1^0 + \sum_{Bfix}^{fix} J_{1B} Q_B +$$

$$\sum_{CNonfix}^{N-fix} J_{1C} Q_C \sum_{CNonfix}^{N-fix} (J_{iC} - J_{1C}) Q_C$$

$$= -\left\{ \left( X_i^0 + \sum_{Bfix}^{fix} J_{iB} Q_B \right) - \left( X_1^0 + \sum_{Bfix}^{fix} J_{1B} Q_B \right) \right\} \sum_{CNonfix}^{N-fix} Q_C$$

$$= Q_{total} - \sum_{Bfix}^{fix} Q_B$$

If Eq.(3062) is modified to Eq.(3131), then a factor of the matrix is $$D_1 = -\left( Q_{total} - \sum_{Bfix}^{fix} Q_B \right) \tag{3132}$$

$$D_i = X_i^{0F} - X_1^{0F}$$

Where $$X_i^{0F} = X_i^0 + \sum_{Bfix}^{fix} J_{iB} Q_B \tag{3133}$$

By modifying the matrix as above, charges are settled within the range of the boundary condition. At this time, if elements of I=1 are set on the boundary value, then rows of the matrix are replaced to select rows such that rows for elements to which the boundary values are not set become I=1 (pivot selection).

The inventors have applied the newly developed charge calculation method to the crystal system and the amorphous system, and have sequentially calculated motion of individual atoms by the molecular dynamics method as well as the charge calculation method and calculated and recorded dipole moment momentarily, and then have calculated IR spectrum by transforming such dipole moment by virtue of Fourier transformation. FIG. 23 shows above procedures.

For contrast, in the gate oxide film used in DRAM after the 16G device and the tunnel oxide film used in NAND EEPROM, high reliability becomes important subject rather than the prior art. In particular, in EEPROM, since the oxide film may be employed under such hard condition that insulating capability must be maintained under application of high electric field while flowing through the tunneling current, it becomes important to search the limit as the insulation material at atom/electron level.

Under such circumstances, experiments for searching the Si/SiO$_2$ interface structure and the SiO$_2$ network structure at atom level, experiment for trap mechanism in SiO$_2$, prediction based on theoretical culcuration, and the like have proceeded in various research institutes. However, in the prior art, there has not provided such an approach that, like the present invention, the network structure and the IR full spectrum are correlated at atom level and utilized. Merely the experimental results in which Si—O asymmetrical stretching peak in the IR spectrum and stress on the oxidation interface are correlated have been reported.

Further, as interpretation of the experimental results, only the discussion has been made in respect of oscillation analysis of the Si—O—Si molecular structure which can be accomplished by extremely simplifying the real network structure with the use of "central force model". Therefore, the discussions in which distribution of Si—O bond length, distribution of Si—O—Si, O—Si—O bond angle, etc., all being unique to the amorphous, are totally mentioned have in no ways provided in the prior art. In the present invention, by taking account of these various distributions unique to the amorphous, correlation of electric property with the structure has been able to be analyzed from the viewpoint different from the central force model.

Respects overcome by the inventors will be mentioned now. In order to apply classical molecular dynamics method, the inventors have examined potentials and further improved them. The inventors have tried to use TTAM potential which has been developed by Tuneyuki et al. at first, but have found that Si—O asymmetrical stretching oscillations are expressed on the very low frequency side. Hence, the inventors have used BSK potential which has been developed by Van Beest et al. Although, in their potential, peaks appear on the higher frequency side rather than TTAM potential, stretching peaks are observed in lower wave number than the measured values.

In order to bring these peak values close to the measured values, the inventors have removed the condition of constant charge which is employed in the existing potential and then introduced into classical molecular dynamics the distribution of charges when Si—O—Si angle, etc. are significantly displaced. Although charge distribution can be calculated by a molecular orbit method in ideal case, it is impossible at present in practical case to calculate charge distribution as for the structure including several hundreds atoms. It is impossible practically to calculate such distribution even by supercomputer.

Therefore, the inventors have calculated charge distribution according to the approach which has been proposed by A. R. Rappe and W. A. Goddard III. See "Charge Equilibration for Molecular Dynamics Simulation", J. Phys. Chem., 95, 1991, pp.3358–3363. The inventors have developed equations with reference to their paper and corrected errors in their paper, and originally calculated necessary parameters, and thus applied their approach to SiO$_2$ system. Outline of Rappe et al. will be explained hereinbelow.

Energy Ei(Q) due to individual charges of atoms i may be approximated as $$E_i(Q) = E_{iO} + X_i^0 Q + \frac{1}{2} J_{ii} Q^2 \qquad (1651)$$

by picking up to the terms of second degree of Taylor expansion. Where $X_i^0$ is electronegativity and given by $$X_i^0 = \frac{1}{2}(IP+EA) \qquad (1652)$$

Jii is Coulomb repulsive force between electrons on the orbit of the atom I. Jii is defined by $$J_{ii} = IP - EA \qquad (1661)$$

Where IP is ionization potential, and EA is electron affinity. Total energy $E(Q_1, \ldots, Q_N)$ of the molecule consisting of N atoms is sum of energy of individual atoms and interaction electrostatic energy $J_{ij}Q_iQ_j$ between atoms.

Where $J_{ij}$ is Coulomb interaction of unit charge at the center of atoms ij. Therefore, $$E(Q_1, \ldots, Q_N) = \sum_{i=1}^{N} E_i(Q) + \sum_{i<j} J_{ij} Q_i Q_j \qquad (1662)$$

$$= \sum_{i=1}^{N} (E_{iO} + X_i^0 Q_i) + \frac{1}{2} \sum_{i,j} J_{ij} Q_i Q_j$$

is satisfied. Chemical potential on atomic scale is given by $$X_i(Q_1, \ldots, Q_N) \equiv \frac{E}{Q_i} = X_i^0 + \sum_{j=1}^{N} J_{ij} Q_j \qquad (1663)$$

If Eq.(1663) is substituted into the condition of charge equilibrium $X_1 = \ldots = X_N$, then $$X_i^0 + \sum_{j=1}^{N} J_{ij} Q_j = X_1^0 + \sum_{j=1}^{N} J_{1j} Q_j \quad (2 \le i \le N) \qquad (1671)$$

may be derived. In other words, following Eq.(1672) can be achieved.

$$\sum_{j=1}^{N} (J_{ij} - J_{1j}) Q_j Q = -(X_i^0 - X_1^0) \qquad (1672)$$

Still further, the condition of total charge shown in $$Q_{tot} = \sum_{i=1}^{N} Q_j \qquad (1673)$$

will be regarded. $J_{ij}$ has been known and is given by $$J_{ij} = \frac{14.4}{R} \qquad (1674)$$

Where R is a size of the atom when I=j while an interatomic distance when I≠j. Accordingly, by introducing a matrix C and a vector d, simultaneous equations shown in following Eq.(1681) concerning Q may be satisfied. That is, if $$C_{1j} = 1$$
$$C_{ij} = J_{ij} - J_{1j}$$
$$d_1 = -Q_{tot}$$
$$d_i = X_i^0 - X_1^0 \qquad (1681)$$

is defined, then $$CQ = -d \qquad (1682)$$

Although $C_{1i} = Q_i$, $C_d = d$ in the paper, the inventors have modified as stated above and then used. Moreover, necessary parameters such as size of atoms like Si—O—H are originally calculated and simultaneous equations are solved to calculate charge distribution. As a result, peak wave number becomes to coincide remarkably with the measured value.

Calculations of a step induction stress in a wide region of several-micron level are performed in (2) or (3) according to input data on the side of a general-purpose three-dimensional process simulator (10), and these resultants are once transferred to a molecular dynamics simulator 11 via a file (22) or a file (32) or again returned to a general-purpose simulator (10), or this flow is repeated, whereby it is possible to use more precise and much more functions. As for a calculation procedure, for example, the resultants of the step induction stress calculation in a wide region to some degree which are acquired in a process tolerance calculation unit at a certain time are once transferred to the molecular dynamics simulator 11, and a correction amount of a physical constant is calculated therein, while movements of atoms are considered all over again and the corrected physical constant is again supplied to the general-purpose simulator, which advances the resultants of the step induction stress calculation etc. in a wide region. If a sufficiently increased stress is locally generated by repeating this procedure, it is possible to consider the movements of atoms on the side of the molecular dynamics simulator 11 and observe presence or absence of a plastic deformation.

Of course, at the time of an impurity redistribution calculation in the above-mentioned general-purpose process simulator portion or a stress calculation, a point defect demeanor calculation portion (9) as described in FIG. 8 is called. As for the point defect, a hollow lattice in a Si substrate and an inter-lattice Si are treated. If the demeanor of these point defects is not correctly fetched for a diffusion of impurities, the redistribution of impurities is not precisely calculated. In an ion implantation calculation portion (4), a great amount of hollow lattices and the inter-lattice Si due to implantation damages are, of course, generated. These are redistributed in a thermal step, but at that time, these have an interaction with impurities so that the interaction must be reflected to the calculation of impurity distribution. Further, even in a silicide/shape/stress calculation portion (7), the demeanor of the hollow lattice in the Si substrate and the inter-lattice Si must sufficiently be taken into consideration, naturally.

By the way, others (8) of FIG. 8 will be just a little explained. In oxidation, diffusion, ion implantation etc. in a LSI element trial step, respective necessary physical constants have already been stored in this process tolerance calculation unit (10) on the basis of a great amount of data. For example, in an oxidation of Si, PB1, PB2 etc. of a formula (1130) or (1131) as represented below are applicable. Further, in a diffusion constant etc. of an oxidizer in a $SiO_2$, D' of a formula (1531) as represented below is applicable. Generally, there are data as described above.

However, such data etc. are not necessarily all present in LSI development. For example, we now consider trial development of a memory cell using a ferroelectric film. We consider the case where $PbTiO_3$ is formed with the use of CDV or a sputter step. In most of the current general-purpose process simulators, even diffusion coefficients of various impurities in the $PbTiO_3$ film have not yet been understood so much. Further, the stress constant is not made clear so much. Further, a segregation constant of impurities on the interface is not made clear so much. In such cases, first entering a step (8), the resultants are immediately once transferred to the molecular dynamics simulator 11 as shown in (84) and potential etc. required for elements is calculated therein and the molecular dynamics portion is activated on the basis of the resultants to calculate a physical constant. The following steps are very similar to the portion described above and these physical constants are stored in a file from (83). Then, in the same manner as the process tolerance calculation unit, a calculation portion is advanced.

Now, specifical processings will be explained with reference to FIG. 9. An oxidation step will be picked up therein. Namely, a wafer is cast and moved to a substrate process step and thereafter enters the oxidation step.

In this oxidation step, for example, an amount of high purity oxygen gas is denoted as, for example, Pox, and further this dispersion is constructed as δtox. Further, a temperature increasing sequence is constructed as Temp, further this dispersion δtemp, and valve sequences tox, δtox etc. In particular, the valve sequence represents a period when a valve is opened therein, for example, and the detail is as described in the embodiments.

For instance, in FIG. 8, the oxidation/shape/stress calculation portion of (2) is accessed, and partial pressure Pox, a temperature Temp etc. are input thereto. An oxidation growing calculation and simultaneously a stress calculation are advanced. At this time, dispersion and tolerance calculations are performed using (21). δpox and δte are input thereto to effectively perform a derivative from a central value.

From these calculation resultants, for example, a growing amount of an oxide film, a shape of an interface between an oxide film and Si and further an amount of impurity are calculated. Further, a stress is also acquired by our inventors. Further, in the same manner, even in portions of Pox=Pox+δpox, Temp=Temp+δtemp etc., a growing amount of an oxide film, a shape of an interface between an oxide film and Si and an amount of impurity are calculated from the dispersion and tolerance. Then, these have once been stored in a memory or a file (22) and are supplied to the molecular dynamics portion. In the molecular dynamics portion, these are input as signals a to calculate a position vector r(t).

FIG. 10 shows the same process chart as FIG. 9. This relates to a formation of a ferroelectric film.

By the way, a description of a diagnostic portion in the present invention will now be made. FIG. 11 shows a part of a binary tree according to this embodiment. This represents the binary tree aiming at the oxidation step. As described in FIG. 11, first a thickness of a $SiO_2$ film supplied from an in-situ monitor is compared with that expected from the calculation therein. Then, we pick up the time when a film thickness exists in an allowable range in order to discuss. Thus, in the following procedure, a 1R spectrum curve supplied from an in situ monitor is compared with a 1R curve expected from the calculation. As described in FIG. 11, the spectrums are first compared to pick up the case where they are just a little slipped out and also the case where they are slipped out toward the high frequency side. If so, in the following procedure, it is considered that a remaining stress is largely induced into $SiO_2$. Then, in this case, it is possible to reduce the remaining stress by gradually descending a temperature.

Thus, an annealing portion as described in FIG. 9 is corrected to be input to (2) of FIG. 8. On the other hand, if the spectrums are compared and exist in an allowable range, the procedure will be continued according to the initial process sequence as it is.

We thought that you could generally understand the flow of data relating to FIG. 8. Now, we will a little bit more refer to an output of FIG. 8. Namely, the execution resultants have once been stored in the file (3). The spectrums in response to the steps or the other optical and electrical characteristic results acquired in each of the steps are stored therein. These will be described later and can be compared with an amount monitored as actual detected data.

On the other hand, one of the inventors has before proposed a process simulator system using a derivative of a process tolerance. Namely, the inventor has proposed in Japanese Patent Application No. SHO63-174331 and Japanese Patent Application No. HEI3-164904. In these proposals, respective steps such as oxidation and diffusion, ion implantation, chemical vapor deposition (CVD), etching and lithography can be handled by fluidal handling. For example, in a diffusion step by a fluid model, a gross amount of impurity is distinguished from an amount of electrical activated impurity, while electrical effects are introduced to acquire a redistribution of impurity.

A schematic chart of the simulation system as shown in Japanese Patent Application No. SHO63-174331 and Japanese Patent Application No. HEI3-164904 will be explained with reference to FIGS. 25 to 33. These proposals handle the process tolerance as follows: When, for example, the steps of the oxidation, the ion implantation and the lithography are described as an example, there are provided an averaged temperature (T) and the allowable variation (δT), an averaged time (t) and the allowable variation (δt), an averaged pressure (P) and the allowable variation (δP), further an averaged mask dimension (L) and the allowable variation (δL), and an averaged dose (D) and the allowable variation (δD) etc. as input values.

As shown in FIG. 25, the process simulator is provided with a portion for calculating a dispersion deviation in each subroutine such as ion implantation, oxidation and diffusion, lithography or the like. As for a calculation procedure, there is adopted such a system that the calculation on these central values is advanced, while the derivative is performed.

This derivative will slightly be described. First, a temperature derivation in the diffusion step. In the diffusion step, when diffusion coefficients are denoted as D, an internal electric field due to an impurity distribution e and a number of electric activated impurity N, an equation based on the Fick's second rule is solved to acquire an impurity concentration distribution C. A procedure of the derivative is shown using FIG. 26. Incidentally, the left side in FIG. 26 is a normal process.

A nonlinear diffusion equation can be represented by the following formula (1071).

$$P(C_{k+1}(T),T)=B(C_k(T)) \qquad (1071)$$

Incidentally, k+1 is a time and impurity concentration $C_{k+1}$ at the time of time k+1 is an unknown quantity. B on the right side is derived from the second member of the following formula (1072).

$$\partial C/\partial t \rightarrow (C_{k+1}-C_k)/t \qquad (1072)$$

As an implicit solution is used in the present invention, all coefficient matrices expressed in the above formulae are expressed using D, an averaged temperature T or the like. In the case of the normal process, a specific diffusion time is appropriately divided until the $(t_{n+1})$th time and solutions are successively acquired from time $t_1$ to time $t_{n+1}$. Therein, these are linearized by using a Newton system in respective times $t_1, t2, \ldots, t_{n+1}$ to advance the calculation.

Next, a process deviated will be explained. This indicates the case where a deviation $\delta T$ generates in the diffusion temperature. When the derivation in the above formula is taken and a change amount $\delta C_K$ of concentration in time k is detected, a derivation $\delta C_{k+1}$ at the time of time k+1 is represented by the following formula (1081):

$$P(C_{k+1}(\overline{T}), \overline{T}) \cdot \delta C_{k+1} = B \cdot \delta C_k - \frac{\partial P(C_{k+1} \cdot \overline{T})}{\partial T} \cdot \delta T \qquad (1081)$$

Namely, values $D, \psi, N, C$ and the like at the time of convergence in the normal process at time k+1 are stored and F' is prepared using these values, and also the change amount for the temperature T is prepared to acquire $\delta C_{k+1}$. Next, a part of matrix elements for preparing F' is shown in FIG. 26. For the derivation of the diffusion coefficients, an electron hole model is basically used. In this case, a fermi level is changed by a temperature change, whereby concentration of an electric charge electron hole is changed and the diffusion coefficients are changed. Accordingly, for a real carrier concentration ni being a basic element, the derivation is first represented by the following formula (4):

$$b_{ij} = (1 + \beta^n \zeta_{ij}^n)^{<\frac{1}{2}n} \qquad (4)$$

Furthermore, the change due to a temperature of the internal electric field of impurity can also be expressed using the above. Further, we take into consideration a derivation of an enhanced effect of diffusion coefficients in an oxidation atmosphere. We take into consideration a linear oxidation rate constant and a parabolic oxidation rate constant because they change in the oxidation step. The prior F' is prepared using the above.

Next, we pick up a certain typical diffusion step and indicate the situation of convergence in one diffusion period in FIG. 27. The axis of abscissas of FIG. 27 shows a number of repetition and the axis of ordinates thereof shows a remaining difference. FIG. 27 shows convergence conditions in the normal process. It is understood that the convergence occurs in thrice circulated Newton loop in the normal process. The prior indicated derivation matrix F' is prepared using D, $\psi$, N etc. at the time of this convergence in order to calculate the temperature derivation. As shown in FIG. 27, it is understood that the convergence occurs in about 50 times and the calculation is ended in a calculation amount of 1/10 of the entire amount.

Furthermore, FIGS. 28, 29 and 30 show precision of the derivation. In FIG. 28, an impurity distribution at the time of 1000° C. is expressed ranging over a two-dimensional lattice as the normal process. FIG. 29 is the process deviated and shows the resultants of calculation based on FIG. 28 in the case of $\delta T=1°$ C. On the other hand, in FIG. 30, 1001° C. is set out as the normal process.

From these figures, it is understood that there is the relationship that a value of FIG. 30 is equal to a value of FIG. 28 and a value of FIG. 29. Further, when the value of FIG. 30 is anew ploted, it is as shown in FIG. 31, and it is understood that, when it is slipped toward a high temperature, impurity concentration decreases on the side of high concentration as a tendency and the impurity concentration increases on the side of low concentration as a tendency.

When a semiconductor element is made, there are a great amount of processes and a plurality of parameters in each of the processes. For example, the processes in a CMOS step mainly comprises (i) ion implantation into an N-well region; (ii) ion implantation into a P-well region; (iii) patterning of SiaN4 for a LOCOS step; (iv) a LOCOS step; (v) $n^+$ ion implantation; (vi) $p^+$ ion implantation; and (vii) an annealing step. When considering a fluctuation of the processes, it is necessary to handle the deviation of the great amount of parameters and its provability (or sensitivity).

In Japanese Patent Application No. SHO63-174331 and Japanese Patent Application No. HEI3-164904, we consider a combination of the provability of the derivation and the execution. For simplicity, it is considered that three steps of $\alpha, \beta$ and $\tau$ are now picked up. In each step, a central value of process parameters is called C (center), a value derived positively U (Upper) and a value derived negatively L (Lower). Their probabilities are defined as shown in FIG. 32 from Japanese Patent Application No. SHO63-174331 and Japanese Patent Application No. HEI3-164904.

When considering the steps $\alpha, \beta$, the combination is considered to be five species, namely CU, UC, CC, LC and CL, if disregarding a calculation execution such as UU, LL or the like. Further, when the process of $\tau$ is continuously passed, the combination of seven species is considered as shown in FIG. 32. However, in Japanese Patent Application No. SHO63-174331 and Japanese Patent Application No. HEI3-164904, these are not all handled, and in the case of L, a calculation is started from U, taking into consideration symmetry of U and L.

FIG. 33 shows a part of a search tree of an inference engine being a central portion of this system. We discuss an oxidation/diffusion step in FIG. 33. In FIG. 33, "expected" denotes an expected value by a statistical analysis system and "actual" denotes an actual detected value.

At this time, an allowable value is a value obtained after passing all the steps such as oxidation, diffusion, etching or the like. At this time, a value $\epsilon$ is obtained by executing a two-dimensional process statistical analysis system. When "actual" is beyond "expected"$\pm\epsilon$, it is described that there is an abnormality in the oxidation step, as shown in FIG. 33. In this case, in order to confirm to what extent the temperature or time slips, a load module of the statistical analysis system is executed as occasion demands. The above-mentioned detection is explained centering the oxidation/diffusion step, but also performed in a lithography step. The fluctuation in the lithography step corresponds to a lateral slippage in a shape of a $SiO_2$ film, a lateral slippage in a connection shape, or the like.

Common LISP is used in the inference engine because this is appropriate for not only a numerical process but also processes of a list and a shape, and because this is further extremely simple in maintenance of the system. This system not only reads data of the actual detected values from the inference engine, but also executes the load module of the statistical analysis system.

According to the simulation system as shown in Japanese Patent Application No. SHO63-174331 and Japanese Patent Application No. HEI3-164904, the coefficients of matrix at the time of convergence of the normal repetition calculation in each of the steps are stored, so that a primary derivation matrix is prepared using these coefficients. Taking into consideration the deviation of the above-mentioned individual process parameter and also overlapping effects, it becomes possible to process the deviation portion by a calculation amount of about 1/100 of that in the prior art. Further, the inference engine is communicated with the above-mentioned system, for example, by the Common LISP, whereby it is understood that it is possible to diagnose and further optimize a process margin and further a process abnormality.

In Japanese Patent Application No. SHO63-174331 and Japanese Patent Application No. HEI3-164904, a basic diffusion equation is made as shown in the following equation (1111) with respect to each impurity:

$$\frac{\partial}{\partial x}\left(D\frac{\partial N}{\partial x}\right) + \frac{\partial}{\partial z}\left(D\frac{\partial N}{\partial z}\right) \pm \left[\frac{\partial}{\partial x}\left(DN\frac{\partial N}{\partial x}\right) + \frac{\partial}{\partial z}\left(DN\partial N\frac{\psi}{\partial z}\right)\right] = \frac{\partial C}{\partial t} \quad (1111)$$

Wherein x, y denote coordinates in a horizontal direction and in a vertical (downward) direction in a two-dimensional space, t a time, C impurity concentration and N electrical activated impurity amount. Further, D denotes diffusion coefficients containing concentration dependency and a rate increasing diffusion effect, and D can be represented by the following equation (1112):

$$D = D_i 1 + \frac{\beta \cdot FV}{1+\beta} \cdot FE + D_{0ED} \quad (1112)$$

In the equation, $D_i$ is basic diffusion coefficients independing on the concentration and its temperature dependency is expressed by the following equation (1113):

$$D_i = BB \cdot exp(-BA/kT) \quad (1113)$$

BB and BA are constants set by a species of impurities and k is a Boltzmann constant. When ni denotes real carrier concentration, FE is given by the following equation (1121):

$$FE = 1 + \frac{|C_D - C_A|}{\sqrt{|C_D - C_A|^2 + 4n_i^2}} \quad (1121)$$

Furthermore, n is as follows:

$$n = \frac{1}{2}[C_D - C_A) + (C_D - C_A)^2 + 4n_i^2]$$

Further, ni is as follows:

$$n_i = 3.87 \times 10^{16} \times T^{1.5} \times exp(-0.625/kT) \quad (1122)$$

Oxide film growing rates are respectively expressed as shown in the following equations (1123) and (1124) using a parabolic oxidation rate constant R1 and a linear oxidation rate constant R2:

$$R1 = PB3 \cdot exp(PB1/kT) \quad (1123)$$

$$R2 = PB4 \cdot exp(PB2/kT) \quad (1124)$$

When the above-mentioned parabolic oxidation rate constants are anew described as B, B/A, and further an oxide film thickness is denoted as $Z_0$, an oxidation time t and a constant τ, at a point of a coordinate x in a horizontal direction, B and B/A have the relationship shown in the following equation (1125):

$$Z_0 = A/2 \cdot [1 + 4B(t+\tau)/A^2 - 1] \quad (1125)$$

These are prepared to acquire the derivation with respect to a temperature δT of each of the above-mentioned coefficients.

The derivation of n is represented by the following equation (1131):

$$\delta n = 1/4[(C_D - C_A)^2 + 4n_i^2] - 1/2 \cdot 8n_i \cdot \delta n_i \quad (1131)$$

$$= \frac{2n_i^2(1.5/T + 0.605/kT^2)}{(C_D - C_A)^2 + 4n_i^2}\delta T$$

Furthermore, the following equation (1132) is established:

$$\delta\psi = \frac{\delta n}{n} - \frac{\delta n_i}{n_i} \quad (1132)$$

$$= \left(2 \cdot \frac{n_i^2}{n} \cdot \frac{1}{(C_D - C_A)^2 + 4n_i^2} - 1\right) \cdot \left(\frac{1.5}{T} + \frac{0.605}{kT^2}\right)\delta T$$

The derivation of growing coefficients is represented by the following equations (1133) and (1134):

$$\delta R1 = -\frac{R1 \cdot RB1}{kT^2}\delta T \quad (1133)$$

$$\delta R2 = -\frac{R2 \cdot RB2}{kT^2}\delta T \quad (1134)$$

When rewritten to B=R1 and A=R1/R2, they are represented by the following equations (1141) and (1142):

$$\delta B = -\frac{B \cdot PB1}{kT^2}\delta T \quad (1141)$$

$$\delta A = \frac{A}{kT^2}(PB2 - PB1)\delta T \quad (1142)$$

Then, the derivation of t+τ is represented by the following equation (1143):

$$\delta(t+\tau) = \frac{Z_0 + A}{B}\delta Z_0 + \frac{Z_0}{B}(\delta Z_0 + \delta A) - \frac{Z_0(Z_0 + A)}{B^2}\delta B \quad (1143)$$

$$= \frac{2Z_0 + A}{B}\delta Z_0 + \frac{Z_0}{B}\delta A - \frac{Z_0(Z_0 + A)}{B^2}\delta B$$

$$= \frac{2Z_0 + A}{B}\delta Z_0 + \frac{Z_0}{kT^2}\left\{\frac{A}{B}PB2 + \frac{Z_0}{B^2}PB1\right\}\delta T$$

The simulation system as explained above was epoch-making at that time. However, it has not already been used for step control in a recent clustering tool and monitor technology.

Then, our inventors etc. have repeatedly discussed more and arrived at completion of the present invention. Therein, a ferroelectric film of a field-effect type MIS element using a perovskite single crystal is designed in an optimum manner, and we actually made the element by way of trial according to the design and evaluated it and confirmed the completion of the present invention.

Namely, a method of manufacturing a field-effect type MIS semiconductor device is provided according to claim 11, wherein when the field-effect type MIS element is formed on a semiconductor single crystal substrate, the ferroelectric film of the MIS element is made a single crystal, and further in a system containing the semiconductor substrate and the single crystal ferroelectric film, an evaluation function based on an ab initio molecular dynamics theory expressing objective characteristics is introduced, whereby the single crystal ferroelectric film and the substrate are design-arranged according to the optimized solution of the system under desired main operation conditions.

Furthermore, a method of manufacturing a field-effect type MIS semiconductor device is provided according to claim 12, wherein when the field-effect type MIS element is formed on a semiconductor single crystal substrate, the ferroelectric film of the MIS element is made a single crystal, and further in a system containing the semiconductor substrate and the single crystal ferroelectric film, as an evaluation function based on an ab initio molecular dynamics theory expressing objective characteristics, free energy of the entire system is picked up, and the above-mentioned single crystal ferroelectric film is arranged so that the free energy is minimized under the main operation conditions.

Furthermore, a method of manufacturing a field-effect type SiMIS semiconductor device is provided according to claim 13, wherein when the field-effect type MIS element is formed on an Si semiconductor single crystal substrate, a gate insulated oxide film of the MIS element is made a single crystal, and further in a system containing the semiconductor substrate and the single crystal ferroelectric film, as an evaluation function based on an ab initio molecular dynamics theory expressing objective characteristics of the system, free energy of the entire system is picked up, and the above-mentioned single crystal ferroelectric film is arranged so that the free energy is minimized under the main operation conditions.

Furthermore, a method of manufacturing a field-effect type SiMIS semiconductor device is provided according to claim 14, wherein when the field-effect type MIS element is formed on a Si semiconductor single crystal substrate, a gate insulated oxide film of the MIS element is made a single crystal, and further in a system containing the semiconductor substrate and the single crystal ferroelectric film, as an evaluation function based on an ab initio molecular dynamics theory expressing objective characteristics of the system, free energy of the entire system is picked up, and the above-mentioned single crystal ferroelectric film is arranged so that the free energy is minimized under the main operation conditions, and also oxygen defect concentration of the single crystal ferroelectric film is suppressed to be not more than 0.01%.

Furthermore, a method of manufacturing a field-effect type SiMIS semiconductor device is provided according to claim 15, wherein when the field-effect type MIS element is formed on a Si semiconductor single crystal substrate, a gate insulated oxide film of the MIS element is made a single crystal, and further in a system containing the semiconductor substrate and the single crystal ferroelectric film, as an evaluation function based on an ab initio molecular dynamics theory expressing objective characteristics of the system, free energy of the entire system is picked up, and the above-mentioned single crystal ferroelectric film is arranged so that the free energy of the system is minimized under the main operation conditions, and in particular a roughness of local energy is set to exist within the deviation value 3 and oxygen defect concentration of the single crystal ferroelectric film is suppressed to be not more than 0.01%.

Hereinafter, these optimizing procedure and trial results are described.

In the present invention, for example, PZT system perovskite is picked up as an example as the single crystal ferroelectric film and also a Si surface is set to be (100) surface, for example. This substrate surface may be, for example, Cu of a FCC structure as a metal electrode. The most material problems are replaced by the problems how the crystal position relationship between the single crystal ferroelectric film PZT system perovskite and the Si (100) surface is established. In the present invention, the entire energy of the system is picked up as the evaluation function being the essential part in the present invention.

Further, a Si/PZT interface is picked up as this system. The inventors etc. have beforehand prepared energy expressing equations as the strict evaluation function and have found out that, by using these equations, the position relationship between the perovskite as PZT and the Si (100) under applying conditions is optimized in the following manner. Namely, we have found out that a median line of an angle made by an axis a1 and an axis a2 of a C4v structure expression of the perovskite is aligned with a [110] axial direction on the Si (100) surface, and that an axis c is inclined and a first Si position and a third Si position coincide with Si on the Si (100) surface, so that the optimum value can be obtained. Further, at this time, it is simultaneously indicated that an allowable range of an oxygen loss is within 0.01% in the PZT. FIG. 34 shows a conceptional view proposed by the present invention invented in this manner.

A description on FIG. 34 will be in detail made. An upper half of FIG. 34a shows a plane view of a single lattice on the Si side. A lower half thereof is a perspective view of a PZT surface. Further, in FIG. 34b, it is pointed out that lines coupling with perovskite toward a [110] Si direction are arranged in parallel, most preferably. At this time, the detail will be described later, and it is necessary that an axis C of perovskite is inclined in order to make a straight line coupling with silicon in parallel to the [110] Si. Thereby, according to the calculation of the inventors etc., we have found out that the entire energy is reduced by more 10%, as compared with the case where the lines coupling perovskite with Si are simply arranged in parallel and the axis C is not inclined. Besides, we further considered that this embodiment is actually used for an element, and we have found out that, if the oxygen loss is within 0.01% in the PZT, original characteristics of the single crystal perovskite are sufficiently indicated.

The problems of interface energy designated in the present invention influence considerably the element characteristics, as described below. The energy due to mismatching generated on the interface formed with the ferroelectric film and the substrate is easy to form negative atoms, so that this accelerates a formation of an interface level. A prevention of a conductive phenomenon and a reduction in reliability are led by this interface level. Further, defects such as an abnormal bond or the like are generated even in the film, so that this has possibility of causing a level. In the present invention, an allowable range of these defects is initially indicated.

The MIS characteristics prepared in the present invention are compared with the prior art. In the present invention, a CD method was used as means capable of evaluating effectively the interface level in particular. In the characteristics in the present invention, variations of data were precisely indicated. In the case of the present invention, it is understood that values of the interface level are reduced to be about 1/10 of the prior art. Further, it is seen that mobility of the MIS element in the present invention is also enhanced by about 12% when it is evaluated under the same electric field conditions. Further, the reliability was also enhanced.

The inventors etc. will explain in detail the procedure that we invented the novel axial relationship which have not existed. FIG. 35 is a constitutional view of an entirely novel strict ab initio and molecular dynamics simulator prepared by the inventors etc. An upper portion of FIG. 36 is a portion of the ab initio and a lower portion thereof is a portion of the molecular dynamics simulator. The inventors have for the first time indicated employing this simulator what, for example, a structure of perovskite is like. FIG. 37 is a perspective view of perovskite that the inventors etc. could indicate the strict structure for the first time. A big ball in FIG. 37 denotes oxygen and a small ball denotes Pb. An axis Z shows an axis C of perovskite, and as is apparent from FIG. 37, as the surfaces of perovskite and Si are uneven as shown in FIG. 37, it is well-understood that it is extremely difficult to presume whether or not a certain surface of perovskite is aptly connected with the corresponding surface of Si.

Furthermore, we aimed at an oxide film for precision check of the above-mentioned molecular dynamics simulator and carried forward comparison works of spectrum data. Namely, we read out a locking mode, a streching mode, or the like of O—Si—O mode or Si—O—Si mode from locations etc. of Si atoms or oxygen atoms moment by moment to acquire peculiar frequency from these numerical values. When comparing these with actual detected values, we obtained 490 cm-1 for 440 cm-1 and 1111 cm-1 for 1100 cm-1, respectively, which are within a proper range. Further, when pressure is applied, it is understood that a fact that the strength of O—Si—O mode increases coincides finely with the actual detected value.

The inventors carried forward these verification works, while we also calculated the case where a very large compression stress is applied to the PZT. It was understood that gains of the entire energy are caused with such-formed construction as an interface.

A region etc. used for the calculation will slightly be discussed in detail. In the calculation, on the Si substrate side, a several-ten atomic layer is assumed in a vertical direction, further a several-ten atomic layer is assumed in a longitudinal direction on the surface and further a several-ten atomic layer is assumed in a right and left direction, to set a calculation area. Further, in perovskite, a several-ten atomic layer is assumed with respect to the lengths, widths and heights, respectively.

We found out the new position relationship by the unknown approach by which we went through. The inventors developed a strict integrating equation of a strict ion coupling potential with respect to a region containing the ferroelectric film and the Si single crystal. The conventional approach lacks strictness and in particular cannot accurately acquire energy of the system. The inventors will succeedingly make clear the conventional defects and unclear places in the specification.

The inventors will be able to explain as follows: The inventors established a new simulator which has never been seen, and for one example, calculated the single crystal of the ferroelectric film, specifically the perovskite.

Hereinafter, the simulator that the inventors prepared will also slightly be explained while comparing it with the prior art. For example, we first describe the oxide film. Three kinds of potential between O and O, between O and O and between Si and Si must strictly be expressed. Actually, it is extremely difficult to express the total potential between Si and O, between O and O and between Si and Si, and an integrating amount on the three kinds infinitely gives forth by a member of a distance r. Further, as a coulombic part potential afar trails the skirt, the calculation itself cannot be brought to an end, and in a little bit strict calculation, an Ewald's system was used in the conventional approach. However, as described later, the calculation lacks the strictness.

The approach used by the inventors when an arrangement is actually made will now be shown. In the present invention, the simulator prepared initially by the inventors will be shown.

The inventors earnestly discussed and constructed a new own ab initio molecular dynamics system according to the rule of computative physics. The new trial became possible because this new system was constructed. Hereinafter, the system invented by the inventors etc. will in detail be interpreted.

In the present invention, $SiO_2$ was adopted as an example, but it was also confirmed that the others could be used if numbers of elements etc. are only replaced with each other.

The entire construction of the new simulator proposed by the inventors etc. is described in FIG. 35. The inventors proposed a new approach obtained by composing the molecular dynamics portion (MD) and the density functional theory (DFT). First, the proper use between the molecular dynamics system and the density functional theory system by the inventors will now be shown with reference to FIG. 36.

As shown in FIG. 36, the molecular dynamics (MD) portion occupies a lower half of a flow chart, and the density functional theory (DFT) portion occupies an upper half. The molecular dynamics system treats a rather large system at a so-called finite temperature which is not OK, and a potential which have beforehand been acquired from the first principle is used as a potential between atoms (ions). On the other hand, the density functional theory (DFT) was used when acquiring basal conditions of a small system. Of course, a temperature in the portion of the DFT was set to be OK. The potential portion was acquired from the basal conditions of the electronic system. Specifically, a wave function (KS equation) was solved and the local density functional theory (DFT) was used together therewith.

The calculation procedure of the simulator by the inventors etc. will actually be described with the use of Si and O as an example. In the DFT portion, the entire energy of the basal conditions of the non-degenerate electronic system. is initially acquired. The electron density is a functional theory $E[n(\gamma_1)]$ of electron density $n(\gamma_1)$ (without going upstream until the wave function).

Namely, $$E[n(\gamma_1)]=\int n(\gamma_1)V_z(\gamma_1)d+\int\int\{2n(\gamma_1)n(\gamma_{1'})\}/(|\gamma_1-\gamma_{1'}|)d\ d'+T_s[n(\gamma_1)]+E_{xc}\psi[n(\gamma_1)] \quad (2061)$$

$V_z(\gamma_1)$ of the 1st member on the right side denotes an external field such as a coulombic part field of a nucleus, the 2nd member denotes coulombic part reciprocal action energy between electrons, and the 3rd member denotes kinetic energy when the inter-electronic reciprocal action is not exerted by supposing an integral approximation of electrons and is expressed as follows:

$$T_s[n(\gamma_1)] = \sum_{i=1}^{N} \int \psi_i \cdot (\gamma_1)(-\nabla^2)\psi_i(\gamma_1)d \quad (2062)$$

The 4th member denotes exchange correlation energy and its shape corresponds to a local density approximation. The electron density $n(\gamma_1)$ is represented as follows:

$$n(\gamma_1) = \sum_{i=1}^{N} |\psi_i(\gamma_1)|^2 = \sum_{i=1}^{N} \psi_i^*(\gamma_1)\psi_i(\gamma_1)d \quad (2063)$$

In the basal conditions, when a derivation of E[n( )] of the equation (2061) is set to be 0, the following KS equations (Kohn-Sham equations) are obtained:

$$[-\nabla^2 + V_{eff}(\gamma_1)]\psi(\gamma_1) = \psi(\gamma_1) \quad (2064)$$

$$VC_{eff}(\gamma_1) = V_2(\gamma_1) + \int 2n(\gamma_1)/(|\gamma_1 - \gamma_1|)n\gamma_1 + \delta E_{xc}\psi[n(\gamma_1)]/\delta n(\gamma_1) \quad (2065)$$

The above equations are solved, and N pieces are adopted from the smaller value of a peculiar value E. As n($\gamma_1$) enters the equation (2065), $n(\gamma_1)$, $\psi(\gamma_1)$, $V_{eff}(\gamma_1)$, the above equation must be solved in a self-consistant manner.

Energy $\epsilon_{xc}(n)$ per electron is multiplied by electron density n and integrated in the local density approximation (LDA) to obtain exchange correlation energy $E_{xc}[n(\gamma_1)]$.

$$E_{xc}\psi[n(\gamma_1)] = \int \epsilon_x \psi(n(\gamma_1))n(\gamma_1)d \quad (2066)$$

Various shapes of $\epsilon_{xc}(n)$ are proposed as equations such as Wigner or the like. Further, when only a valence electron is handled without considering an inner shell, the coulombic part field of a nucleus is not used as it is as $V_z(\gamma_1)$ of the equation (2065) but replaced by a norm preservation pseudopotential erasing singularity at a position of the nucleus. It is leveled like this, so that a number of components in Fourier expansion can be suppressed.

As the entire energy, the inventors etc. use energy containing the coulombic part potential among atoms (ions) to ensure a strictness. Namely, $$E = \sum_{i=1}^{N} \psi_i^*(\gamma_1)(-\gamma_1^2)\psi_i(\gamma_1)d + U(n(\gamma_1), \{R_1\}, \{\alpha\gamma_1\}) \quad (2071)$$

wherein {R1} is coordinates of the nucleus of ions and $\{\alpha\gamma_1\}$ is external restriction conditions (volume $\Omega$, strain $\epsilon$, etc.). The first member on the right side from the equation (2071) is $T_s[n(\gamma_1)]$ on the right side from the equation (2065) of the DFT, and the remainder on the right side of the equation (2065) is a part of U of the equation (2071). Similar to the case of the DFT, the portion is represented by $V_{eff}(\gamma_1)$ from the equation (2065) of the integral approximation, and after all, $Vz(\gamma_1)$ is replaced by the pseudopotential to use.

In the present invention, a new method of thinking was introduced. E is deemed as potential energy to introduce another vertical kinetic energy:

$$E = \sum_{i=1}^{N} \mu \int |\dot{\psi}_1|^2 d + \sum_{i=1}^{} \frac{1}{2}M_1 \dot{R}_1^2 + \sum_{i=1}^{} \frac{1}{2}\mu_\gamma \dot{\alpha}_\gamma^2 \quad (2072)$$

Accordingly, Lagrangian is as follows:

$$L = K - E \quad (2073)$$

In the equation (2073), $M_1$ is a mass of real atoms (ions), but $\mu$, $\mu$ are virtual masses and is changed in response to an object as described below. Since the following regular perpendicular conditions:

$$\int \psi_i^*(\gamma_1,t)\psi_k(\gamma_1,t)d = \delta_{ik} \quad (2074)$$

are imposed as bound conditions, when an Euler equation is made, an undetermined multiplier $\Lambda_{ik}$ is introduced, and L is added to the following equation:

$$\sum_{i,k} \Lambda_{ik} \left[ \int \psi_i^*(\gamma_1,t)\psi_k(\gamma_1,t)d - \delta_{ik} \right] \quad (2075)$$

A derivation is taken from the above resultants. As the results, $$\mu\ddot{\psi}(\gamma_1,t) = -(\delta E/\delta\psi_i^*(\gamma_1,t)) + \sum_k \Lambda_{ik}\psi_k(\gamma_1,t) \quad (2076)$$

$$M_1 \ddot{R}_1 = -\nabla_{R1} E \quad (2077)$$

$$\mu_\gamma \ddot{\alpha}_\gamma = -(\delta E/\delta\alpha) \quad (2078)$$

A temperature T of the kinetic energy of the equation (2073) corresponds thereto. Since the respective degrees of freedom have temperatures by the energy etc. distributive law of classic statistical dynamics, if mentioning from the relationship among $\Sigma$, $M_1$ and 12, the temperature is not virtual but actual. Further, it is possible to suppress or reinforce i according to the size of $\mu$, $\mu$.

For example, if T->0 from a high temperature as $\mu$, $M_1$, $R_1$ is stopped while $\psi_i$ is changed, to obtain the basal conditions of the electronic system. At this time, the left side of the equation (2076) becomes 0, and from the equation (2071) and the below notice, the right side becomes as follows:

$$[\nabla^2 - V_{eff}(\gamma_1)]\psi_i(\gamma_1) + \Sigma\psi_k(\gamma_1) \quad (2079)$$

Therefore, $\{\Lambda_{ik}\}$ appropriately making a linear coupling of $\psi_i$ is made a diagonal line to obtain the KS equation (2064). In short, the same results as those obtained by solving the KS equation by the DFT were obtained by a simulated annealing. However, the conditions of the temperature T are made not by a Monte Carlo method but by a motion of a virtual dynamic system. Therefore, it is called a dynamical simulated annealing (DSA).

When the equation (2076) is integrated, $\psi_i$ is not necessarily treated as a variable as it is, and expansion coefficients (namely, Fourier coefficients) that it is expanded by plane surface waves can be treated as a variable. In order not to thoughtlessly increase a number of these expansion coefficients, it is necessary that, similar to the case of the DFT, singularity is erased at a position of a nucleus by the pseudopotential. In particular, when periodicity of crystal can be utilized, the linear coupling of $\psi_i$ making $\{\Lambda_{ik}\}$ described above as a diagonal line is described as $\Phi_{nk}$. k denotes a wave number vector within a Brillouin band and n denotes a band index. $\Phi_{nk}$ should be satisfied with:

$$\mu\ddot{\Phi}_{nk}(\gamma_1,t) = [\nabla^2 - V_{eff}(\gamma_1)\Phi_{nk}(\gamma_1) + \lambda_{nk}\Phi_{nk}(\gamma_1,t)] \quad (2081)$$

$\lambda_{nk}$ is a peculiar value of the matrix $\{\Lambda_{ik}\}$ and an energy level. $\Phi_{nk}(t)$ is expanded to obtain a reciprocal lattice vector.

$$\phi_{nk}(K,t) = \sum_G \psi_{n,K+G}(t)\exp[i(K+G) \cdot r] \tag{2082}$$

If the pseudopotential is local (these conditions are not generally satisfied), a valid potential $V_{eff}$ is also expanded.

$$V_{eff}(K,t) = \sum_G V_G(t)\exp[i^{G \cdot K}] \tag{2083}$$

The equation (2075) and the equation (2076) are substituted for the equation (2074).

$$\mu \sum_G C_{n,K+G}(t)\exp[i(K+G)^K] = \tag{2084}$$
$$\sum [-|K+G|^2 + \lambda_{nk}]\psi_{n,K+G}(t)\exp[i(K+G)^K] -$$
$$\sum_{G'}\sum_{G''} V_{G''}(t)\psi_{n,K+G}(t)\exp[i(K''+G'+K)]$$

When G=G+G' is placed in the last member on the right side, as Σexp[i(K+G)] is common to the all members, it is removed to obtain the following equation:

$$\mu C_{n,K+G}(t) = [-|K+G|^2+\lambda_{nk}]\psi_{n,K+G}(t)-\Sigma V_{G-G'}(t)\psi_{n,K+G'}(t) = -[|K+G|^2+V_0(t)-\lambda_{nk}]\psi_{n,K+G}(t)-\Sigma V_{G-G'}(t)\psi_{n,K+G'}(t) \tag{2085}$$

Next, frequency is defined.

$$\omega = ((|K+G|^2+V_0(t)-\lambda_{nk})/\mu)^{1/2} \tag{2086}$$

The left side of the equation (2085) is corrected as a difference to obtain the following equation:

$$\psi_{n,K+G}(t+\Delta t)=2\text{os}(\psi\Delta t)\psi_{n,K+G}(t)-\psi_{n,K+G}(t-\alpha t)-2[1-\psi\text{os}(\psi\Delta t)]\{\Sigma_{G',G}V_{G-G'}(t)\psi_{n,K+G'}(t)\} \tag{2087}$$

Since this equation is analytically integrated an oscillation portion, it is possible to reduce a calculation amount by increasing Δt more than in a pure numerical system.

The Coulombic part potential is obtained as follows: When the inventors resolved it, we found out that it is divided into four members. In particular, there were three members in the prior art, but we newly confirmed existence of the 4th member. These systems will be described successively. As described below, the inventors first started to solve from a fundamental equation to which a dielectric constant is added as a departure of a strict equation. Initially, a fundamental equation is defined.

$$V_{(\varepsilon=\infty)} = V_{(\varepsilon=1)} - 2\pi/3L^3\left|\sum_i Z_i K_i\right|^2 \tag{2091}$$

The coulombic part potential in the case of a conductor $\varepsilon=\infty$ is different from that in the case of a vacuum $\varepsilon=1$, and L is one edge of a (cubic) unit crystal, Σ is taken within the unit crystal and Zi, oxygen i and an electric charge and a position of the i-st particle. This is because polarization generates on an inner surface of a sphere by the electric charge in the sphere. A layer of a dipole is formed on an inner surface of the unconducted sphere, but the last member of the above-mentioned equation works so as to just cancel the effects. Since, in the Ewald's system, $\varepsilon=\infty$ is given on the left side, the last member of the above-mentioned equation must be added to acquire a value in the vacuum. Only the resultants are described. There are often made some errors in the conventional derivation even in this portion.

The coulombic part potential is as follows:

$$\phi = \sum_{i=1}^{N}\sum_{j=1}^{N}{}' \sum Z_i Z_j / (|m+K_j-K_i|) \tag{2092}$$

N denotes a number of atoms in a unit crystal, $\gamma_1 i$ and $Z_i$ denote a position and an electric charge of the first atom therein, and x, y and z denote vectors designating the unit crystal and a substance sliding it periodically and are set as described below.

$$m=n_x Z_x+n_y Z_y+n_z Z_2 \tag{2093}$$

wherein $n_x$, $n_y$, and $n_z$ denote vectors of an edge in x, y and z directions, respectively, and $n_x$, $n_y$ and $n_z$ denote integers ranging from $-\infty$ to $+\infty$, respectively (in the case of bulk crystal). – of Σ' means that J=i is excluded at the time of n=0.

Next, a new F function is introduced, $$F(K) = \int_0^\infty 2/\sqrt{\pi}\sum_{j=1}^N\sum_n Z_j\exp[-|n+K_j-K|^2 t^2]dt \tag{2094}$$
$$\int_0^\infty G(K,t)dt$$

wherein $G(\gamma_1,t)$ denotes a periodic function. We found out that this can be expressed by a Fourier series.

The inventors etc. further deform this as described below.

$$G(K,t) = 2\pi/(L_x+L_y+L_z)\sum_{j=1}^N\sum_m \exp[-\pi^2|m|^2+2\pi im(K-K_j)] \tag{2095}$$

wherein m denotes a reciprocal lattice.

$$m=m_x(1/L_x,0,0)+m_y(0.1/L_y,0)+m_z(0,0,1/L_z) \tag{2096}$$

Indexes $m_x$, $m_y$ and $m_z$ are integers ranging from $-\infty$ to $+\infty$, respectively. As, at the time of =, exp [ . . . ]=1 is set, $\Sigma Z_i=0$ is obtained, and if the gross electric charge in the unit crystal is 0, the member of m=m is erased. The member of m=m has beforehand been excluded.

$$G(K,t) = \tag{2097}$$
$$2\pi/(L_x+L_y+L_z)\sum_{j=1}^N\sum_m{}' Z_j/t^3\exp[-\pi^2|m|^2+2\pi im(K-K_j)]$$

The inventors etc. divided the integration range by k and separately used two shapes of $G(\gamma_1,t)$.

$$F(\ ) = \int_0^{*k} 2\pi/(L_x+L_y+L_z) \tag{2101}$$
$$\sum_{j=1}^N\sum_m{}' Z_j/t^3\exp[-\pi^2|m|^2+2\pi i(K-K_j)]$$
$$\int_k^\infty 2/\sqrt{\pi}\sum_{j=1}^N\sum_n Z_j\exp[-|n+K_j-K|t^2]dt$$

Therein, the inventors etc. used the following equation as a formula:

$$\int_0^k 1/t^3 \exp[-a^2/t^2]dt = 1/2a^2 \exp[-a^2/k^2] \qquad (2102)$$

$$\int_k^\infty \sqrt{\pi} \exp[-b^2/t^2]dt = 1/b\,\mathrm{erfc}(kb) \qquad (2103)$$

Thereby, the first coulombic part potential is as follows:

$$\phi = 1/(L_x+L_y+L_z)\sum_{j=1}^N \sum_m{}' Z_j/|m|^2 \exp[-\pi^2|m|^2/k^2]\cos[2\pi m(K-K_j)] +$$

$$1/2\sum_{j=1}^N \sum{}' Z_jZ_i/|n+K_j-K|\mathrm{erfc}(k|m+K_j-K|) +$$

$$1/2\sum_{i=1}^N \sum Z_i \lim\{Z_i/|K_i-K|\mathrm{erfc}(k|K_i-K|) - Z_i/|K_i-K|\}$$

A mark — on the upper right side of $\Sigma'$ means that, at the time of m=m, J=i is excluded. Further, $$1/2\sum_{i=1}^N Z_i \lim_{s\to 0} Z_i/s\left(2/\sqrt{\pi}\int \exp(-t^2)dt - 1\right) = \qquad (2105)$$

$$1/2\sum_{i=1}^N Z_i^2 \lim_{s\to 0}(2/\sqrt{\pi}\,K\exp(-K^2s^2)) = -\sum_{i=1}^N K/\pi \sum Z_i^2$$

This has nothing to do with a force because is not included. Further, this can be transformed as follows:

$$\sum_i\sum_j Z_iZ_j\cos[2\pi K(K_i-K_j)] = \qquad (2106)$$

$$\sum_{i=1}^N Z_i\cos[2\pi K_i]\sum_{j=1}^N Z_j\cos[2\pi K_j] +$$

$$\sum_{i=1}^N Z_i\sin[2\pi K_i]\sum_{j=1}^N Z_j\sin[2\pi K_j] =$$

$$\left(\sum_{i=1}^N Z_i\cos[2\pi m_i]\right)^2 + \left(\sum_{i=1}^N Z_i\sin[2\pi m_i]\right)^2$$

Therefore, $$1/(L_x+L_y+L_z)\sum_{j=1}^N \sum_m{}' Z_j/|m|^2 \exp\Bigg[ \qquad (2111)$$

$$-\pi^2|m|^2/K^2\left(\sum_{i=1}^N Z_i\cos[2\pi mK_i]\right)^2 + \left(\sum_{i=1}^N Z_i\sin[2\pi mK_i]\right)^2\Bigg]$$

The resultants obtained so far are summarized and the coulombic part potential is finally described as follows:

$$\phi = 1/2\sum_{i=1}^N \sum_{j=1}{}' \sum Z_jZ_i/|m+K_i-K_j|\phi^{(1)} + \phi^{(2)} + \phi^{(3)} \qquad (2112)$$

-continued $$\phi^{(1)} = 1/2\sum_{i=1}^N \sum_{j=1}{}' \sum Z_jZ_i/ \qquad (2113)$$

$$|m+K_j-K|\mathrm{erfc}(K|m+K_j-K_i|)$$

$$\phi^{(2)} = 1/2(L_xL_yL_z)\sum_m^N{}' 1/ \qquad (2114)$$

$$|m|^2\exp[-\pi^2|m|^2 + K^2|((\sum Z_i\cos[2\pi m\cdot K_i])^2 +$$

$$(\sum Z_i\sin[2\pi m\cdot K_i])^2)$$

$$\phi^{(3)} = -K/\sqrt{\pi}\sum Z_i^2 \qquad (2115)$$

$$\phi^{(4)} = 2\pi/(3L_xL_yL_z)\left|\sum_{i=1}^N Z_iK_i\right|^2 \qquad (2116)$$

Therein, $$m=n_x(L_x,0,0)+n_y(0,L_y,0)+n_z(0,0,L_z)$$

The points where the above-mentioned expressions are convenient are a fact that the member of original $\Sigma$ is not damped in order of an inverse number, and on the other hand, in $\Phi(1)$, the member of $\Sigma$ is abruptly damped due to a factor of erfc, and in $\Phi(2)$, the member of $\Sigma$ is abruptly damped due to a factor of exp. Since a speed in the damps in $\Phi(1)$ and $\Phi(2)$ is exerted to a reverse direction to that in the damp in $\Phi(3)$, an appropriate k is selected so that the both are balanced. This is the resultants that a contribution of a coulombic part force is calculated sequentially from a place near in a distance, and moreover, this is the resultants when the surroundings are conductors. One more member is added when the surroundings are vacuum. This is a portion which has not in particular been taken notice of.

A rotational point group prepared by the inventors etc. is shown below using FIG. 40. Si atoms are placed at a center (0, 0, 0) of a sphere of a radius r, and four oxygen atoms are placed in a position of a vertex of a regular tetrahedron on a spherical surface. A position of atoms C can be designated by an Euler angles ($\theta$, $\Phi$). In order to represent it with coordinates (x, y and z), with respect to a vector (0, 0, $\tau$) directing to the North Pole, first, a rotation of $\theta$ about an axis y is only made and then a rotation of $\phi$ about an axis z is only made.

The rotation matrix is as follows:

$$R(\theta,\phi) = \begin{pmatrix} \cos\theta & n\phi & 0 \\ -\sin\phi & \cos\phi & 0 \\ 0 & 0 & 1 \end{pmatrix} \times \begin{pmatrix} \cos\theta & \sin\theta & 0 \\ 0 & 1 & 0 \\ -\sin\theta & 0 & \cos\theta \end{pmatrix} \qquad (2117)$$

$$= \begin{pmatrix} \cos\phi\cos\theta & \sin\phi & \cos\phi\sin\theta \\ -\sin\phi\cos\theta & \cos\phi & -\sin\phi\sin\theta \\ -\sin\theta & 0 & \cos\theta \end{pmatrix}$$

Therein, when one out of four oxygen atoms is placed on the North Pole (0,*) and further $\phi$ is indefinite and denoted by $\ne$, positions of the other three oxygen atoms are respectively represented as (109° 28", $\psi$), (109° 28', $\psi+120°$) and (109° 28', $\psi+240°$) by an undetermined angle $\psi$. Accordingly, when $\cos\theta=-1/3$, $\sin\theta=2\sqrt{2}/3$ and $\phi$ are respectively set to be $\psi$, $\psi+120°$ and $\psi+240°$ in the equation (2061), the results are acted on t(0,0,r), in order to obtain the following coordinates (x,y,z):

$$r\begin{pmatrix} 2\sqrt{(2)/3}\cos \\ -2\sqrt{(2)/3}\sin \\ -1/3 \end{pmatrix}, r\begin{pmatrix} 2\sqrt{(2)/3}\cos(\psi + 120) \\ -2\sqrt{(2)/3}\sin(\psi + 120) \\ -1/3 \end{pmatrix}, \quad (2121)$$

$$r\begin{pmatrix} 2\sqrt{(2)/3}\cos(\psi + 240) \\ -2\sqrt{(2)/3}\sin(\psi + 240) \\ -1/3 \end{pmatrix}$$

The R($\phi$, $\theta$) of the equation (2061) is only acted as it is in order to direct the first oxygen atoms directing to the North Pole to ($\theta$, $\phi$). As the results, the inventors etc. acquired as described later. The coordinates (x,y,z) of the four oxygen atoms are as follows:

$$R(\phi, \theta)\begin{pmatrix} 0 \\ 0 \\ r \end{pmatrix} = rR(\phi, \theta)\begin{pmatrix} 2\sqrt{(2)/3}\cos(\psi) \\ -2\sqrt{(2)/3}\sin(\psi) \\ -1/3 \end{pmatrix} \quad (2122)$$

$$rR(\phi, \theta)\begin{pmatrix} 2\sqrt{(2)/3}\cos(\psi + 120) \\ -2\sqrt{(2)/3}\sin(\psi + 120) \\ -1/3 \end{pmatrix} = \quad (2123)$$

$$rR(\phi, \theta)\begin{pmatrix} 2\sqrt{(2)/3}\cos(\psi + 240) \\ -2\sqrt{(2)/3}\sin(\psi + 240) \\ -1/3 \end{pmatrix}$$

The coordinates (x,y,z) of the four Si atoms in a unit lattice are represented by parameters a,b,c. When referring to FIG. 40, 2a is a common period in a vertical direction and in a lateral direction.

←I (0,0,0)
↑II (a,b,c)
↓III (a−b,a+b,2c)
—IV (−b,a,3c)
→V (0,0,4c)

Namely, when the first atom is placed on the origin, and a coordinate z rises by a constant value c and is made an orthogonal projection on a surface (x,y), a square is made with the use of ←, ↑, ↓ and —. The fifth atom is the next first atom of the unit lattice in which a coordinate z increases by 4c, and which exists directly above the first atom. As for the arrangement of four oxygen atoms belonging to each of the Si atoms, an arrangement relative to the Si atoms is rotated about an axis z by 90° s. Movements of the Si atoms as described above are added thereto. The equation (2061) may be used as it is as the coordinates (x,y,z) of four oxygen atoms surrounding the first Si atom, and the coordinates (x,y,z) of oxygen atoms surrounding the second, third and fourth Si atoms can be obtained by respectively acting:

Rotation of R(0, 90°) and parallel movement (a, b, c)
Rotation of R(0, 90°) and parallel movement (a, b, c),
Rotation of R(0, 180°) and parallel movement (a−b, a+b, 2c) and
Rotation of R(0, 270°) and parallel movement (−b, a, 3c)

with respect to the oxygen atoms surrounding the first atoms.

On the other hand, sets of I↑1 and ↓2, II↓1 and —2 and III—1 and →2 are respectively the same oxygen atoms, but these give the same associated equation as avove (as a matter of course). The oxygen atoms ←1 and ↑4 are slipped by one periodic portion 2a in a lateral direction.

As investigated in this manner, we further considered real process and investigated to what extent defect density is allowable. Namely, for example, 3200 pieces of Si and 3200 pieces of Ti are now prepared, and 0 to 100 pieces of oxygen defect was made therein. From a position etc. of the Si atoms and the oxygen atoms moment by moment in this case, the following matter came to appear. First, we investigated the connection between dynamic demeanor and PZT structure factors of the oxygen atoms and the Ti atoms.

When the oxygen defects exist in the single crystal PZT, disturbance is apparently exerted on even distant Ti and oxygen of several atoms-ahead as compared with the case of non-defects, and moreover mobility of point defects is considerably high. When these dynamic demeanor is compared with the case of the single crystal Si, it was understood that influences and ranges in the case of the PZT are extremely higher than Si. It is possibly considered that the active movements described above occur because ion coupling components are fairly contained in the PZT and the PZT has properties easy to polarize, accordingly a local loss works as a trigger and communicates with a potential change. The inventors etc. investigated in detail according to such procedure and found out that, if below 0.01%, it is sufficiently possible to lead out advantages on the single crystal ferroelectric film.

An atomic level calculation of a ferroelectric material by the inventors will hereinafter be described. The inventors etc. advanced a structure grasp at atomic levels of PTO, PZO or PZT, or a grasp calculation of the structure and the film characteristics. We report the resultants of calculation. As for an objective structure used in the atomic level calculation, there are (1) a substance that oxygen and Ti are respectively placed in a high symmetrical position in perfect crystal of PTO; (2) a substance that oxygen is slipped by 0.3 Å in perfect crystal of PTO; (3) a substance that one oxygen defect enters a portion along an axis c in (2) described above (FIG. 37); (4) a substance that one oxygen defect enters a portion along an axis a in (2) described above (FIG. 43); (5) a substance that T of PTO is replaced by Zr, and the like. In particular, in (5), a substance that Zr is replaced artificially by a layered form was executed. It was initially understood that operations of oxygen or Pb differed in the PTO, PZO or the like. We grasped an opportunity of "self-forming polarization" of the ferroelectric film therefrom. Further, we grasped the connection between an atomic arrangement of the ferroelectric film, a strain, a defect structure or the like and fundamental film characteristics etc.

A calculation at the atomic level of a most fundamental PbTiO$_3$ film will initially be shown. Concerning the case where a pulling strain is exerted; the case where a Pb position is slipped from a balance point as a trial (FIGS. 44 and 45); the case where the oxygen defects are generated or the like, we investigated whether or not an electric charge distribution being most fundamental is so acquired when acquiring the film characteristics. FIG. 44 shows a view of a unit cell of PbTiO$_3$ and further the case where Pb is slightly slipped from a central position. This acquires an equal returnability view of the electric charge distribution at this time. Further, FIG. 45 also shows a view of a unit cell and the case where a portion of Ti-oxygen coupling is strained. We came to understand the following points from these resultants.

(i) The entire has fairly many ion coupling components. Further, (ii) it was understood that almost most of electric charges is attracted to oxygen strong in the electronegative degree and next the electric charge exists about Ti. Further, (iii) as an electric charge distribution is symmetrical, the self-forming polarization does not occur as it is, but taking into consideration the oxygen "defect" or a position deviation of Ti, it is easily understood that local electrical neutrality is destroyed. Further, it was confirmed that a dielectric constant decreases by pulling.

A calculation result of finding an ideal stable structure of a PbTiO3 film composed of a point group C4v at 25° C. without thermal agitation will be explained. We found that the original point group C4v of stable energy is restored even if oxygen is shifted very slightly. It is generally understood that there will be a more stable equilibrium point if an oxygen position is shifted by 0.3 Å. We examined about this and found a stable position slightly away from the 0.3 Å position. An area around this position is the generally admitted position, to cause spontaneous polarization. We found for the first time that there are at least two stable points, one is at a simple cubic crystal and the other is slightly away from there.

An origin of polarization is an atomic position where the neutrality of charge is broken. This position is stable in terms of free energy. The above calculations show that oxygen plays an important role. Accordingly, oxygen deficiency may trigger polarization in terms of crystallography and electronics.

(1) The three kinds of atoms have each a local charge distribution.

(2) According to order in the periodic table, O, Ti, and Pb are (1s2, 2s2, 2p4), (1s2, 2s2, 2p6, 3s2, 3p6, 3d2), (1s2, 2s2, 2p6, 3s2, 3p6, 3d10, 4s2, 4p6, 4d10, 4f14, 5s2, 5p6, 5d10, 6s2, 6p2), respectively. The charge distribution of Pb is particularly large.

(3) The charge distribution of Ti is modified by adjacent O. To suppress this, halogens such as F, Cl, Br, and I may properly be used for replacement.

EXAMPLE 2

The above example relates to Si·PZT. A monocrystalline ferroelectric film may be a spinel $MgAl_2O_4$ film, a cerium oxide $CeO_2$ film, or a strontium titanate $SrTiO_3$ film. It is also possible to employ a film of aluminum oxide $Al_2O_3$, zirconium oxide $ZrO_2$, yttrium oxide $Y_2O_3$, stabilized yttrium zirconium YSZ, $PrO_2$, or calcium fluoride $CaF_2$, or a lamination thereof. It is also possible to sandwich silicon PZT between a monocrystalline ferroelectric film and a base silicon wafer or a base electrode.

It is important to reduce free energy when a voltage is applied. It is not always necessary to minimize strain energy. Our perovskite structure is based on this idea.

An actual measurement system according to the present invention will be explained. FIG. 47 shows a Sawyer-Tauwa circuit. The circuit involves a high-voltage transformer T, a known fixed capacitance Co, and a cathode ray oscilloscope CRO. If the capacitance Co is sufficiently larger than the capacitance of a ferroelectric sample, a secondary voltage of the transformer T is mostly applied to the sample. The secondary voltage is divided by a resistor Rd and is applied to an abscissa of the oscilloscope CRO. An oscillation on the abscissa is proportional to an electric field E in the sample. An oscillation on an ordinate of the oscilloscope CRO represents a terminal voltage, which is equal to DS/Co. Namely, a graph on the oscilloscope CRO indicates a D–E curve, and the absolute values of D and E are easily obtained from the oscillation on the ordinate. A spontaneous displacement Ds is obtained as D when a saturated part is extrapolated according to E=0. Spontaneous polarization Ps is equal to Ds. If this circuit is used to observe a paraelectric sample having no loss, it will show a straight line passing through an origin. A paraelectric sample having a loss cr a ferroelectric sample shows a hysteresis. In FIG. 48, a continuous line is a D–E curve according to the present invention, and a dotted line is a D–E curve according to the conventional PZT. As is apparent in the figure, the present invention provides a very large dielectric constant.

When a voltage is applied to an interface between a ferroelectric film and a substrate, non-conformity at the interface may produce energy. This energy must be minimized while keeping a practical quality allowance. Reducing the interface energy results in preventing a level that may interfere with conductivity and in improving reliability. The present invention estimates a preferable structure with the use of a new ab-initio/molecular dynamics simulator. This simulator employs no empirical models, and therefore, is able to completely estimate natural phenomena. The simulator is useful not only to estimate every energy to be produced in a system when a voltage is applied thereto but also to design a system that provides a required dielectric constant or a system that has required durability.

Calculating the properties of a two-dimensional sample has been mentioned above, and calculating the properties of a three-dimensional sample has been explained with reference to FIG. 8.

Actual comparison and diagnosis will be explained. A simulation result is transferred to the scheduler 13. At the same time, an actual experimental system provides monitored data every moment. These result and data are stored in the file 4. Data in the files 3 and 4 are synchronized by the scheduler and transferred to a comparison-test-diagnosis block in the comparison-test-diagnosis unit IV.

FIG. 49 schematically shows a clustering tool and an in-situ monitor. Monitored quantities are, for example, gas composition analysis, XPS signals, and FT-IR signals. These are averages in a given time space and are only a limited part of information. The present invention provides a method of comparing the limited information with a sufficient amount of calculated information. FIG. 50 shows graphic images displayed on a monitor according to the present invention.

FIG. 51 shows a temperature sequence serving as input data to the ab-initio molecular dynamics simulator of the present invention. FIG. 52 shows a concept of an atomic level estimation carried out by the simulator. The present invention is able to show reactions of atoms on a substrate and molecular dissociation.

FIG. 53 shows an atomic level estimation provided by the simulator of the present invention. This is an atomic view after depositing amorphous silicon on a substrate and annealing the same at about 600° C.

The simulator of the present invention is applicable not only to the silicon film but also to an oxide film.

FIG. 54 shows a simulation result of the simulator on $SiO_2$. The simulator provides Si—O—Si angles of $SiO_2$ every moment, Fourier-transforms them into natural frequencies, multiplexes them, and provides FT-IR spectra only by calculations. The estimated results are compared with actual measurements obtained every moment.

FIG. 55 shows an atomic level simulation result provided by the simulator of the present invention with respect to the input data of FIG. 51. The result is as expected.

FIGS. 56 to 69 show Si—Si distances and bond angles at different times and temperatures during the depositing, annealing, and solid-state forming of a silicon film according to the input data of FIG. 51.

The system of FIG. 1 employs the film property calculation unit 111 to calculate basic film properties. On the other hand, a system of FIG. 70 omits the film property calculation unit 111 and employs a process variation calculation unit 1 to calculate necessary properties. In this way, the present invention properly modifies the unit for calculating film properties depending on design requirements.

The present invention is capable of greatly reducing hardware and calculations compared with the prior art. For example, the process simulator TOPAZ with a memory of about 24 megabytes takes an execution time of several minutes as shown in FIG. 98. On the other hand, a process simulator SUPREM4 achieved on CRAY with a memory of 200 megabytes or more takes an execution time of one day because it considers viscoelasticity. Molecular dynamics and ab-initio calculation tools need memory capacity and execution time several times more than those the present; invention needs.

If the molecular dynamics and ab-initio calculation tools are fully used to estimate atomic dynamic behavior and optical properties, calculation costs will greatly increase. To solve this problem, the present invention provides a new mathematical technique and a new technique of using a simulator.

FIG. 99 is a flowchart showing an essential part of processing a concentration functional according to a conventional molecular dynamics simulator. This prior art sets a virtual mass and uses a Lagrangian for a whole system. This corresponds to the expression (1223) and to a known Car-Parrinello method. The prior art of FIG. 99 looks fast. However, it takes a whole day and night to calculate a single case even with a supercomputer such as CRAY. Accordingly, this prior art never serves a real-time diagnostic tool when calculating changes in various parameters.

BRIEF DESCRIPTION OF THE DRAWINGS

FIG. 9 is a view showing an example of input sequences of a general-purpose two/three-dimensional process simulator;

FIG. 10 is a view showing another example of input sequences of a general-purpose two/three-dimensional process simulator;

FIG. 12 is a schematic view showing Coulomb interaction in ionization;

FIG. 13 is a schematic view showing Coulomb interaction in ionization;

FIG. 14 is a schematic view showing Coulomb interaction in ionization;

FIG. 15 is a schematic view showing a simple atomic structure model;

FIG. 16 shows alkali metal halite molecule;

FIG. 17 is a table showing valence orbital index $\zeta$;

FIG. 24 is a table showing O—Si—O angle, Si—O—Si angle, and O—Si distance as results executed by the molecular dynamics simulator according to the present invention;

FIG. 28 is a table showing data as with precision in variation;

FIG. 29 is a table showing data as with precision in variation;

FIG. 30 is a table showing data as with precision in variation;

FIG. 32 is a table showing variation in process and execution combination according to the conventional simulation system;

FIG. 46 is a table showing a part of data derived from the simulator developed by the inventors of the present invention;

FIG. 73 is a characteristic view showing Raman's measured result in the prior art;

FIGS. 74A and 74B are views showing models to illustrate Raman's measured results in the prior art;

FIG. 100 is a view showing calculation procedures executed by the inventors of the present invention;

FIG. 108 is a view showing main stress distribution and maximum shear stress in trench oxidation if convolution coefficient is used;

FIG. 120 is a characteristic view showing change in stress due to difference of temperature rising steps;

FIG. 121 is a characteristic view showing change in stress due to difference of temperature rising steps;

FIG. 122 is a view showing calculation example of stress distribution;

FIG. 123 is a view showing oxidation temperature and compressive stress in a film in the seventh embodiment;

FIG. 124 is a view showing calculation results of change in IR spectrum because of atress application;

FIG. 125 is a view showing relationship between compressive stress in an oxidation film and shift of wave number of Si—O—Si asymmetric expansion peak;

FIG. 126 is a view showing a relationship between Qbd and frequency of occurrence of bond wherein an Si—O interatomic distance in first proximity is more than 1.8 Angstrom;

FIGS. 127A and 127B are views showing change in distribution of Si—O interatomic distance according to whether stress is applied or not;

FIG. 128 is a view showing relationship between dRAM generation and chip cost;

FIG. 129 is a schematic view showing steps of manufacturing a semiconductor device according to the conventional example; and FIG. 130 is a view showing clustered tool according to the conventional example.

DETAILED DESCRIPTION OF THE EMBODIMENTS

Various embodiments of the present invention will be described with reference to the accompanying drawings hereinbelow.

Embodiment 1

A first embodiment is directed to optical spectrum direct predict function which is one of significant features of the present invention.

To begin with, technology of high reliability oxide film design, its evaluation associated technology, and the like will be briefly discussed from the viewpoint of conventional technical level. As a publicly known publication, there is "The Physics and Technology of Amorphous $SiO_2$," Plenum Publishing Corporation, ISBN 0-306-42929-2, for example. In this publication, IR's results and Raman's results are set forth as optically measured results of various oxide films.

Figure 1:
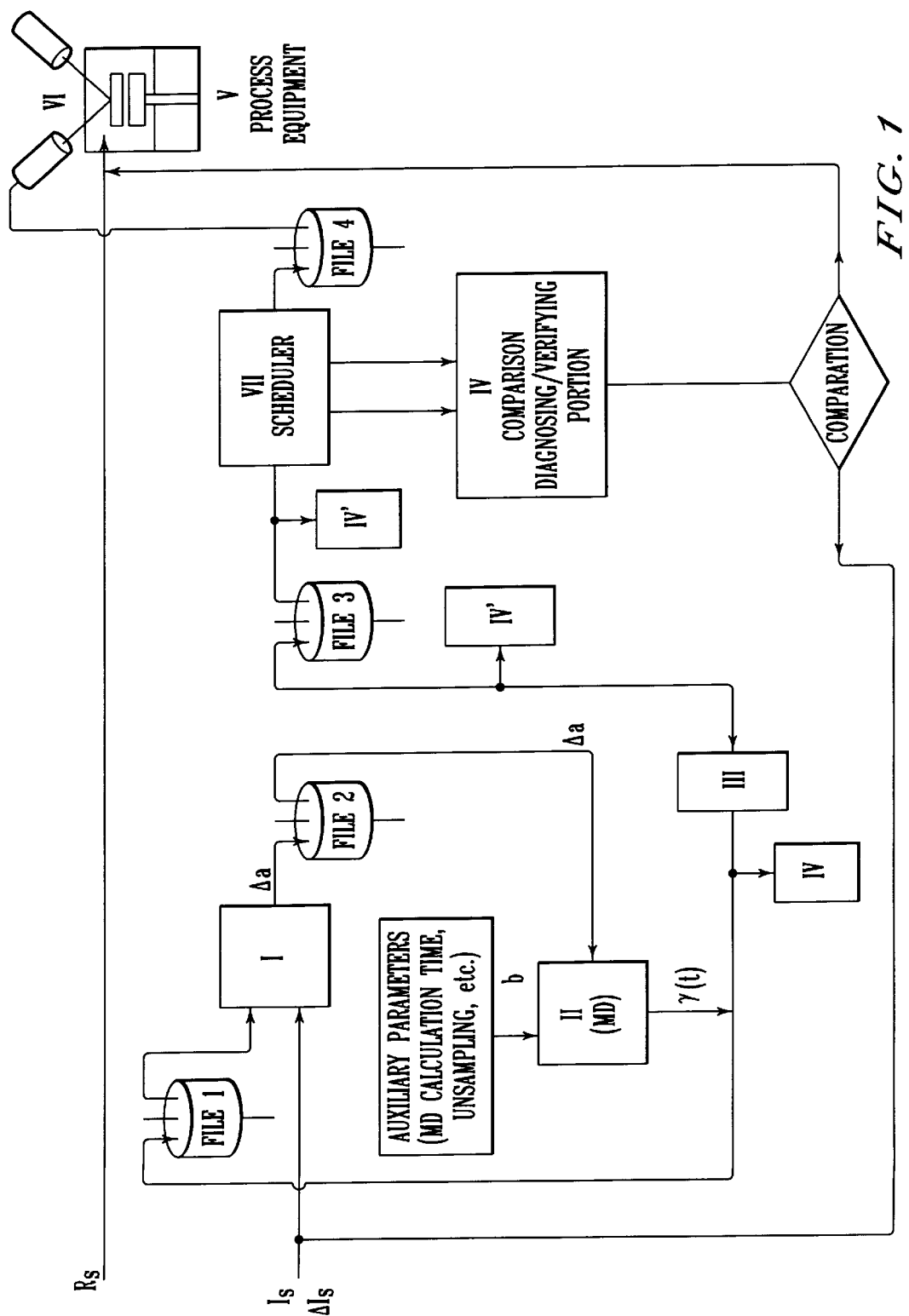
FIG. 1 is a schematic view showing overall structure of a system according to the present invention.
Figure 2:
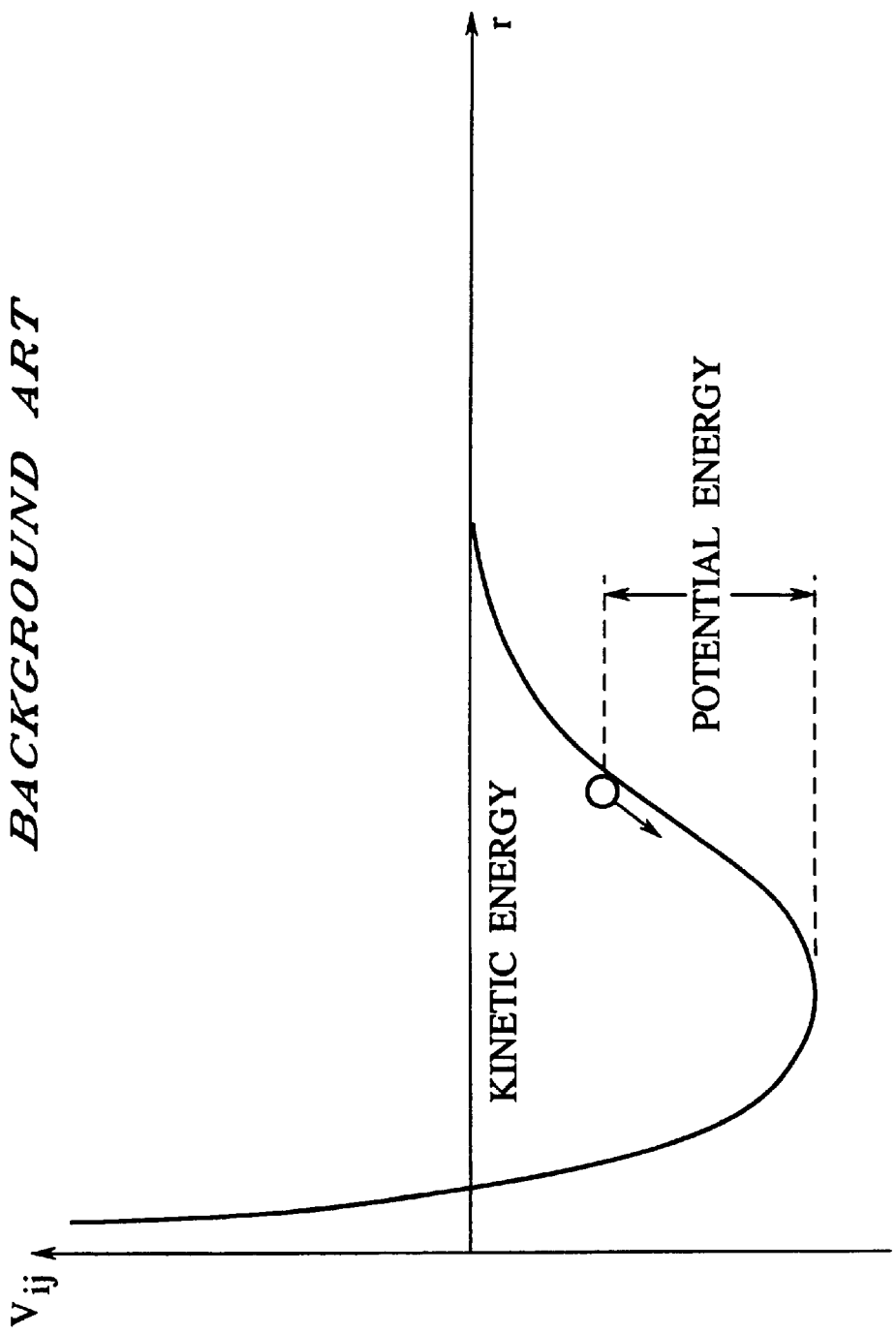
FIG. 2 is a view showing that gradients of the magnitude of potential in respective directions serve as force in respective directions.
Figure 3:
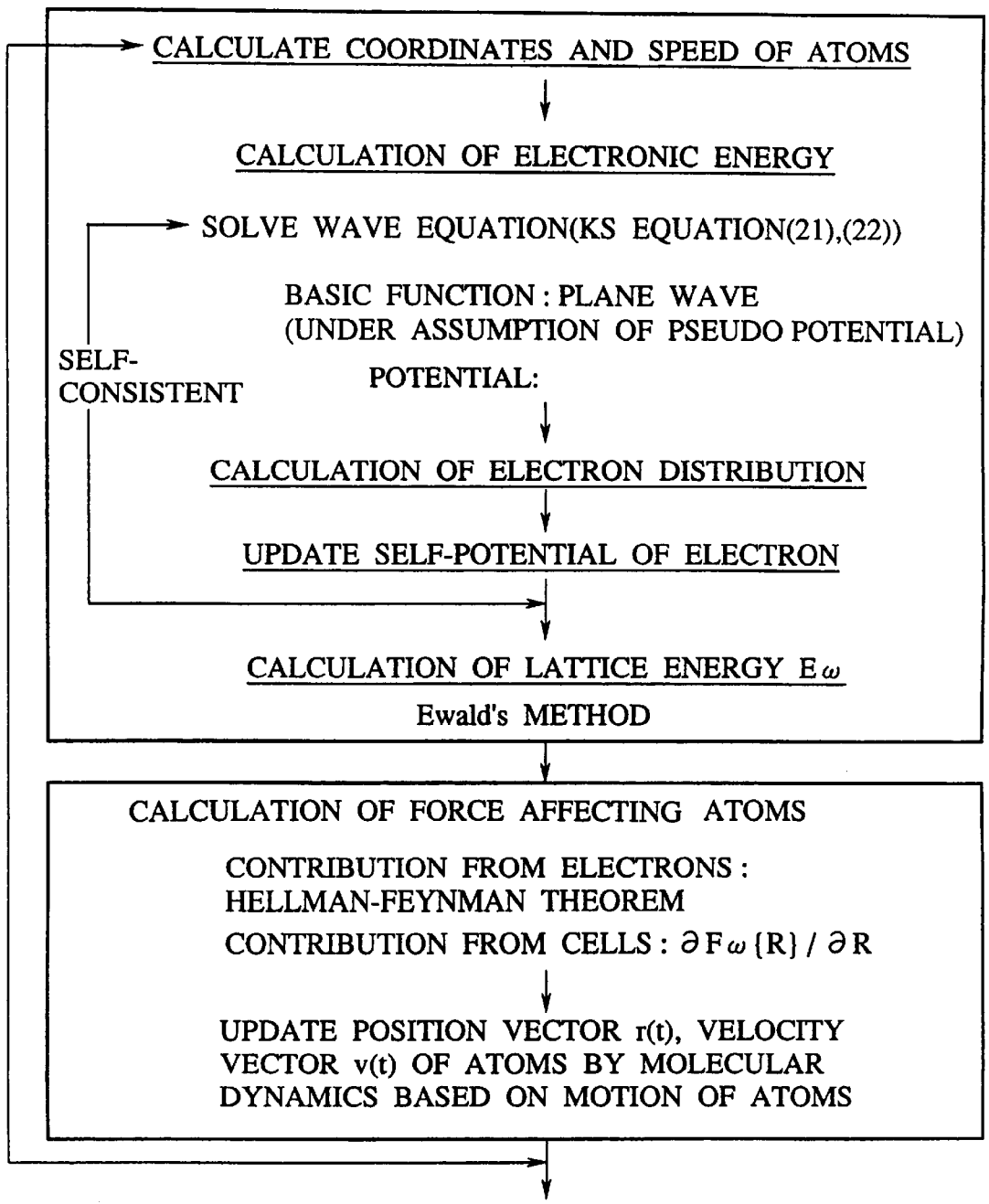
FIG. 3 is a view showing a new ab initio molecular dynamics simulation system utilized in the present invention.
Figure 4:
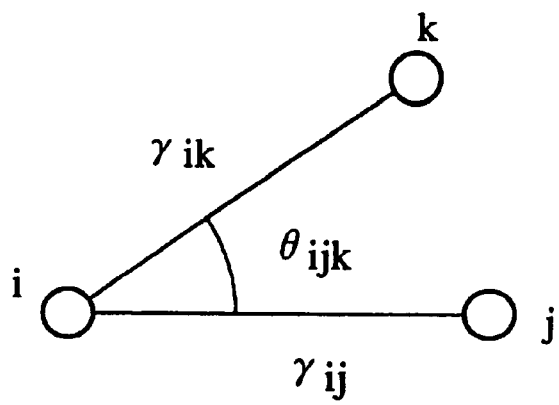
FIG. 4 is a view showing action which is affected to interaction between a first atom (i) and a second atom (j) by a third atom (k) via the second atom (J)
Figure 5:
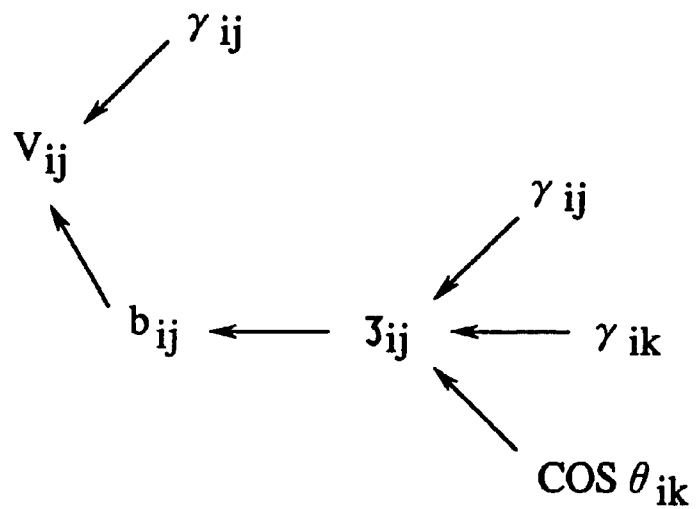
FIG. 5 is a view showing dependence relation between various physical properties, letting r be a distance between particles and θ be particle angle.
Figure 6:
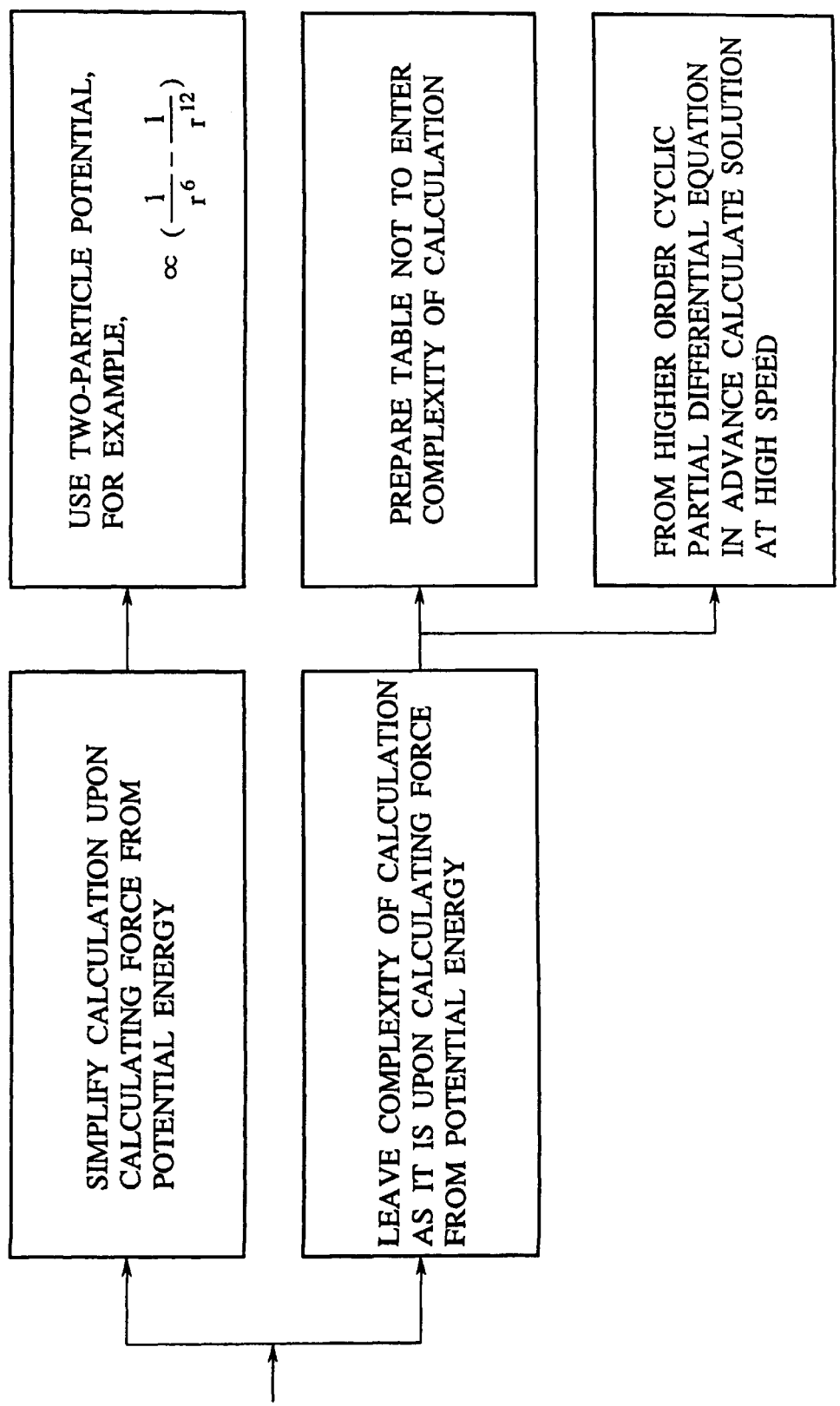
FIG. 6 is a view showing relationship between a higher order cyclic partial differential method according to the present invention and a calculation approach in the prior art.
Figure 7:
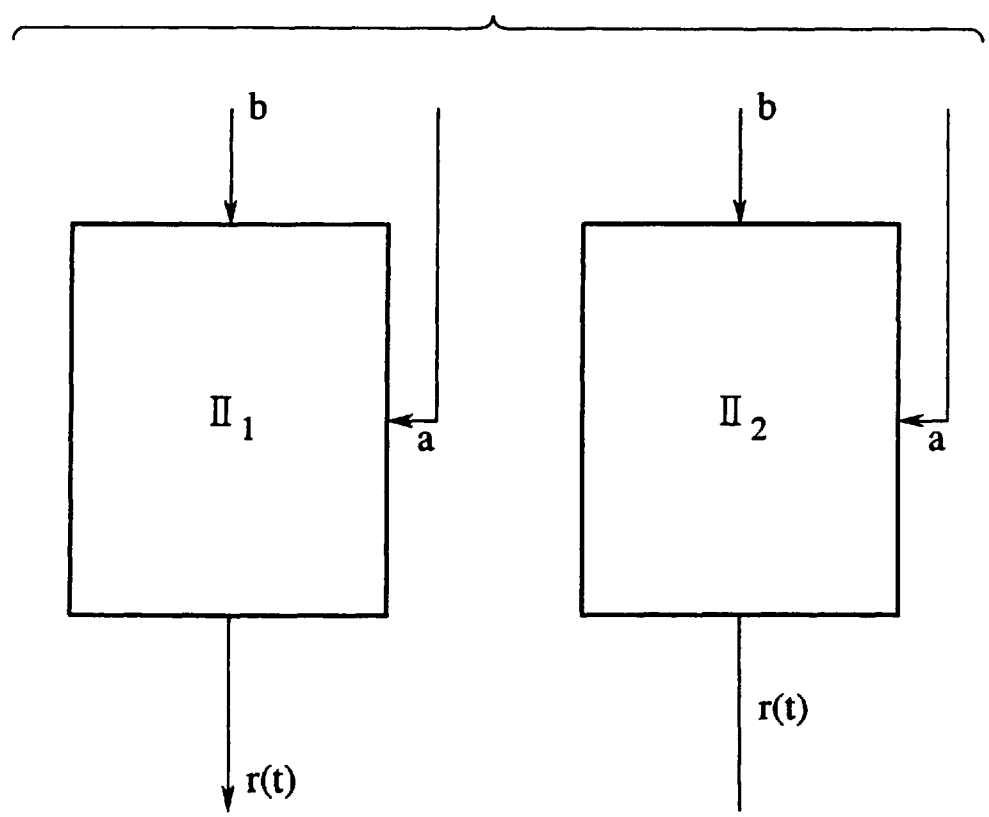
FIG. 7 is a diagram of a molecular dynamics simulator according to the invention having two parts.
Figure 8A:
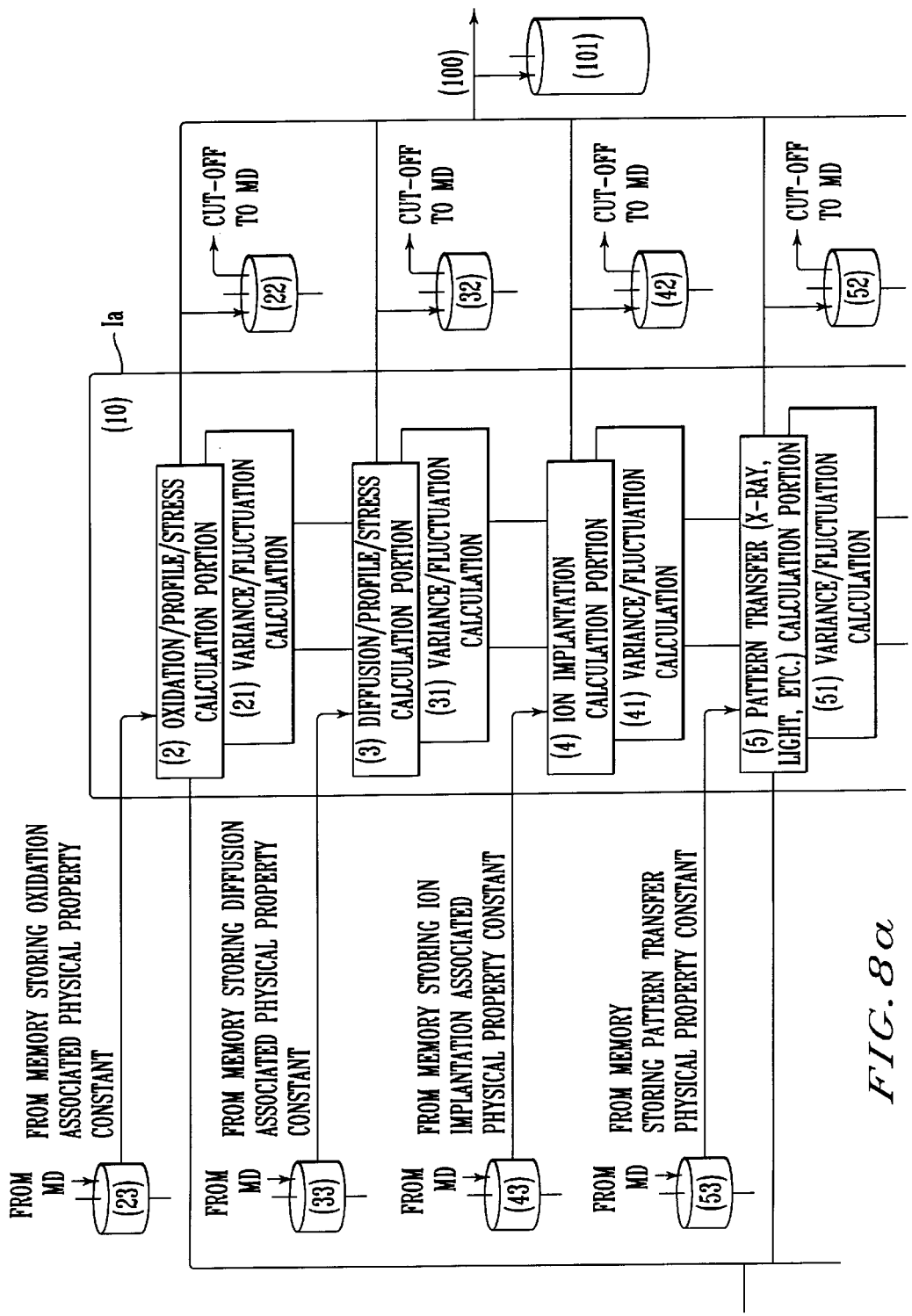
FIG. 8 is a diagram showing an overall diagram of a simulator according to the invention.
Figure 8B:
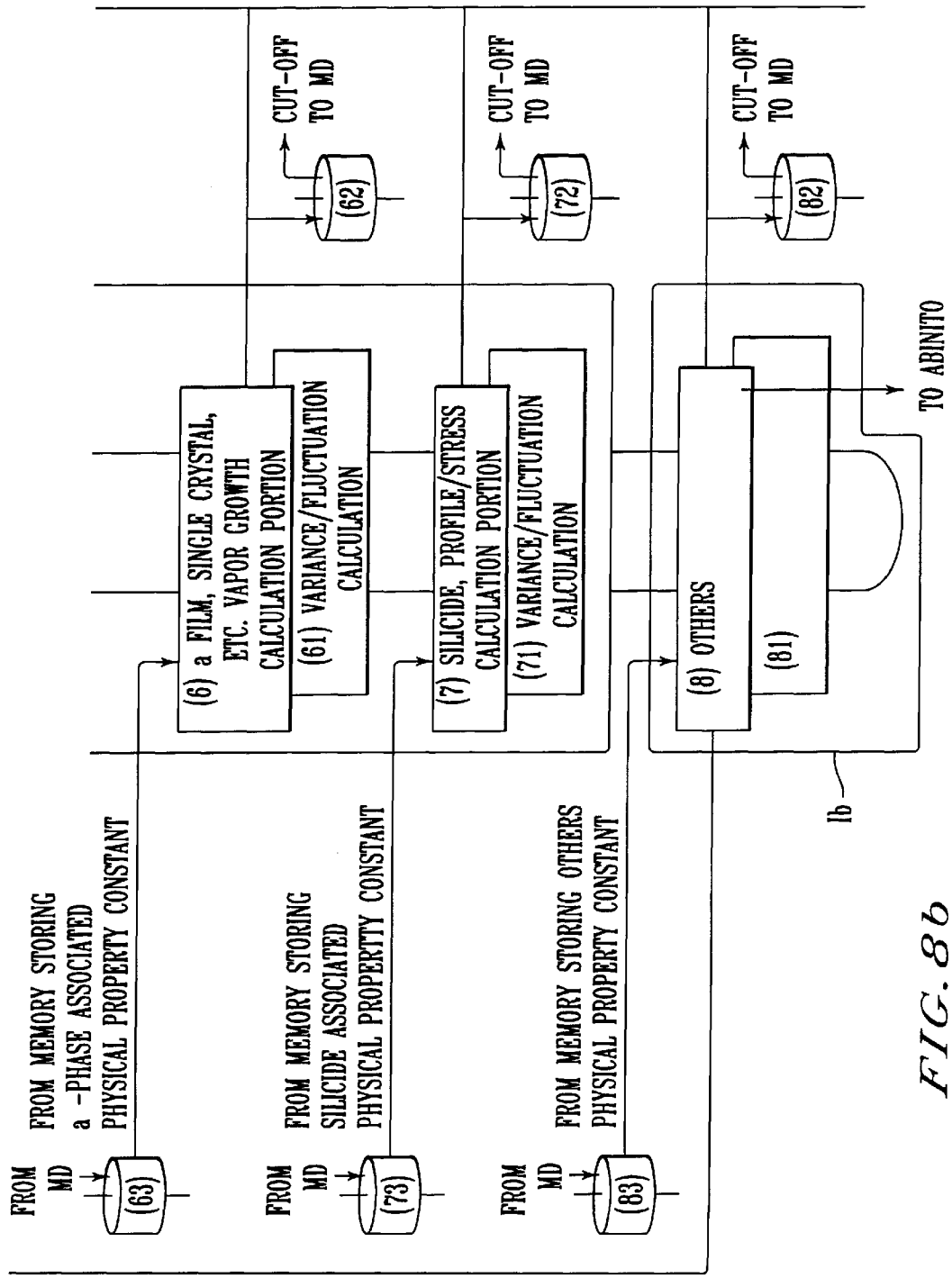
Figure 11:
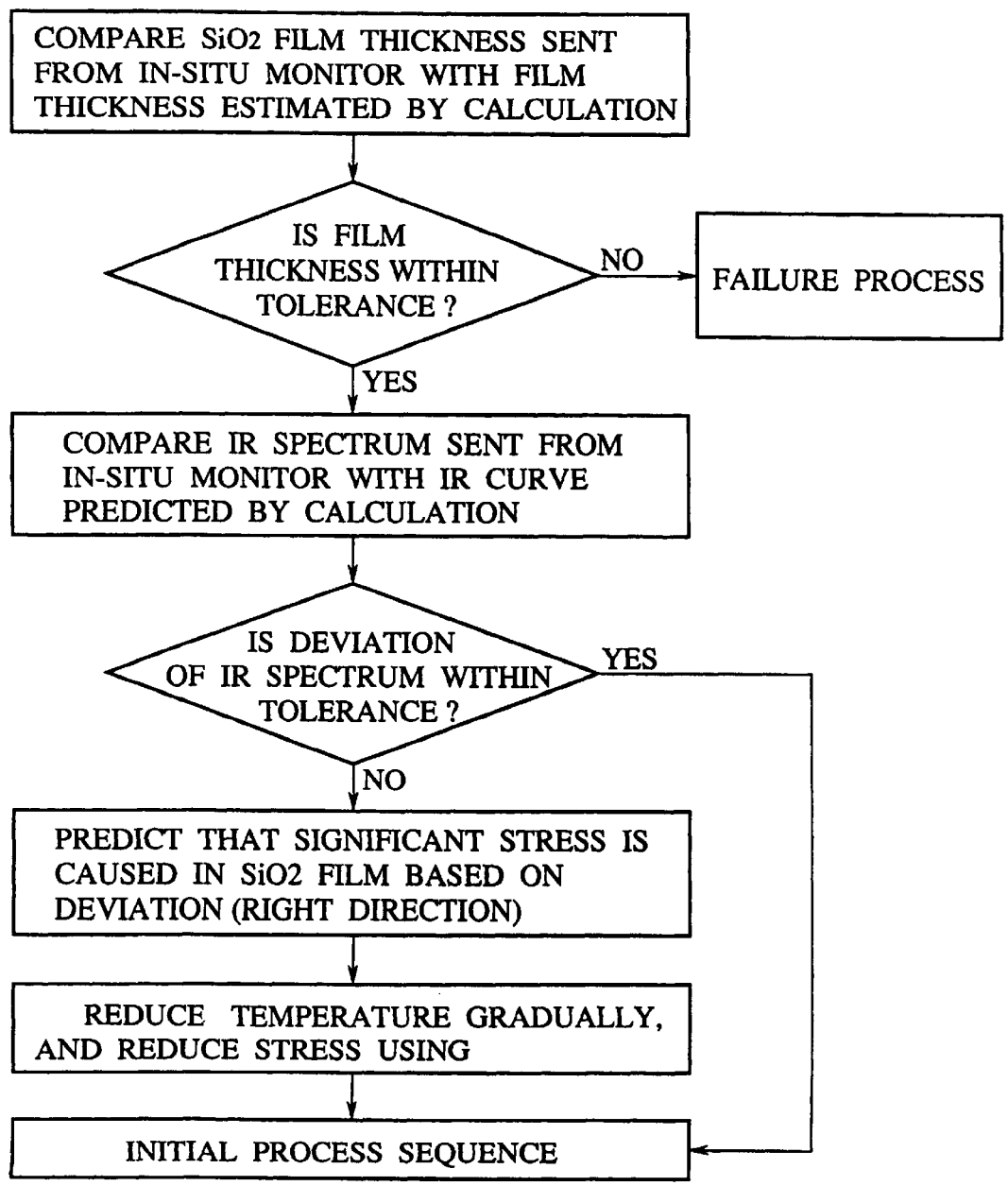
FIG. 11 is a view a part of a binary tree according to an embodiment of the present invention.
Figure 18:
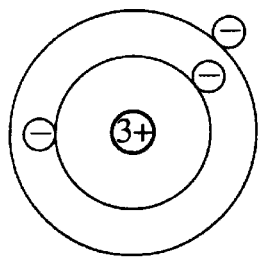
FIG. 18 shows charges obtained by solving a matrix (2063)
Figure 19:
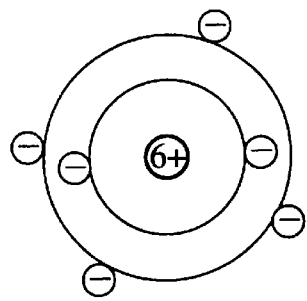
FIG. 19 shows charges obtained by solving a matrix (2063)
Figure 20:
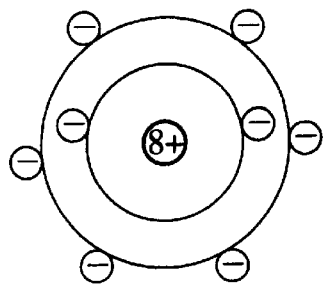
FIG. 20 shows charges obtained by solving a matrix (2063)
Figure 22:
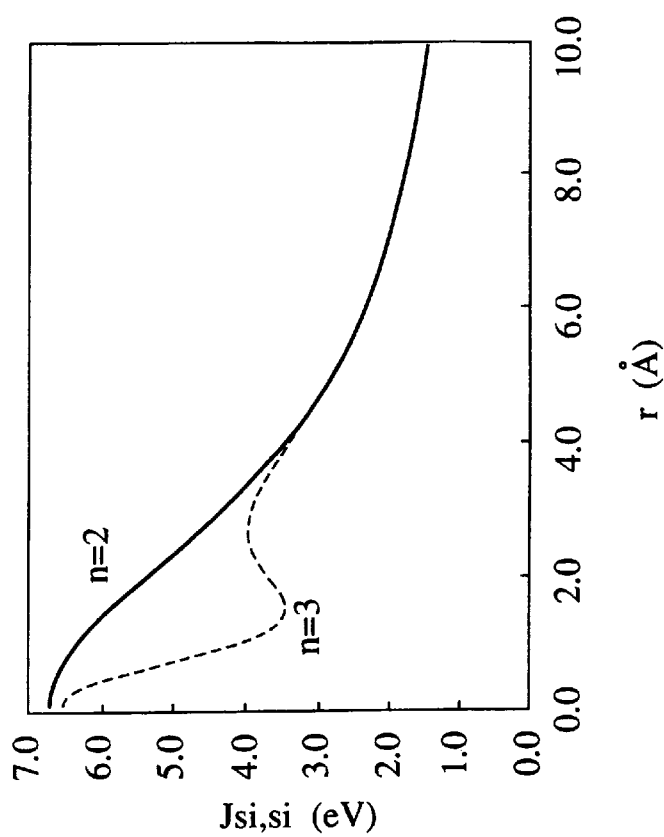
FIG. 22 shows calculation results of JAB if a state in which charge of 0 is 2S, and Si is 2s or 3s is modeled.
Figure 21:
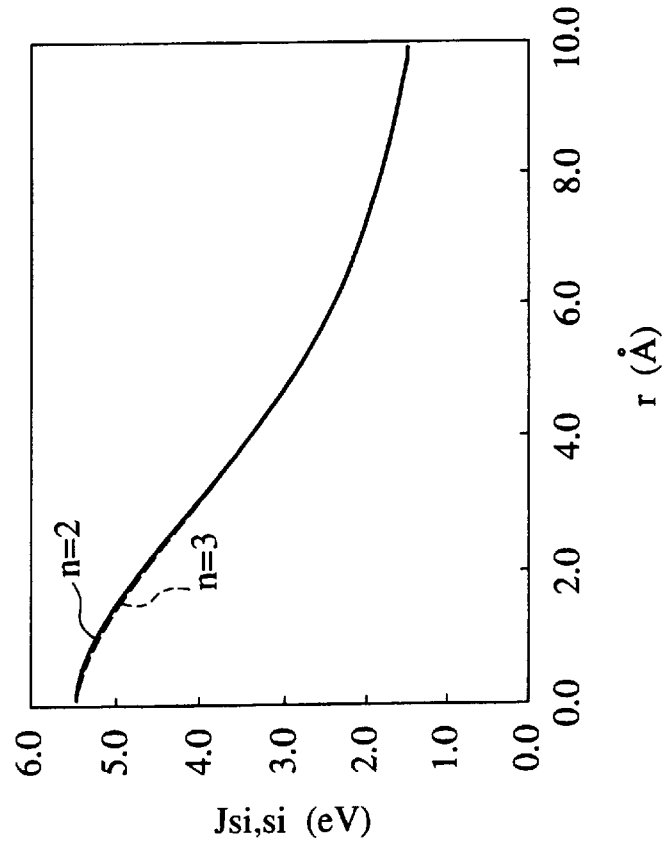
FIG. 21 shows a calculation result of Coulomb interaction J between Si—Si.
Figure 23:
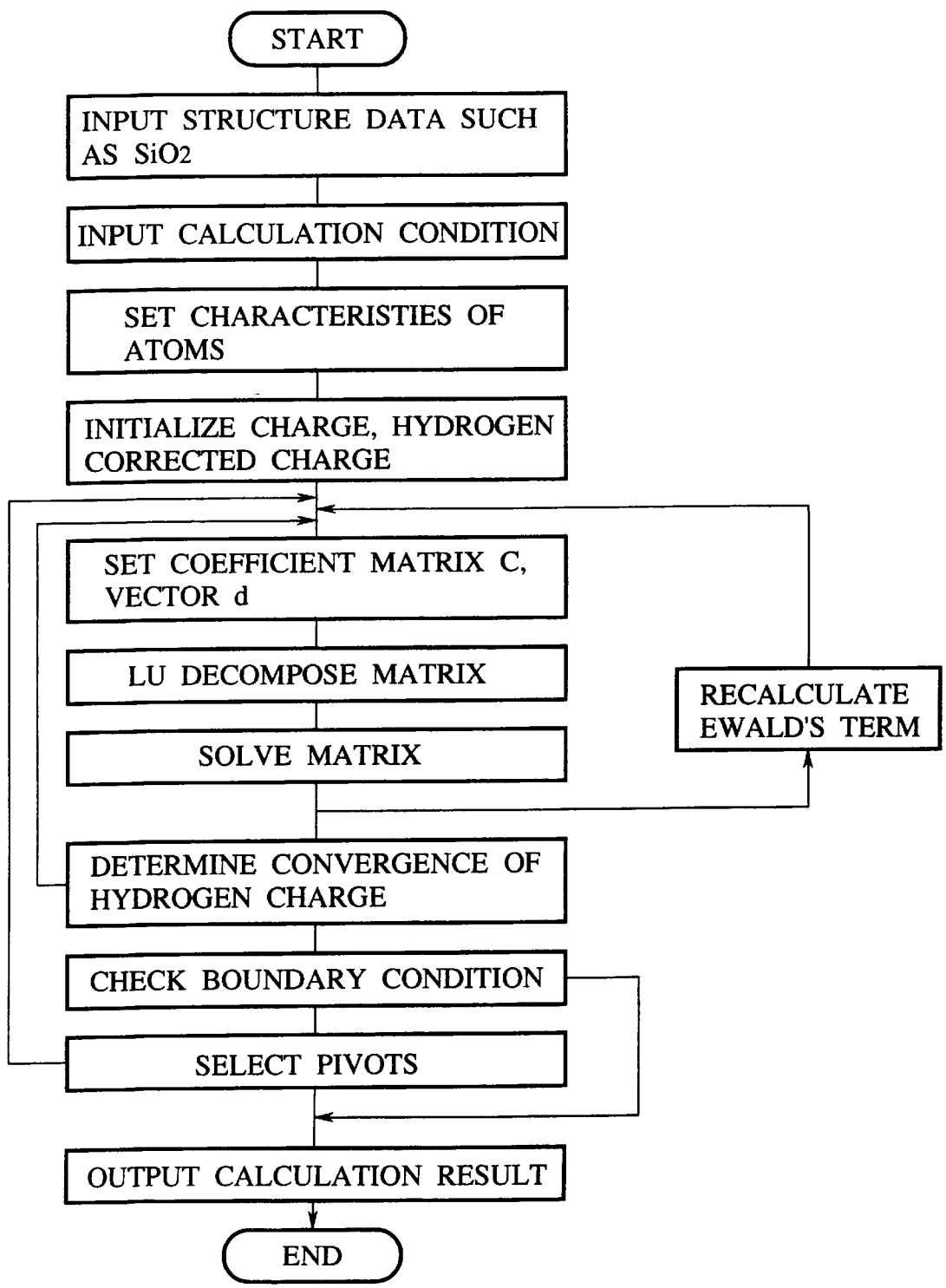
FIG. 23 is a flowchart showing procedures of a charge calculation method newly developed for use in a crystal system and an amorphous system.
Figure 25:
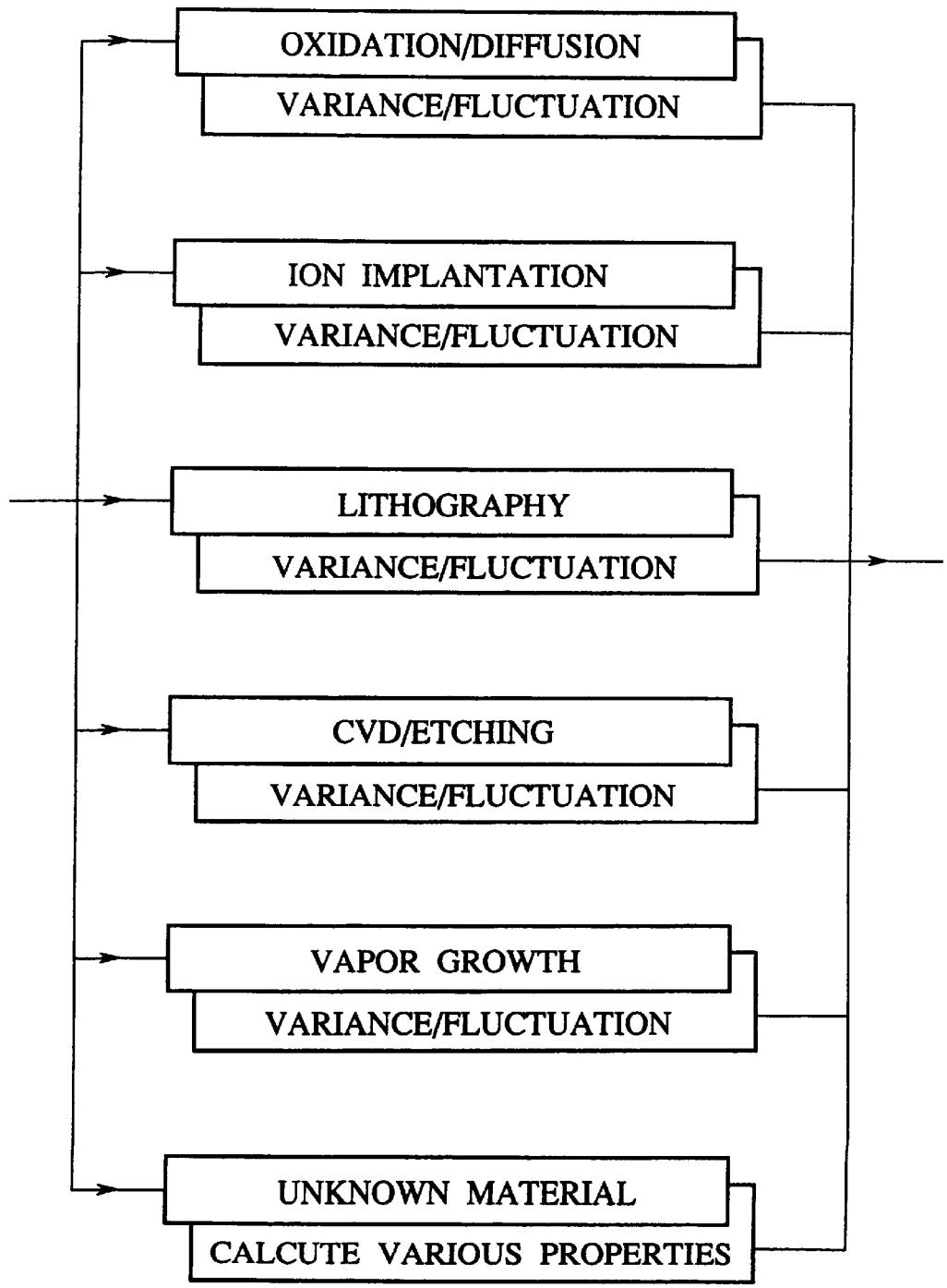
FIG. 25 is a view showing subroutines including variation calculation in the conventional simulator system.
Figure 26:
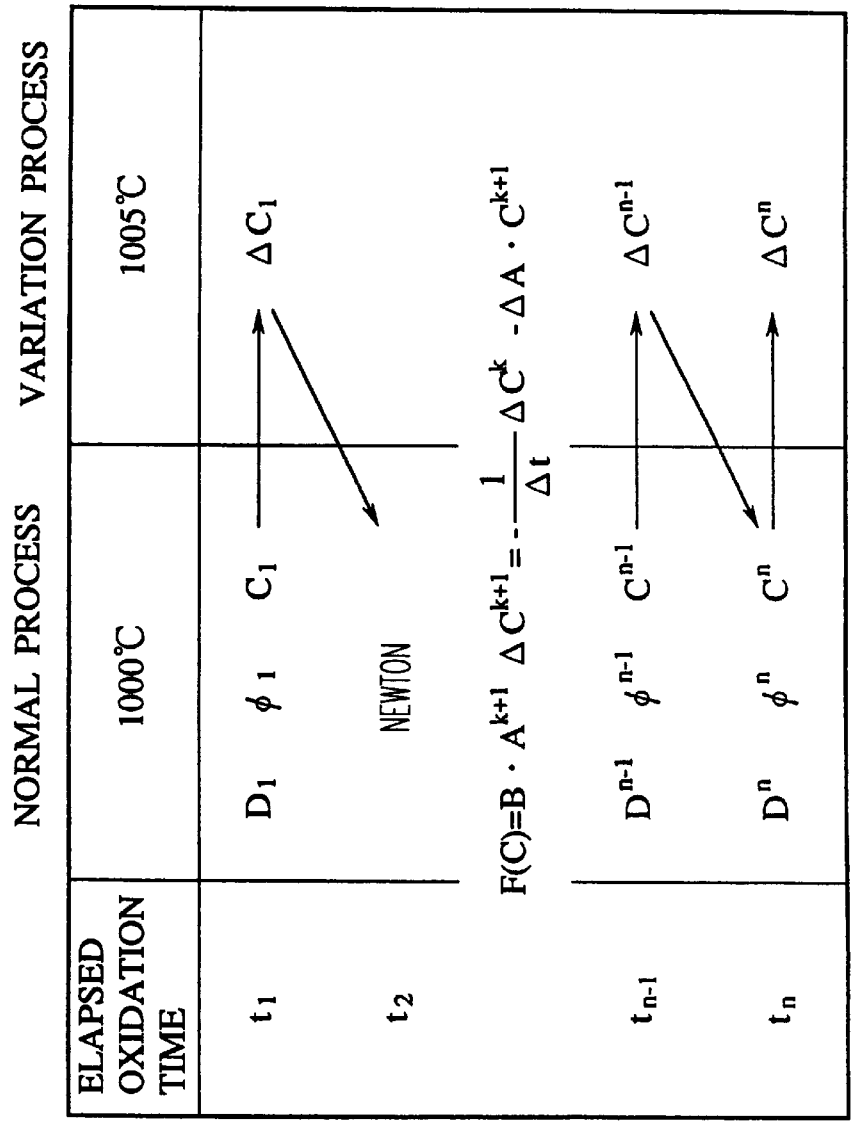
FIG. 26 is a view showing procedures of variation calculation in the conventional simulator system.
Figure 27:
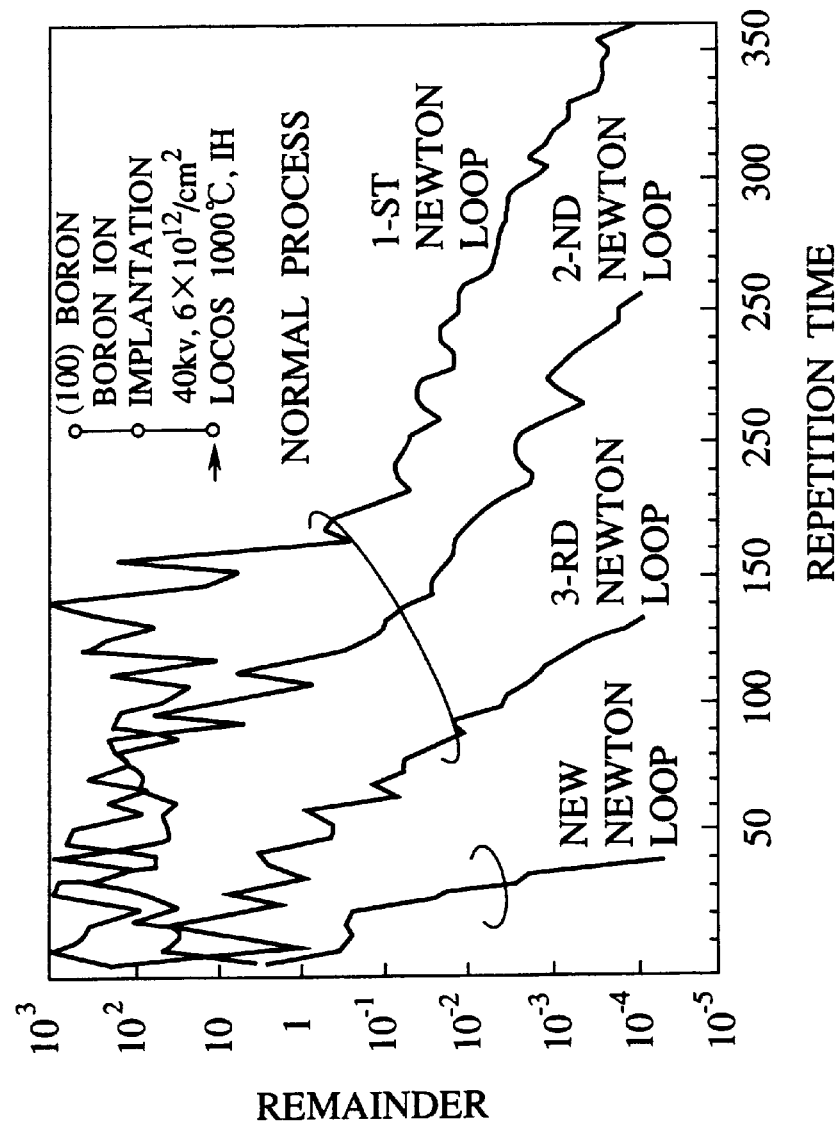
FIG. 27 is a characteristic view showing convergence states of the conventional process and variation process.
Figure 31:
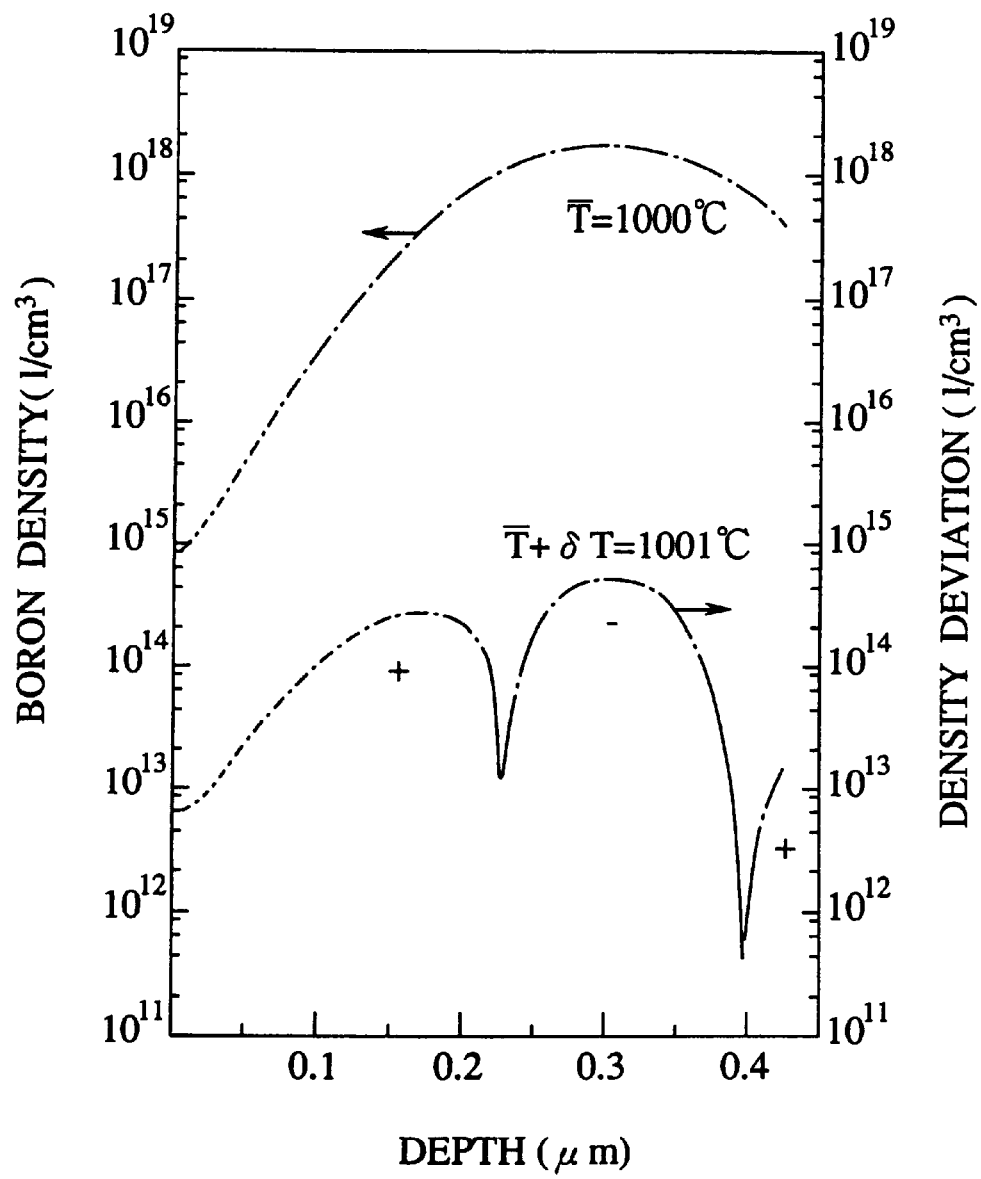
FIG. 31 is a view showing impurity distribution and its variation according to the conventional simulation system.
Figure 33:
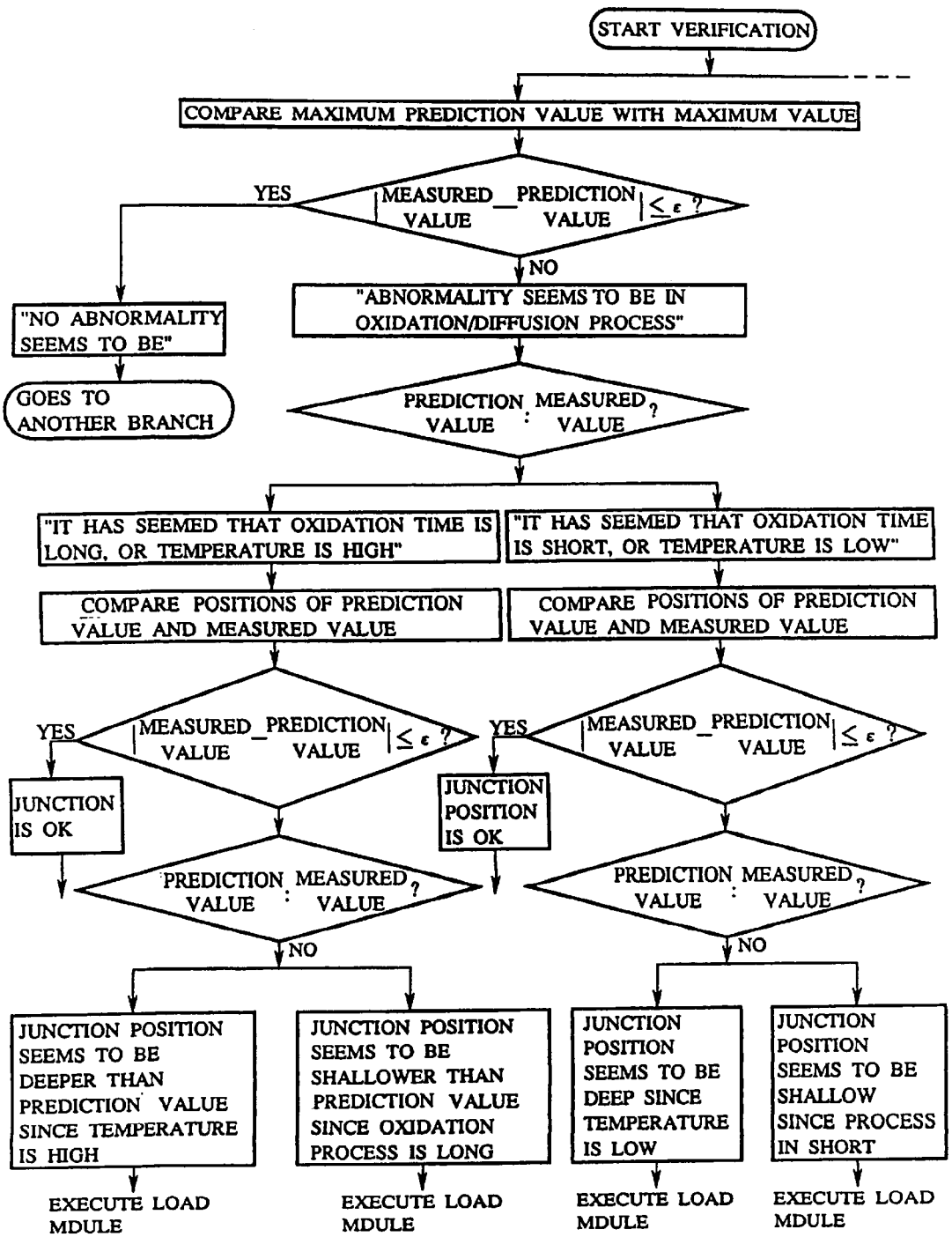
FIG. 33 is a flowchart showing a part of search tree of an inference engine according to the conventional simulation system.
Figure 34A:
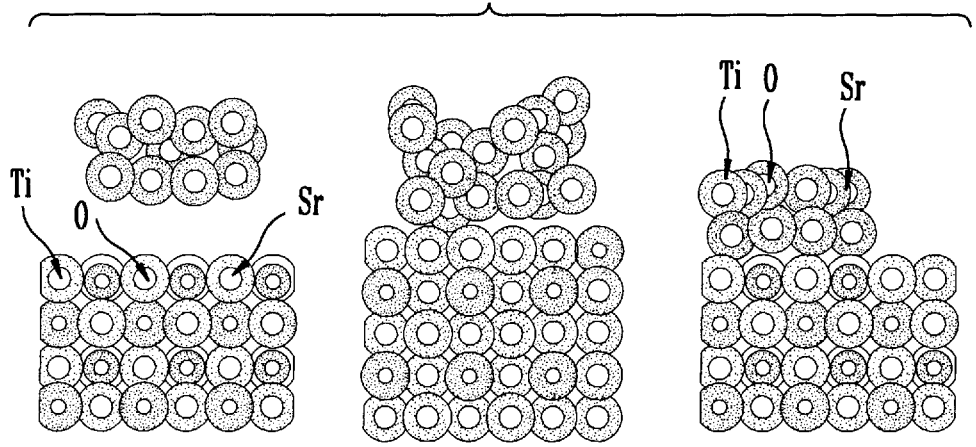
FIGS. 34A and 34B are views showing optimized perovskite and Si system crystals according to a new abinitlo MD simulator developed by the inventors of the present invention.
Figure 34B:
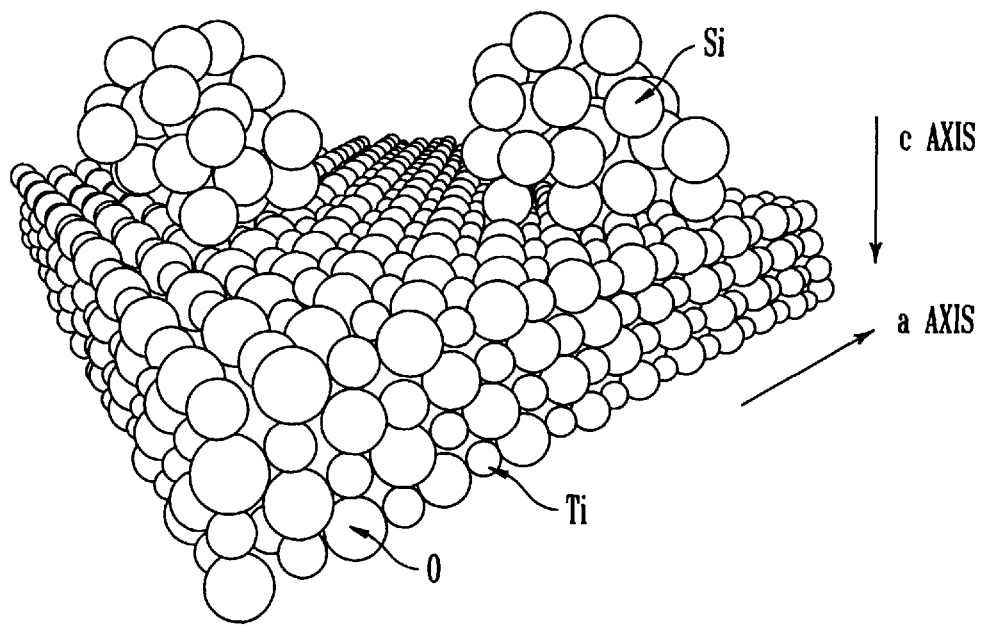
Figure 35:
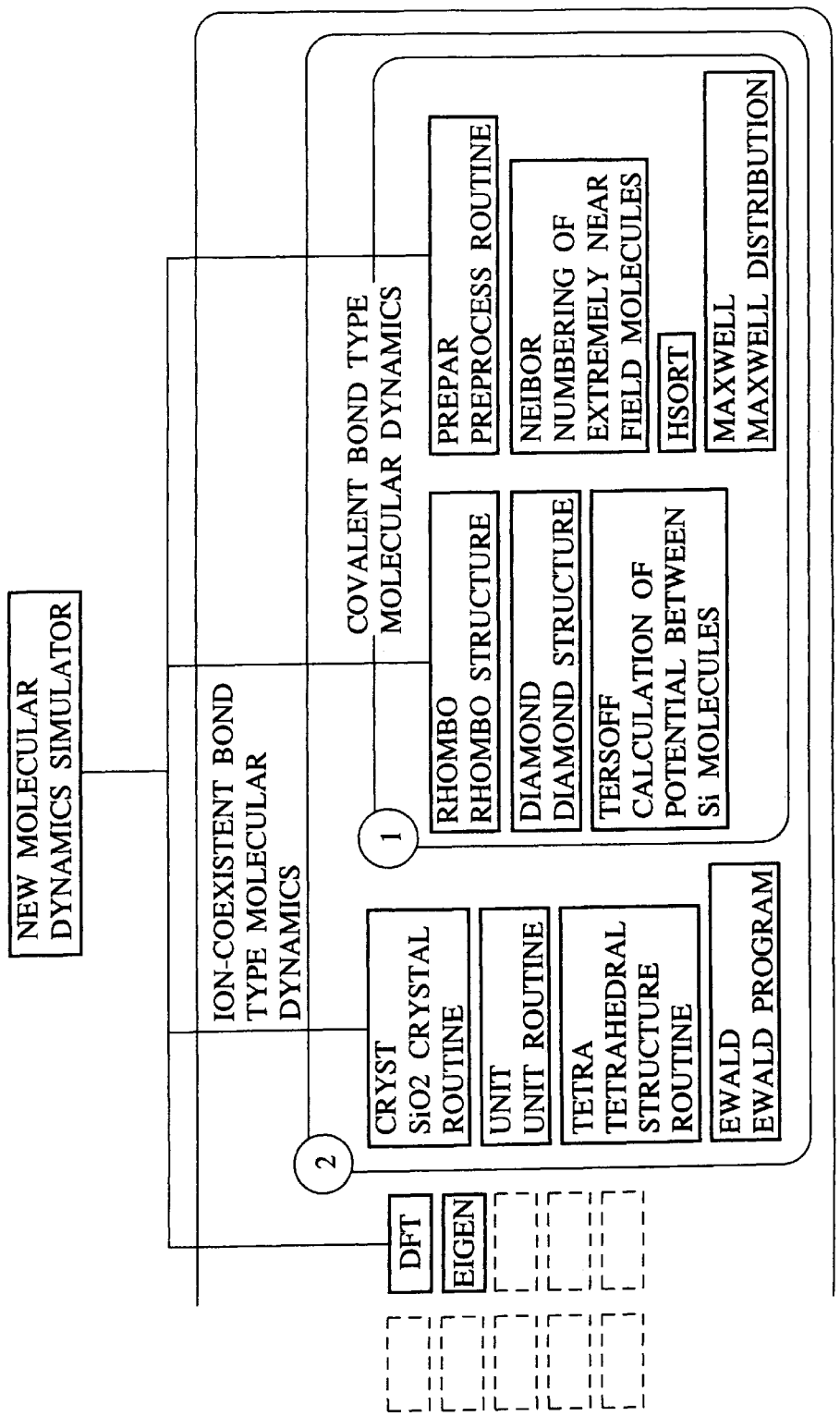
FIG. 35 is a conceptional view showing a configuration of a simulator developed originally by the inventors of the present invention.
Figure 36:
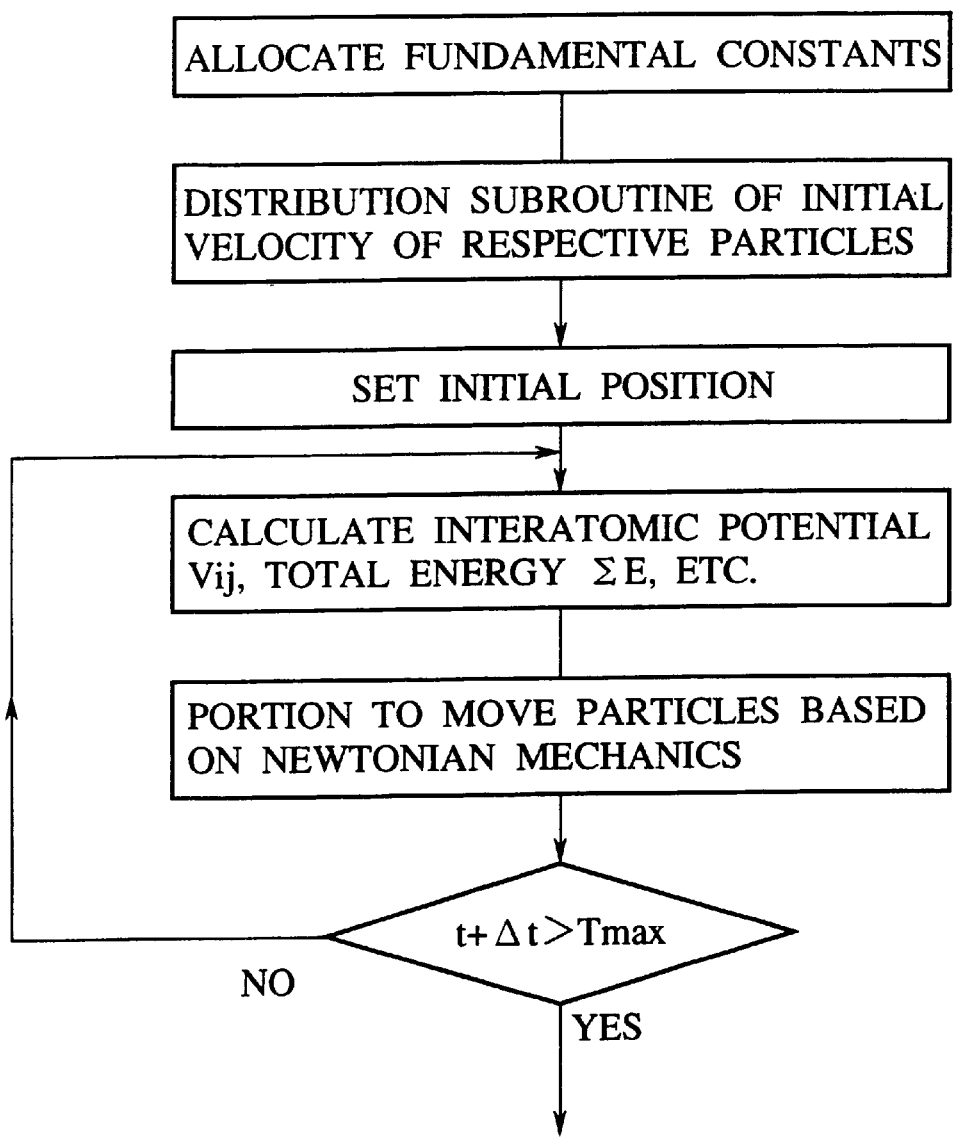
FIG. 36 is a flowchart showing procedures executed by the simulator developed originally by the inventors of the present invention.
Figure 37:
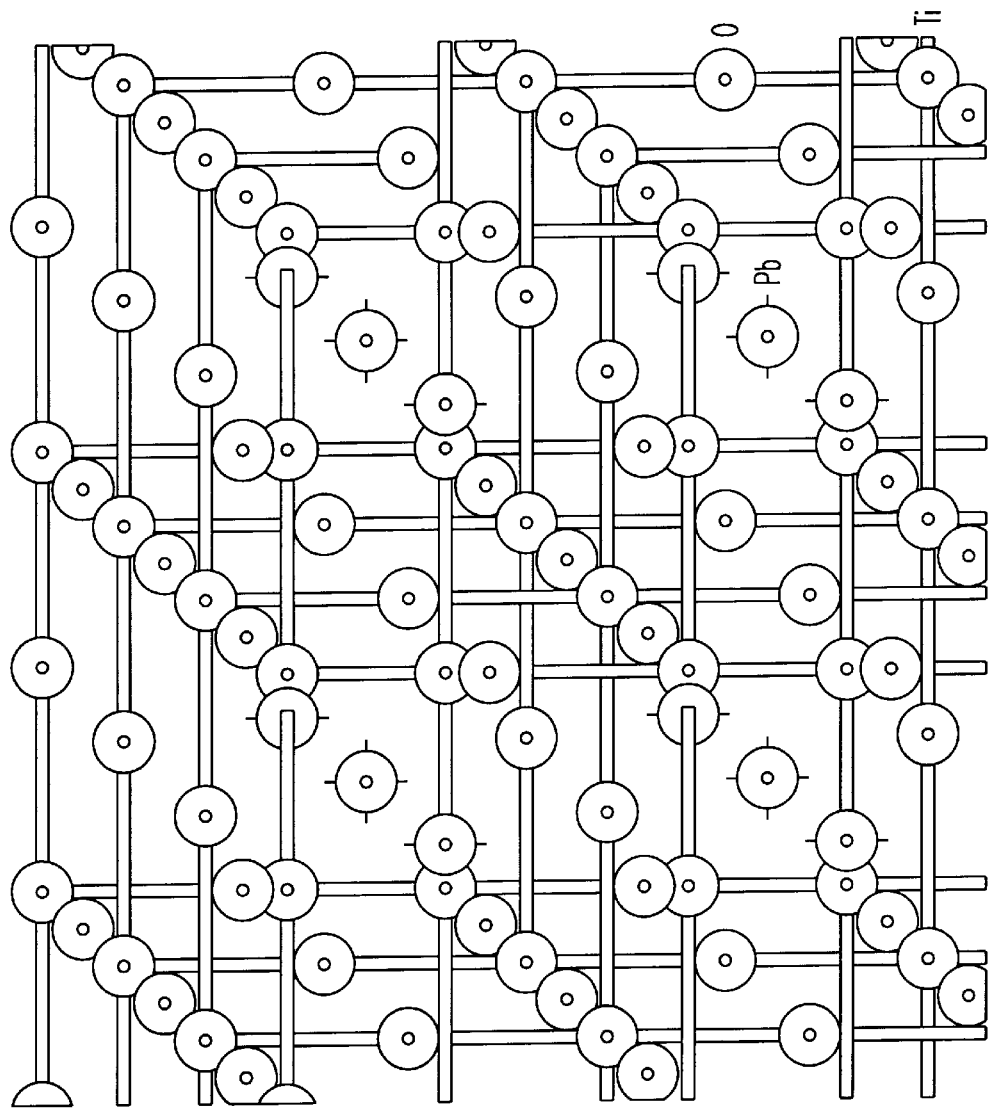
FIG. 37 is a diagram of a perovskite crystal structure.
Figure 38B:
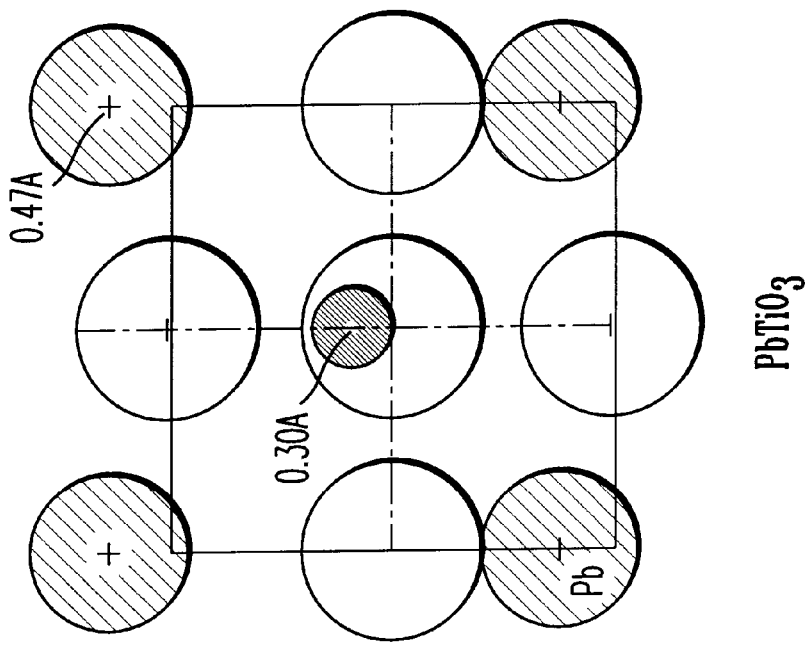
FIG. 38 is a view showing a structure of perovskite BaTiO3 and PbTiO3.
Figure 38A:
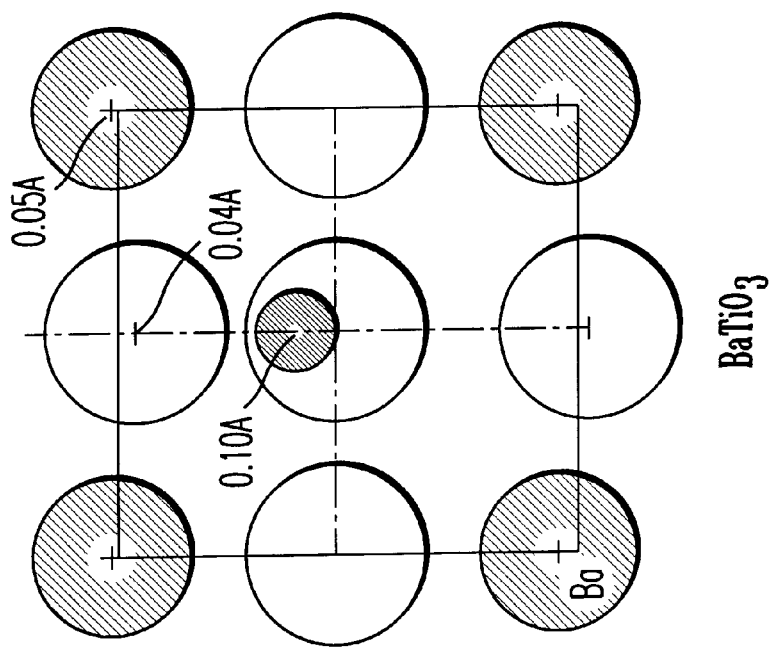
Figure 39:
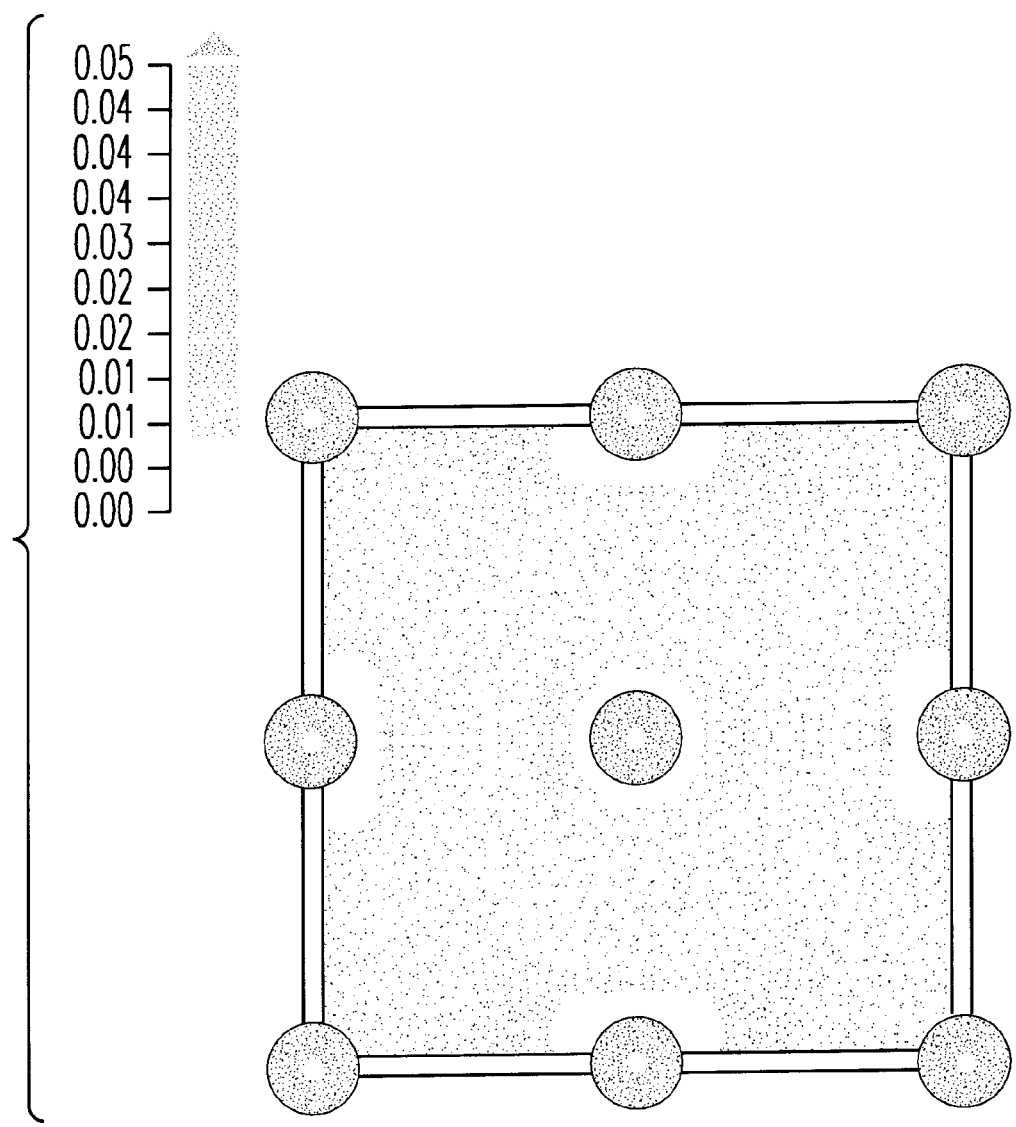
FIG. 39 is a view showing output potential in perovskite PTO according to the simulator developed newly by the inventors of the present invention.
Figure 40A:
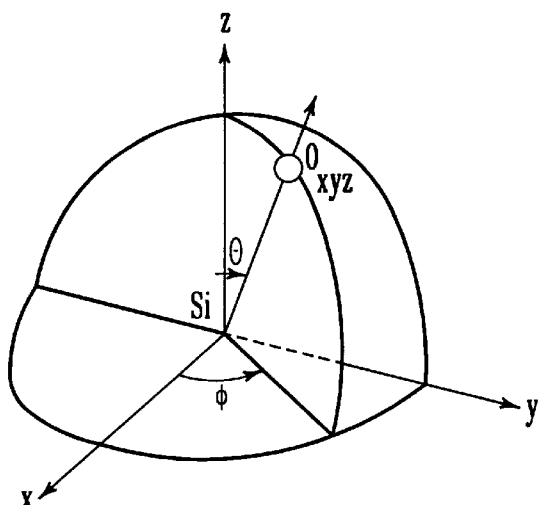
FIG. 40 is a view showing an example of $SiO_2$ formed according to the simulator developed newly by the inventors of the present invention.
Figure 40B:
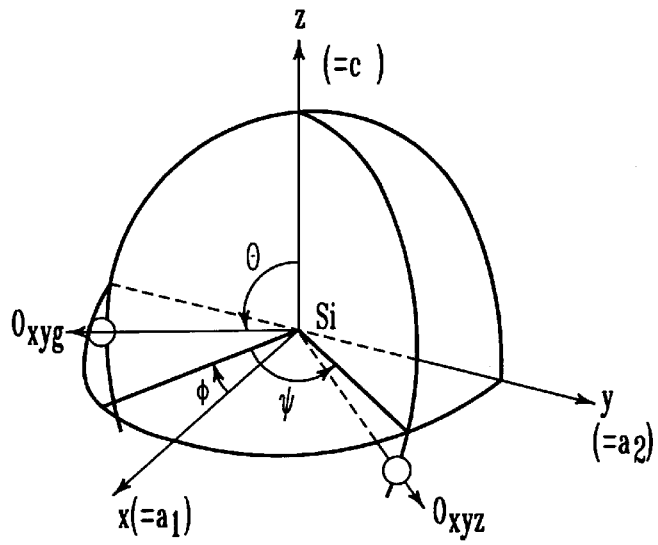
Figure 40C:
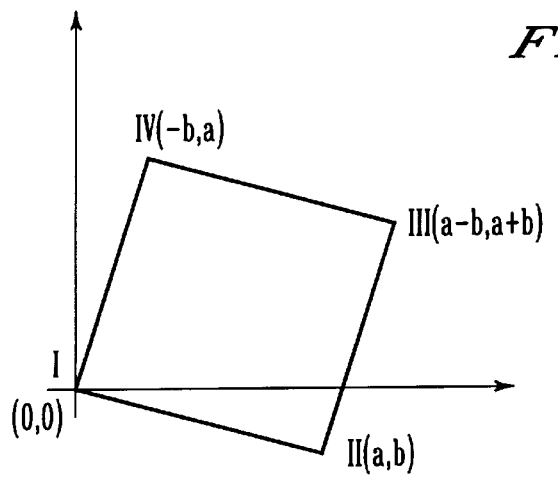
Figure 41:
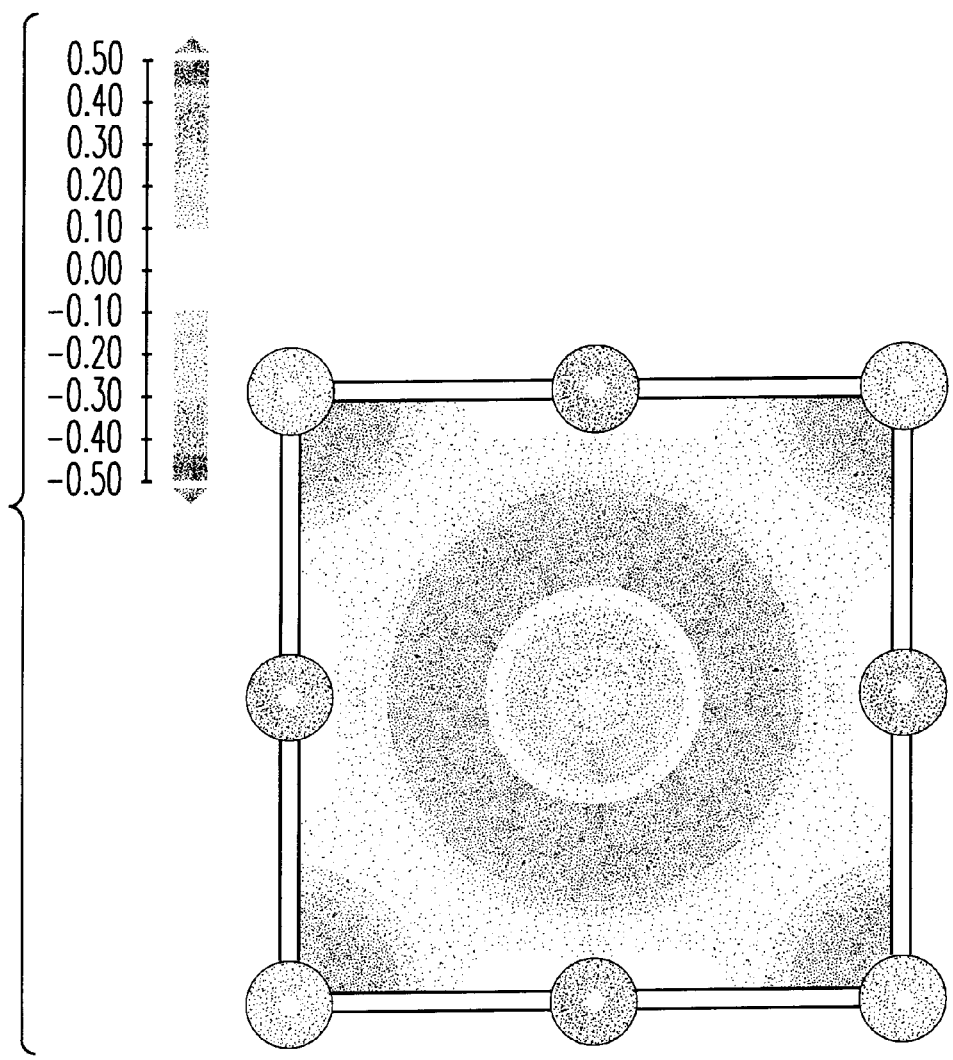
FIG. 41 is a view showing output charge in perovskite PTO according to the simulator developed newly by the inventors of the present invention.
Figure 42:
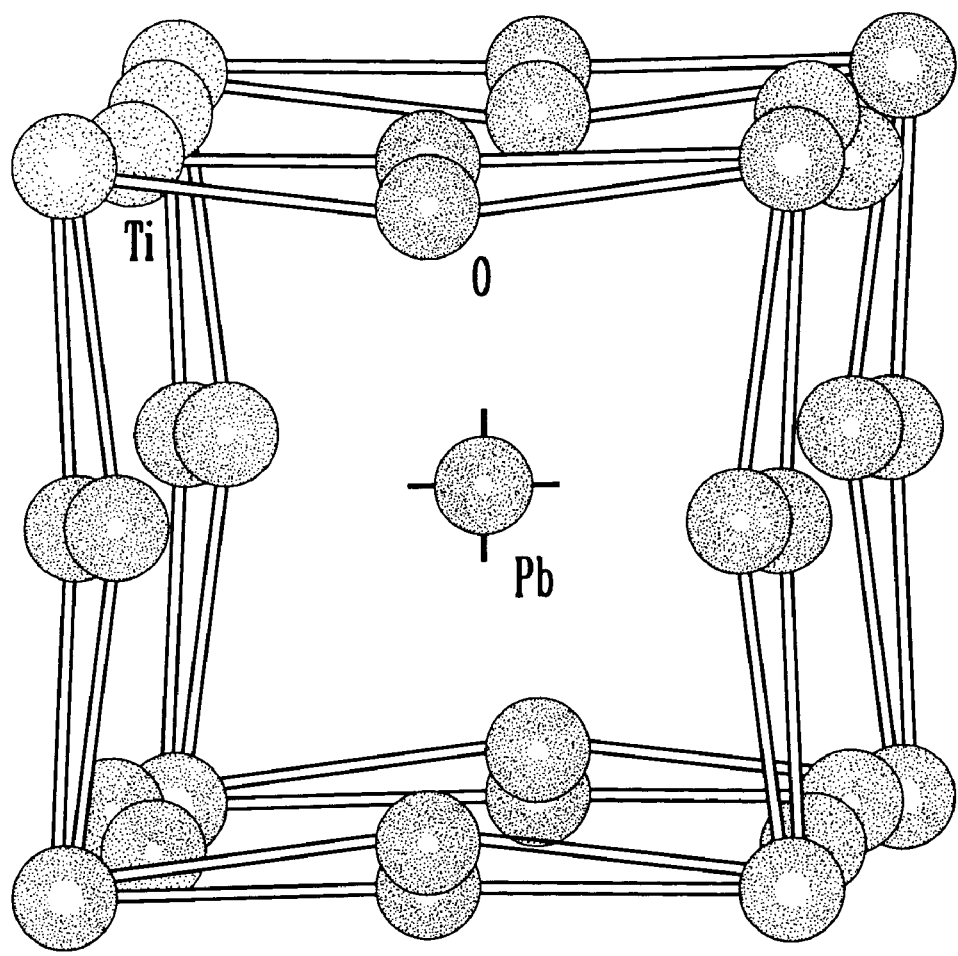
FIG. 42 is a view showing an example of strain in perovskite PTO according to an ab initio/MD simulator developed newly by the inventors of the present invention.
Figure 43:
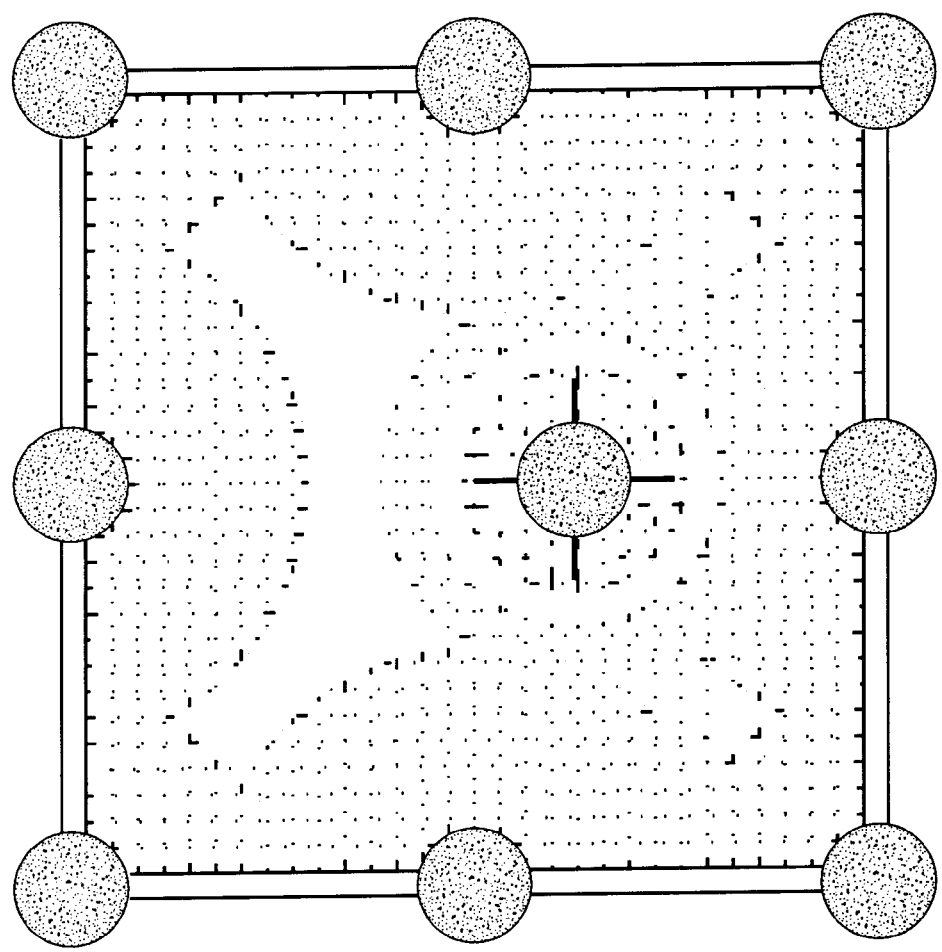
FIG. 43 is a view showing an example of oxygen deficiency in perovskite PTO according to the ab initio/MD simulator developed newly by the inventors of the present invention.
Figure 44:
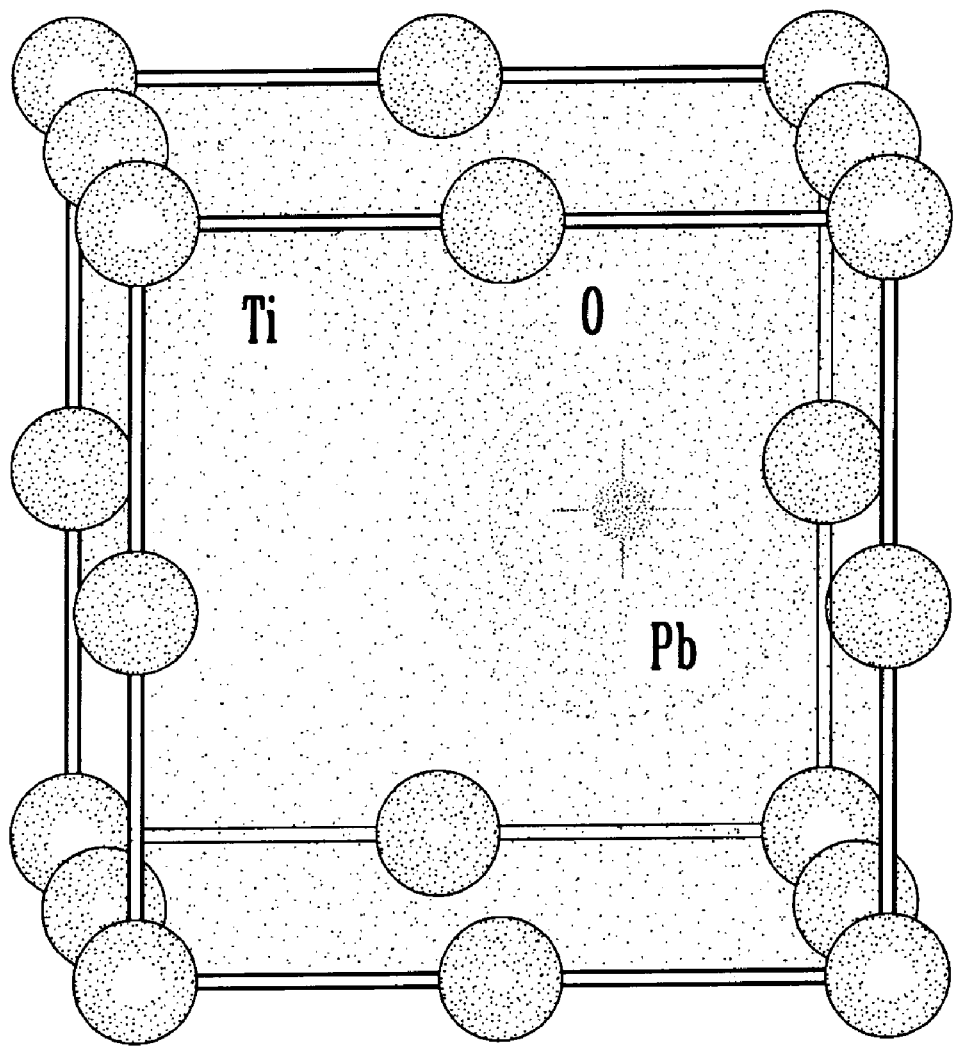
FIG. 44 is a view showing an example of movement of Pb in perovskite PTO according to the ab initio/MD simulator developed newly by the inventors of the present invention.
Figure 45:
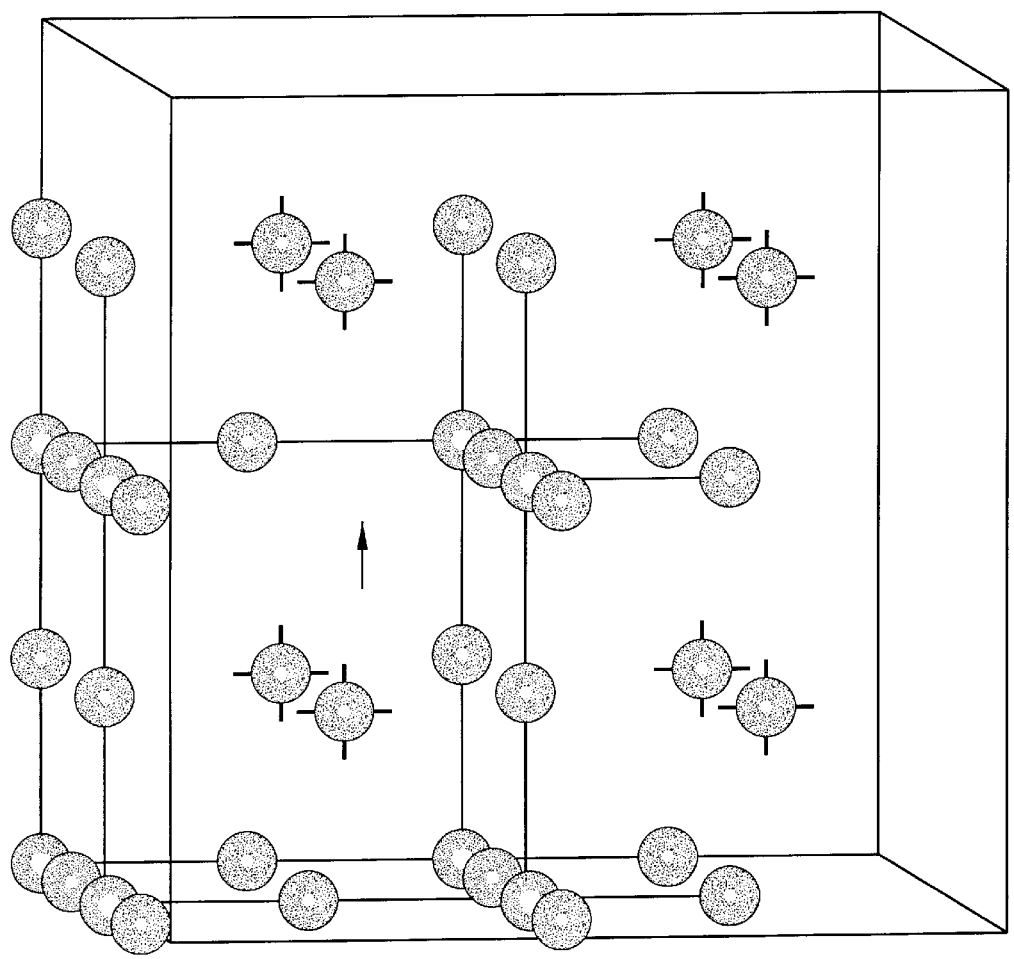
FIG. 45 is a view showing another example of movement of Pb in perovskite PTO according to the ab initio/MD simulator developed newly by the inventors of the present invention.
Figure 47:
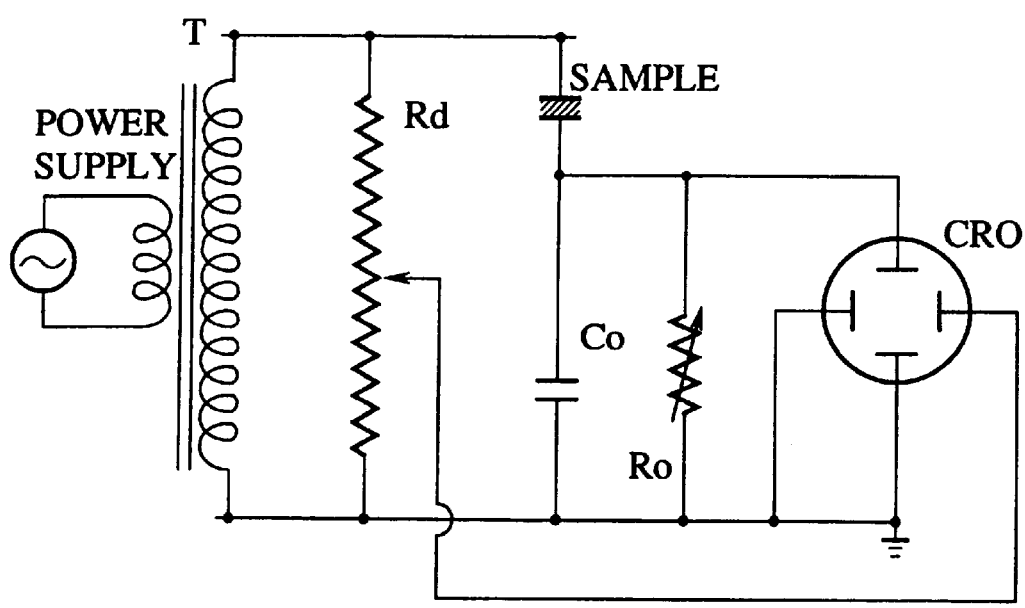
FIG. 47 is a circuit diagram showing a Soyer-Touwa circuit.
Figure 48:
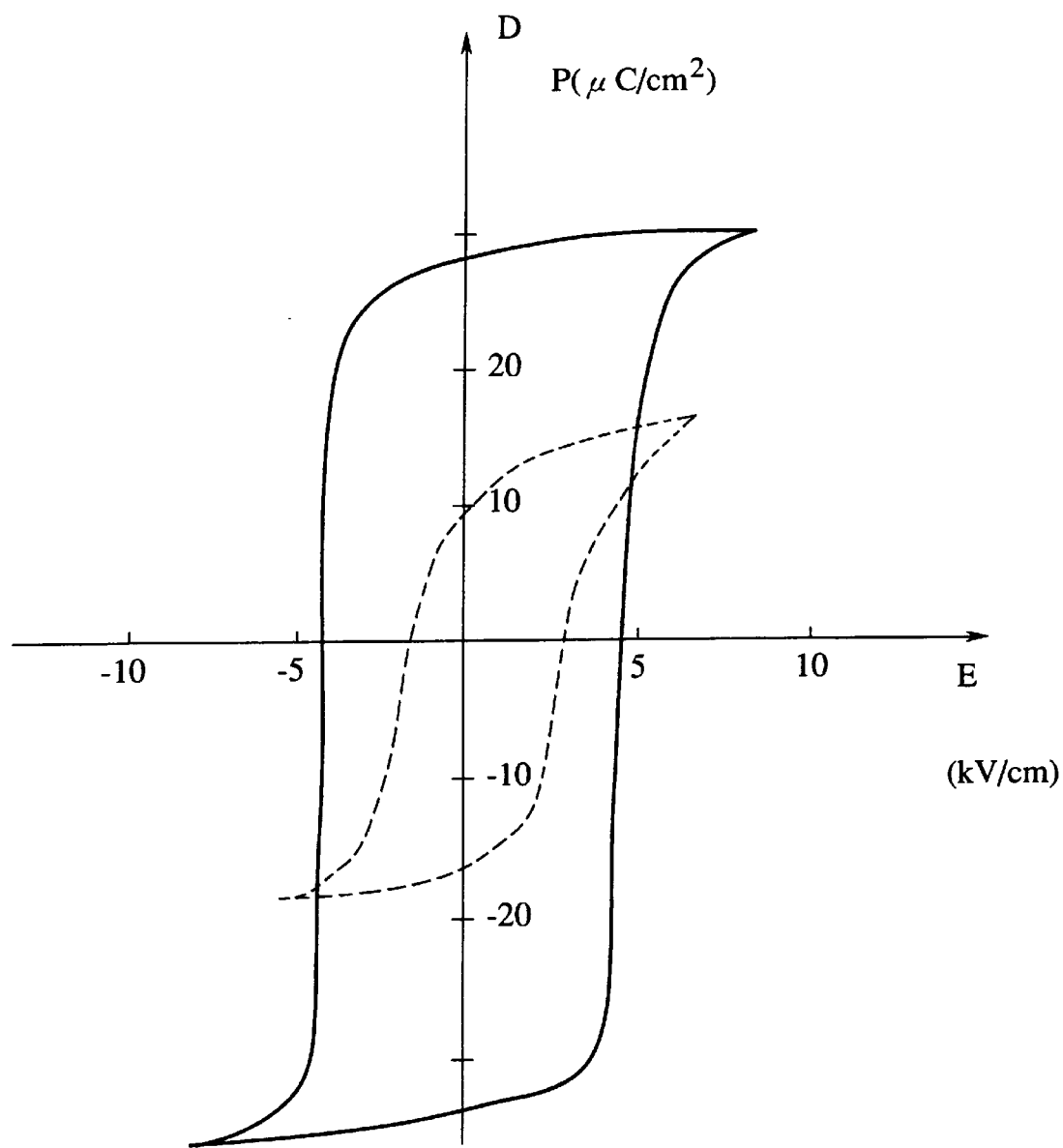
FIG. 48 is a view showing a DE characteristic of a PTO film according to the embodiment of the present invention.
Figure 49:
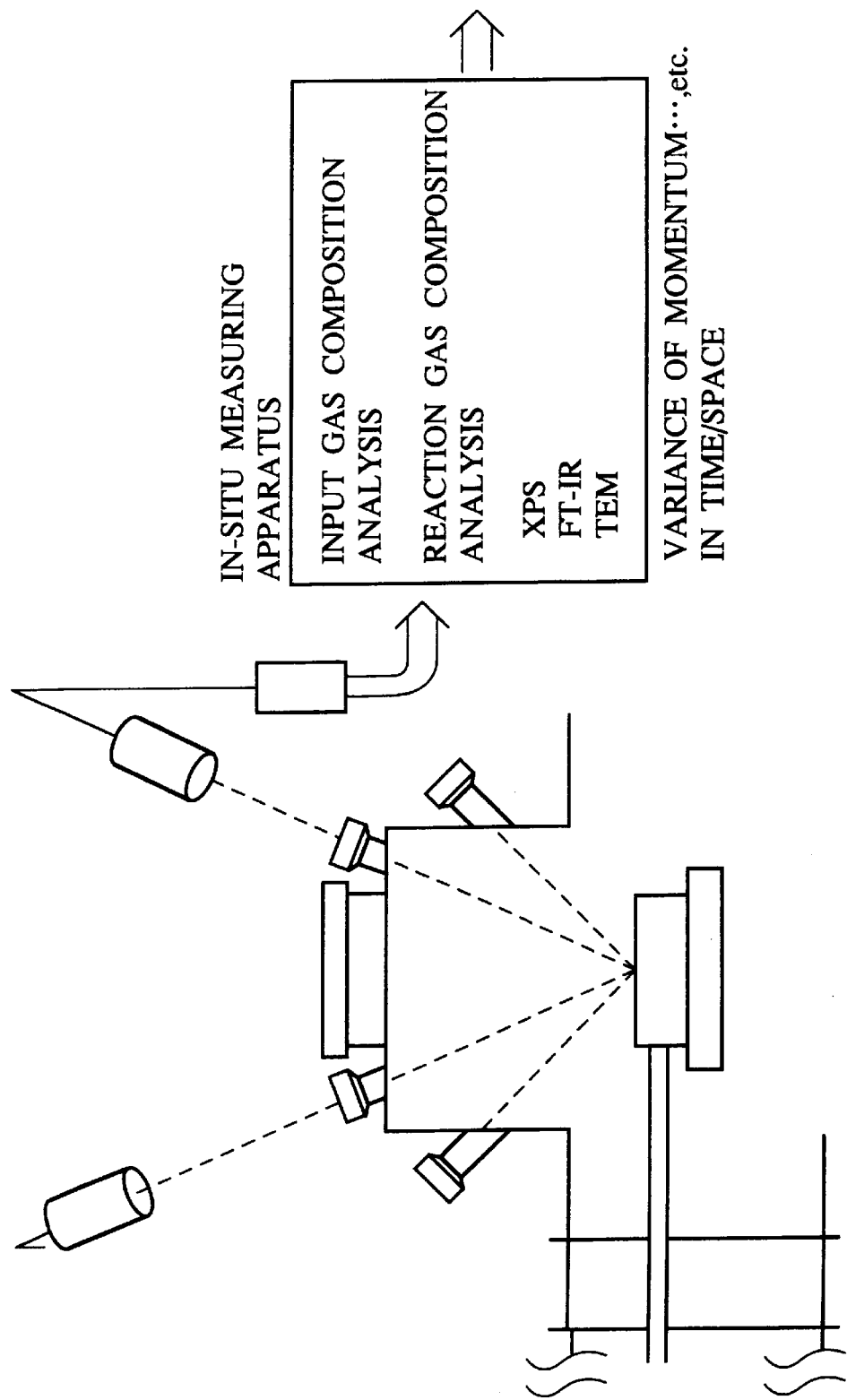
FIG. 49 is a schematic view showing how the in-situ monitor measuring equipment is affixed in clustered tool utilized in the present invention.
Figure 50:
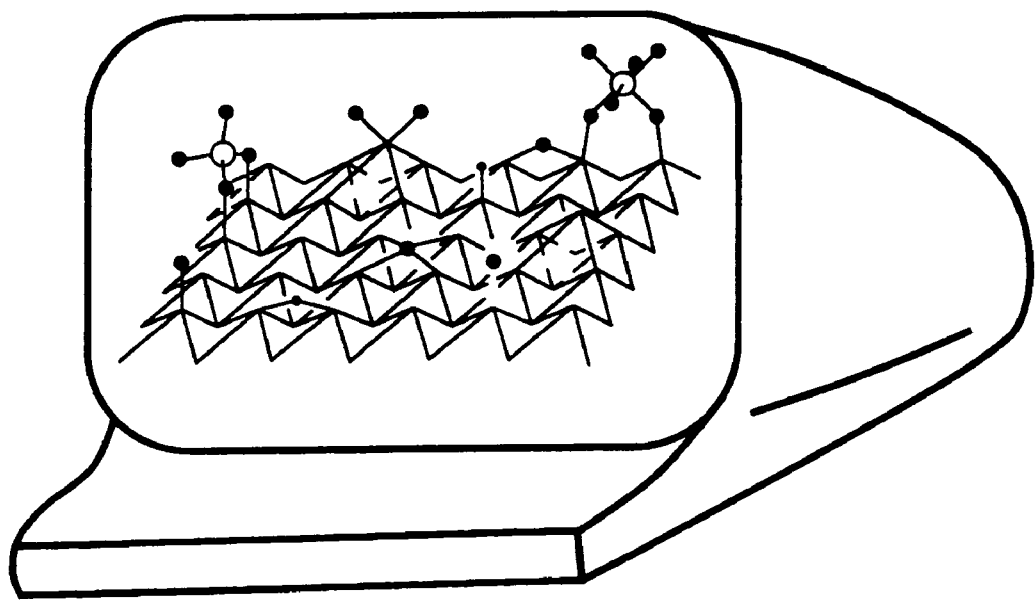
FIG. 50 is a view showing how to compare limited measured amount with sufficient information derived from calculation is displayed on a monitor as graphic images.
Figure 51:
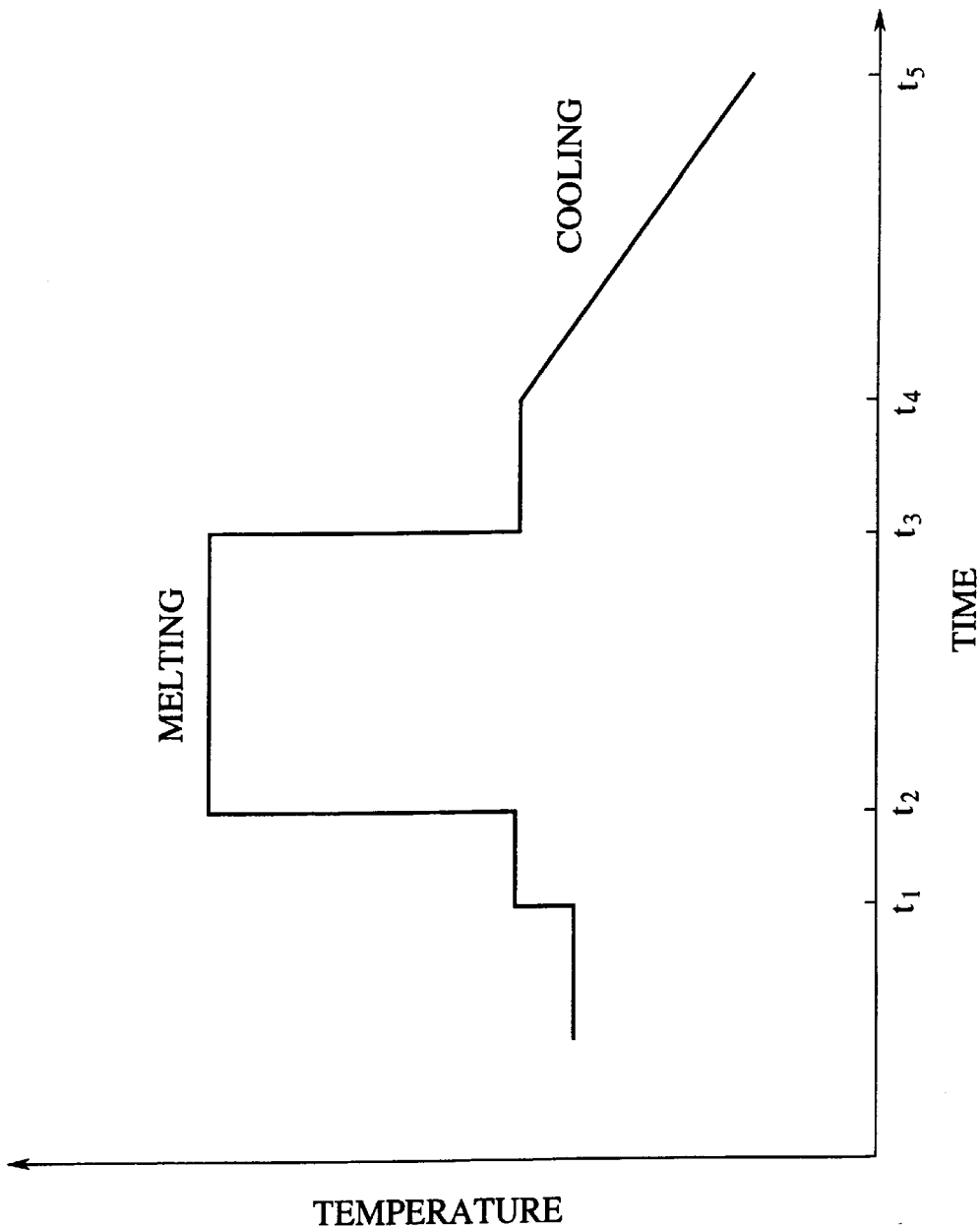
FIG. 51 is a view showing temperature sequence as an example of input data to the ab initio molecular dynamics simulation system according to the present invention.
Figure 52:
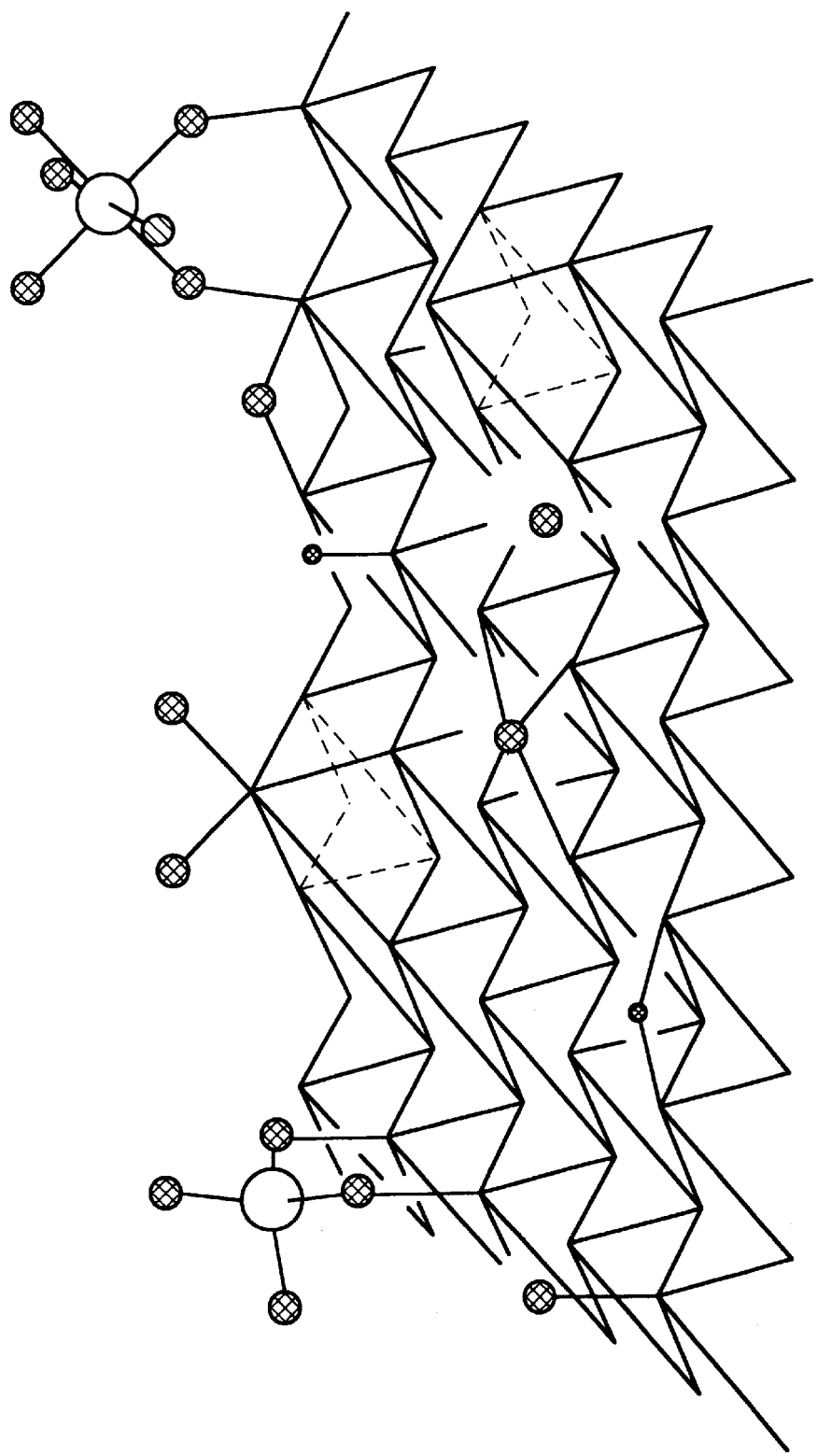
FIG. 52 is a schematic view showing prediction execution at atomic level according to the ab-initio molecular dynamics simulation system according to the present invention.
Figure 53:
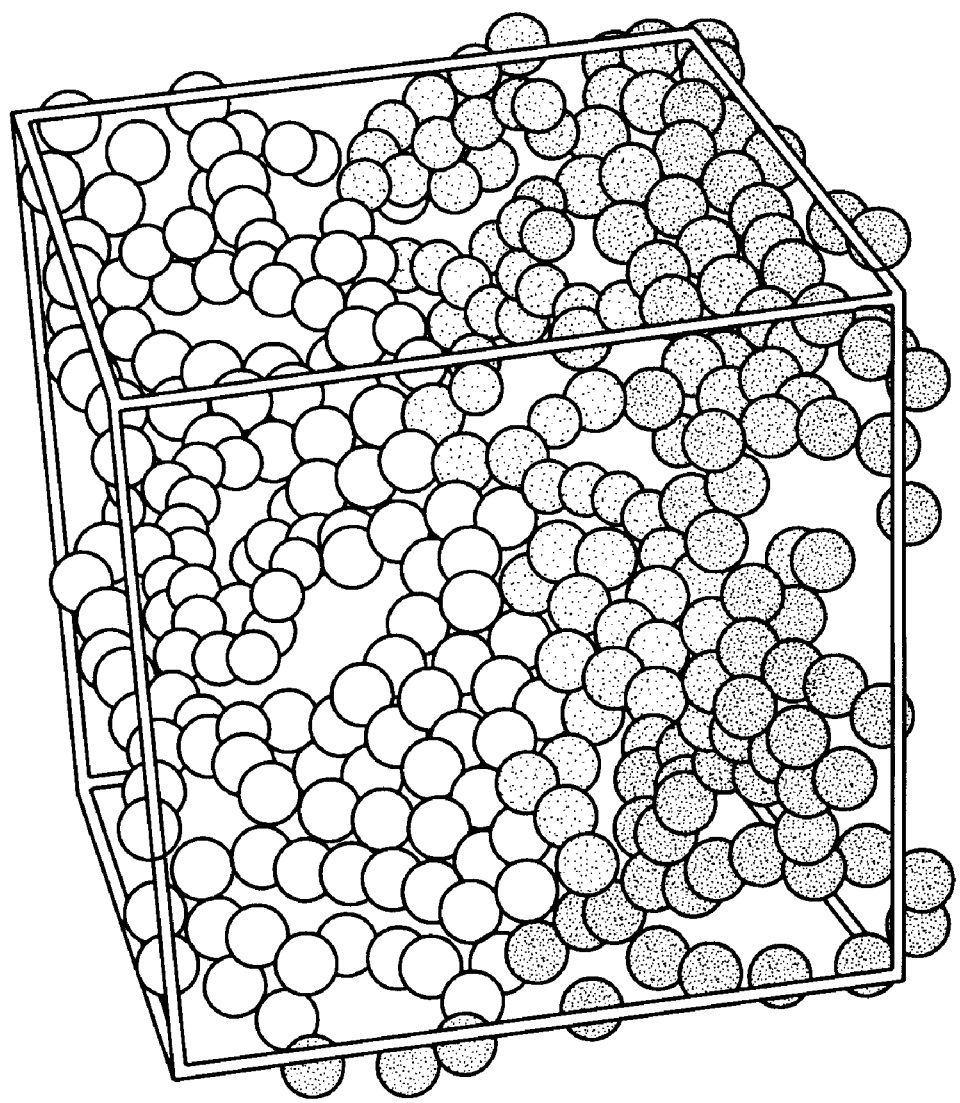
FIG. 53 is a schematic view showing visualized prediction execution at atomic level according to the ab initio molecular dynamics simulation system according to the present invention.
Figure 54:
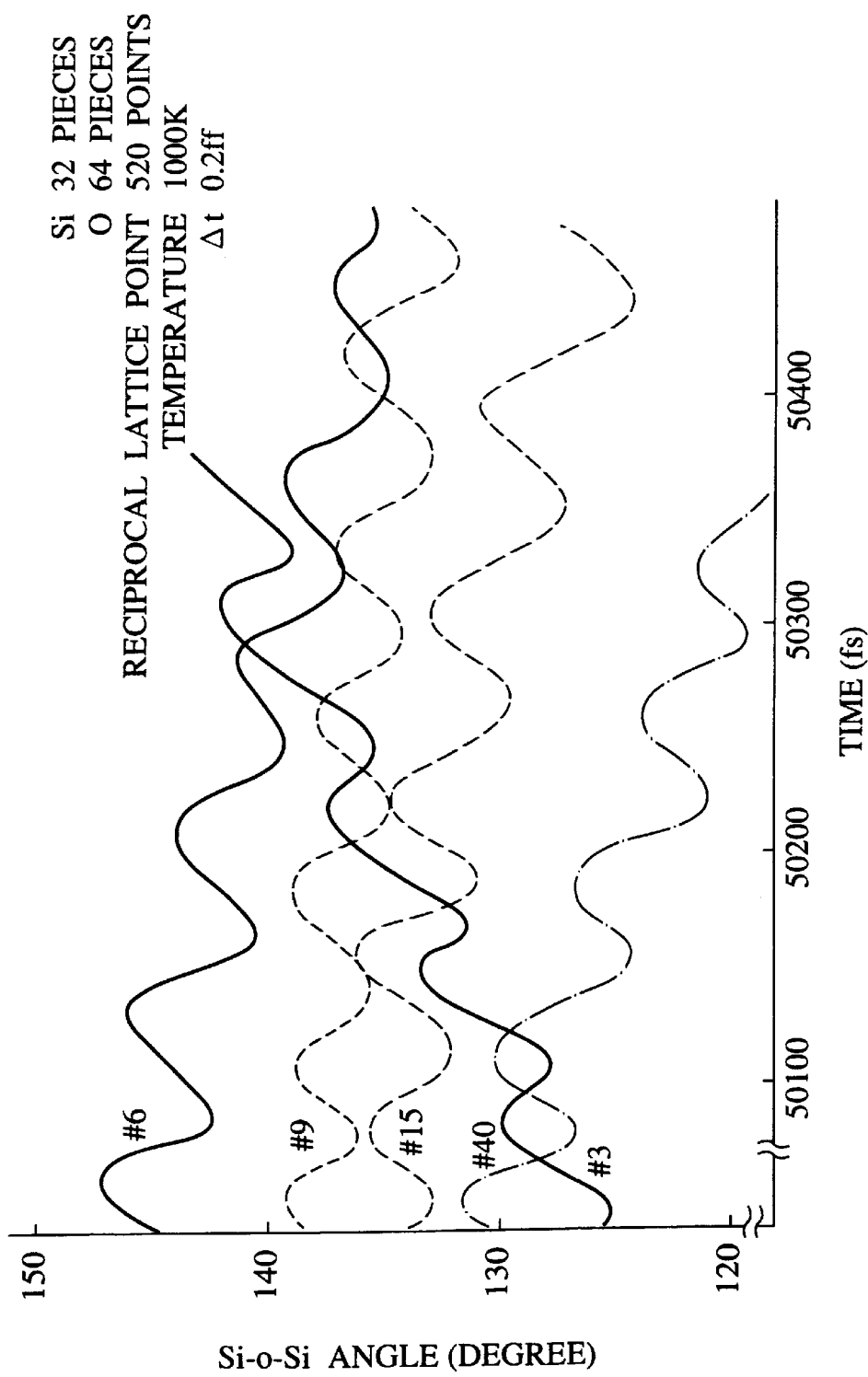
FIG. 54 is a view showing change in Si—O—Si angle relative to elapsed time as an execution example of $SiO_2$ according to the ab initio molecular dynamics simulation system according to the present invention.
Figure 55:
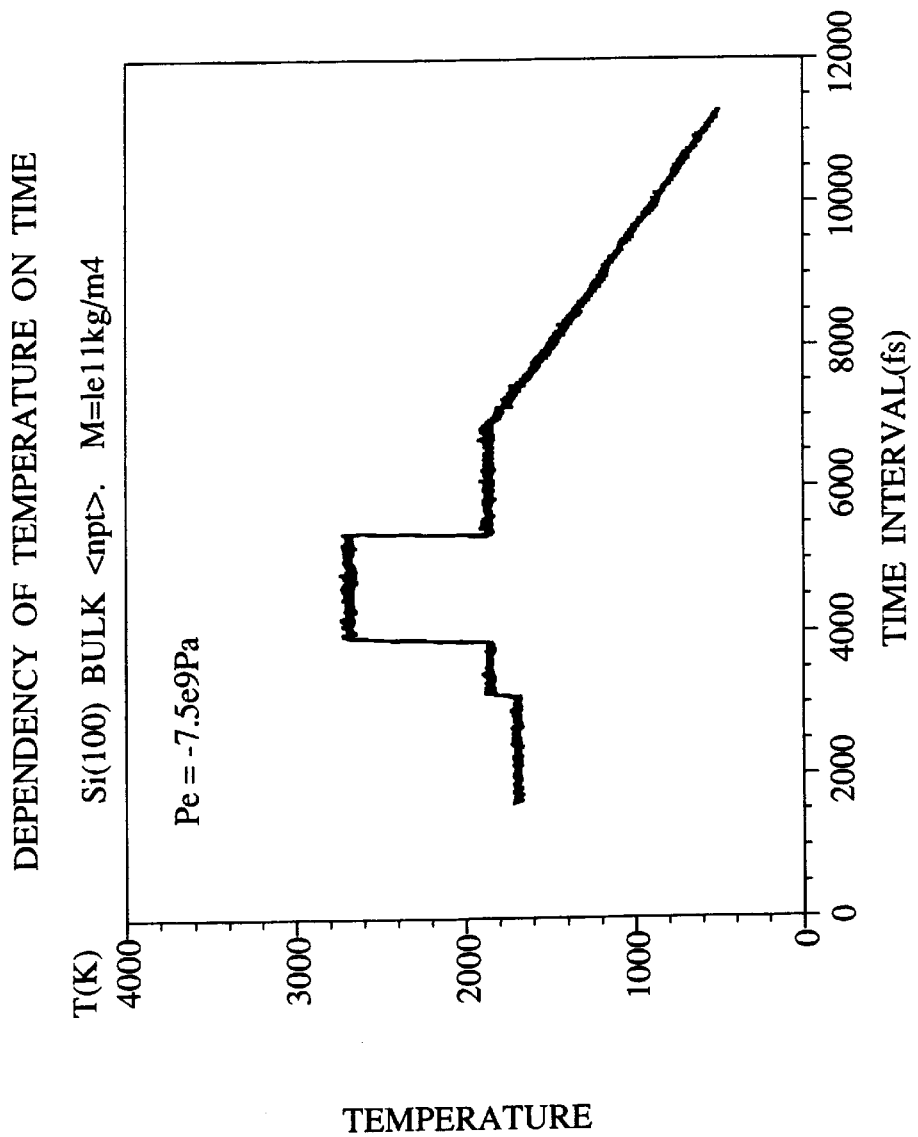
FIG. 55 is a view showing prediction of change in measured values of temperature as an output example via the input sequence shown in FIG. 51.
Figure 56:
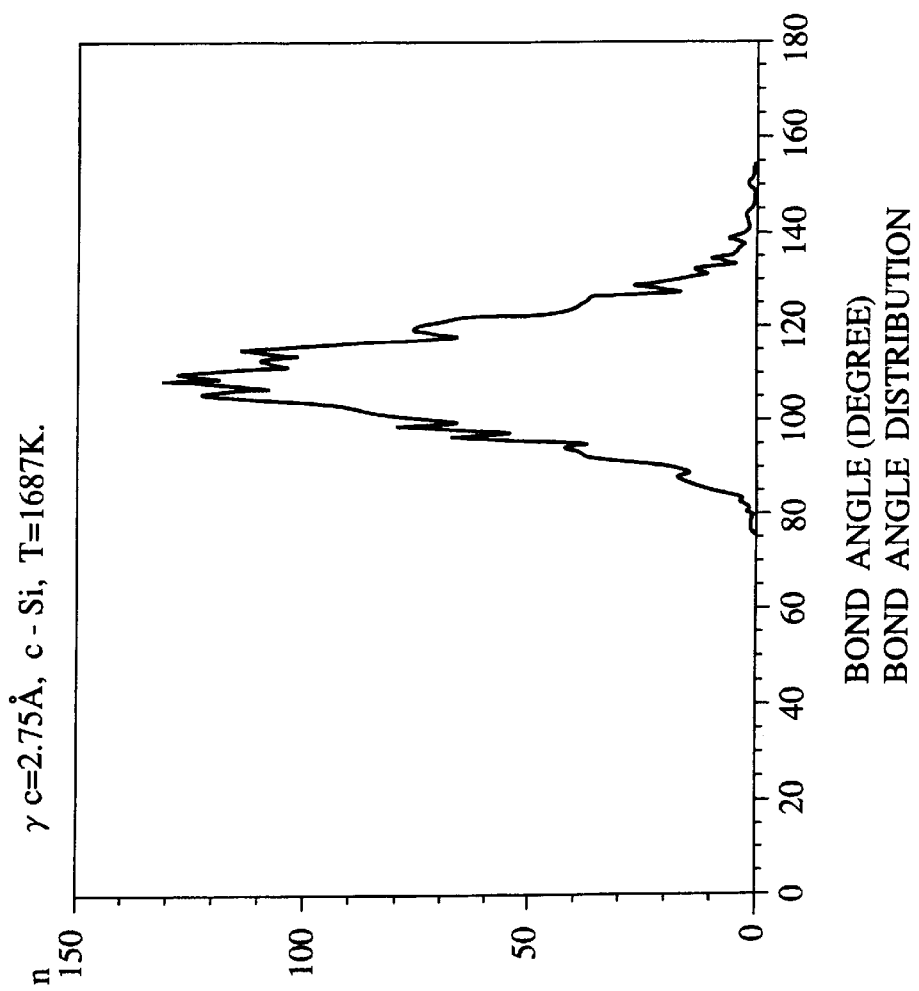
FIG. 56 is a view showing distribution of coordination angle in film formed Si as an execution example at atomic level according to the simulation system according to the present invention.
Figure 57:
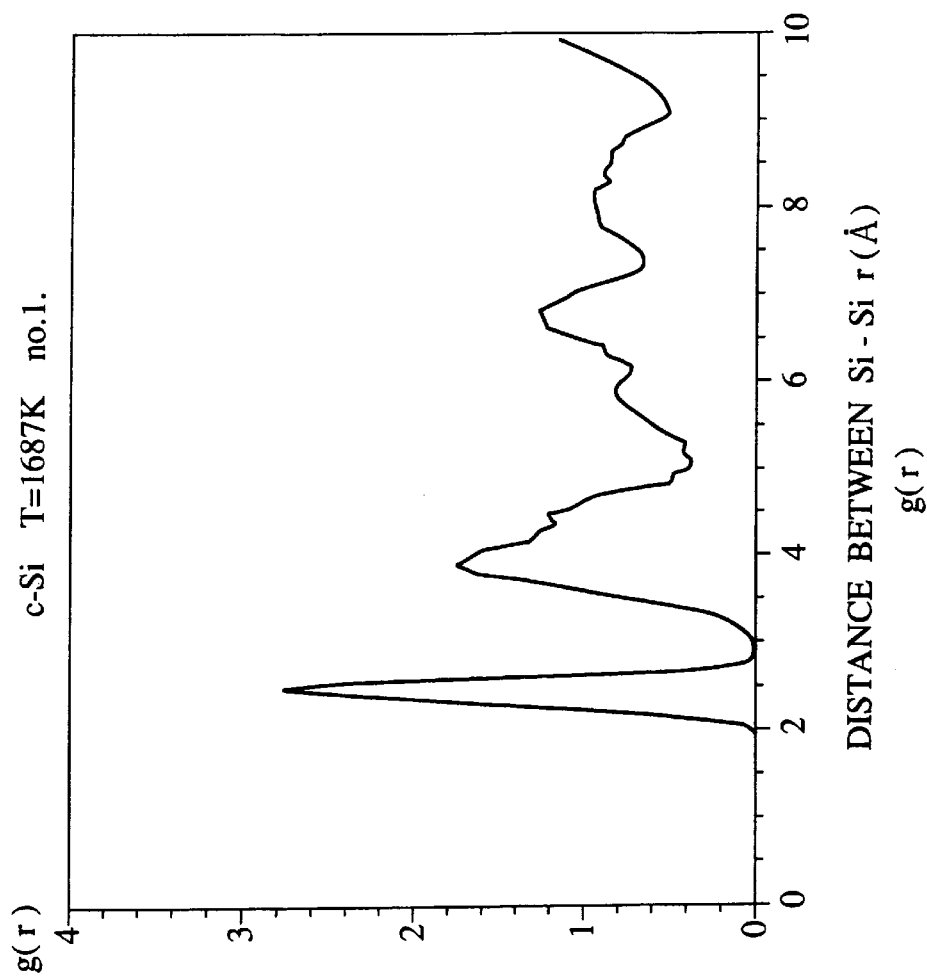
FIG. 57 is a view showing distribution of an Si—Si distance as an execution example at atomic level according to the simulation system according to the present invention.
Figure 58:
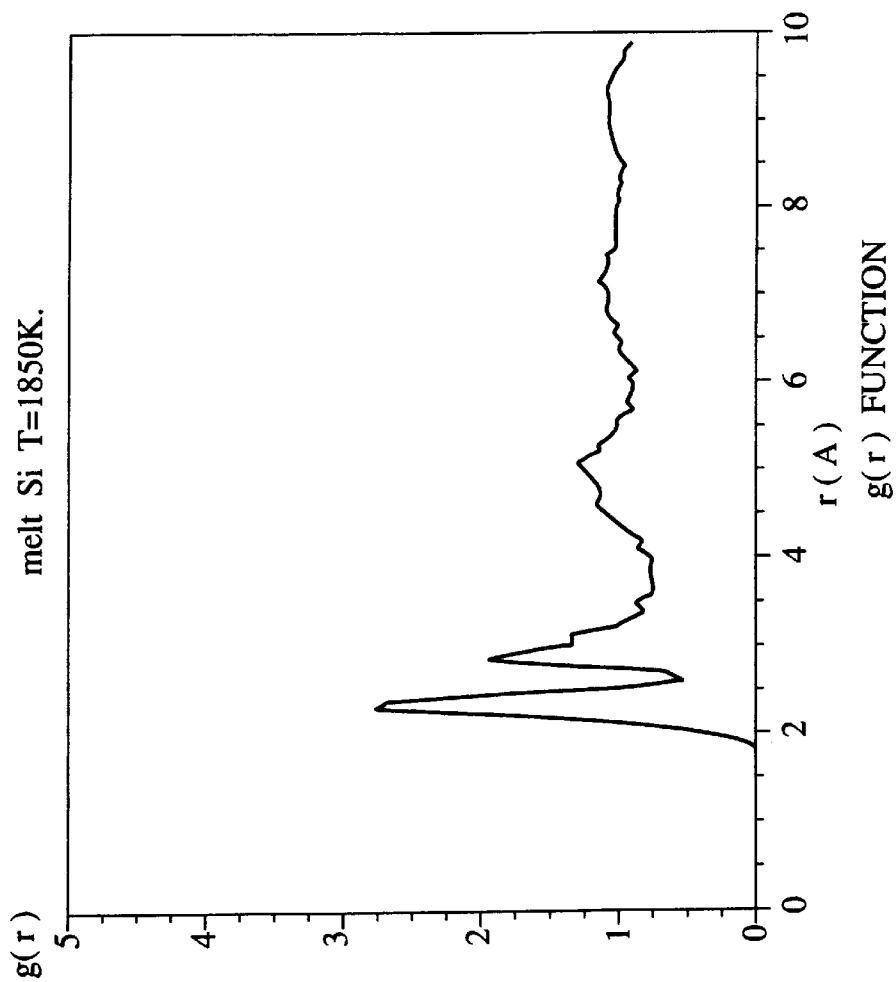
FIG. 58 is a view showing distribution of an Si—Si distance as another execution example at atomic level according to the simulation system according to the present invention.
Figure 59:
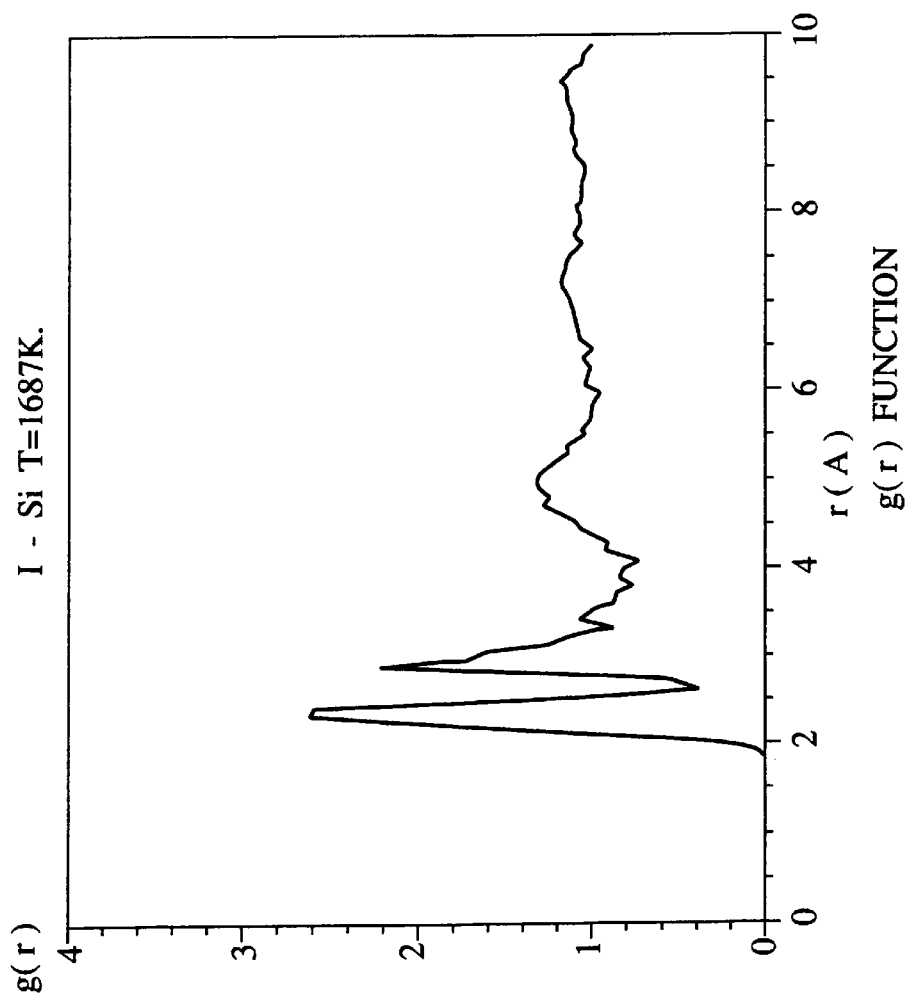
FIG. 59 is a view showing distribution of an Si—Si distance as still another execution example at atomic level according to the simulation system according to the present invention.
Figure 60:
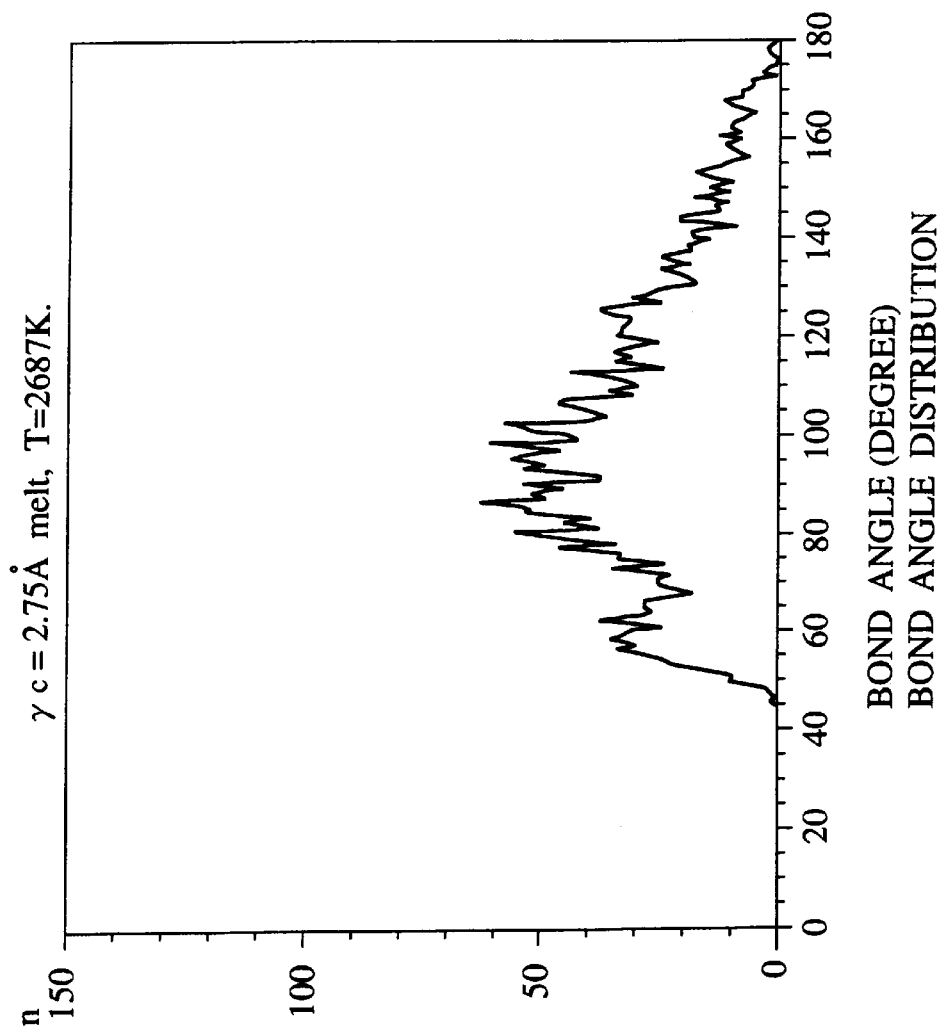
FIG. 60 is a view showing distribution of Si coordination angle as another execution example at atomic level according to the simulation system according to the present invention.
Figure 61:
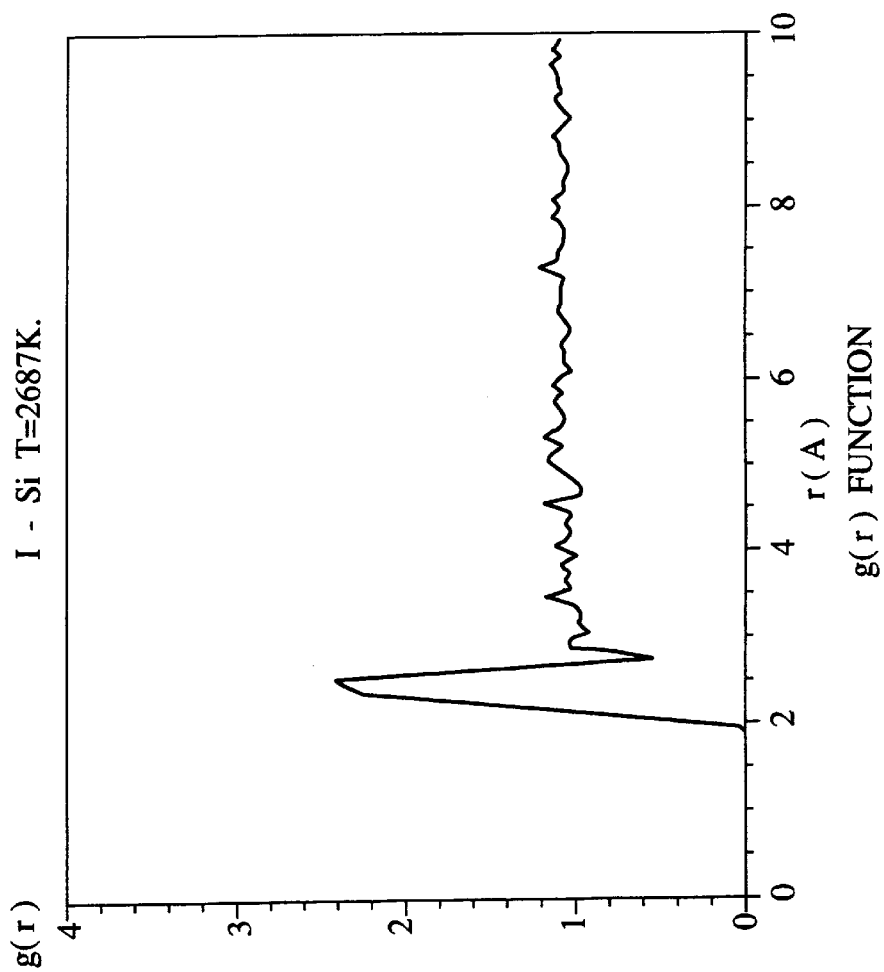
FIG. 61 is a view showing distribution of an Si—Si distance as yet still another execution example at atomic level according to the simulation system according to the present invention.
Figure 62:
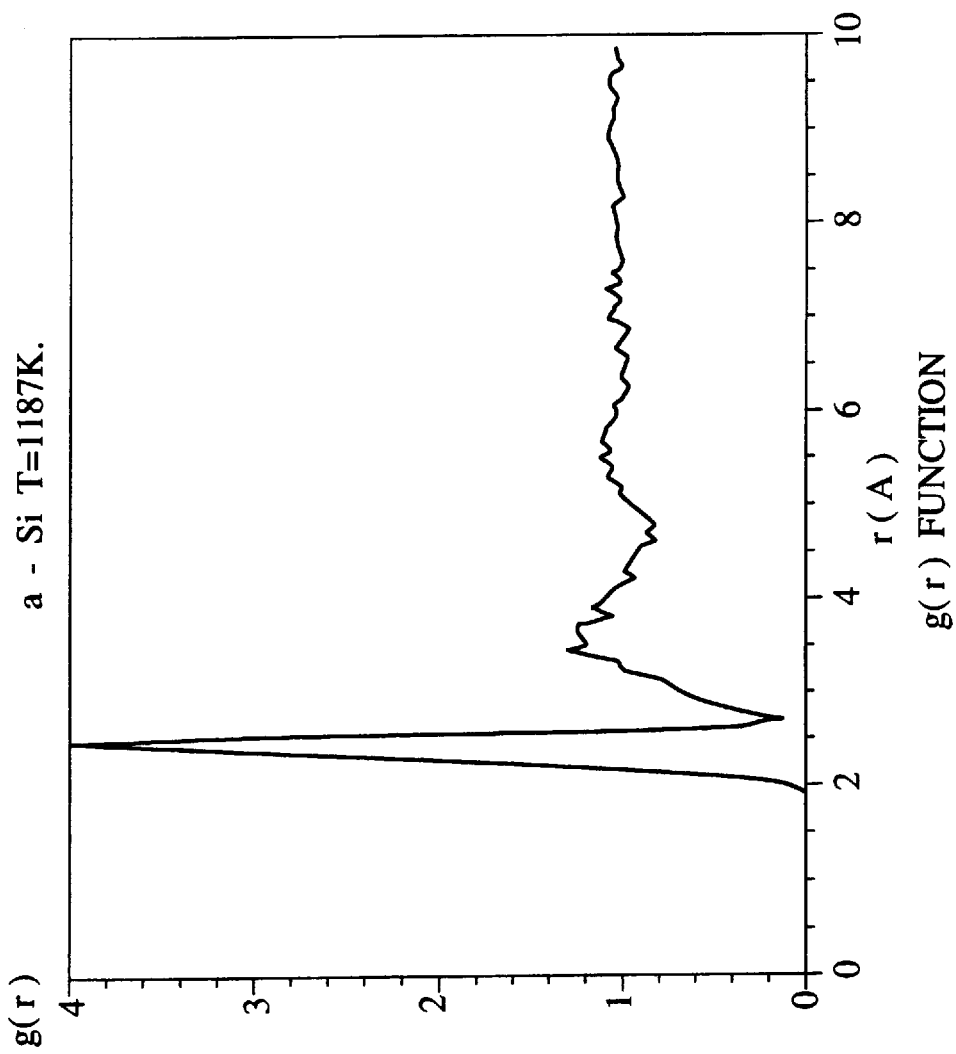
FIG. 62 is a view showing distribution of an Si—Si distance as further execution example at atomic level according to the simulation system according to the present invention.
Figure 63:
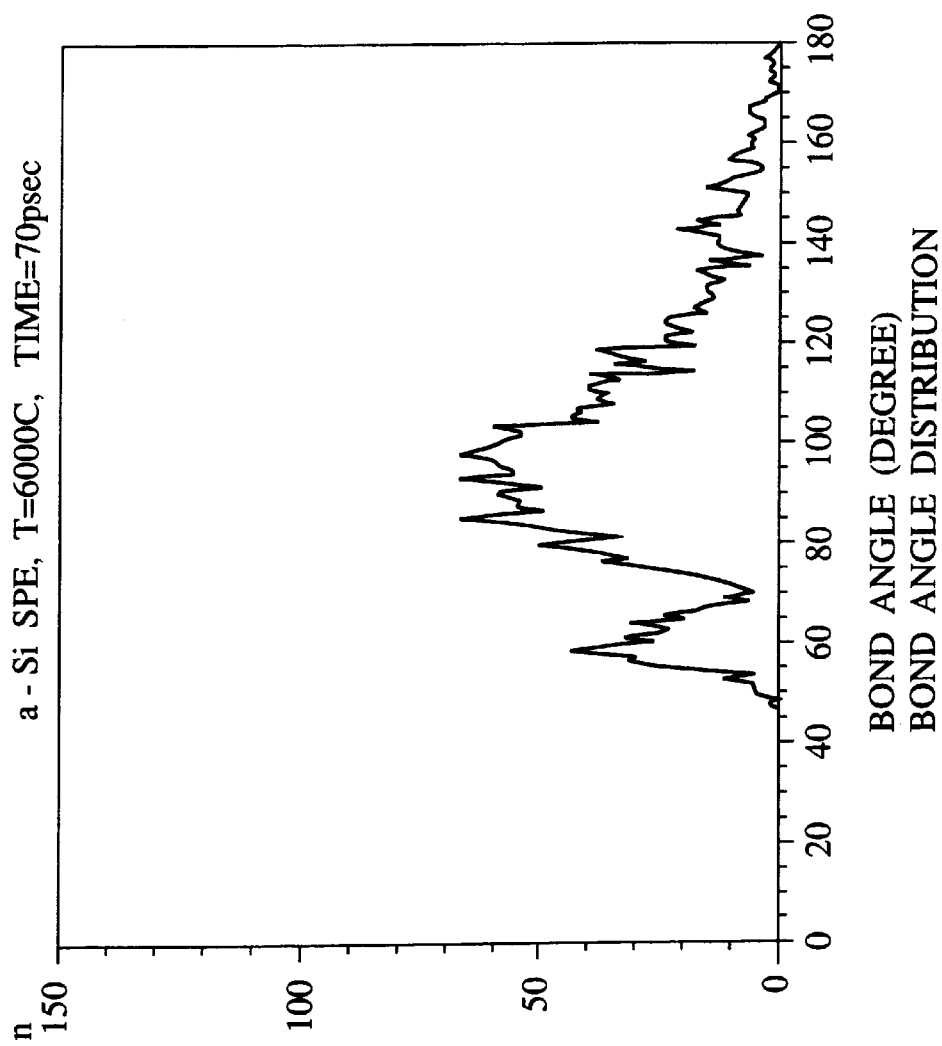
FIG. 63 is a view showing distribution of Si coordination angle as a further execution example at atomic level according to the simulation system according to the present invention.
Figure 64:
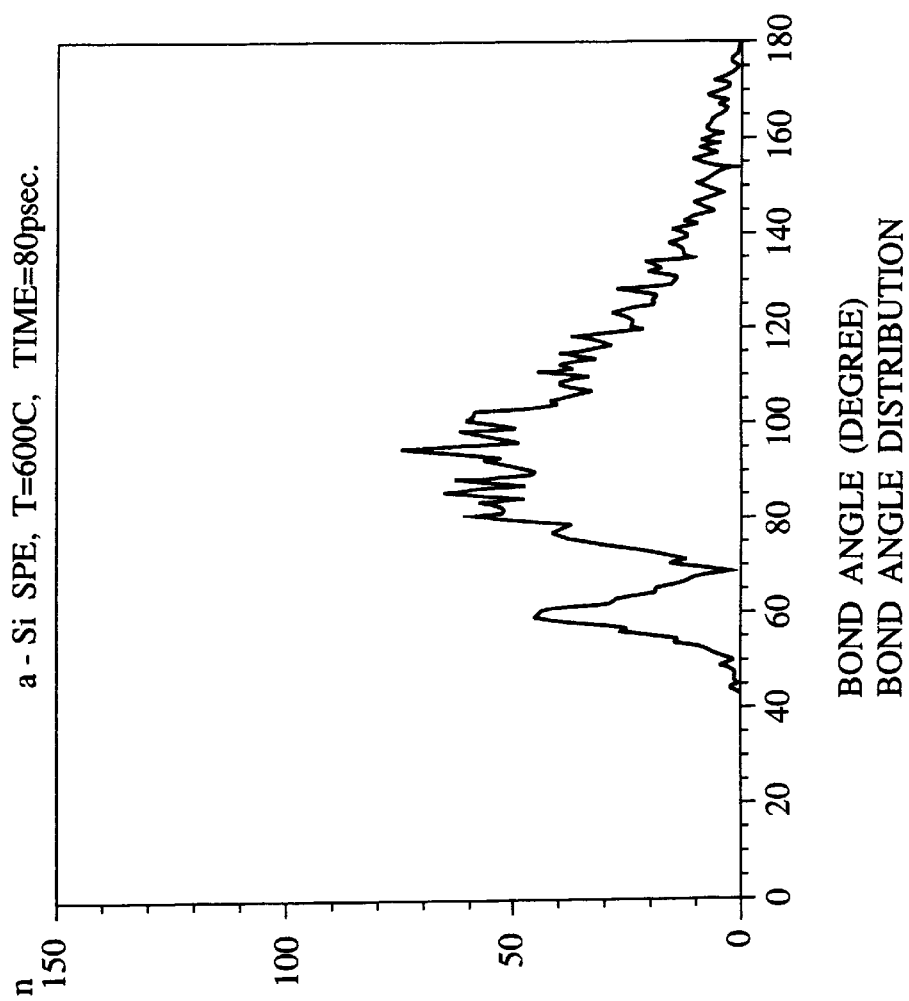
FIG. 64 is a view showing distribution of Si coordination angle as a still further execution example at atomic level according to the simulation system according to the present invention.
Figure 65:
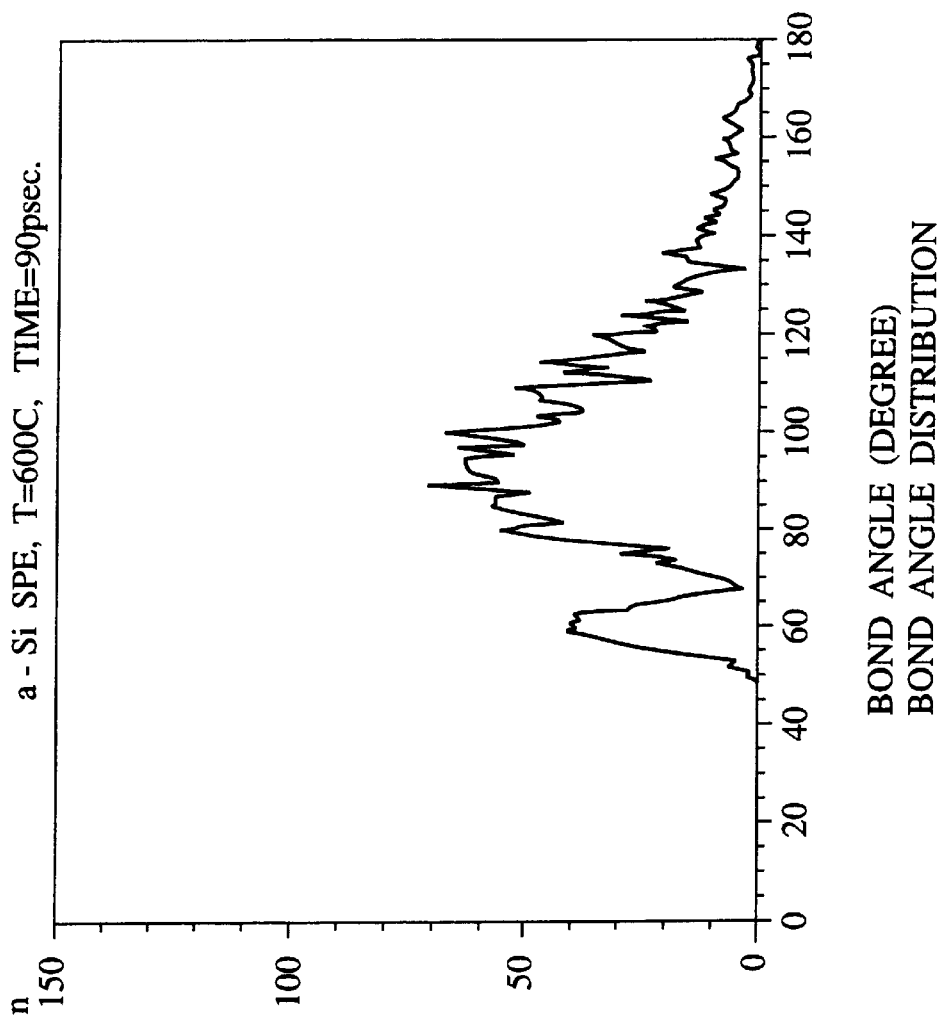
FIG. 65 is a view showing distribution of Si coordination angle as a yet still further execution example at atomic level according to the simulation system according to the present invention.
Figure 66:
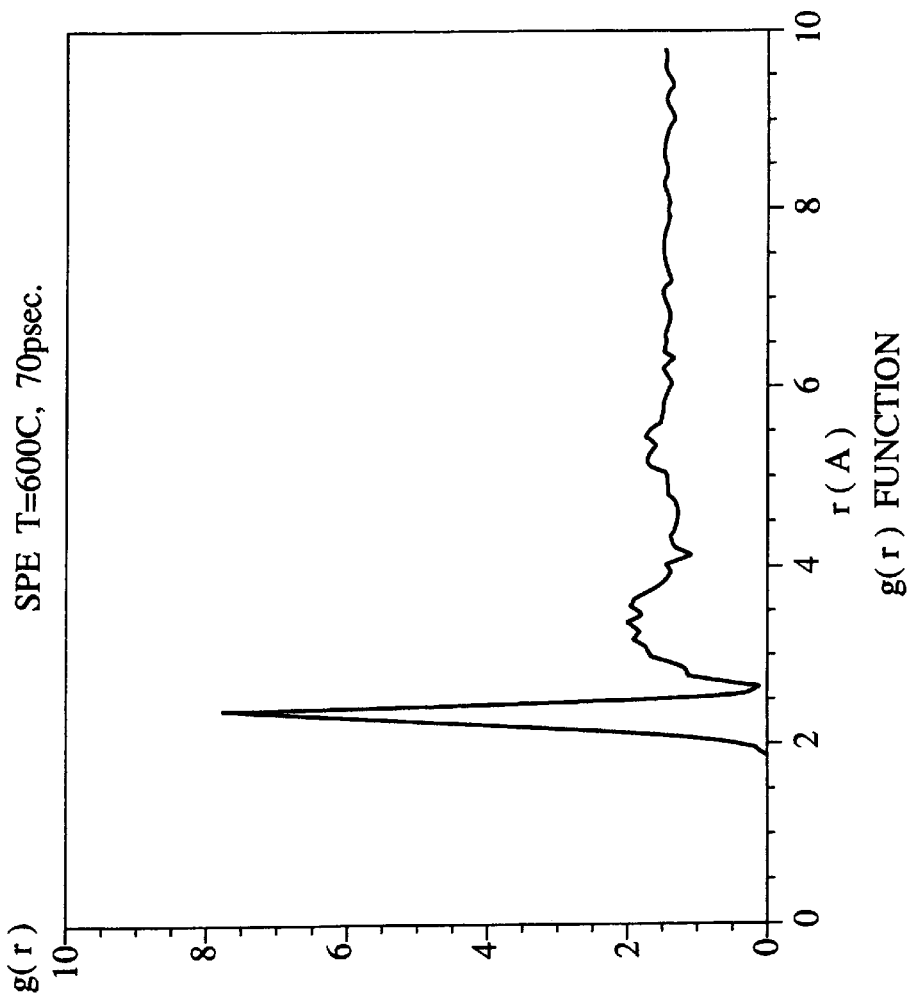
FIG. 66 is a view showing distribution of an Si—Si distance as still further execution example at atomic level according to the simulation system according to the present invention.
Figure 67:
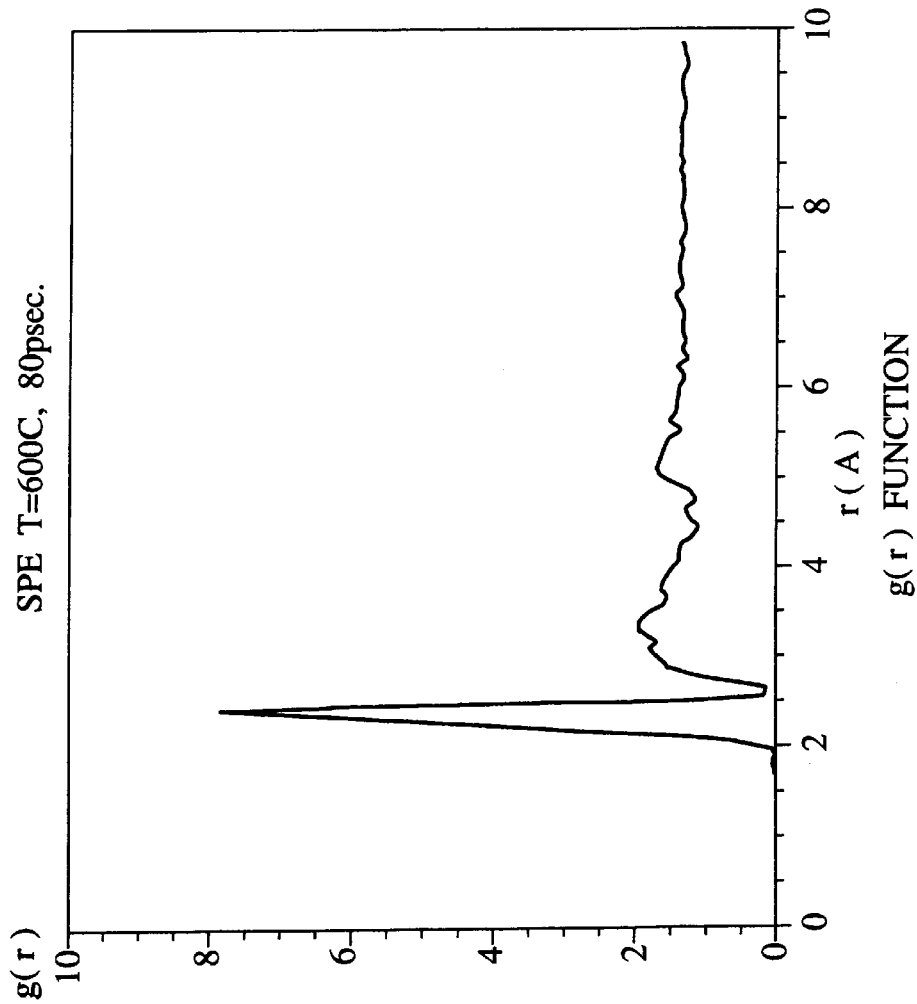
FIG. 67 is a view showing distribution of an Si—Si distance as yet still further execution example at atomic level according to the simulation system according to the present invention.
Figure 68:
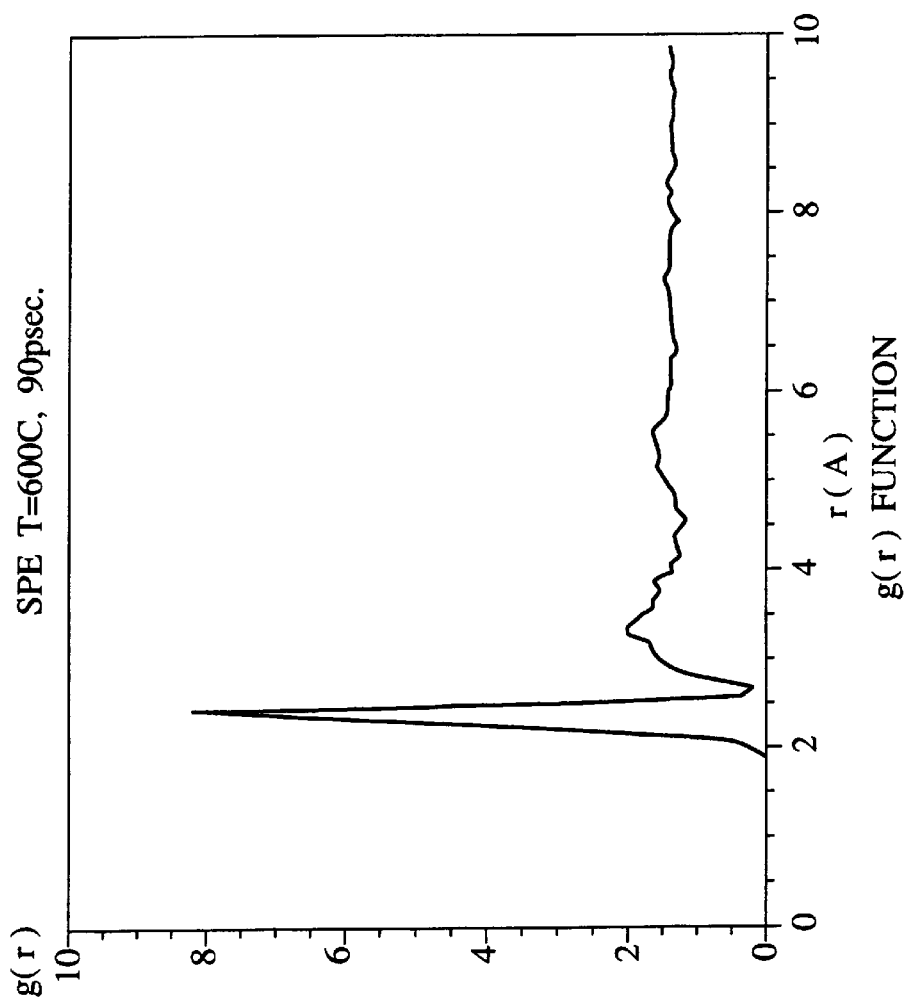
FIG. 68 is a view showing distribution of an Si—Si distance as an additional execution example at atomic level according to the simulation system according to the present invention.
Figure 69:
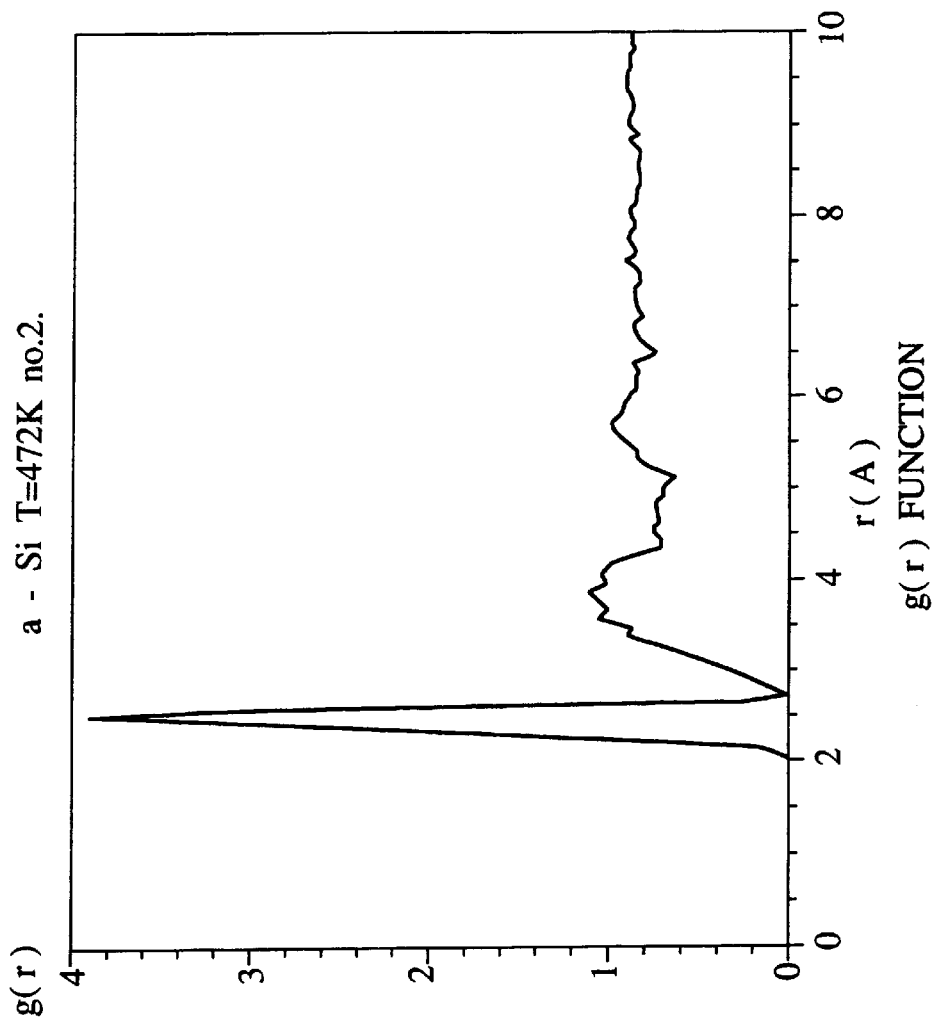
FIG. 69 is a view showing distribution of an Si—Si distance as another additional execution example at atomic level according to the simulation system according to the present invention.
Figure 70:
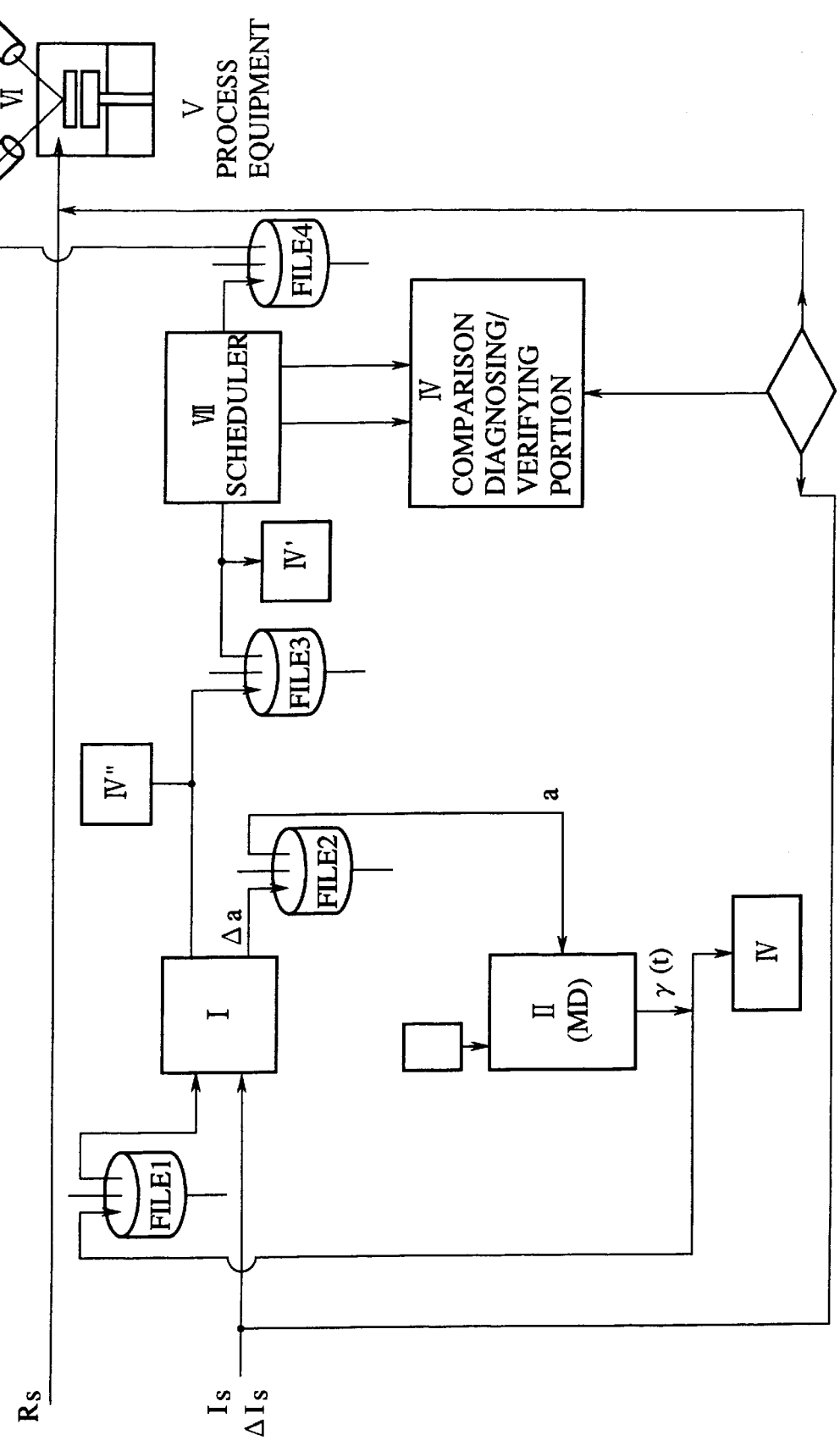
FIG. 70 is a schematic view showing over all structure of another system according to the present invention.
Figure 71:
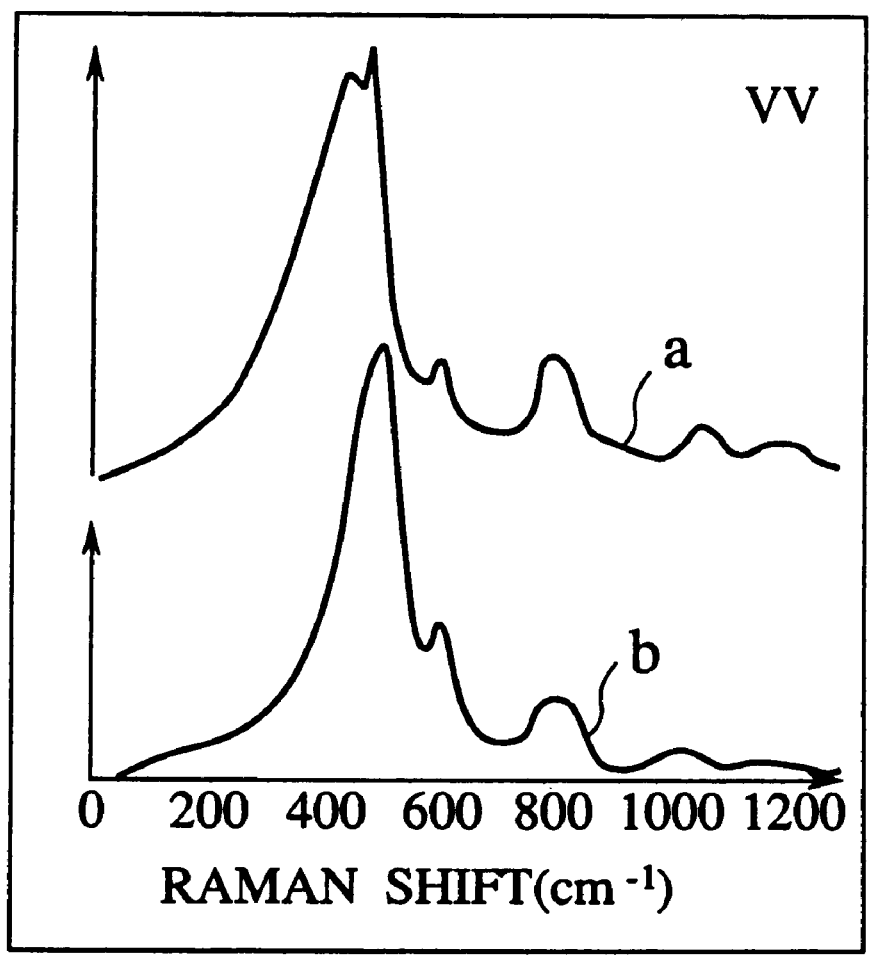
FIG. 71 is a characteristic view showing Raman's measured result in the prior art.
Figure 72:
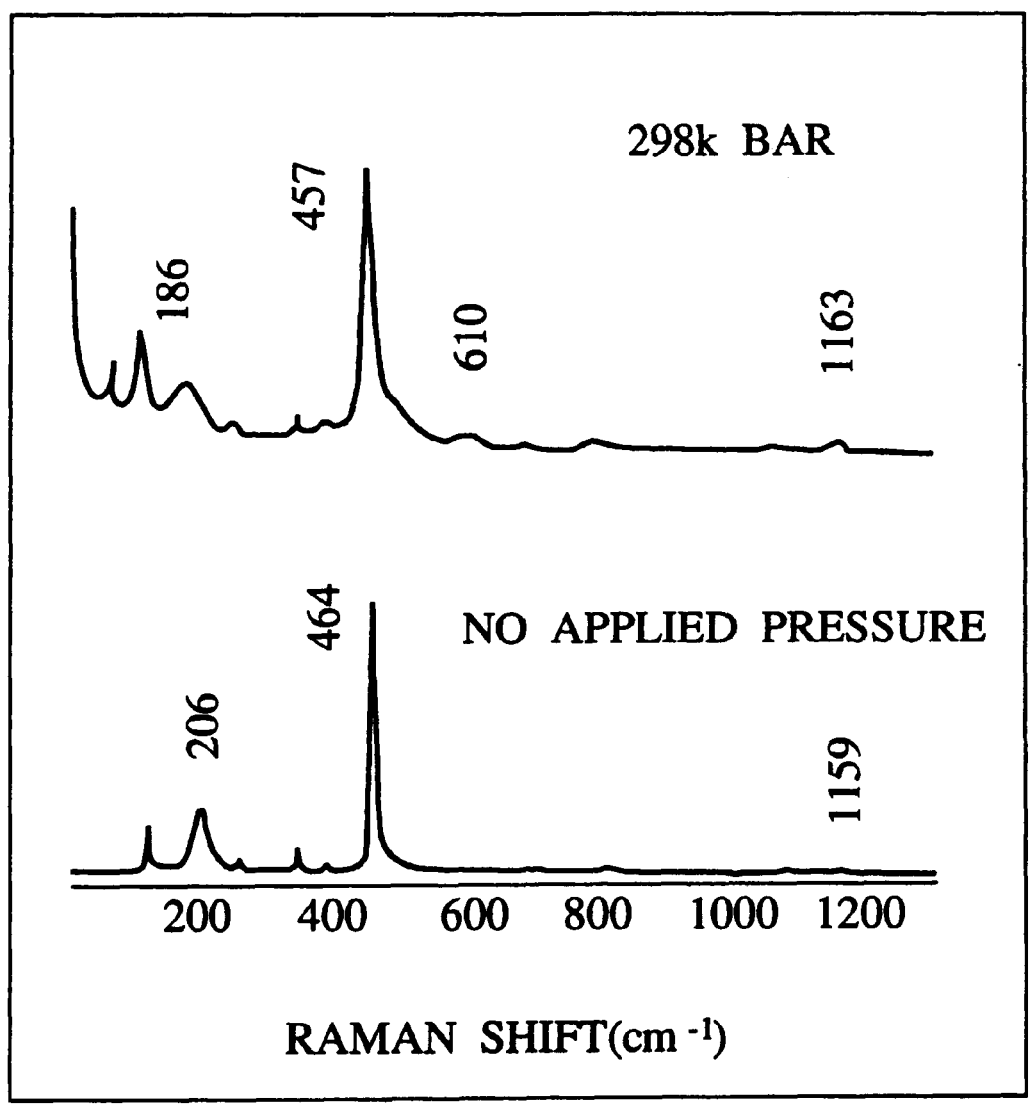
FIG. 72 is a characteristic view showing Raman's measured result in the prior art.

On page 63 of this publication, how Raman signals of the amorphous oxide film would be changed according to steps is discussed by Paul McMillan. FIGS. 71 and 72 show the results measured by Paul McMillan. For instance, in FIG. 71, a curve a indicates Raman's measured results of usual oxide film while a curve b indicates Raman's measured results of densified oxide film.

In the prior art, reason for this difference has been considered that moisture is removed by a densifying process to thus change spectrum in the latter, for example, when spectra in both results are compared with each other. Also FIG. 72 shows spectra before and after pressure is applied to a single crystal quartz. Changes in spectra can be seen especially at 610 and 500 1/cm. However, first it is apparent at a glance from the above that an amount of change in spectrum is very small, and as a result it needs considerable technique to determine to which range of the spectrum attention is to be paid and whether such change is difference in significance or not. In addition, further complicated experience is required to identify an amount of variation in material based on the amount of variation in spectrum.

Because of such circumstances, there are a lot of materials for which an identification table of spectrum is not prepared, so that interpretation of spectrum becomes a major bar to development of new materials which are required much more in future.

Moreover, as discussed on page 71 of the above publication, Kobayashi et al. have checked changes of Raman spectrum of the oxide fiber under high stress. A part of the results is shown in FIG. 73. The results are shown here in the event that no stress is applied to $SiO_2$ fiber and 3.5% tensile strain is applied to the same. As seen from FIG. 73, if 3.5% tensile strain is applied, the change appears near 450 1/cm. However, as also seen in this case, an amount of change in spectrum is extremely small, and therefore technique would be required considerably to determine to which range of the spectrum attention is to be paid and whether such change is difference in significance or not. Still further, more experience is required to identify an amount of variation in material based on the amount of variation in spectrum.

In the above publication, Kobayashi has tried to interpret the spectrum with the use of FIG. 74. As understood from FIG. 74, he has mentioned that a tetrahedral portion in the $SiO_2$ structure at 109.5 degree is distorted when the $SiO_2$ is subjected to tensile strain. However, although he has put forward only a set of tetrahedral structures to argue, he has not discussed bonding state between the tetrahedral portion and an adjacent tetrahedral portion at all. In practice, angular distribution exist certainly since temperature is finite.

Figure 75A:
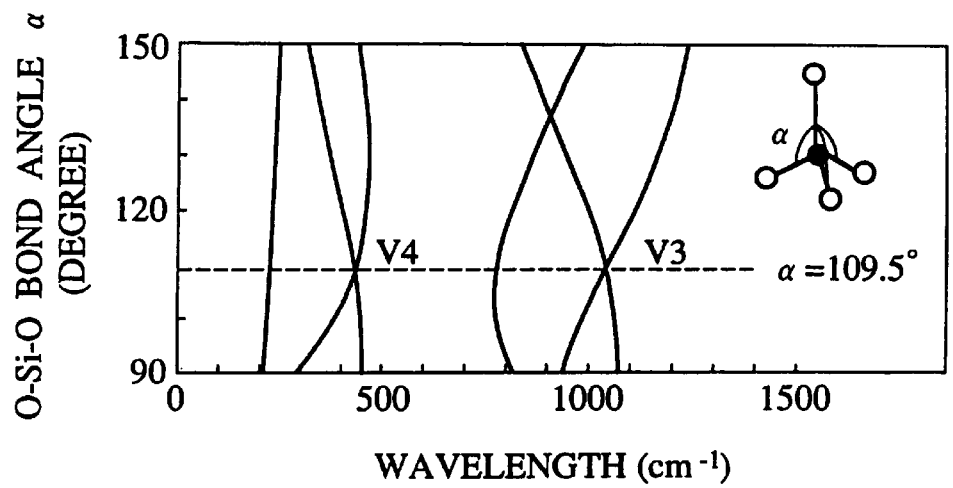
FIGS. 75A, 75B and 75C are characteristic views showing wavelength of normal mode oscillation of SiO4 tetrahedron as a function of O—Si—O bond angle and reduction in strength due to stress.
Figure 75B:
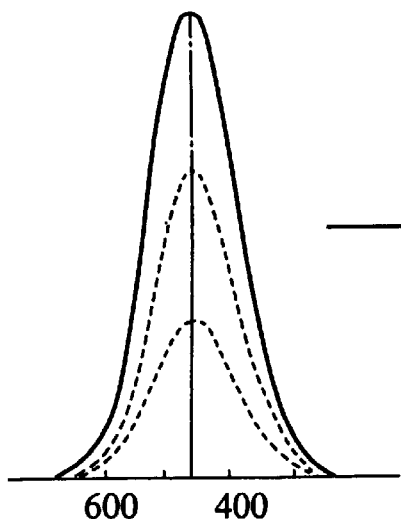
Figure 75C:
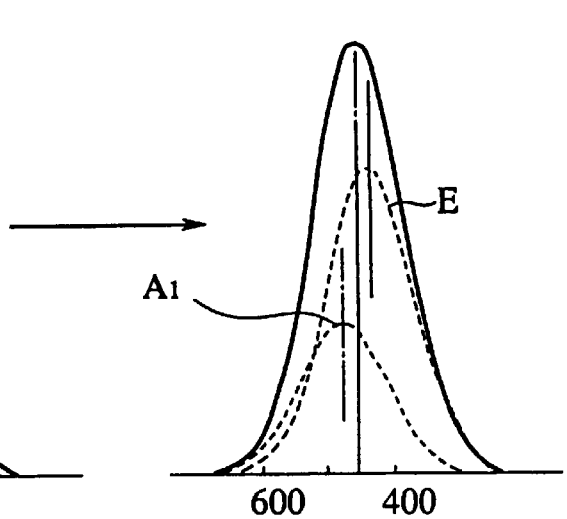

As described often in this specification by the inventors of the present invention, such discussion is quite far from spectrum analysis unless quantitative distribution can be grasped. With respect to FIG. 75, similar discussion has been developed by Kobayashi. FIG. 75(*a*) is a characteristic diagram showing wavelength in normal oscillation mode of a $SiO_4$ tetrahedron as function of O—Si—O bond angle. FIGS. 75(*b*) and 75(*c*) are characteristic diagrams showing reduction in strength due to decoupling in V4 mode caused by stress.

Figure 76:
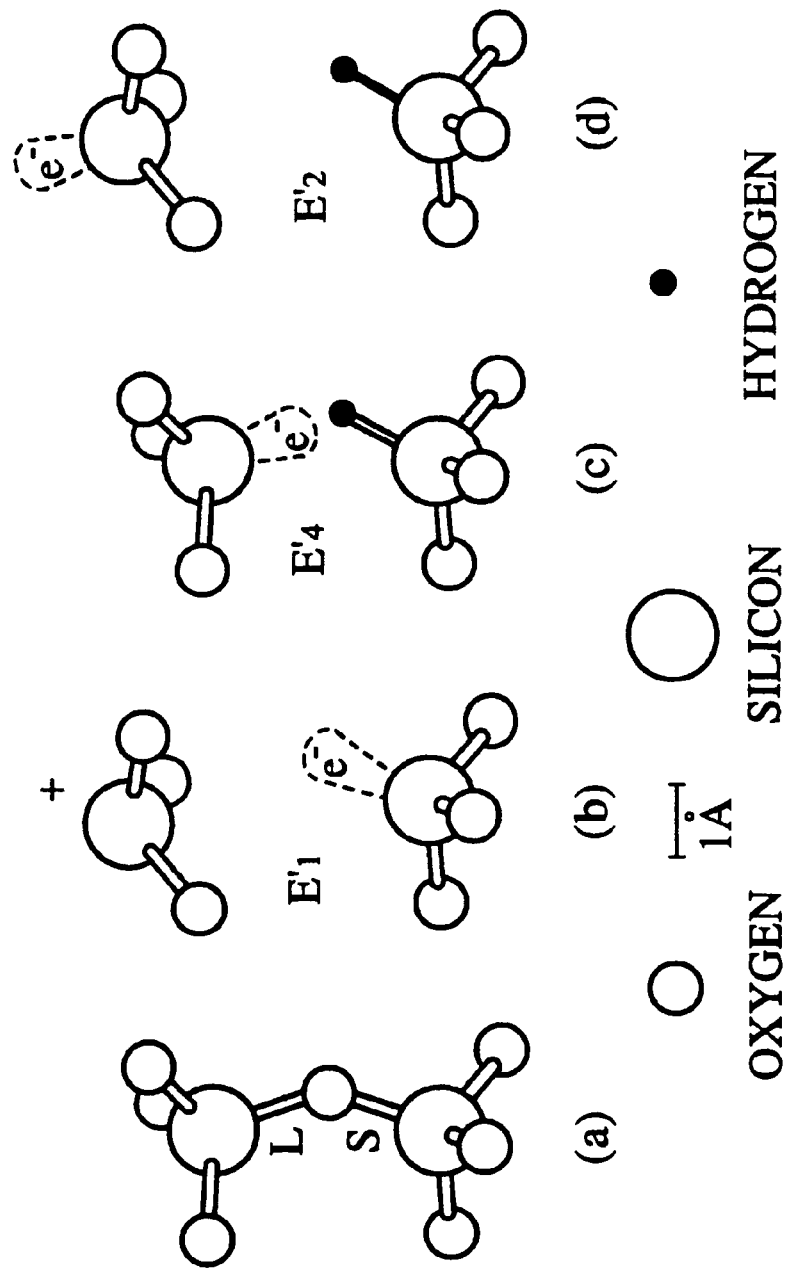
FIGS. 76A, 76B, 76C and 76D are views showing models having default in $SiO_2$ respectively.

FIG. 76(*a*) to 76(*d*) are views showing defect models in oxide film provided by W. B. Fowler, which are set forth on page 107 of the above publication. FIG. 76(*a*) shows a bond model of part of perfect α type quartz. L is long bond and S is short bond. FIG. 76(*b*) shows a model at $E_{1'}$ center, FIG. 76(*c*) shows an $E_{4'}$ model, and FIG. 76(*d*) shows an $E_{2'}$ model. Unpaired electrons in FIGS. 76(*b*) to 76(*d*) are represented by $e^-$.

As is evident from FIGS. 76(*a*) to 76(*d*) in the above publication, the deficient structure has been discussed with the use of one or two tetrahedral structures at 109.5 degree. However, as described above, actually angular distribution would occur surely at a certain finite temperature. Accordingly, unless a large number of calculations in some kind have to be carried out, such discussion is quite far from spectral analysis.

Figure 77:
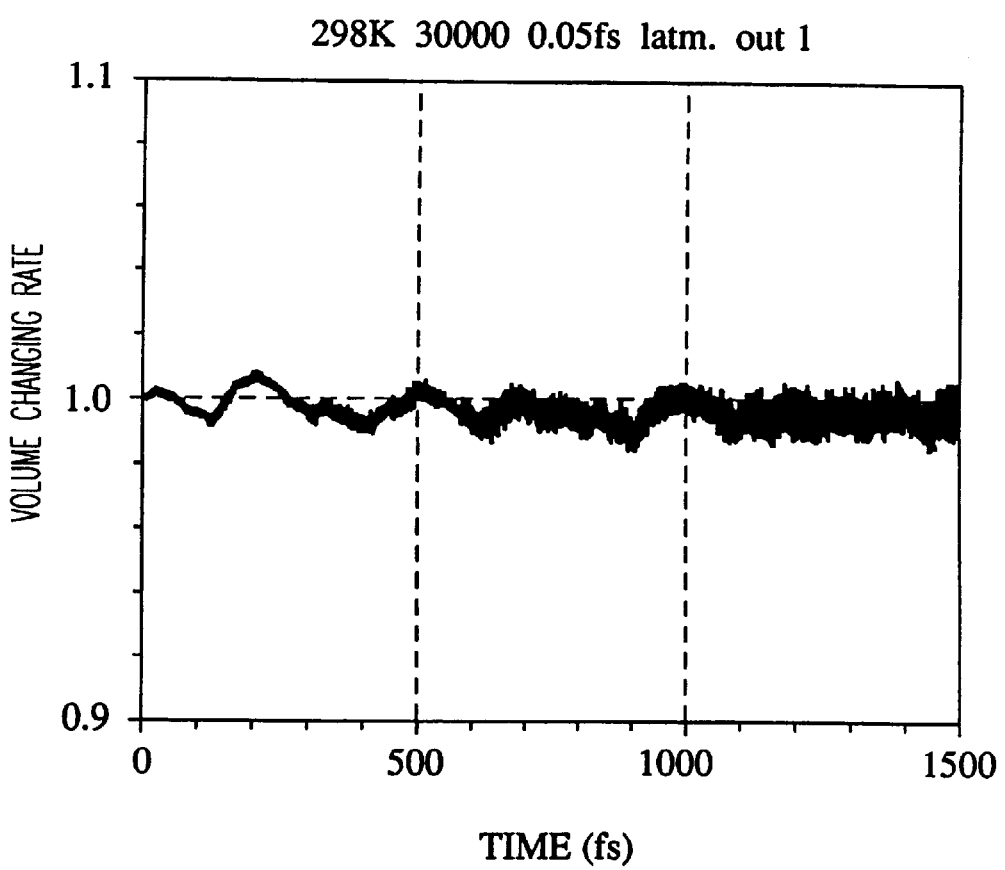
FIG. 77 is a characteristic view showing an example executed by the molecular dynamics simulator according to the present invention.

FIG. 77 shows an example which is carried out by a new molecular dynamics simulator fabricated by the inventors of the present invention. Thirty-two of Si and sixty-four of oxygen have been used and five hundreds and twenty of reciprocal lattice point have been present. The ordinate shows rate of change while the abscissa shows time. It has been confirmed from FIG. 77 that the pressure reaches substantially equilibrium with external pressure after 1000 fs. For purposes of example, O—Si—O angle (degree), Si—O—Si angle (degree), and O—Si distance (Angstrom) at this time are shown in FIG. 24.

The inventors of the present invention have prepared several measures in computation approach. For instance, in Infrared absorption, oscillation modes to meet law of selection in infrared absorption are extracted from time series data of momentary oscillation motion c,f atoms and their probability may be calculated.

With the use of molecular dynamics system, time is set to zero when the system reaches sufficiently equilibrium and then a time period from zero to time t is set as a sampling time. Time correlation is calculated as follows.

$$F(\omega) = \int <M(t) \cdot M(0)> e^{-\omega^{ni}t} dt \qquad (1361)$$

Where M(t) is dipole moment which is expressed by following Eq.(1362). Integrated value of the above Eq.(1361) is obtained by integrating over the range from $-\infty$ to $+\infty$.

$$M(t) = \Sigma e_i \cdot r(t) \quad (1362)$$

In addition, <M(t)·M(0)> denotes autocorrelation function of M. Where $e_i$ is the number of charge in that point, i is particle number, and r is vector. Especially there is no restriction on a starting point of measurement of r, but the starting point is preferred to be set at a corner of a computation cell.

In order to calculate time correlation, $s(t_1) \cdot (t_2) \cdot s(t_3) \cdot s(t_4) \cdot s(t_5) \cdot s(t_6) \cdot s(t_7) \cdot s(t_8)$ are to be calculated at respective times.

For instance, in the calculation results obtained by the molecular dynamics in which higher order terms are introduced, calculated values in momentary coordinate location over the overall sampling time, their kinetic energy, momentum, etc. are included with respect to all particles. Further, mutual distance between particles, their relation between angular locations, etc. are also calculated.

Figure 78:
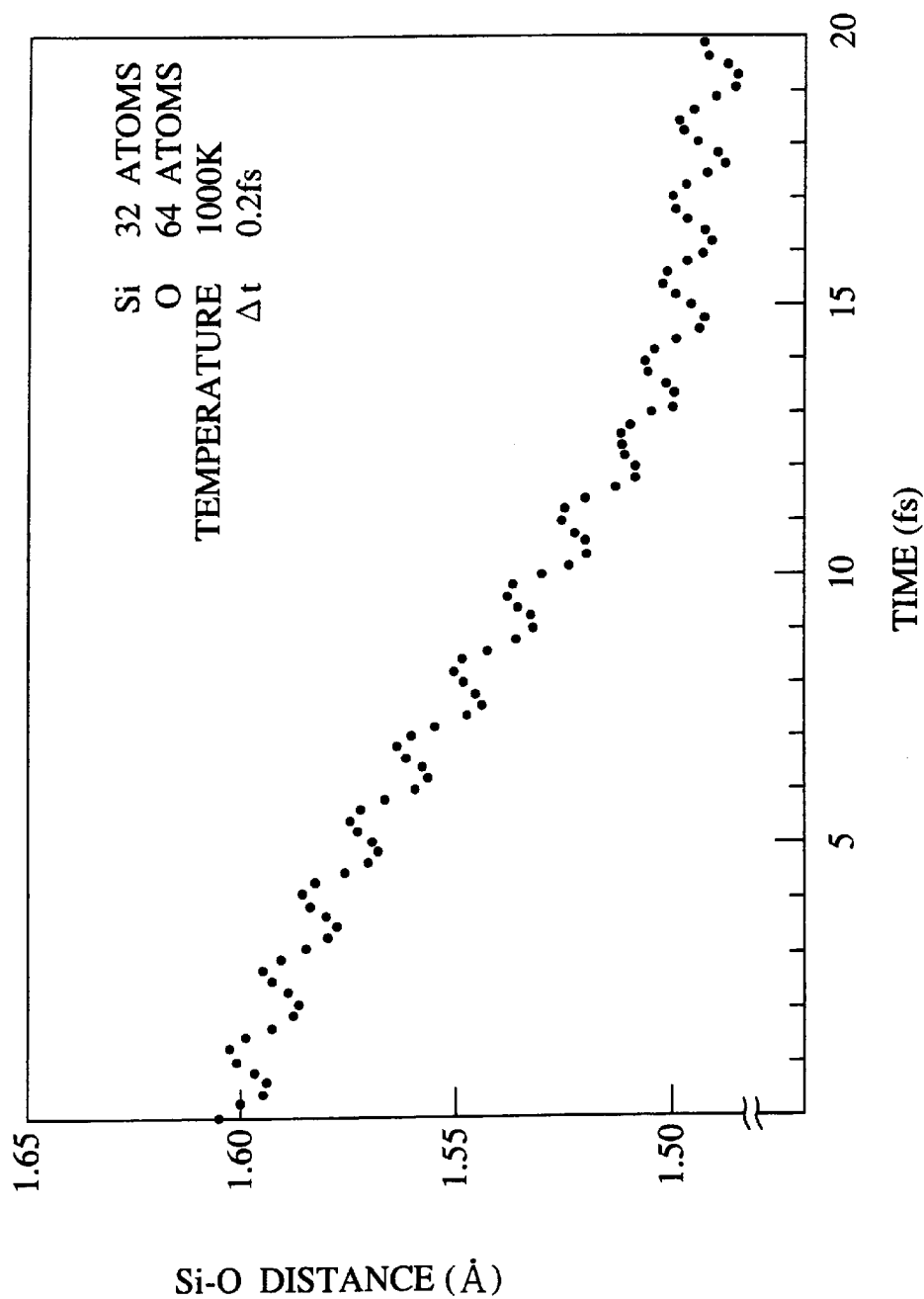
FIG. 78 is a characteristic view showing another example executed by the molecular dynamics simulator according to the present invention.
Figure 79:
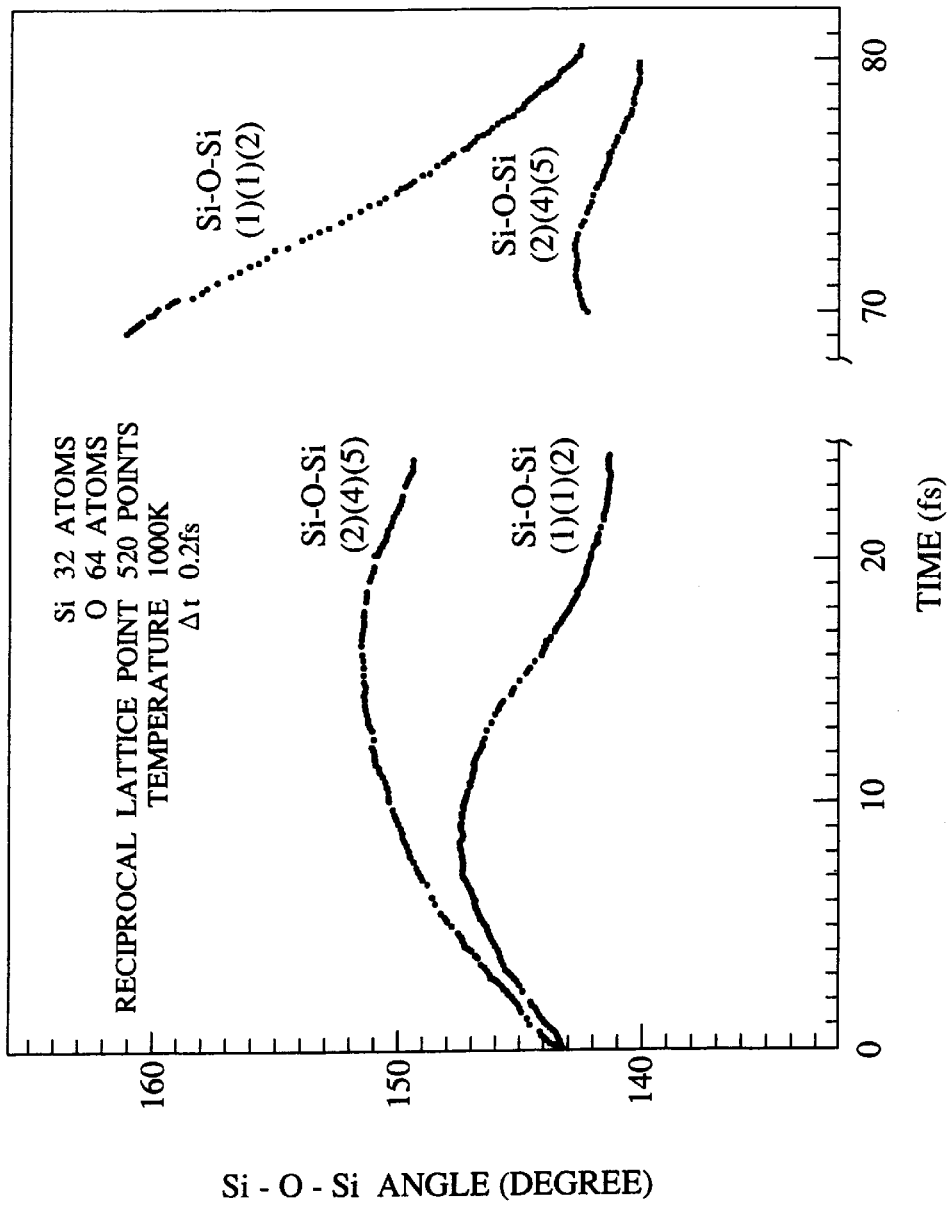
FIG. 79 is a characteristic view showing still another example executed by the molecular dynamics simulator according to the present invention.

Several crystalline oxide films and amorphous oxide films are also calculated by the inventors. A part of the results is shown in FIG. 78. In other words, FIG. 78 shows calculated results of Si—O distance in a single crystal cristobalite as an example. FIG. 79 shows calculated results of Si—O—Si angle if deficiencies are caused. It should be understood from FIG. 79 that motion has been disturbed significantly around deficiencies. While changing density of these deficiencies variously, similar behavior has been calculated.

Figure 80B:
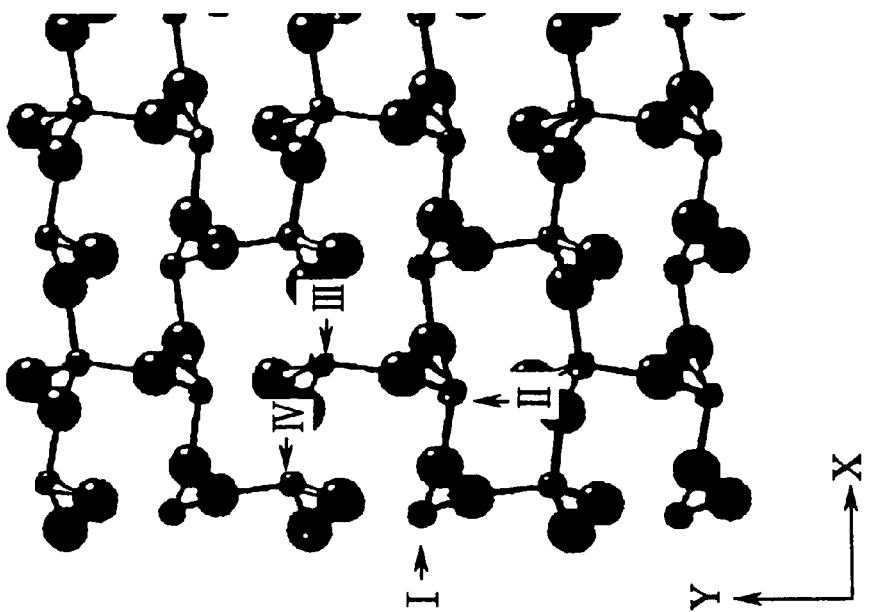
FIGS. 80A and 80B are views showing motion of atoms as examples executed by the molecular dynamics simulator according to the present invention.
Figure 80A:
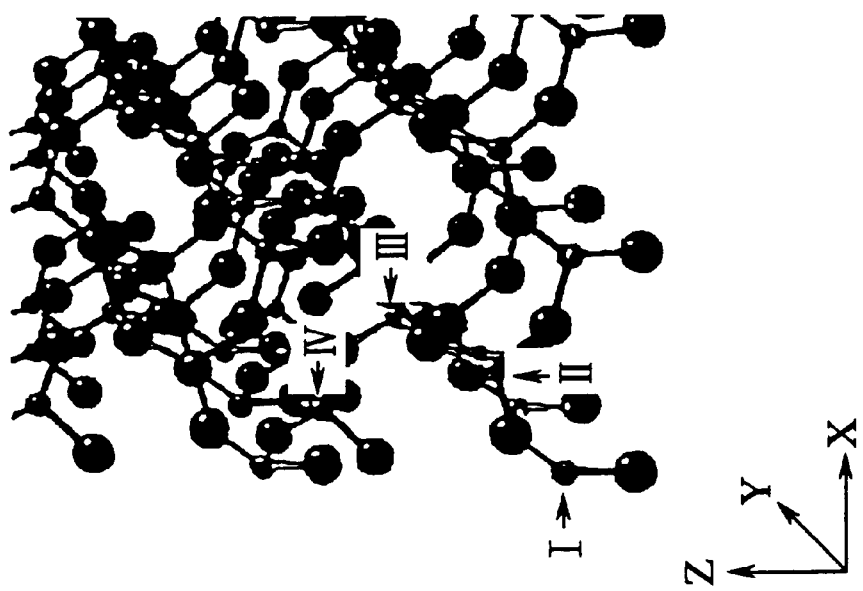

FIG. 80(*a*) and 80(*b*) show an example executed by a new molecular dynamics which is established by the inventors. Motion of atoms has been simulated on the display based on r, θ which change depending upon time. In FIGS. 80(*a*) and 80(*b*), large round marks show oxygen and small round marks show Si. FIG. 80(*a*) shows atoms in an XYZ space and FIG. 80(*b*) shows projection onto the XY plane. It has been found that, although loci of the projection are not illustrated to avoid the unclear drawing, atoms have mainly moved preferentially in the direction along a median line between X-Y axes in this single crystal. This fact provides a large bias to the portion given in the above Eq.(1362), i.e., $$M(t) = \Sigma e_i \cdot r(t) \quad (1371)$$

and as a result it shows the spectrum profile being unique to a single crystal as optical spectrum depending upon dipole moment.

Figure 81:
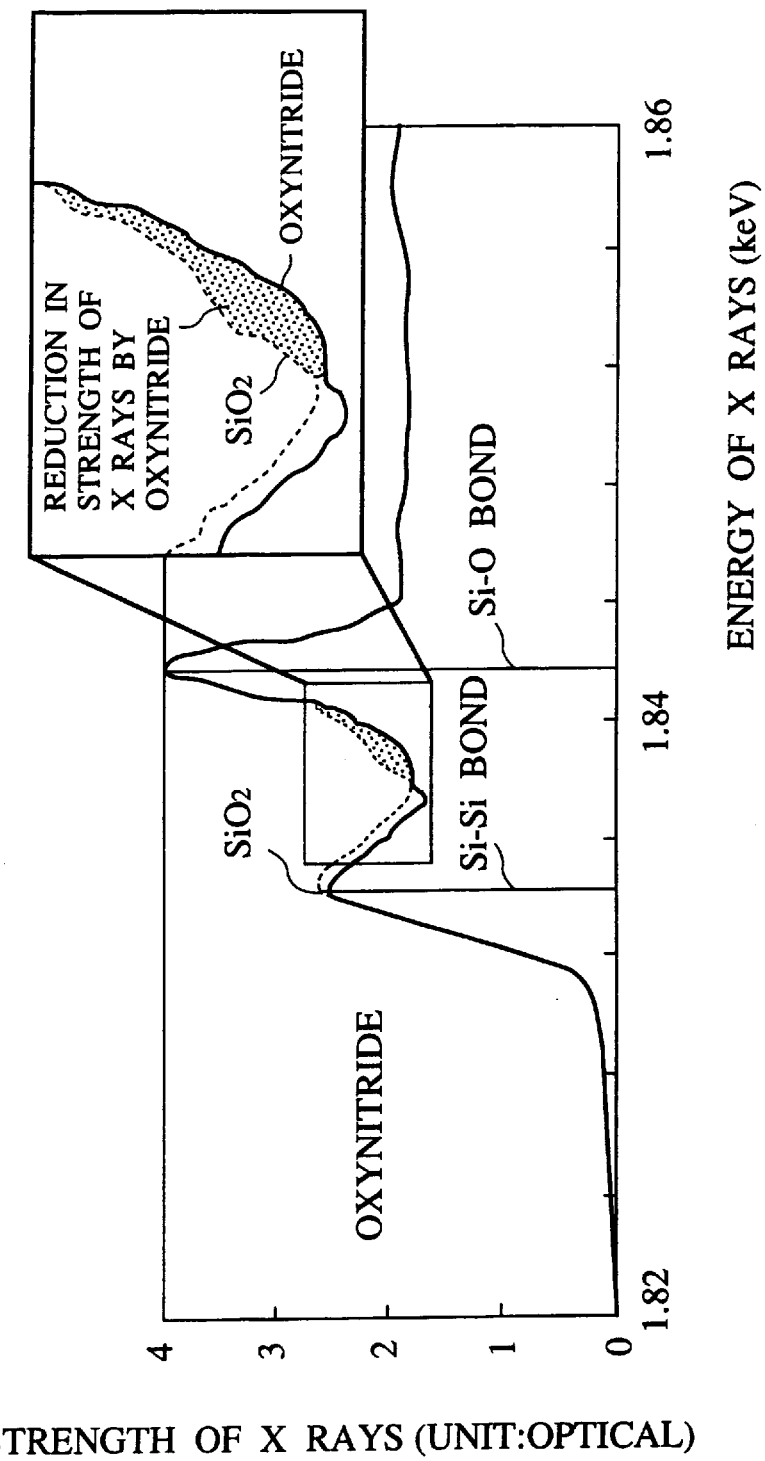
FIG. 81 is a characteristic view showing an X-ray spectrum prediction result as an example executed by the molecular dynamics simulator according to the present invention.
Figure 82A:
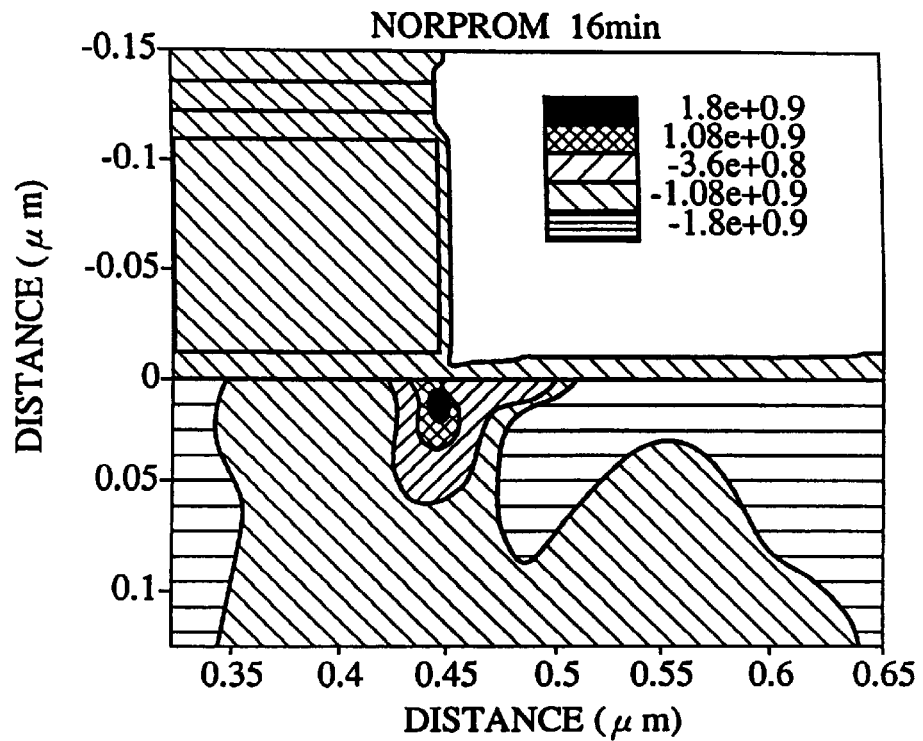
FIGS. 82A and 82B are characteristic views showing stress prediction results as examples executed by the molecular dynamics simulator according to the present invention.
Figure 82B:
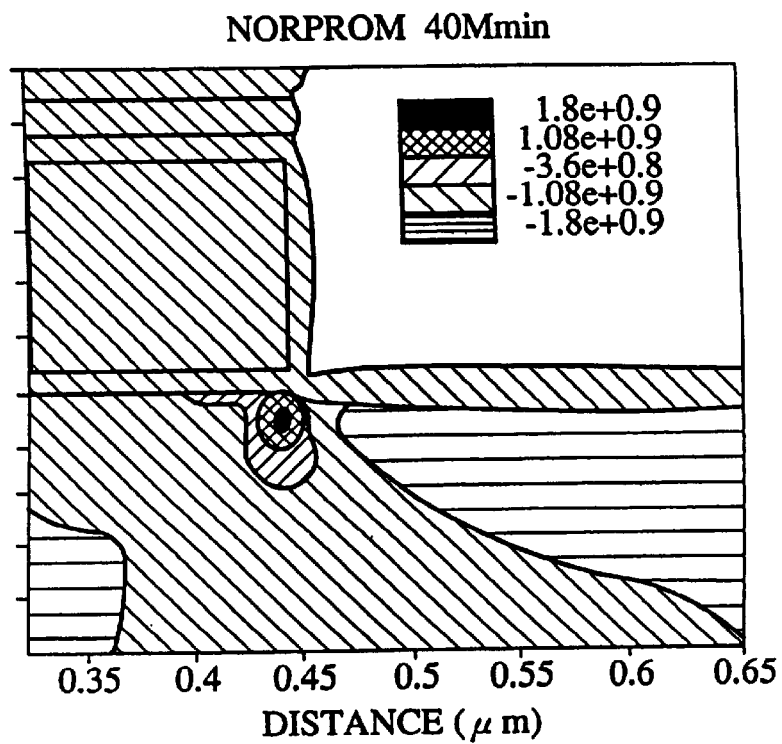

With changing the measuring temperature, simulations as for behavior of individual atoms, states of natural oscillation based on such behavior, and cases where distortion is applied to the above have been executed by the inventors. FIG. 81 and FIG. 82 show examples of them. More particularly, FIG. 81 is a view showing X-ray spectrum prediction by means of the new molecular dynamics simulator fabricated by the present invention, and FIG. 32 is a view showing similar stress prediction results.

Embodiment 2

The inventors of the present invention enable spectrum of the oxide film to predict if oxygen deficiency is caused, and then enable the film to be compared with the actual oxide film. As the second embodiment, an example is shown wherein even optical natures of the oxygen deficient oxide film can be calculated.

No problem occurs when ab initio molecular dynamics is used. However, if oxygen deficiency is dealt with by the molecular dynamics using TTAT potential or BK potential, there is a problem that what is the best way how to set charge of respective atoms. This is because, if distortion is enhanced significantly, constant charge cannot be supposed because of expansion of bond or presence of Si—Si bond. For example, actually distribution of charge is varied due to expansion of Si—O bond so that polarization is accelerated. As a result, it is supposed that electrostatic energy of expansion oscillation is enlarged and peak frequency of IR is Increased.

Therefore, the inventors of the present invention perform such an approach that may apply to $SiO_2$ for the first time a charge equilibration approach using both ionization potential and electric affinity which have been tried to alkali and hydrogen as object by Rapipe-Goddard, calculate electrostatic potential by incorporating amendment of charge, and detect motion and IR of individual atoms.

Such charge equilibration approach is that electrostatic energy of system is treated as functions of ionization energy of respective atoms, electric affinity of respective atomic pairs, and charge of respective atoms and that, in equilibrium state, simultaneous equations the number of which correspond to the number of atoms are solved from the condition that atomic chemical potentials of respective atoms are equal to thus calculate charges of respective atoms.

Figure 83:
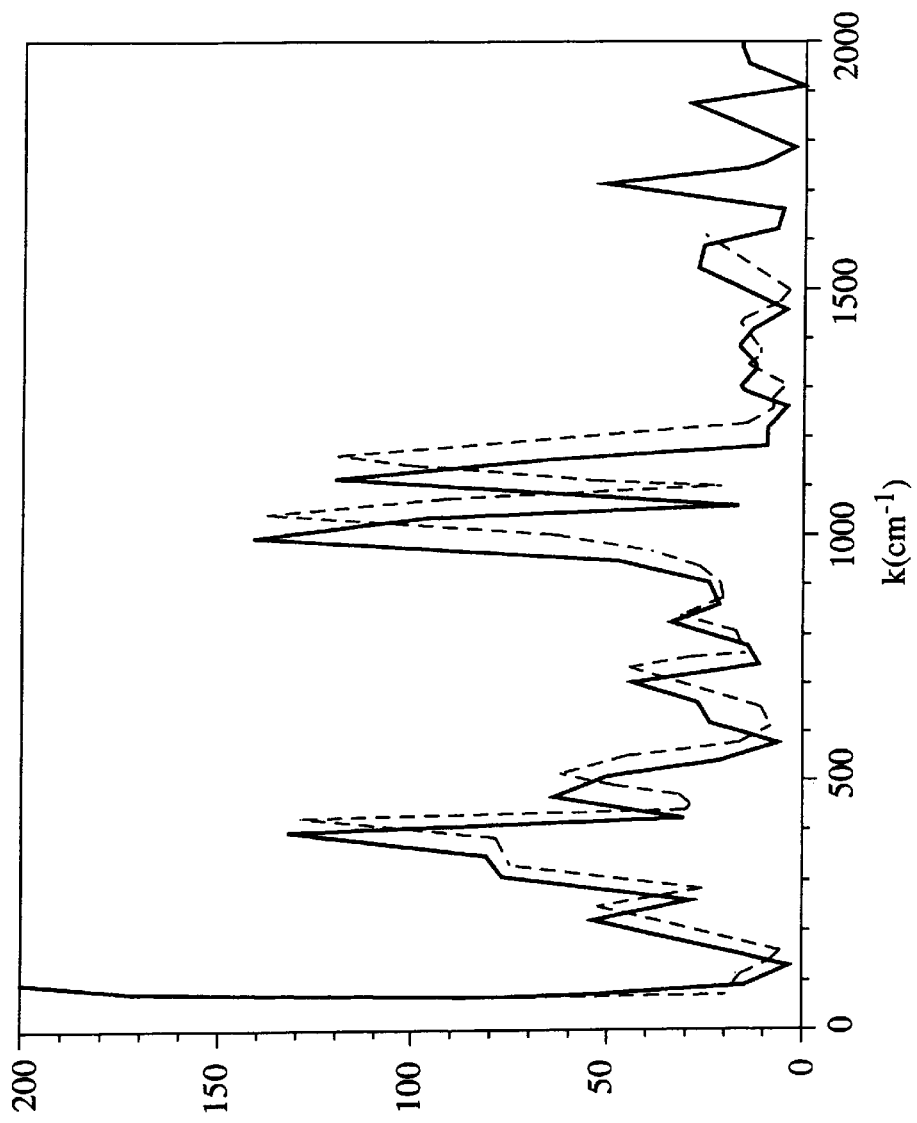
FIG. 83 is a characteristic view showing a result calculated by the molecular dynamics simulator developed newly by the inventors of the present invention.

Comparison between IR line spectrum obtained if this approach is applied to β-quartz and the conventional example is shown in FIG. 83. According to this approach, a peak frequency is shifted toward the low frequency side by about ten %. This value may fit the measured value with high precision. According to this approach, even in a-$SiO_2$, structure and IR spectrum can be correlated with each other with higher precision, so that comparison of calculated value and the measured value can be effectively conducted.

Figure 84:
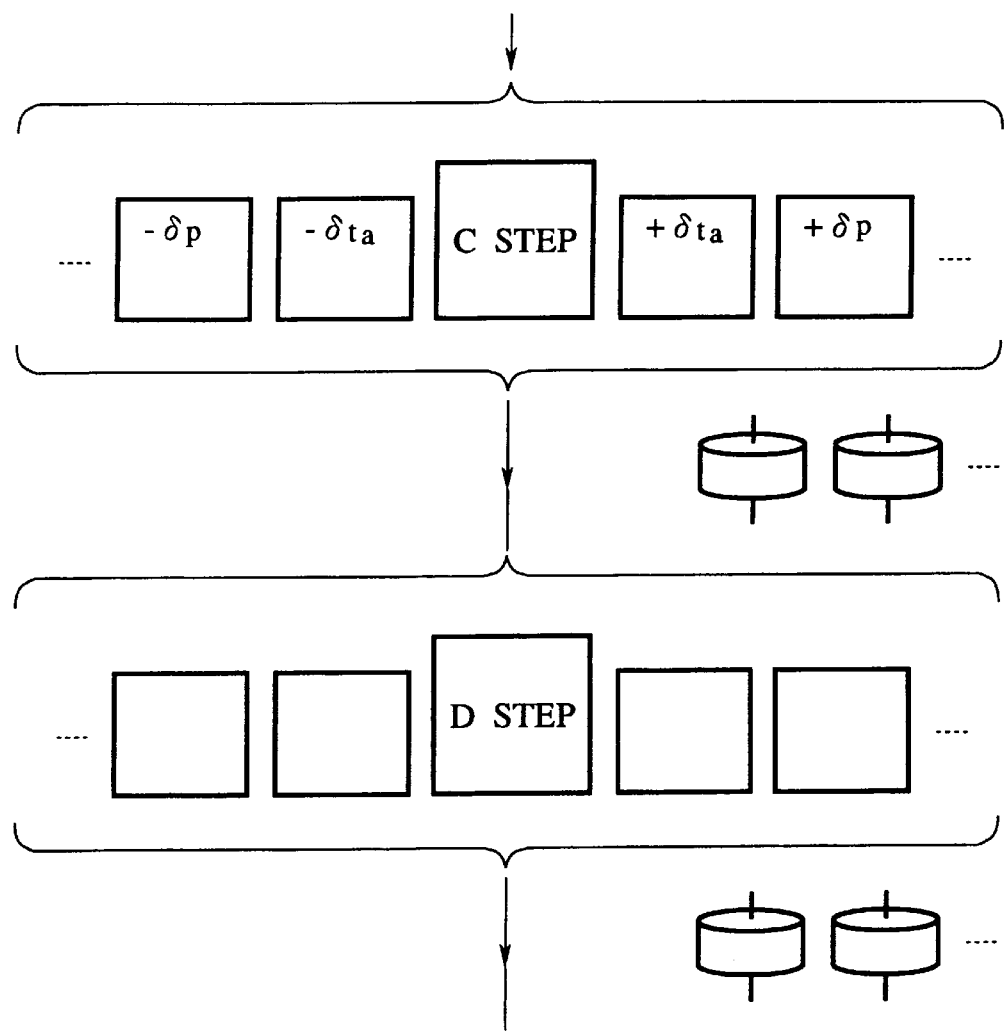
FIG. 84 is a view showing integral calculation including variation of the molecular dynamics simulator with the use of calculus of variation according to the present invention.
Figure 85:
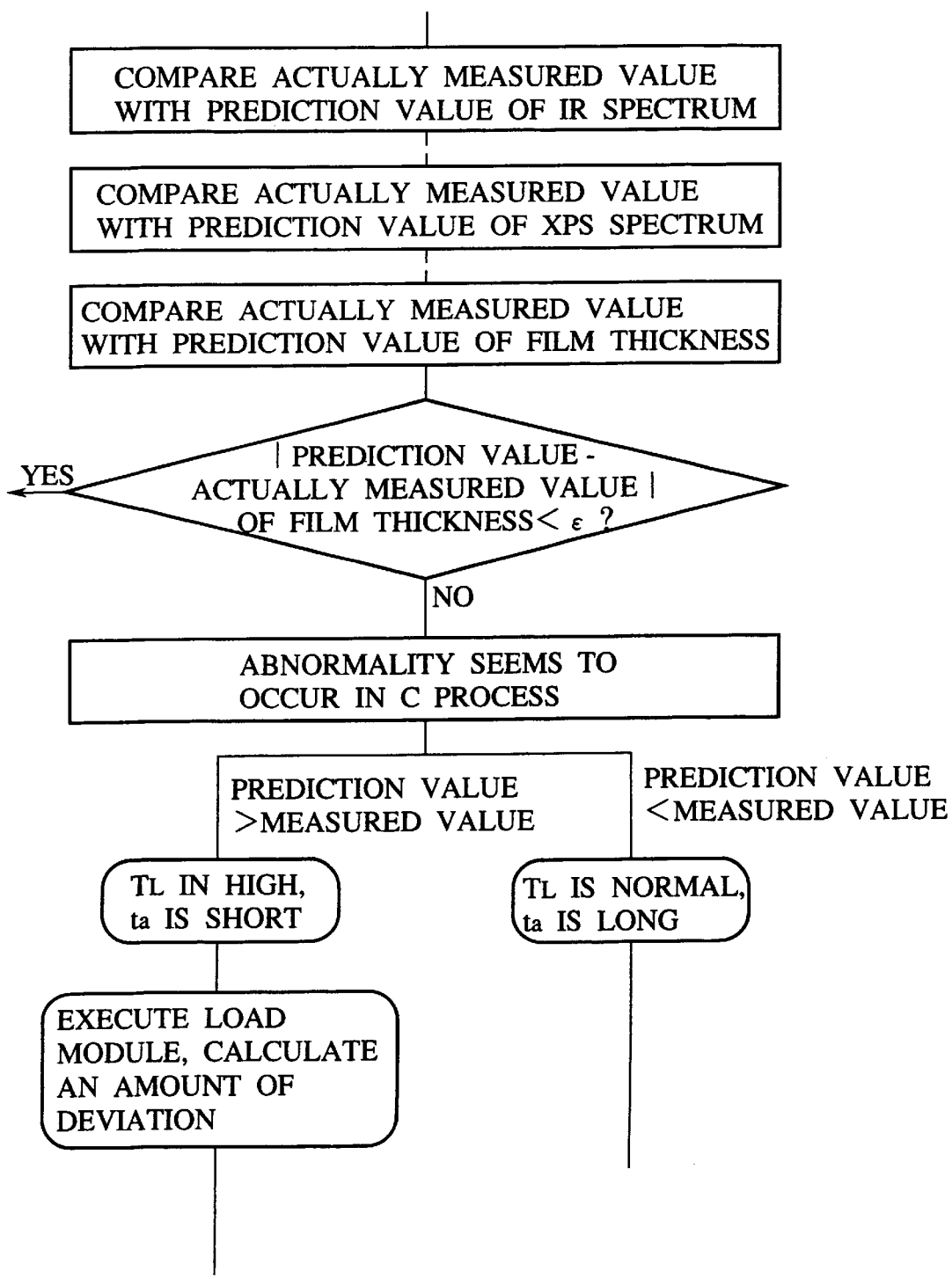
FIG. 85 is a flowchart showing search procedures executed by the molecular dynamics simulator according to the present invention.

For easy understanding, an approach invented by the inventors is shown as a conceptional view in FIG. 84. Also search approach is shown in FIG. 85.

The present invention is not limited to the above embodiment but is applicable effectively when other devices such as liquid phase device and superconductive device are manufactured particularly by the clustered manufacturing equipment. Furthermore, various modifications will be practicable without departing from the scope Of the present invention.

Embodiment 3

Optical spectrum prediction will be discussed in detail as a third embodiment hereinbelow. At first, an approach of forming a-$SiO_2$ (amorphous $SiO_2$) on the computer and then predicting its optical spectrum will be discussed.

Figure 86:
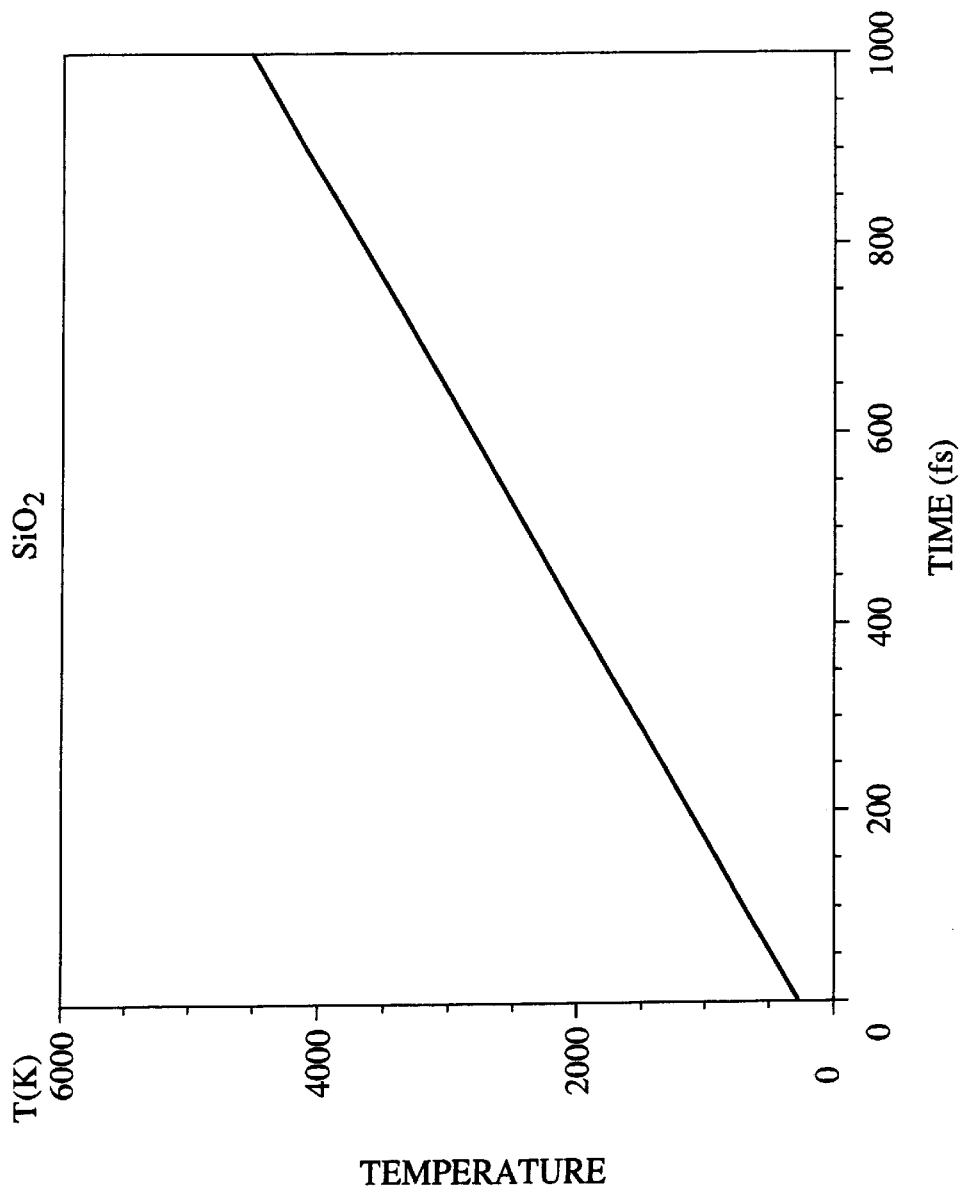
FIG. 86 is a characteristic view showing temperature set carried out by the inventors of the present invention upon forming amorphous $SiO_2$.
Figure 87:
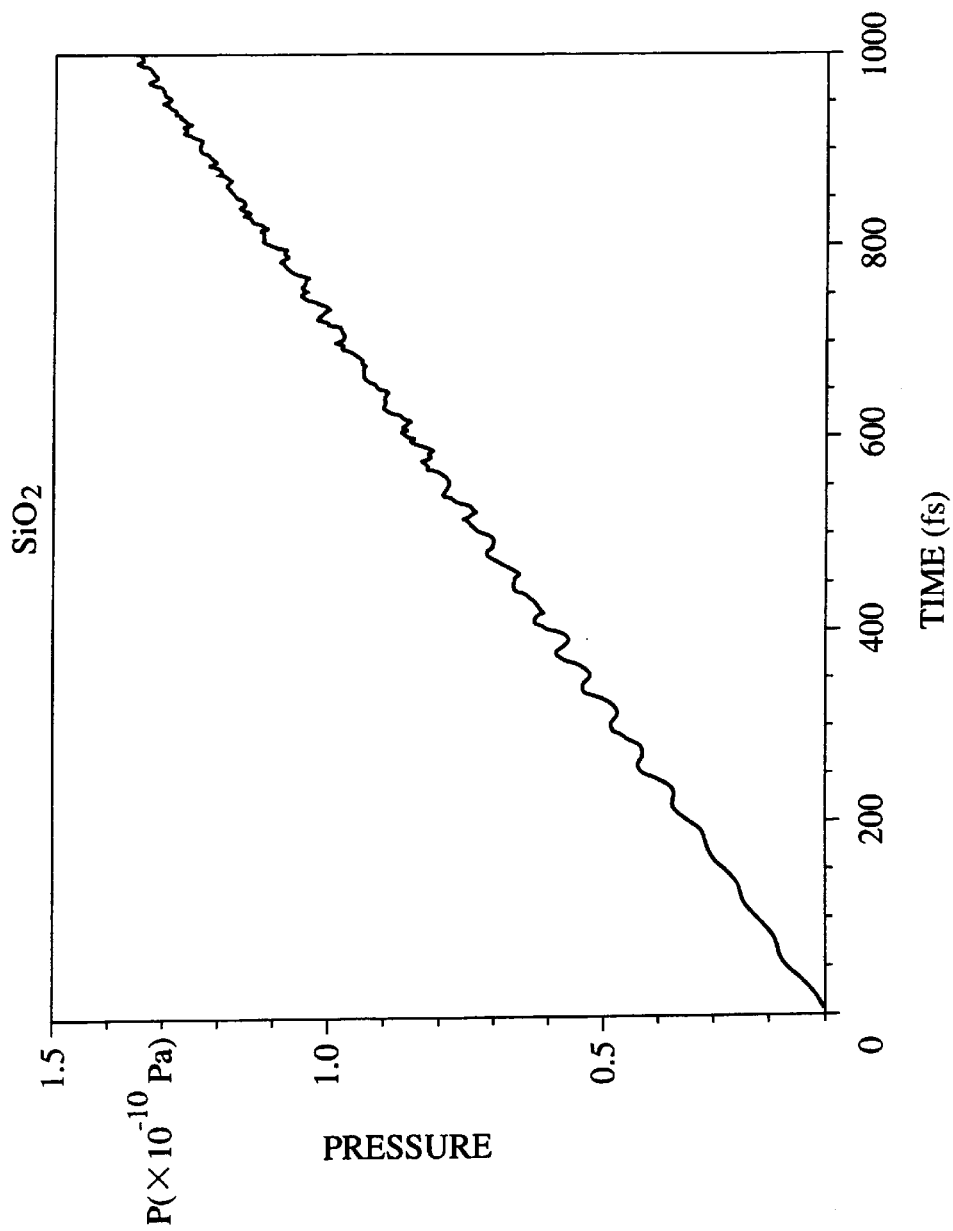
FIG. 87 is a characteristic view showing change in pressure caused in a computer operated by the inventors of the present invention upon forming amorphous $SiO_2$.
Figure 88:
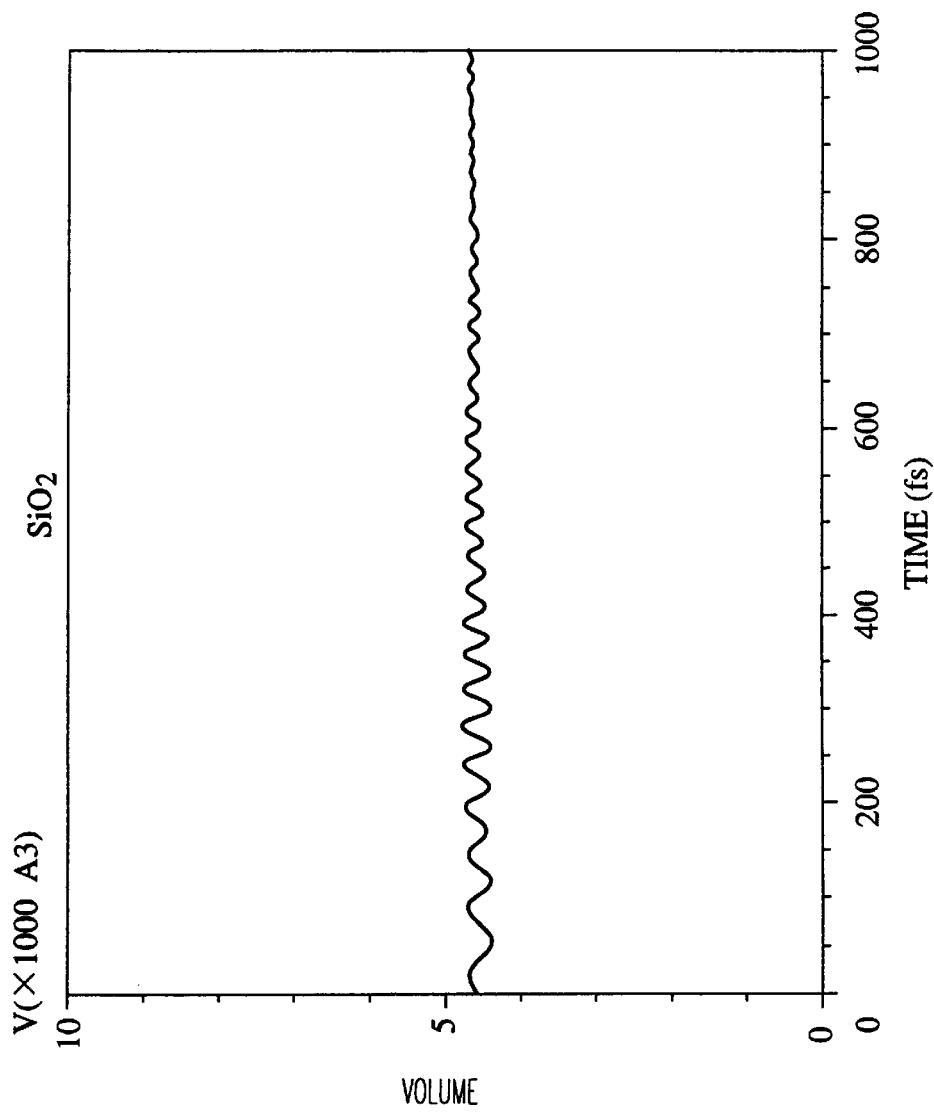
FIG. 88 is a characteristic view showing change in volume detected by the molecular dynamics simulator developed newly by the inventors of the present invention upon forming amorphous $SiO_2$.

The a-$SiO_2$ is formed by melting a single crystal $SiO_2$ on the computer and then quickly chilling it. FIG. 86 shows temperature set upon forming the a-$SiO_2$. Melting may be carried out gradually, but the a-$SiO_2$ has been quickly melted by quickly raising temperature here. Then, temperature is lowered at a similar rate. FIG. 87 shows change in pressure at that time. FIG. 88 shows change in volume of the computational region.

The inventors have found that, in both cases that empirical molecular dynamics method is used and ab initio molecular dynamics method is used, how to treat external pressure and volume in this process is very important when temperature rise and temperature fall is largely varied. For instance, in this embodiment, with keeping the volume substantially constant, external pressure is treated as function of temperature so as to cause phase modification such that pressure is increased with the temperature rise. This behavior is shown in FIGS. 87 and 88.

Figure 89:
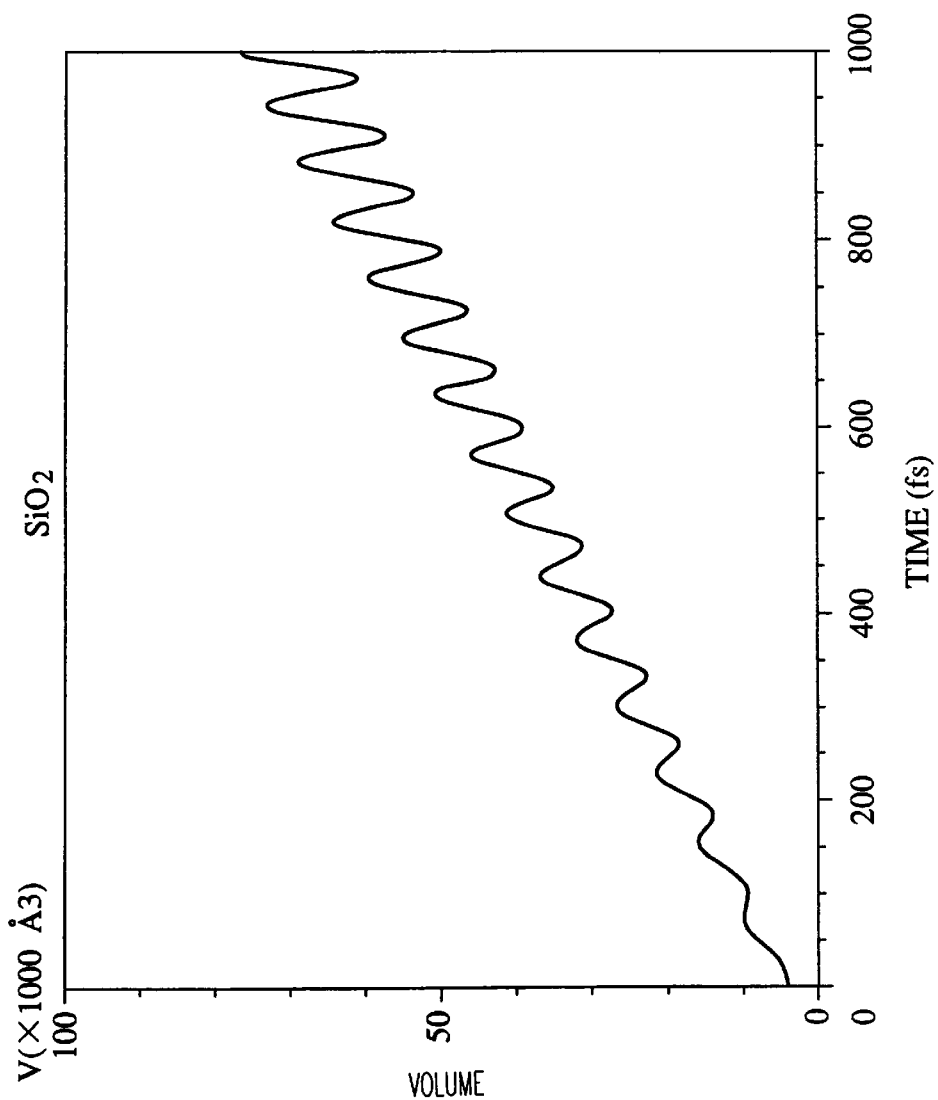
FIG. 89 is a characteristic view showing change in volume detected by the molecular dynamics simulator developed newly by the inventors of the present invention upon forming amorphous $SiO_2$.

However, if external pressure is kept constant with taking no account of the volume, extreme expansion of the volume occurs as shown in FIG. 89. For this reason, SiO$_2$ with extremely low density, which differs entirely from the actual SiO$_2$ melted at high temperature, is formed. Further, even in cooling process, SiO$_2$ with impossibly low density is formed in solid state. Of course, potential energy is very high and is therefore in unstable state. Thus this causes comparison with measured value to be difficult. Accordingly, it has been found that to form a-SiO$_2$ with having sufficient regard to external pressure is desired, and this finding has been carried out.

Figure 90:
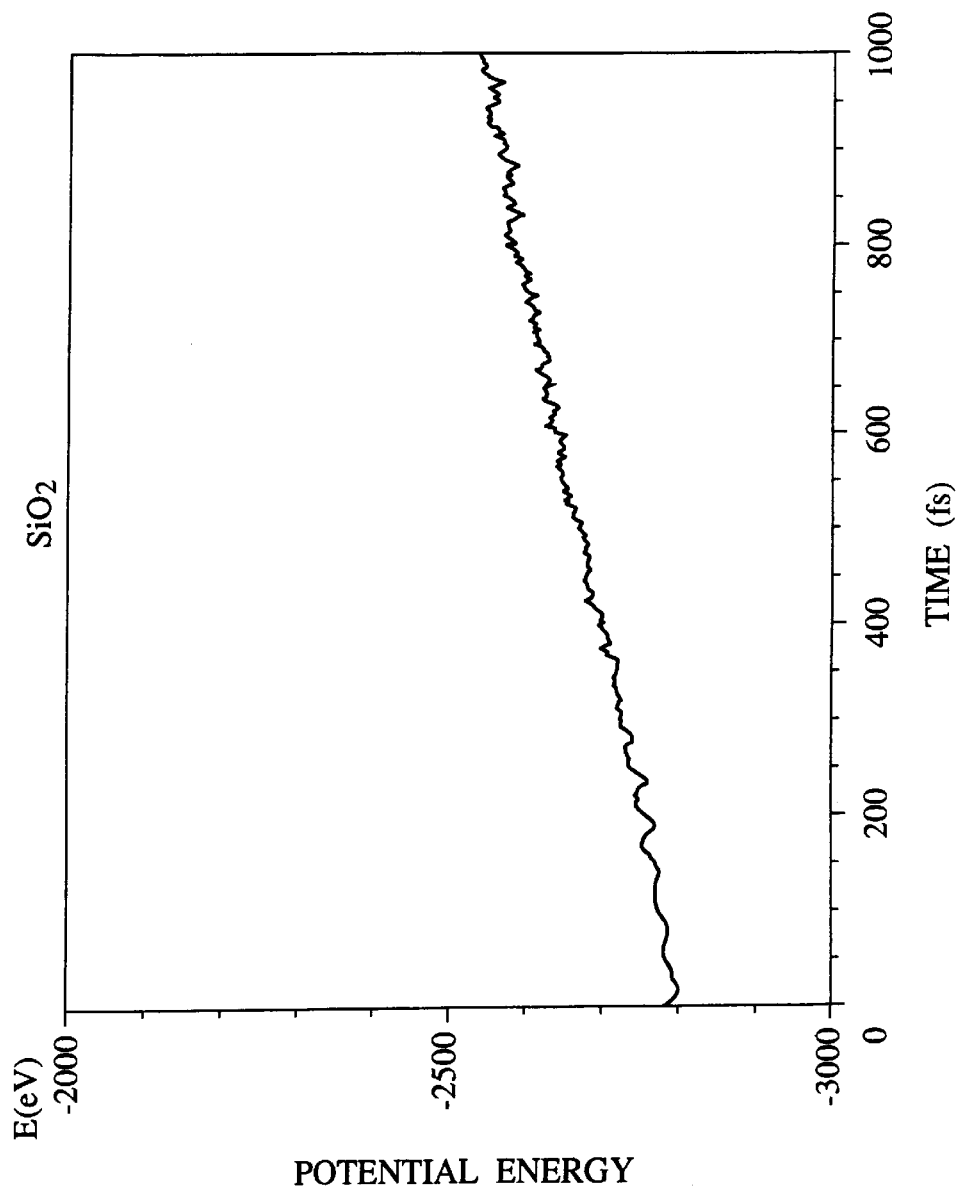
FIG. 90 is a characteristic view showing change in potential energy detected by the molecular dynamics simulator developed newly by the inventors of the present invention upon forming amorphous $SiO_2$.
Figure 91:
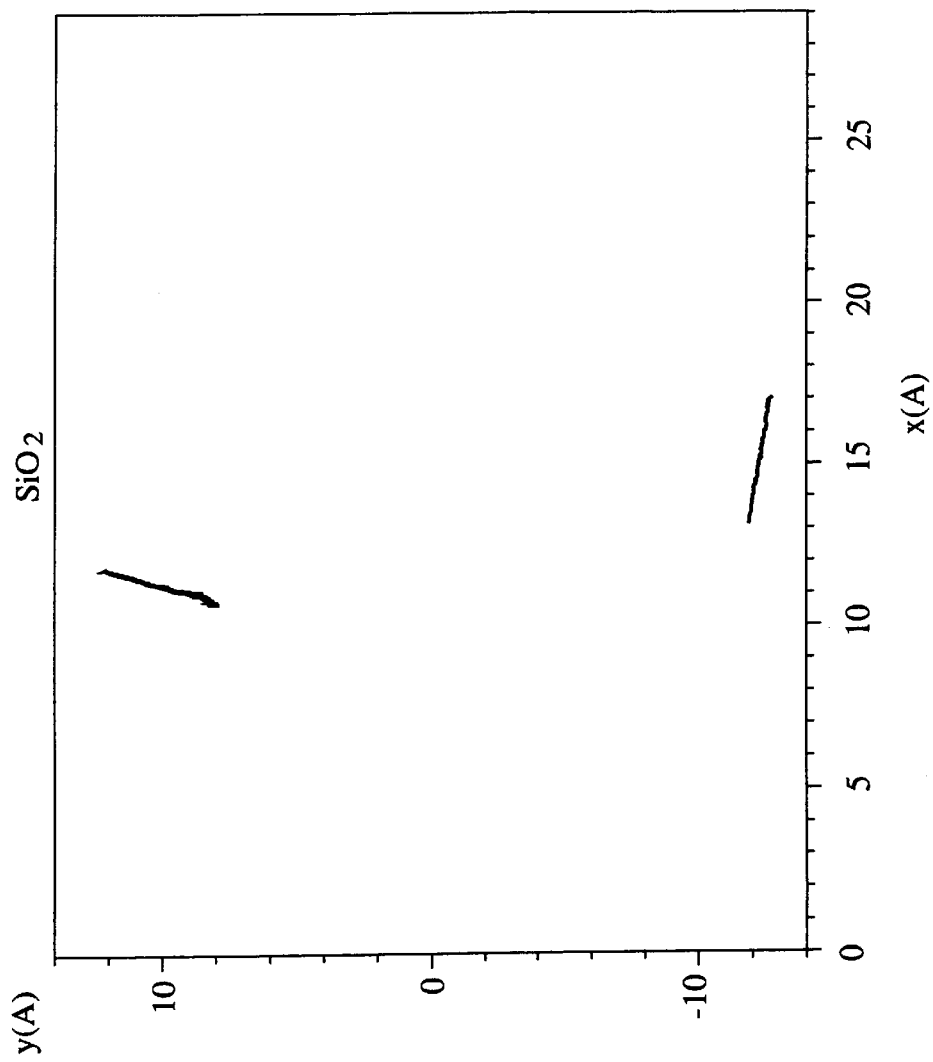
FIG. 91 is a characteristic view showing change in time on two sides of a computational cell detected by the molecular dynamics simulator developed newly by the inventors of the present invention upon forming amorphous $SiO_2$.

Variation in potential energy upon melting is shown in FIG. 90. Since external pressure is taken into account, potential energy is gradually increased while being oscillating. Similarly potential energy is decreased gradually upon quickly chilling. Variation of two sides on a plane perpendicular to a cell c axis in the computation range relative to time at this time is shown in FIG. 91. Since Parinello-Rahman approach is adopted to enable the profile to be changed according to phase modification, the cell is varied in melting process.

Because the quartz assumes a rhombus initially, an angle between two sides is 60 degrees. However, since crystal structure is destroyed when the quartz is melted and internal pressure is applied uniformly to respective sides, an angle between two sides becomes close to 90 degrees. The structure does not return to the quartz even if it is quickly chilled and a rectangular parallelepiped is held at about 90 degrees.

In addition, the inventors have found that there is another caution point upon forming a-SiO$_2$. It relates to Si and O potential. In the ab initio molecular dynamics method and the empirical potential (TTAT potential or BKS potential) molecular dynamics method, potential energy is largely varied due to change in location of atoms if SiO$_2$ system is dealt with. Therefore, in order to treat motion of atoms, there is necessity of calculating motion of atoms with higher precision than ordinary Velret's algorithm.

Figure 92:
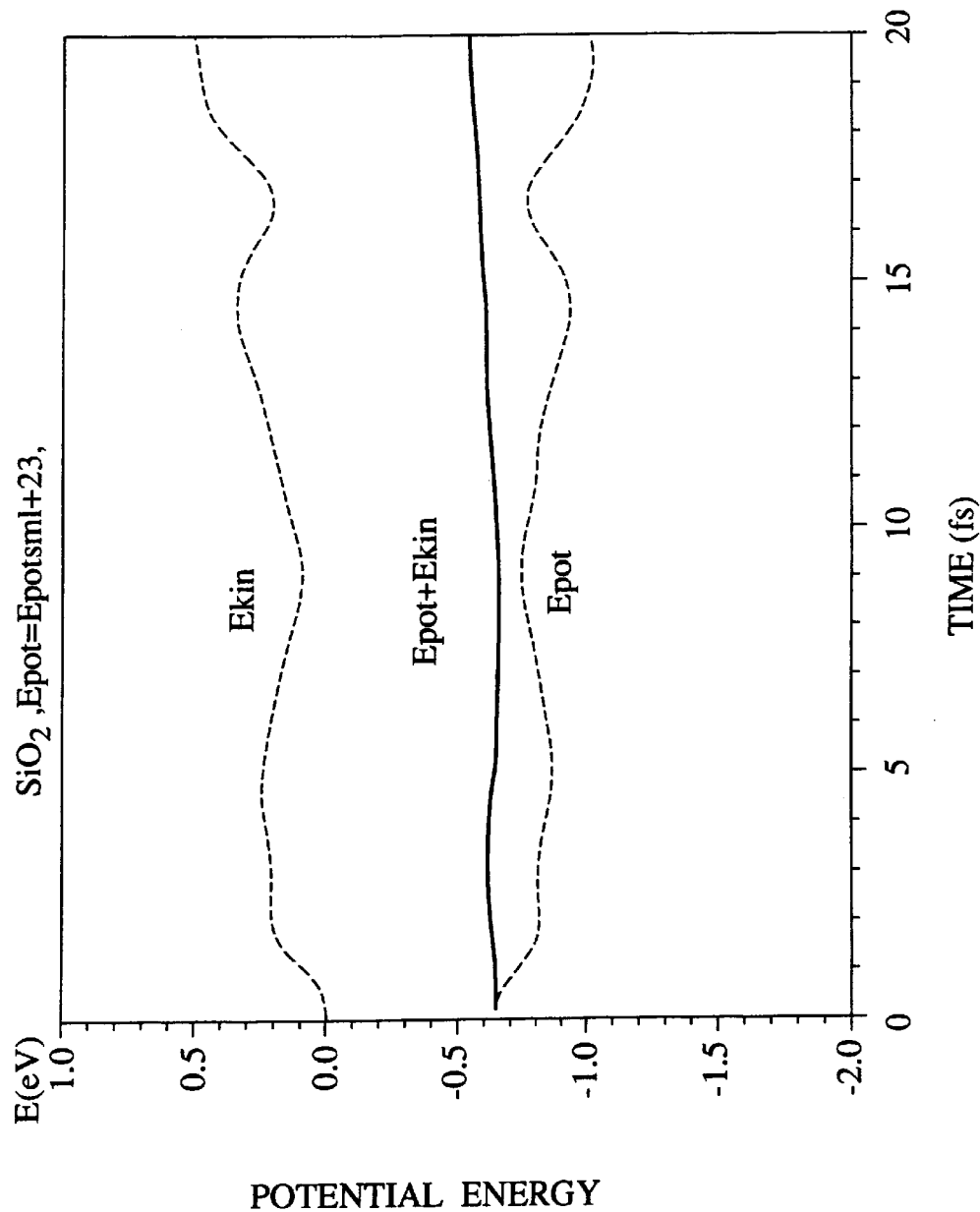
FIG. 92 is a characteristic view showing change in energy calculated by the molecular dynamics simulator developed newly by the inventors of the present invention with the use of normal Verlet's argolithm.

FIG. 92 shows variation in potential energy, variation in kinetic energy, and sum of potential energy and kinetic energy in case motion of atoms are calculated by ordinary Velret's algorithm. Total energy is kept constant if there is no energy exchange between atoms and external fields. However, since integration of equation of motion derived from Lagrangian cannot executed with sufficient precision by ordinary Velret's algorithm, conservation of such energy cannot be executed. Even if time interval serving as integral interval is set to be fine to improve integration precision, such circumstance is not improved substantially. It has been found that such circumstance is peculiar to the material in which potential of oxygen is very steep.

Figure 93:
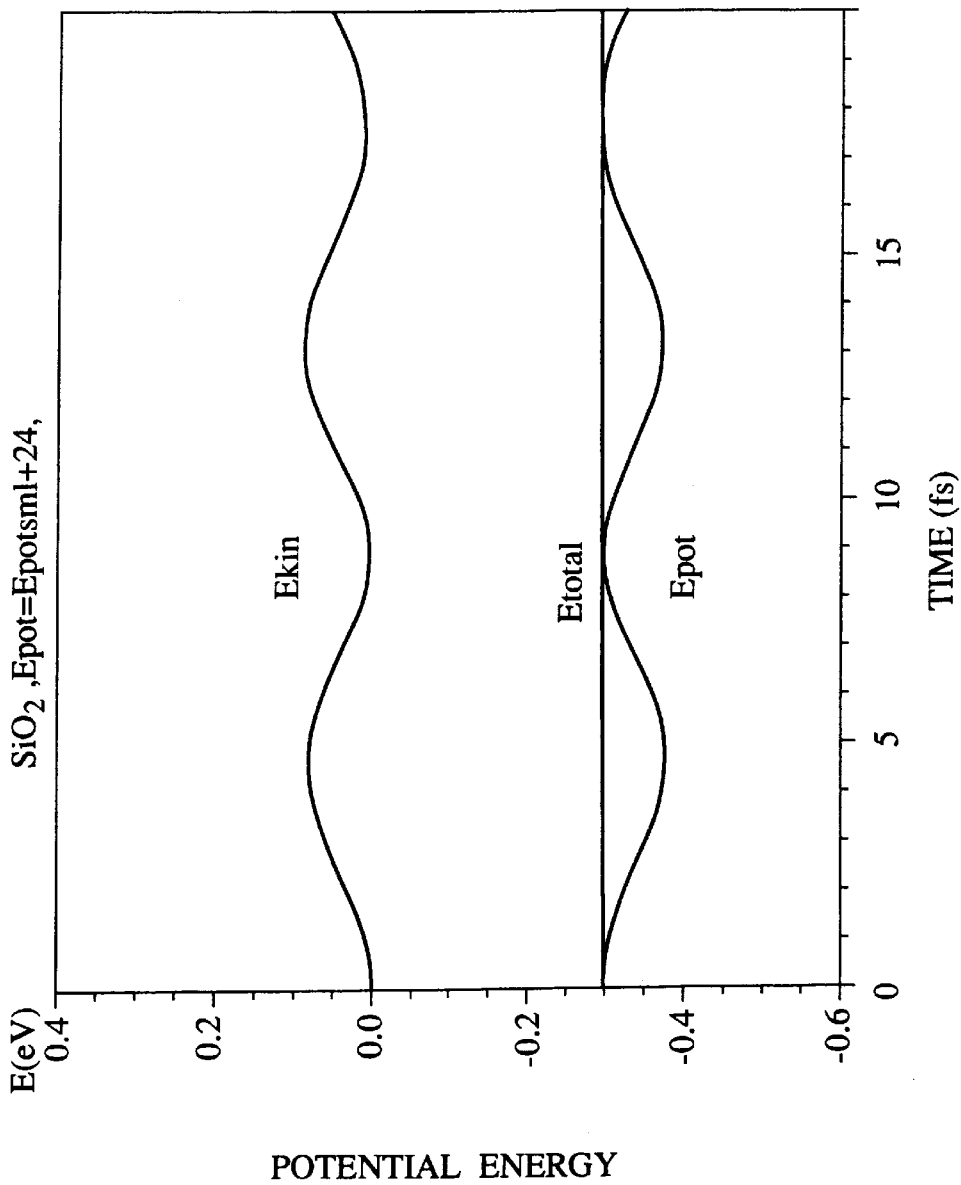
FIG. 93 is a characteristic view showing change in energy calculated by the molecular dynamics simulator developed newly by the inventors of the present invention with the use of improved Verlet's argolithm.

Accordingly, in order to treat oxygen precisely, Velret's algorithm is improved such that acceleration of momentary motion of individual atoms can be calculated up to higher order and velocity and location can be calculated by integrating such acceleration. As a result, as shown in FIG. 93, kinetic energy changes in opposite phase to potential phase so that total energy can be kept constant. Unless such precise treatment of energy is carried out, it has been found according to the results obtained by the inventors that structure is destroyed at random because of low calculation precision when motion of atoms is rapid at high temperature or when liquid SiO$_2$ is used and therefore a-SiO$_2$ cannot be formed. In addition, IR spectrum being totally different from the measured value has been obtained.

As stated above, the inventors make it possible to form a-SiO$_2$ on the computer for the first time based on their original invention upon forming a-SiO$_2$. A—SiO$_2$ formed as above has Si—O bond length which is slightly longer than the quartz, and Si—O length is within the constant range. Many Si—O having smaller Si—O length rather than that in the quartz are included in melted SiO$_2$, but such smaller Si—O length has been eliminated by cooling process so that only longer bond lengths rather than the quartz remain in SiO$_2$. As for the coordination number, if first proximity is assumed as 2 Å, then Si includes mostly four coordination number and three and five coordination numbers are mixed slightly. No other coordination number occurs. Oxygen includes mostly two coordination number.

Next, in order to predictively calculate change in the structure of a-SiO$_2$ according to various stress fields by applying hydrostatic pressure or uniaxial stress to a-SiO$_2$ temperature is kept at 900° C. until potential energy reaches equilibrium and subsequently structure relaxation is applied to SiO$_2$ for two nanoseconds. Various structures of a-SiO$_2$ are transformed to numerical values of atomic location, velocity, acceleration, liner differential value, cell basic vectors, displacement velocity of cell basic vectors, etc. respectively, and then these numerical values are saved.

After various a-SiO$_2$ structures are formed by aforementioned processes, IR spectrum is calculated for respective structures. IR spectrum is calculated from dipole moment which can be given by $$M = \Sigma q_i \cdot r_i \tag{1461}$$

Where $q_i$ is charge of atom i and $r_i$ is location of the atom i. If a system is neutral (i.e., $\Sigma q_i = 0$) when this location is to be detected, then dipole moment has the identical value wherever an origin $r_0$ is set. This is because dipole moment is given as $$\begin{aligned} M &= \sum q_i(r_i - r_0) \\ &= \sum q_i \cdot r_i - \sum q_i \cdot r_0 \\ &= \sum q_i \cdot r_i - r_0 \sum q_i \\ &= \sum q_i \cdot r_i \end{aligned} \tag{1462}$$

If a system is not neutral, absolute value of dipole moment is changed according to the origin since terms in which r0 is multiplied remain. However, it should be understood that, if the dipole moment is translated by Fourier transformation, the frequency appears only at zero component and other portion is not affected. Upon calculating the dipole moment, the inventors are aware that one caution point has to be taken to set atomic location r.

That is, since periodic boundary condition is applied on applying the molecular dynamics method, such caution point is to eliminate discontinuous variation of the dipole moment owing to motion of atoms which go out to the −x direction of the cell and enter from the +x direction.

Figure 94:
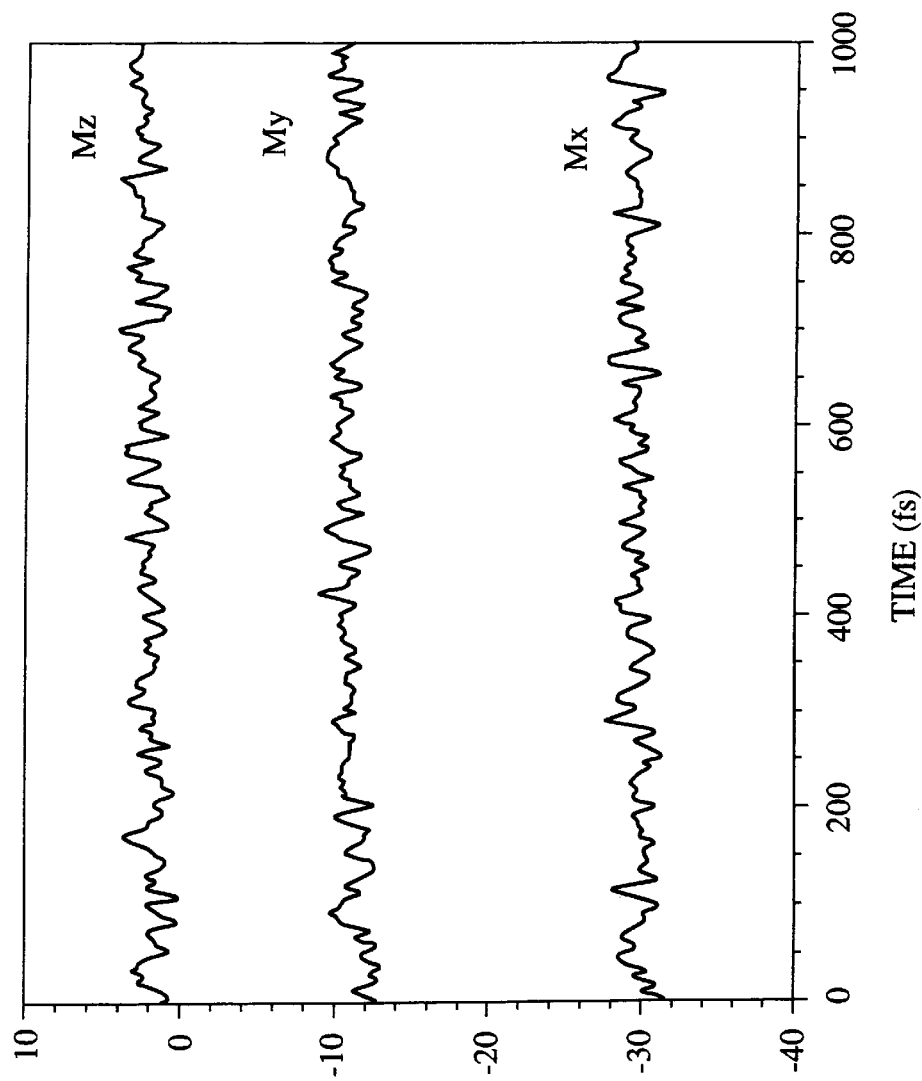
FIG. 94 is a characteristic view showing change in time of dipole moment calculated by the molecular dynamics simulator developed newly by the inventors of the present invention.

Taking into account that a-SiO$_2$ is not so much diffused at temperature where IR is actually measured but is only thermally oscillated, the dipole moment can be calculated under the assumption that, without considering periodic boundary condition, r used on calculating the dipole moment is treated such that charge resides at the location out of the cell even if the charge go out from the cell in the −x direction. In other words, two atomic locations, i.e., atomic location with taking account of the periodic boundary condition and atomic location without taking account of the periodic boundary condition are dealt with on calculating motion of individual atoms. An example of time variation of dipole moment as calculated like the above is shown in FIG. 94. Since this is three-dimensional calculation, dipole moments have been able to be obtained in x, y, z directions.

Figure 95:
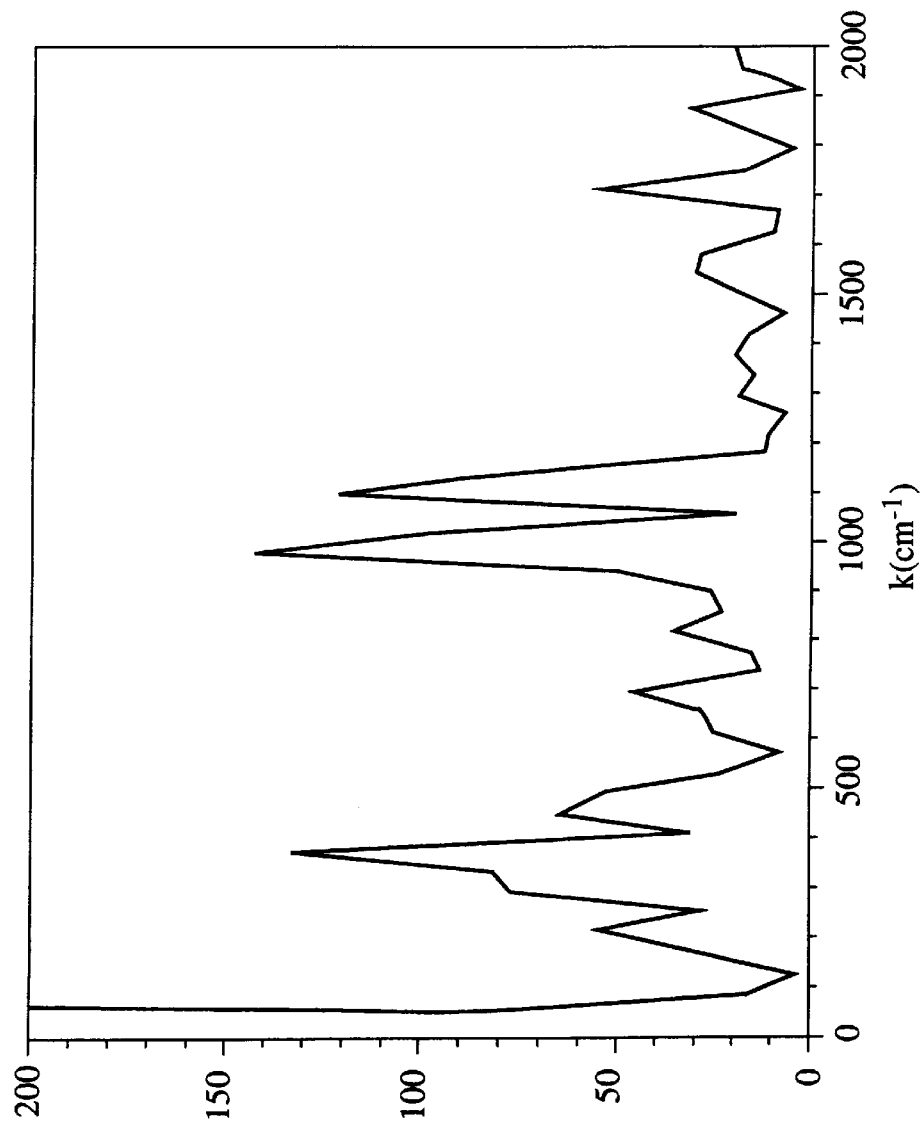
FIG. 95 is a characteristic view showing power spectrum calculated from dipole moment by the molecular dynamics simulator developed newly by the inventors of the present invention.

In order to calculate IR spectrum, as the first step, the dipole moment is treated by Fourier transformation to thus calculate power spectrum which is IR line spectrum An example is shown in FIG. 95. Peak locations of IR spectrum can be predicted at this stage. That is, a large peak appears at about 1000 1/cm and a large peak also appears at about 500 1/cm. This result corresponds to IR measured value of a-SiO$_2$.

In order to detect IR spectrum, following Eq.(1471) can be derived by multiplying line spectrum I($\omega$) by function of $\omega$ and temperature T.

$$\alpha(\omega)=(4\pi 2/3hcn)\cdot\omega\cdot(1-\exp(-h\omega/kT)\cdot I(\omega) \tag{1471}$$

Details (peak shift, peak shoulder, etc.) of stress fields, structure of a-SiO$_2$, and IR spectrum can be correlated with each other by calculating IR of a-SiO$_2$ in various stress fields. Thereby, it becomes feasible to compare calculation values with the measured values.

Figure 96:
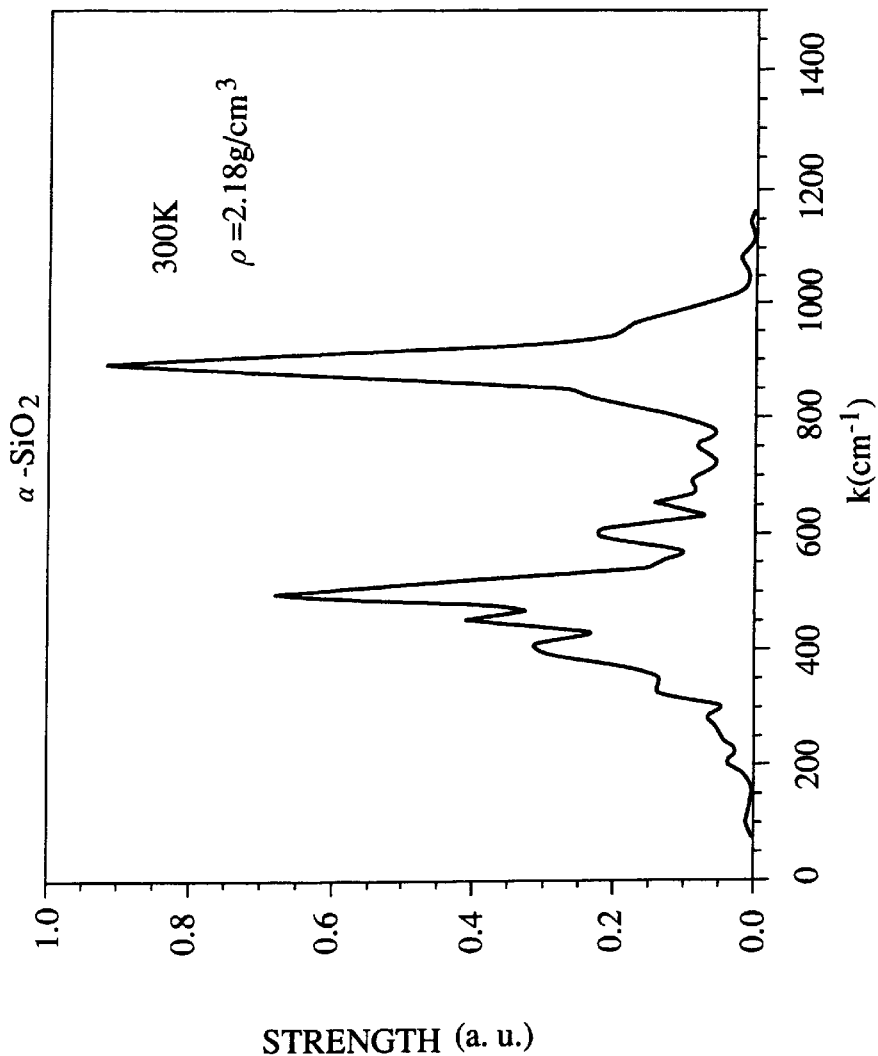
FIG. 96 is a characteristic view showing IR spectrum calculated by applying to $\alpha$-$SiO_2$ the molecular dynamics simulator developed newly by the inventors of the present invention.
Figure 97:
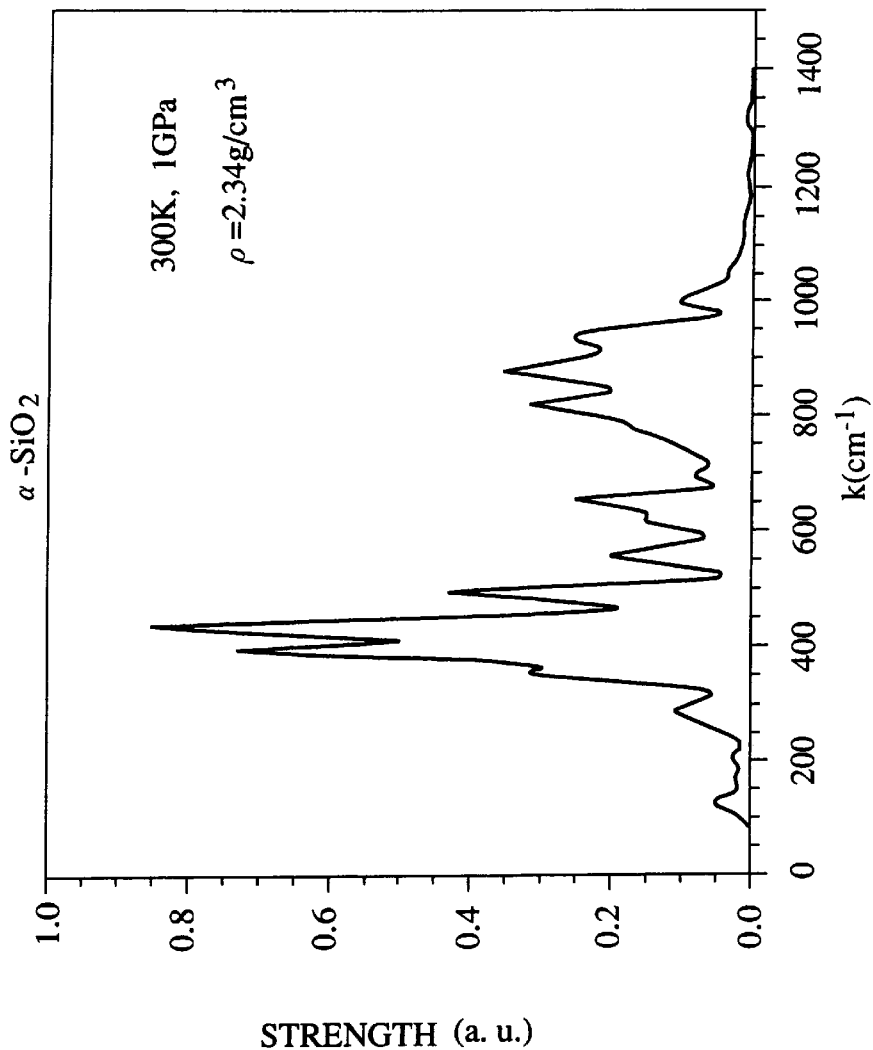
FIG. 97 is a characteristic view showing predicted IR spectrum calculated by applying to $\alpha$-$SiO_2$ the molecular dynamics simulator developed newly by the inventors of the present invention in case external pressure is applied.
Figure 98:
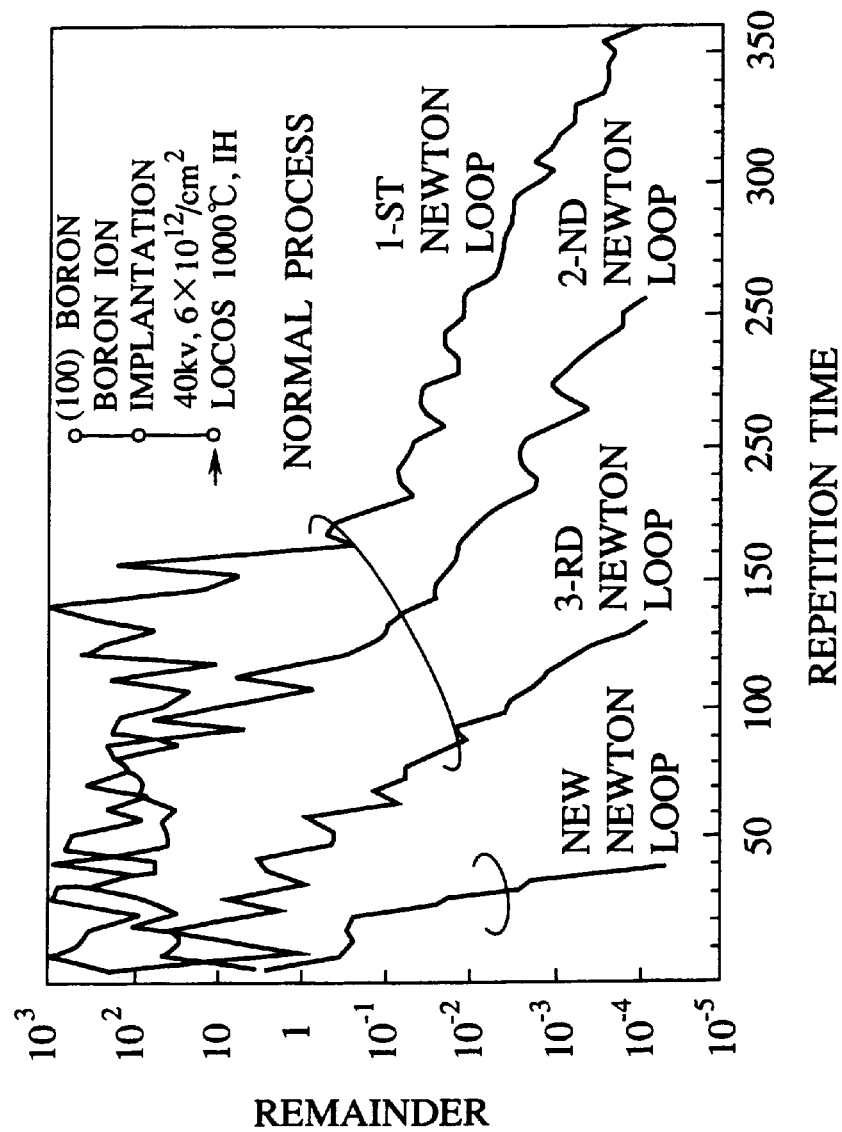
FIG. 98 is a characteristic diagram showing variation in volume of amorphous SiO obtained by the molecular dynamics simulator in accordance with the present invention.
Figure 99:
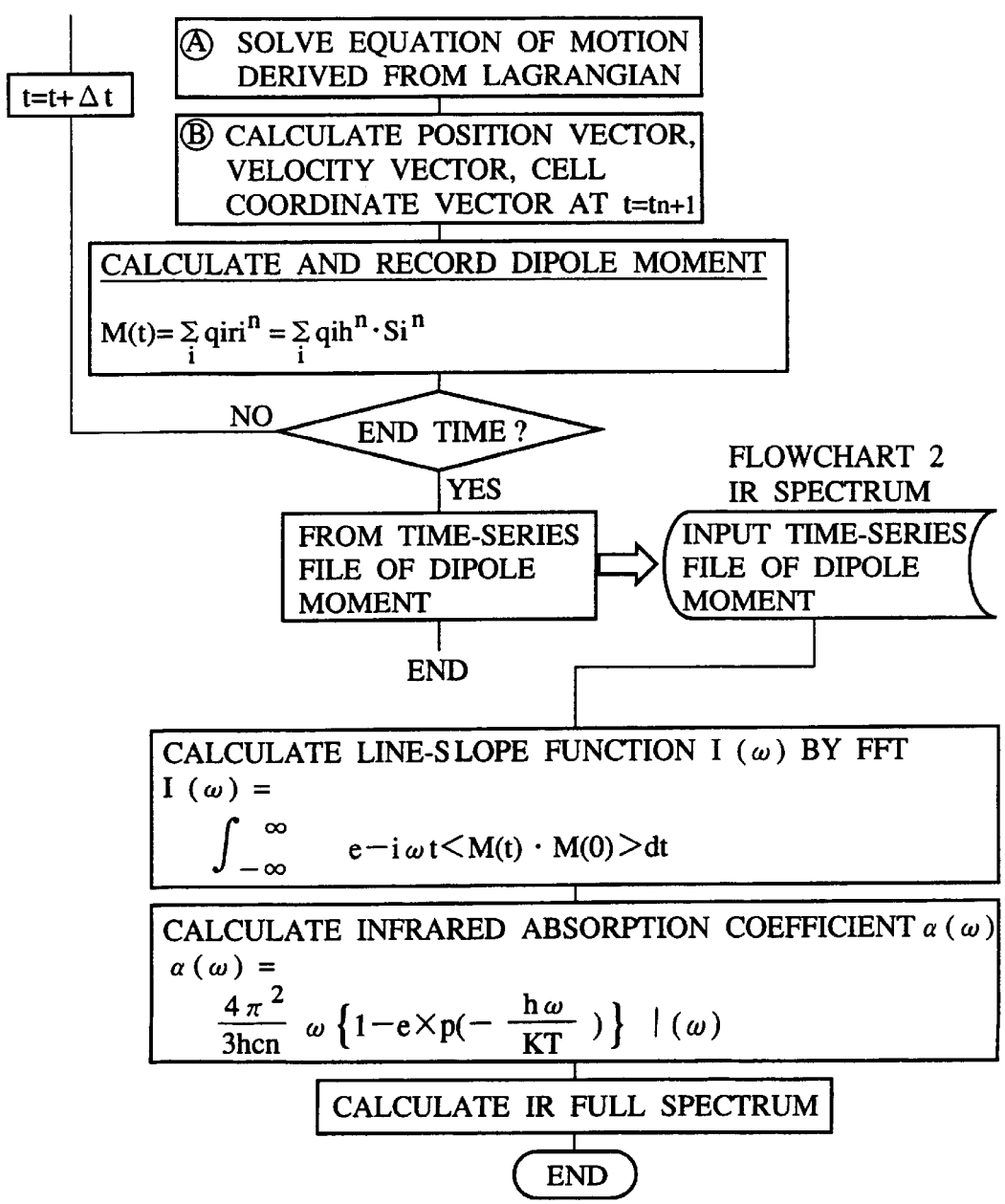
FIG. 99 is a characteristic diagram showing variation in energy calculated by the molecular dynamics simulator in accordance with the present invention, utilizing the conventional Verlet algorithm.
Figure 101:
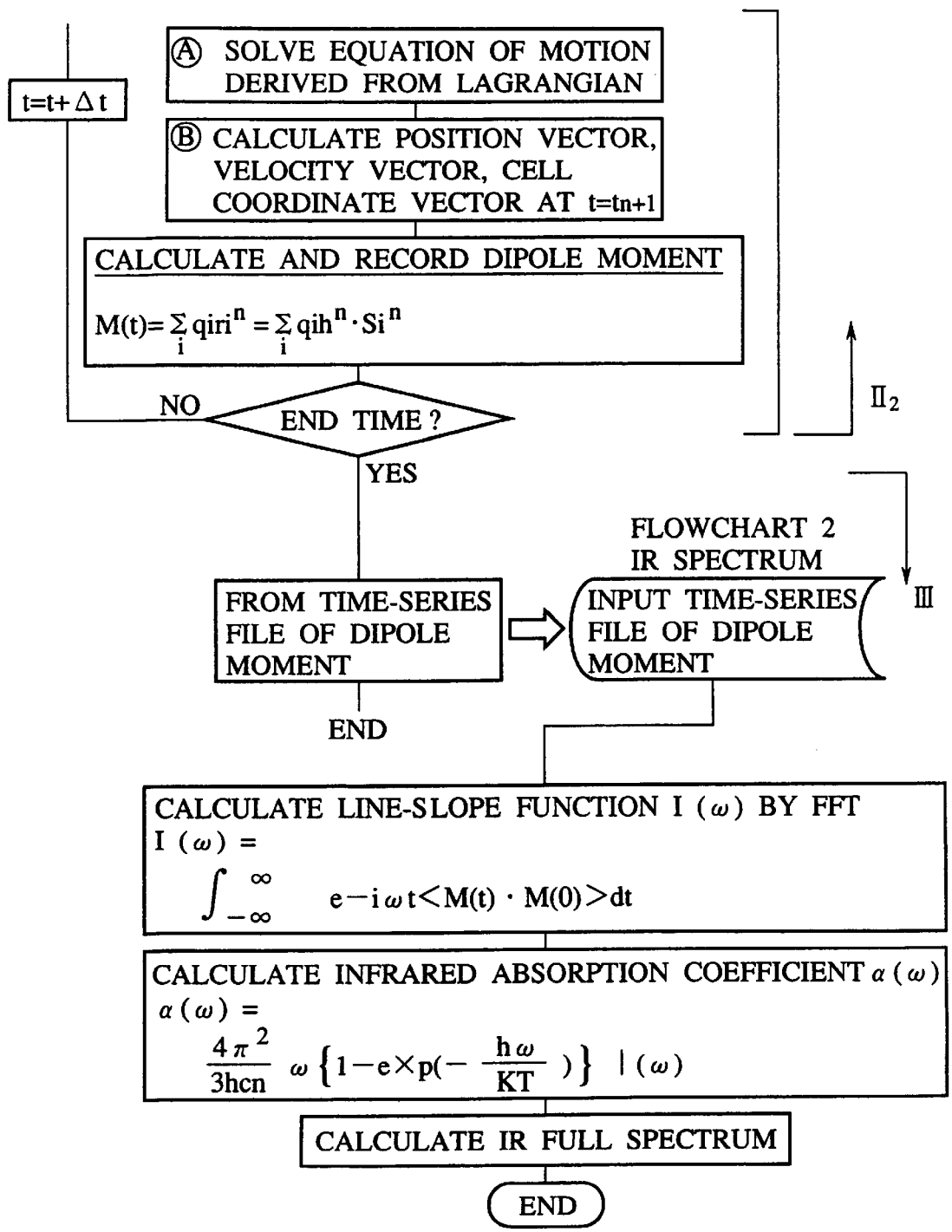
FIG. 101 is a view showing calculation procedures executed by the inventors of the present invention.

IR spectrum which is calculated by applying the molecular dynamics simulator developed by the inventors at this time to a-SiO$_2$ is shown in FIG. 96, while IR spectrum which is predicted by applying the molecular dynamics simulator developed newly by the inventors to a-SiO$_2$ under application of the external pressure is shown in FIG. 97. Computational procedures conducted by the inventors are also shown in FIGS. 100 and 101. In the block B in FIG. 100, A and B in equation of motion of individual atoms denote terms given by $$A = \frac{1}{4!}\Delta t^4 \text{Si}^{(IV)n} + \frac{1}{5!}\Delta t^5 \text{Si}^{(V)n} + \frac{1}{6!}\Delta t^6 \text{Si}^{(VI)n} \tag{1481}$$

$$B = \frac{1}{3!}\Delta t^3 \text{Si}^{(IV)n} + \frac{1}{4!}\Delta t^4 \text{Si}^{(V)n} + \frac{1}{5!}\Delta t^5 \text{Si}^{(VI)n} \tag{1482}$$

Embodiment 4

By predicting the magnitude of stress induced during steps and its components and further grasping detailed relationship between stress and material properties with the use of a system according to the present invention, phenomena such as plastic deformation between the substrate and the interlayer film can be predicted. In this embodiment, especially stress problem will be discussed as an example. How to predict stress induction and how to reduce it while considering the process variation width will be examined.

In the recent fine device process design, it is indispensable to take account of stress generated in the progress of process. As with the stress, following phenomena occur, for example.

(1) In a buried device isolation method (ST1), SiO$_2$ is buried in trenches cut out in an SiO$_2$ substrate. In this case, because of difference in thermal expansion coefficient between the Si substrate and SiO$_2$, strain and stress remain and in some case crystal defect is caused according to thermal history. Accordingly, a device structure and manufacturing process which can reduce residual stress as much as possible must be designed.

(2) For purposes of forming a high quality oxide film, the Si substrate in which interstitial oxygen density is low is employed frequently. Under such circumstance, strength of the Si substrate is lowered to cause plastic deformation readily.

(3) To maintain formation of shallow junction layers and well regions, thermal processes such as annealing process and oxidation process are employed, but such thermal processes become a burden on the substrate much more because of employment of RTP.

In such conditions, it is important that how generation of defect must be prevented and that, if such stress that is larger than a specified value or a variation prediction value is observed while monitoring the stress in the middle of process, cause must be instantly made clear and then future process must be corrected correspondingly. This is more important to the clustered tool.

Figure 102:
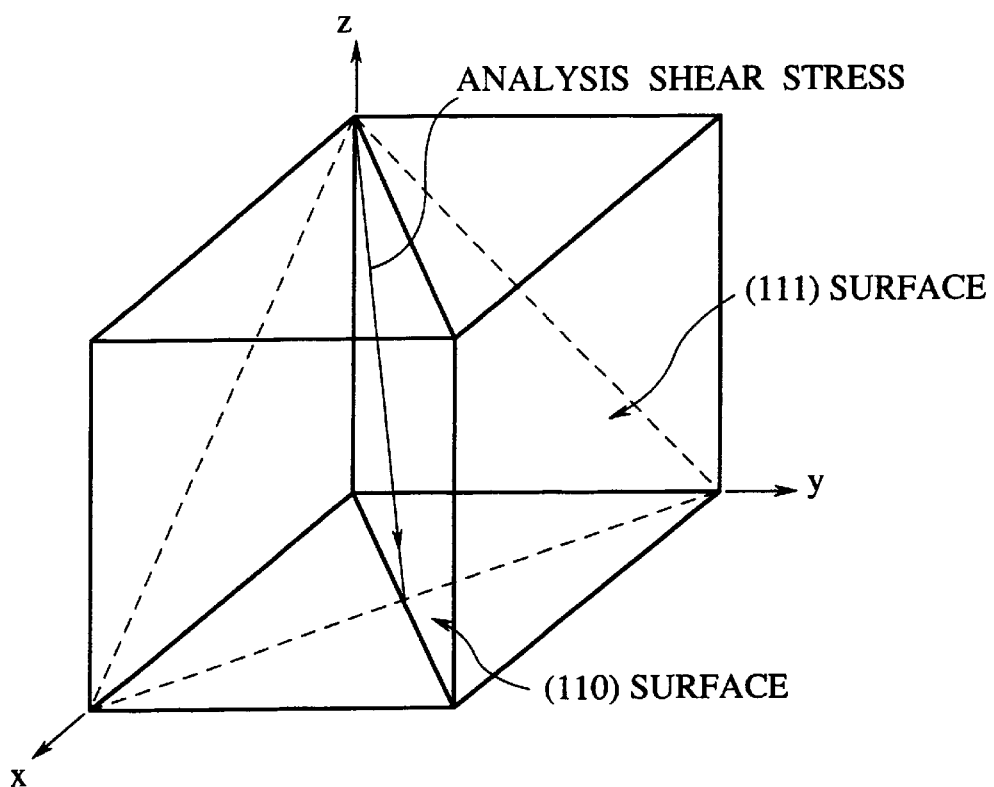
FIG. 102 is a view showing glide plane, decomposition sheer stress, etc. on an Si (100)

Still further, kind of stress and identification thereof is extremely important. Though it is important to pursue main stress and principal face of maximum stress, it is also important to take notice of decomposition shear stress. For example, in the event of using an Si(100) substrate, a best priority glide plane is (111) face, as shown in FIG. 102. A [100] direction is a gliding direction on the (111) face, but such a case is regarded to be most dangerous that a shearing force acts in this direction.

A simulation system fabricated by the inventors can provide these identification outputs. In this manner, with paying attention to plastic deformation, first oxidation of trench of ST1 will be picked up and then oxidation profile and stress distribution as well as design guide to achieve a predetermined shape will be discussed. For instance, it is said that stress is contributed to "truncated" and "rounded" phenomena of the trench angle in oxidation, but mechanism of such phenomena has not been analyzed yet in the existing state.

Therefore, it is necessary at first that these phenomena have to be understood in detail and that proper process design which permits the "truncated" phenomenon to be suppressed and the "rounded" phenomenon to be accelerated is provided. In addition, profile of the oxide film cannot be grasped clearly unless induced stress can be grasped precisely. The stress problem is not only the problem on plastic deformation simply but also the item indispensable to profile analysis as well as impurity distribution analysis on the stress field. Further, prediction of thickness of the oxide film, and the like are especially susceptible to the stress in the progress of oxidation after the SOI substrate which will be used in the device following a future 1G device is subjected to the LOCOS step, unlike ordinary Si substrate. Furthermore, quantitative prediction thereof is more complicated problem.

In considering such background, instead of the conventional oxidation diffusion model, analysis must be extended up to grasp of behavior of oxidizing agent under the stress, understanding of oxidation phenomenon under the stress, and impurity rediffusion under the stress. In addition, computation must be carried out in a very short time and at high speed. The inventors can fabricate a new simulator which is capable of predicting generation of stress and its redistribution and also calculating two-dimensional diffusion of the point defect under the stress. The atomic level simulator is equipped with this new simulator. In other words, a high speed two-dimensional oxidation/diffusion/stress/deformation process simulator being originally developed is attached to a main body of the atomic level material design system.

Measurement of in situ observation of stress is effected by using microscopic Raman and FT-IR. Calibration of these measuring equipments is conducted previously. Physical property quantities concerning Si and SiO$_2$ can be instantly calculated by executing the atomic level material design system in advance at the time when an operations sheet is input. These data are sent to the high speed two-dimensional oxidation/diffusion/stress/deformation process simulator.

To begin with, the inventors will discuss analysis of "truncated" and "rounded" oxidation phenomena which are made clear with the use of the new high speed two-dimensional oxidation/diffusion/stress/deformation process simulator and then discuss the results of fundamental examination for the buried device isolation step, etc. as an application example.

If Si is oxidized to become $SiO_2$, then volumic expansion occurs. Although part of the stress may be relaxed at this time because of viscoelasticity of $SiO_2$, the stress still remain in both Si and $SiO_2$.

Figure 103:
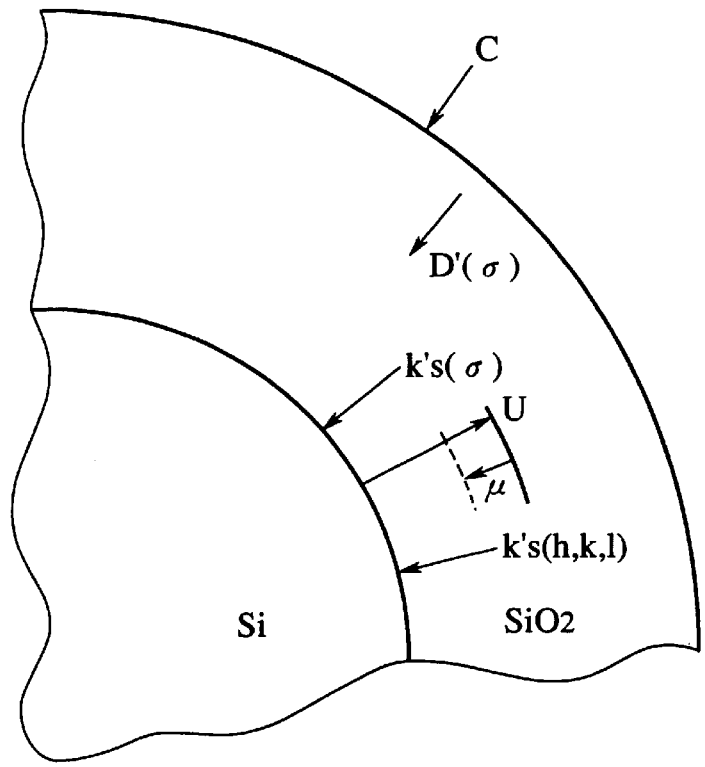
FIG. 103 is a schematic view showing reaction near $SiO_2$ and $Si/SiO_2$ boundary face.

Taking the case of oxidation of trench corner as an example, such circumstance has been examined and is shown in FIG. 103. First, oxidizing agent of density C reaches $SiO_2$ and enters into the $SiO_2$ film. At this time, diffusion D' of the oxidizing agent is affected by stress σ caused in the $SiO_2$ film. In addition, it is also affected by accumulated residual stress in the substrate when the oxidizing agent reacts with Si on the $Si/SiO_2$ interface.

As a concrete effect, if compressive stress σ exists in the $SiO_2$, for example, then an atomic distance in the network is narrowed to suppress diffusion of the oxidizing agent. Moreover, if compressive stress σ is accumulated on a surface of the Si substrate, then an Si atomic distance is narrowed to suppress entrance of the oxidizing agent, as a result, to suppress oxidation speed.

Assuming that a component of main stress S in the x direction is $\sigma_{xx}$ and a component of main stress S in the y direction is $\sigma_{yy}$, following Eqs.(1531) to (1534) are concluded for the stress on the two-dimensional plane. Where $\mu$ is coefficient of viscosity, ν is Poisson's ratio, and u is displacement.

$$D' = D \exp\left(-\frac{pVD}{kT}\right) \quad (1531)$$

$$k's = ks \exp\left(-\frac{\sigma nVR}{kT}\right)\exp\left(-\frac{\sigma tVR}{kT}\right) \quad (1532)$$

$$\sigma_{xx} + \sigma_{yy} = \frac{\mu}{\left(\frac{1}{2} - V\right)}\left[\left(\frac{\partial u_x}{\partial x}\right) + \left(\frac{\partial u_y}{\partial y}\right)\right] \quad (1533)$$

$$\sigma_{xx} - \sigma_{yy} = 2\mu\left(\frac{\partial u_y}{\partial x} - \frac{\partial u_x}{\partial y}\right)$$

$$\sigma_{xy} = \mu\left(\frac{\partial u_x}{\partial y} + \frac{\partial u_y}{\partial x}\right)$$

$$\mu = \text{VISC.} \exp\left(\frac{\text{VISC.E}}{kT}\right) \quad (1534)$$

Meanwhile, temperature dependency of coefficient of viscosity $\mu$ can in general be expressed by Eq.(1534). Where VISCO.O and VISCO.E denote proportional constant and activation energy respectively. Therefore, if temperature dependency of coefficient of viscosity $\mu$ is added to the above angular stress equation, then respective components of main stress are decreased with the increase of temperature. Similarly, when the oxidizing agent which comes to the $Si/SiO_2$ interface reacts on the Si surface, reaction constant κs' can be expressed as the above Eq.(1532). Where κs is the value when no stress exists, σn is $\sigma_n = -(\sigma_{xx}n_x^2 + \sigma_{yy}n_y^2 + 2\sigma_{xy}n_xn_y)$, $\sigma\tau = -(\sigma_{xx}n_y^2 + \sigma_{yy}n_x^2 - 2\sigma_{xy}n_xn_y)$, and VR is a parameter. It can be seen from this Eq.(1532) that oxidation reaction constant is decreased as compressive stress is increased. Influence of accumulated residual stress in the substrate when the oxidizing agent reacts with Si on the above $Si/SiO_2$ interface corresponds to this event.

In addition, diffusion coefficient D' of the oxidizing agent In the oxide film can be expressed by the above Eq.(1531). Where p is $p = -\frac{1}{2}(\sigma_{xx}+\sigma_{yy})$, and D is diffusion coefficient in case no stress exists. Meaning of this Eq.(1531) can be interpreted as follows. That is, in stress $\sigma_{xx}$ and $\sigma_{yy}$, tensile stress is set to positive and compressive stress is set to negative. Hence, if compressive stress is present in the film and material is in a dense state, then diffusion coefficient becomes small.

The above Eq.(1531) indicates this event.

Figure 104:
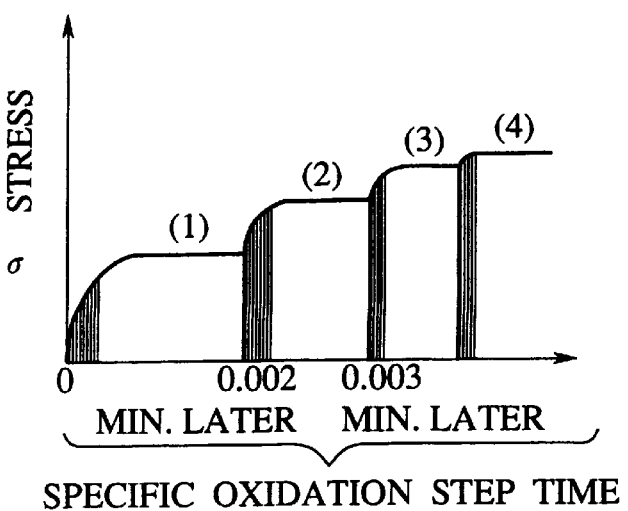
FIG. 104 is a schematic view showing sequential calculation of viscoelasticity.

Calculating procedures for this portion which are found by the inventors are shown in FIG. 104. First, density of the oxidizing agent at respective nodes on the $Si/SiO_2$ interface is calculated. After this, temporary oxidation rate at respective nodes is calculated for the first time based on this density. Subsequently, a growth amount of the $SiO_2$ film at respective nodes is calculated. Stress S is then calculated from the above Eq.(1533) using this u. Oxidation rate is calculated once more based on Eqs.(1532), (1531) and (1534) using this stress S. Again, a growth amount is calculated and stress is calculated. If stress has converged sufficiently, then new oxidation time starts to proceed over again. In other words, a Newton's method is employed.

However, as can seen from FIG. 104, if the Newton's method is used, then a very long calculation time is required for calculation of stress applied upon oxidation. Oxidation of the typical trench structure had been tried by 1300 of initial nodes and at 900° C. Oxidation atmosphere is made up of 100% dry oxygen and oxidation time is set to 300 minute. A calculation time is checked by making use of EWS Sun4. In the prior art, roughly 15900 minute of time is required, which corresponds to substantial ten days. Hence, this method is extremely unsuitable for practical use as it is.

The inventors introduce a variational principle into calculation by the Newton's method to conserve previous convergence condition, and then proceed convergence calculation by using its linear differential. According to a new method, a calculation time can be reduced less than 1/1000 of the conventional time in the range of 900° C. and 1100° C. Consequently, a present simulator may proceed rationalization of physical property values of material and high-speed operation in an arithmetic portion and go them to a level being usable as a real time tool. As basic precision of the simulator, the inventors have further examined the precision of time dependency of the oxide film thickness, profile reproducibility at corner portion of the trench, and others.

Figure 105:
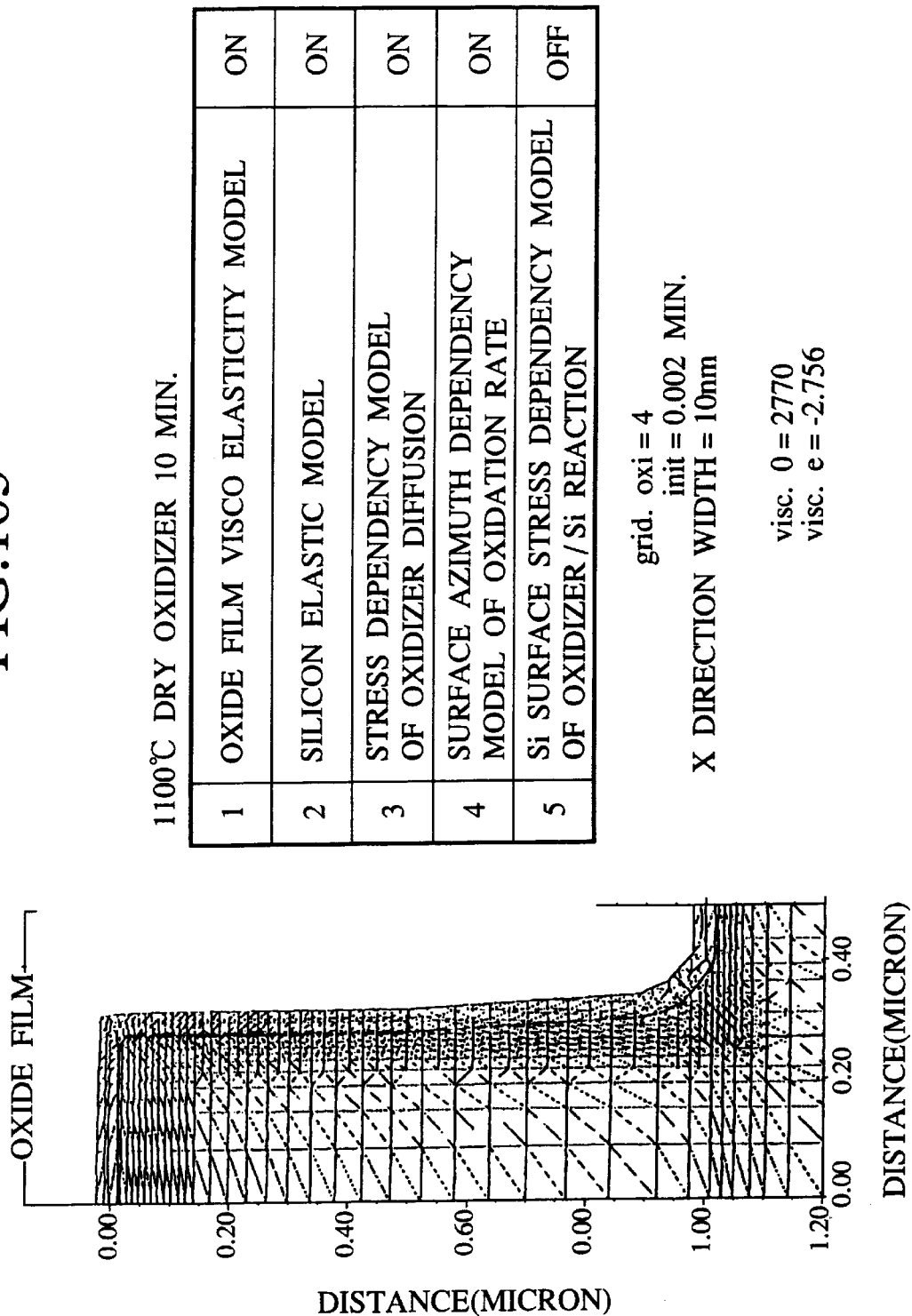
FIG. 105 is a characteristic view showing temperature and time dependency of a film thickness of an oxide film.
Figure 106:
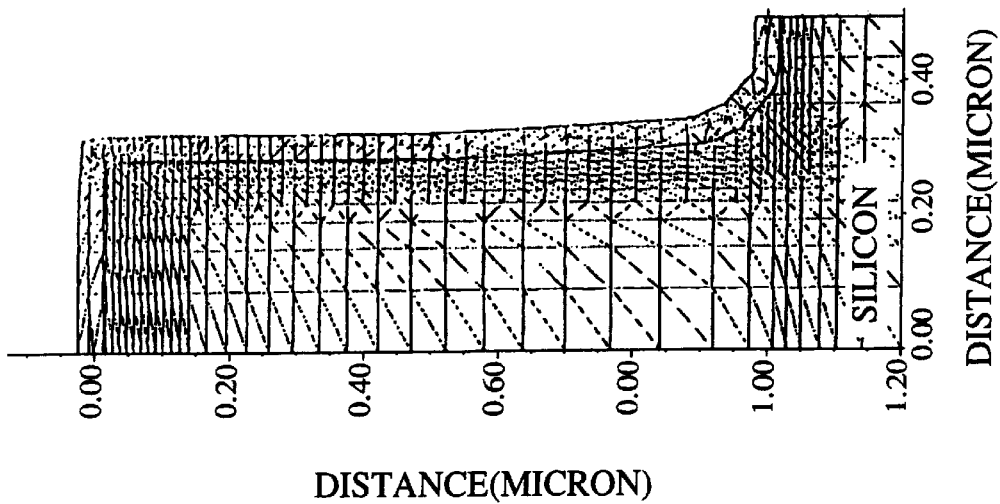
FIG. 106 is a characteristic view showing temperature and time dependency of a film thickness of an oxide film.
Figure 107:
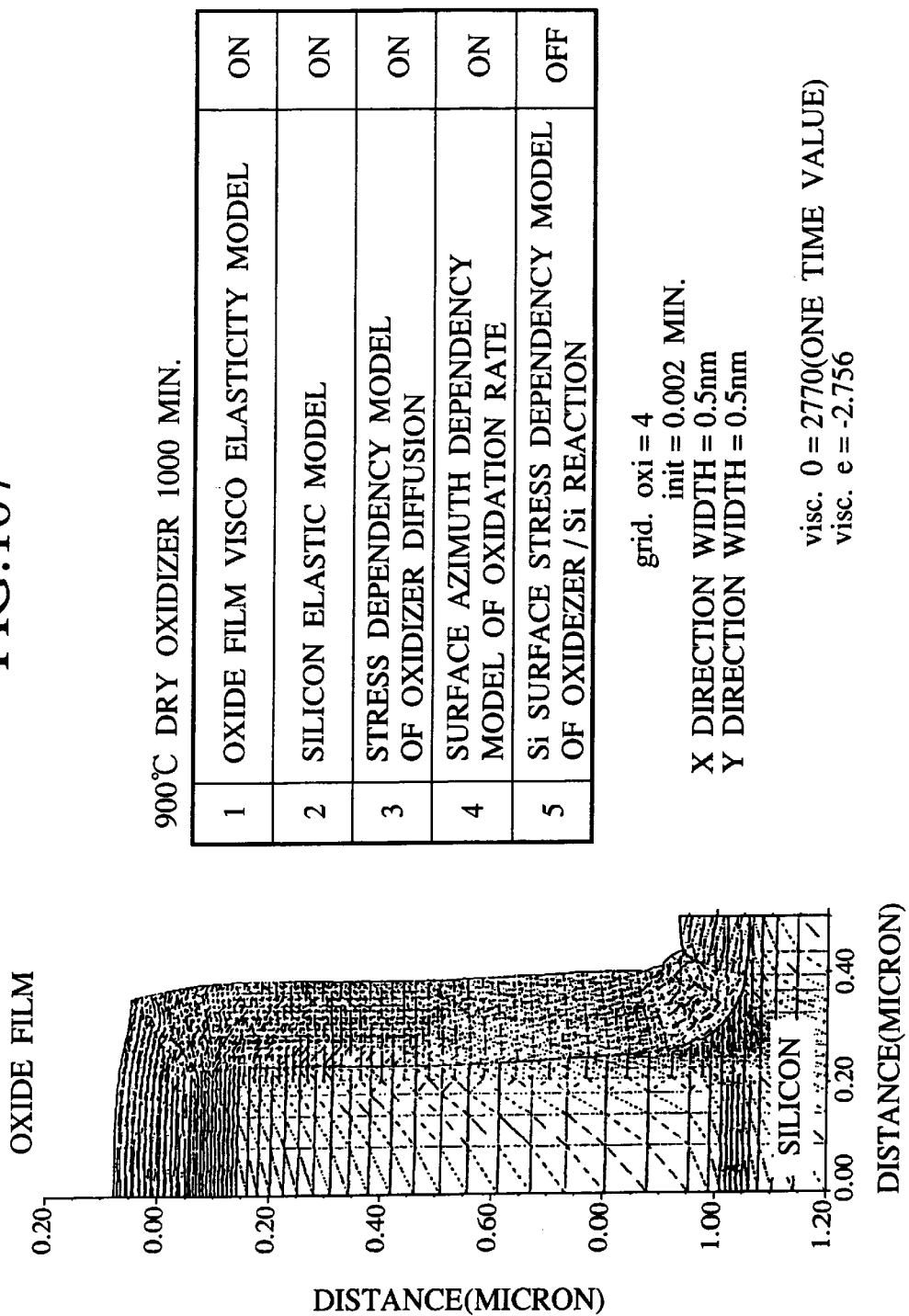
FIG. 107 is a characteristic view showing temperature and time dependency of a film thickness of an oxide film.
Figure 109:
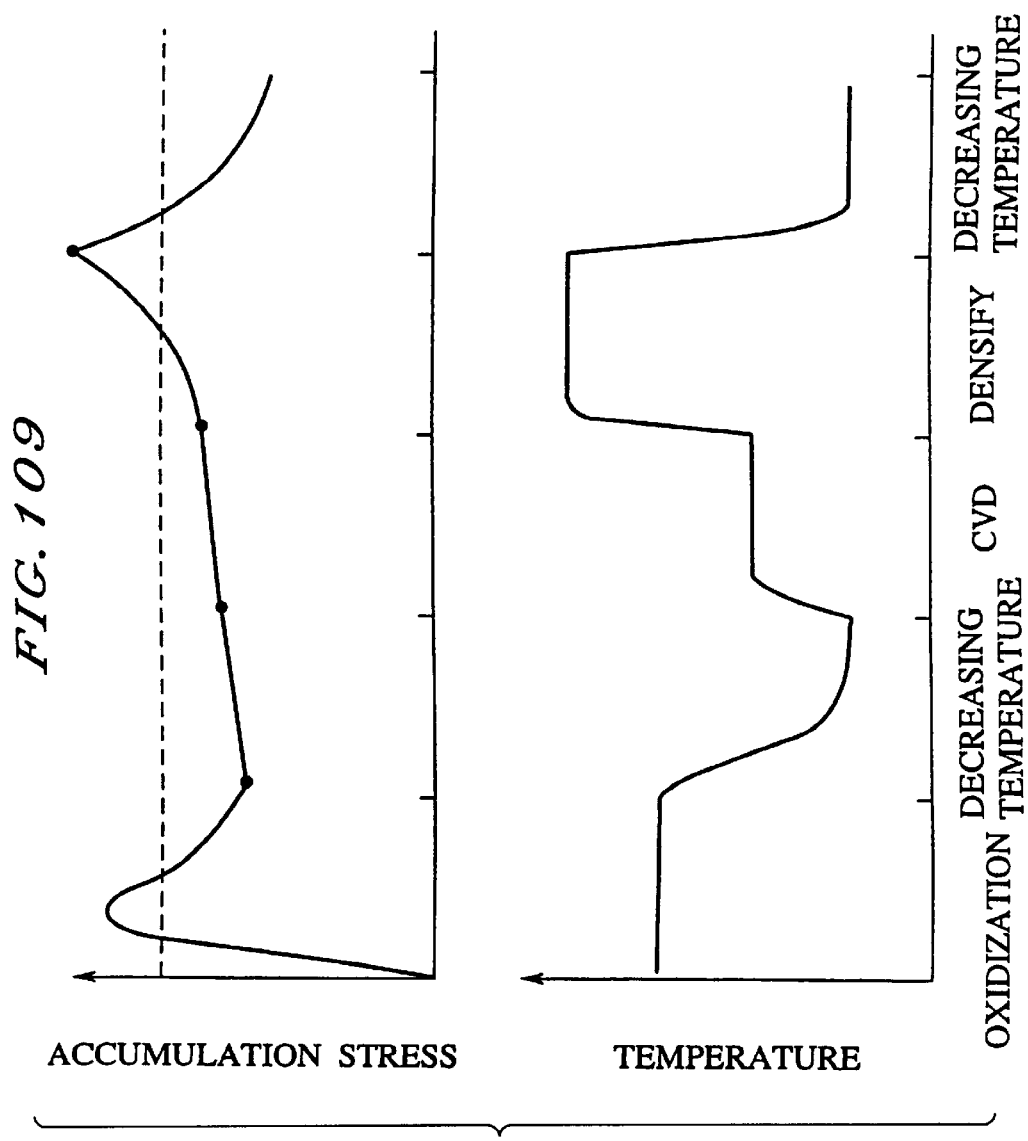
FIG. 109 is a characteristic view showing change in temperature and storage stress in typical thermal process.
Figure 110:
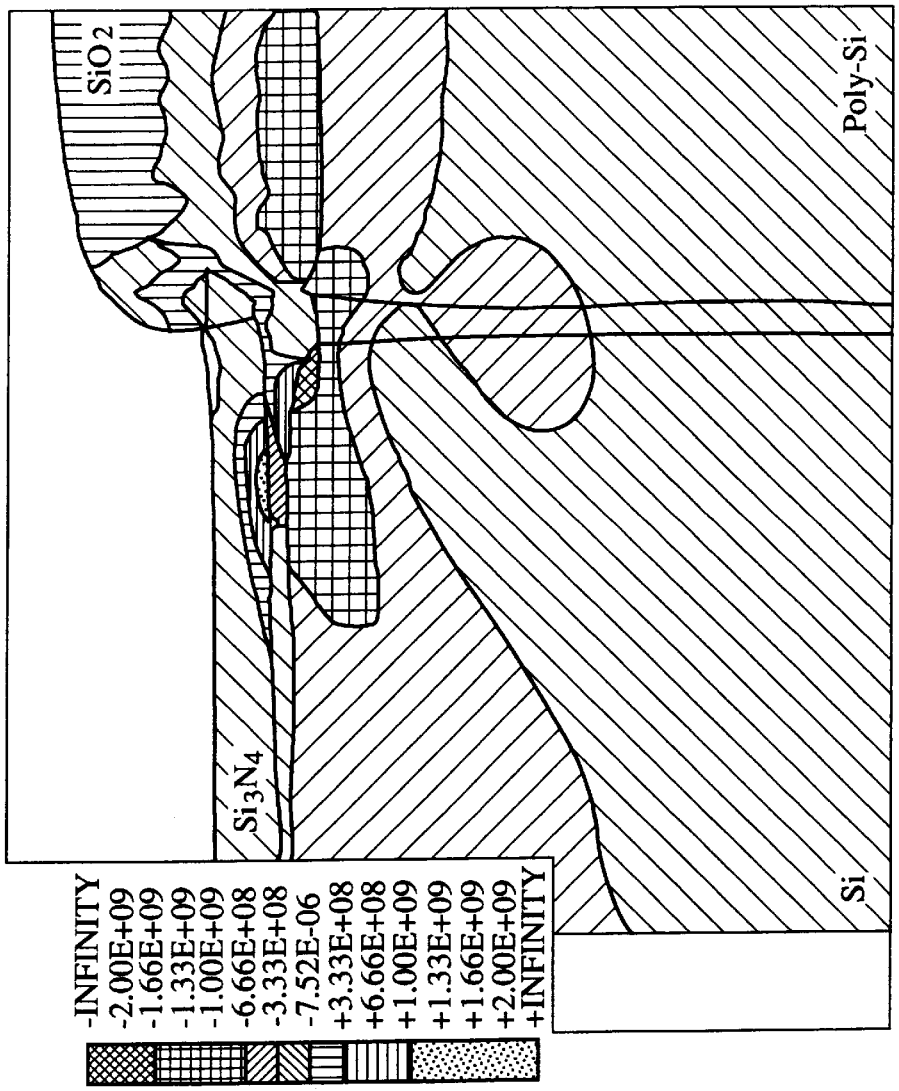
FIG. 110 is a view showing prediction calculation for disribution of $\sigma_{xx}$ in a trench angle.
Figure 111:
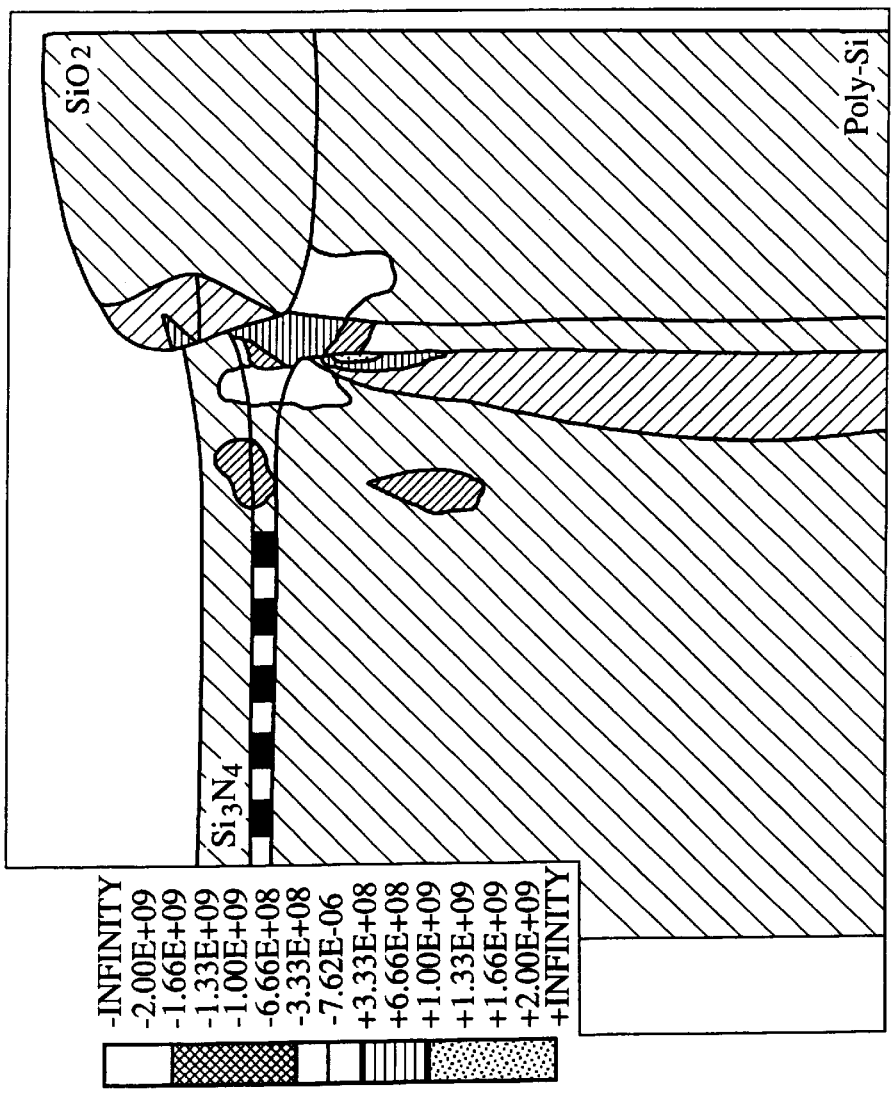
FIG. 111 is a view showing prediction calculation for disribution of $\sigma_{xx}$ in a trench angle.
Figure 112:
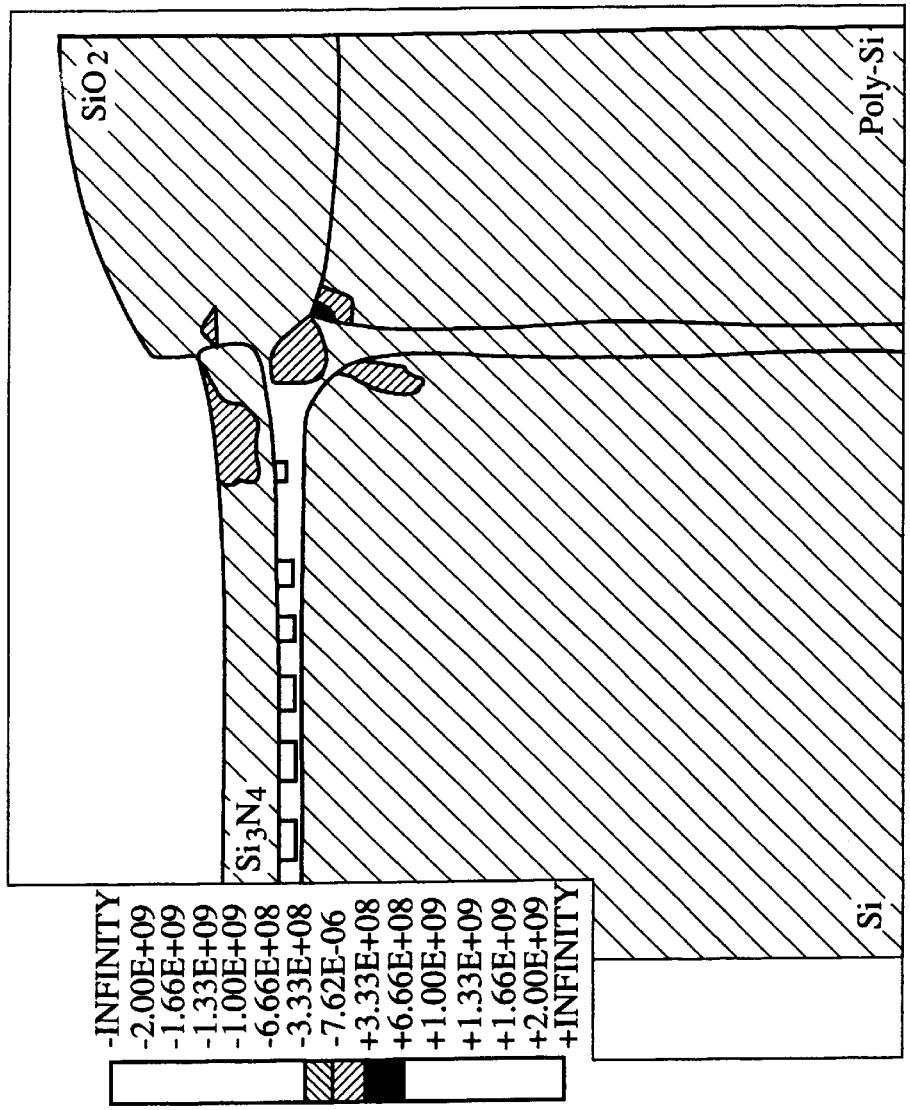
FIG. 112 is a view showing prediction calculation for disribution of $\sigma_{xx}$ in a trench angle.
Figure 113:
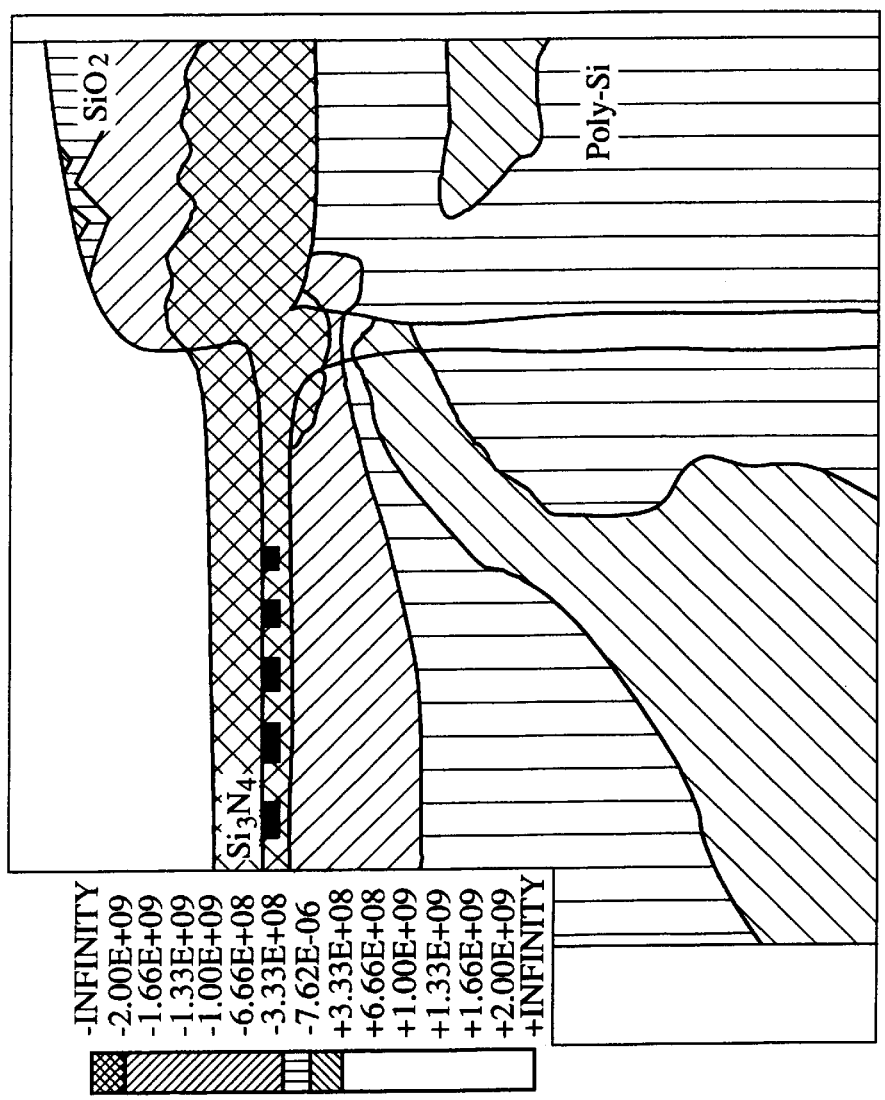
FIG. 113 is a view showing prediction calculation for disribution of $\sigma_{xx}$ in a trench angle.
Figure 114:
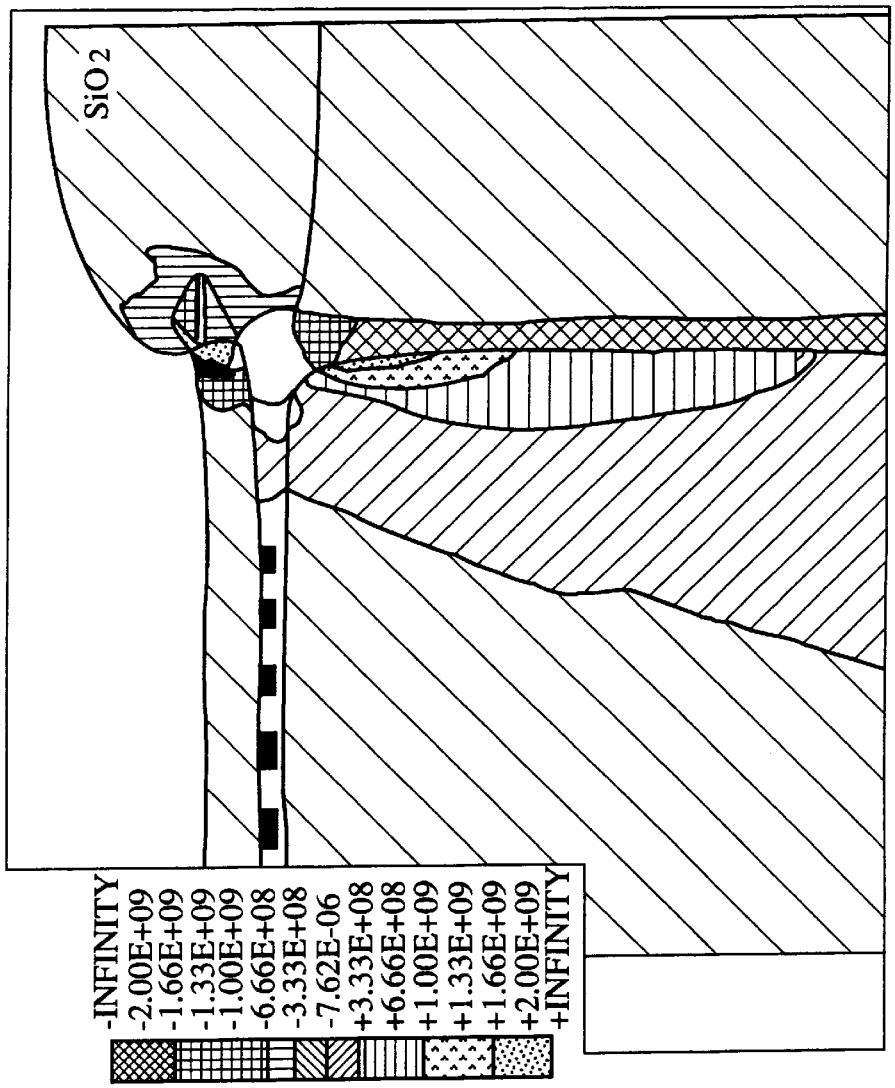
FIG. 114 is a view showing prediction calculation for disribution of $\sigma_{xx}$ in a trench angle.
Figure 115:
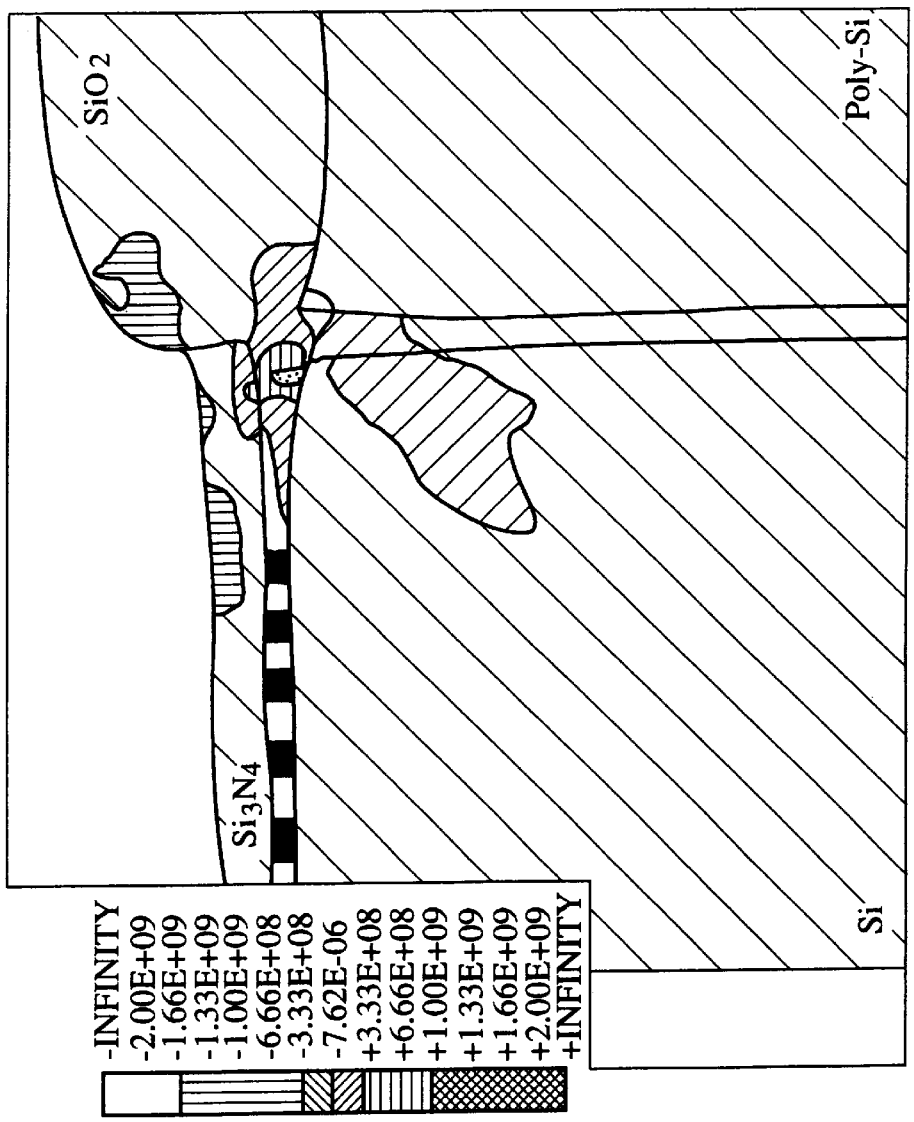
FIG. 115 is a view showing prediction calculation for disribution of $\sigma_{xx}$ in a trench angle.
Figure 116A:
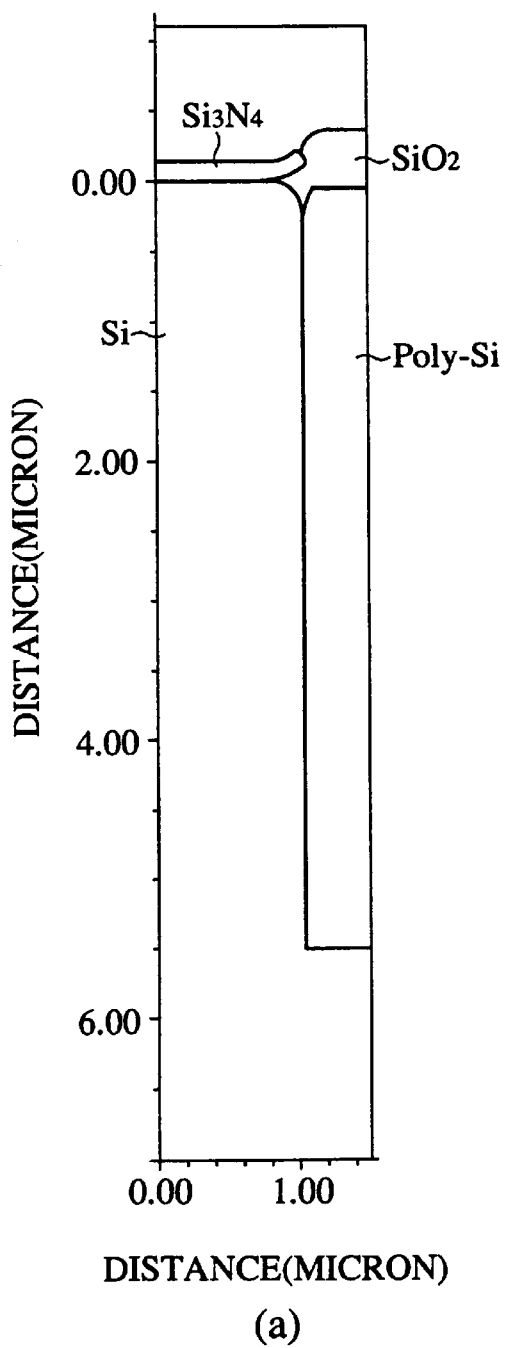
FIGS. 116A and 116B are views showing optimized profiles of oxidation prediction.
Figure 116B:
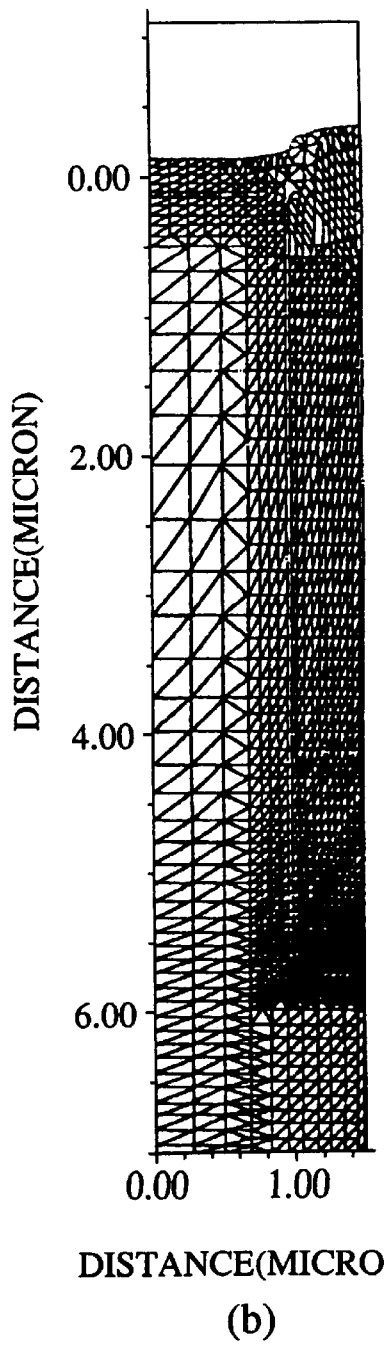

FIGS. 105 to 107 are graphs showing the results of temperature of thickness of growth film, and time dependency examined by using the above simulator. The inventors have examined, though not shown herein, low pressure behavior when oxygen partial pressure is 10% and 1%. As a result, when oxidation rate is slow, oxidation advances while stress caused by expansion of the oxide film is sufficiently relaxed. Therefore, stress is not accumulated in the substrate so that uniform oxide film can be formed on the convex portion. As the result of careful examination by the inventors, it has been found that such an approach is effective that oxygen partial pressure is lowed at initial oxidation to make oxidation rate slow and thus to relax stress sufficiently and then oxygen partial pressure is increased gradually.

Embodiment 5

This embodiment shows an example wherein the present invention is applied to stress problem in the silicon thermal oxide film. The stress problem is important to suppress generation of crystal defect and dislocation in the silicon substrate. But the stress problem is further important as a factor which affects film quality in various materials.

In the silicon thermal oxide film, there are caused oxidation stress due to volumic expansion when the silicon is oxidized and thermal stress caused by temperature rise and temperature fall. These affect quality of the oxide film. That is, stress affects the network structure in the silicon oxide film if it is mentioned at atomic level, and there is possibility that stress produces further effect on the tetrahedron structure acting as a unit structure of the $SiO_2$ system. In turn, stress have effects on electric insulating properties. Therefore, while preparing findings as with IR spectrum in the silicon oxide film, structure at atomic level, and electric chracteristics, the inventors proceed oxidation step with controlling quality of the oxide film.

Figure 117:
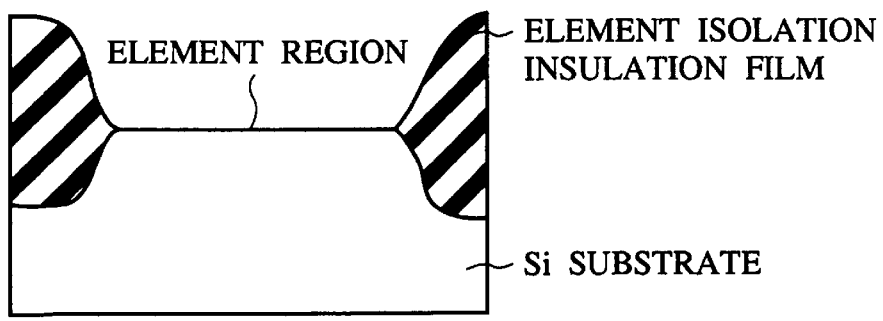
FIG. 117 is a sectional view showing process of forming a gate thermal oxide film in a seventh embodiment.
Figure 118:
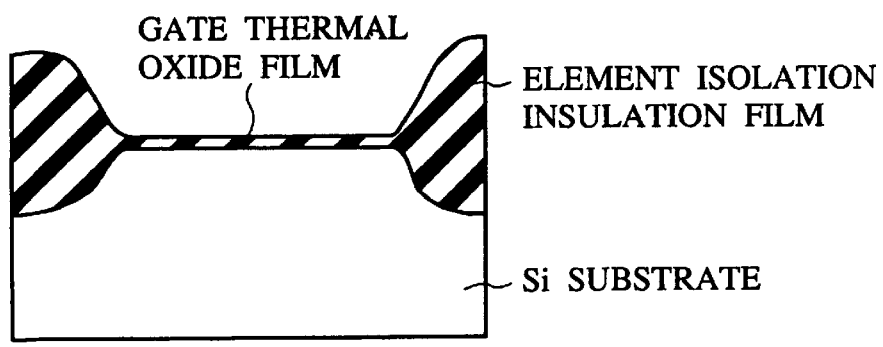
FIG. 118 is a sectional view showing process of forming the gate thermal oxide film in the seventh embodiment.

At first, the inventors have investigated IR spectrum in the silicon oxide film, structure at atomic level, and electric chracteristics as prestages. As shown in FIG. 117, by preparing the substrate and executing device isolation step, the device regions which are isolated by the device isolation regions are formed. Next, the silicon substrate is introduced into the oxidizing equipment to thus form the gate thermal oxide film, as shown in FIG. 118 At this time, the oxidizing temperature is changed variously from 800° C. to 1100° C.

Figure 119:
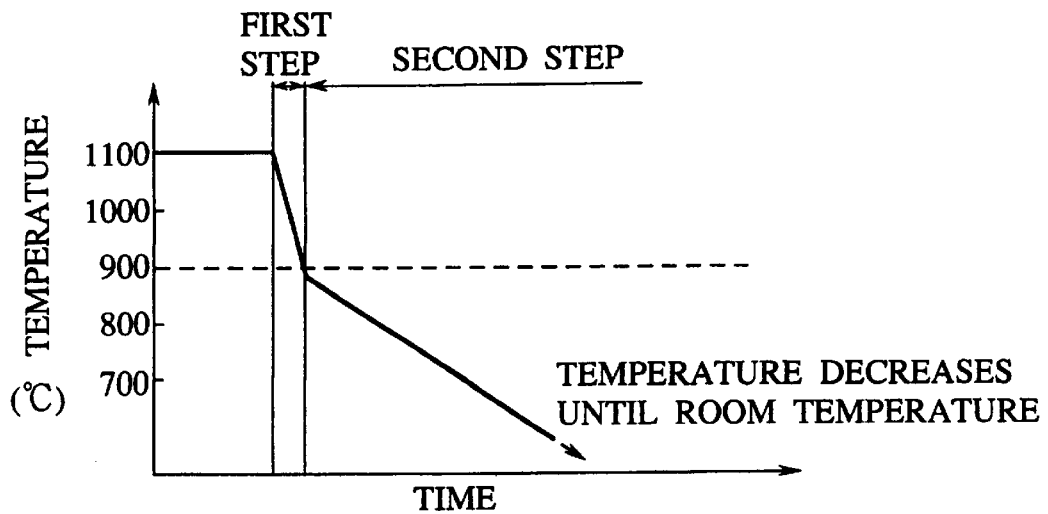
FIG. 119 is a characteristic view showing process of rising temperature after the gate thermal oxide film is formed in the seventh embodiment.

After the silicon oxide film of a predetermined thickness is formed, the substrate temperature is decreased. In this event, the substrate temperature is decreased at two stages, as shown in FIG. 119. The first stage is to decrease the substrate temperature up to 900° C. and the substrate temperature quickly falls down. The second stage is to decrease the substrate temperature from 900° C. to room temperature and the falling speed is not especially mentioned. If the oxidation temperature is set less than 900° C., the substrate temperature is decreased by the second stage only.

Figure 120:
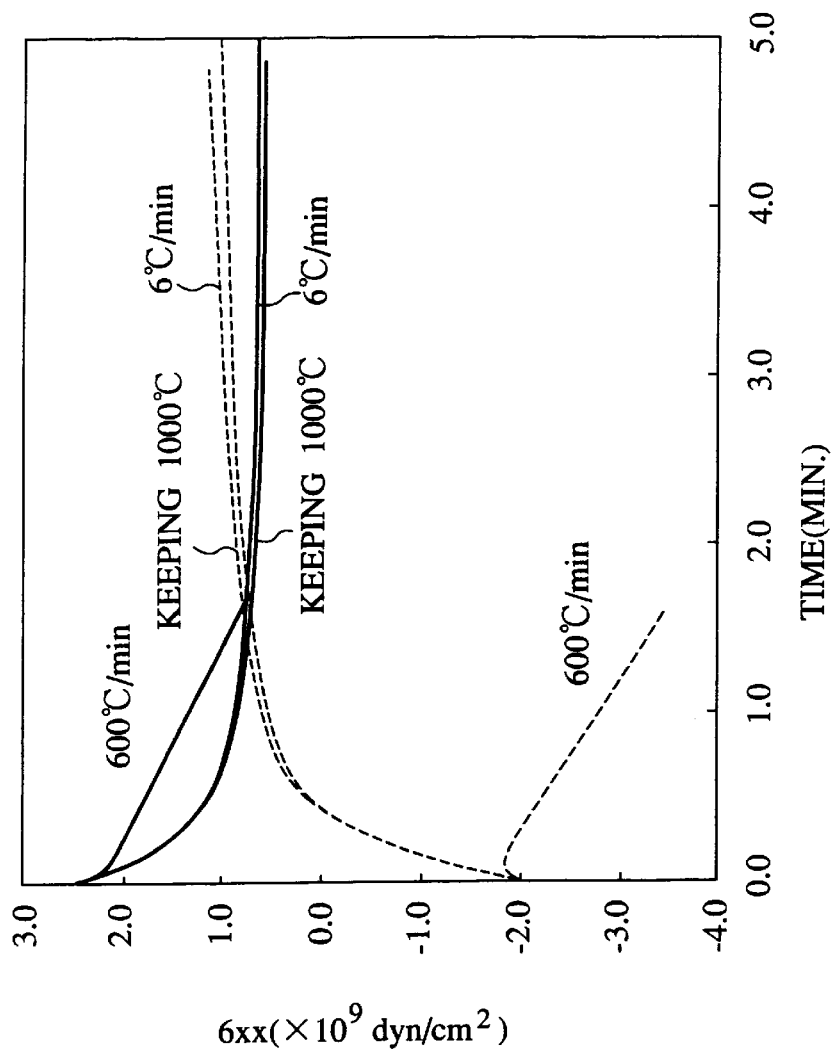
Figure 121:
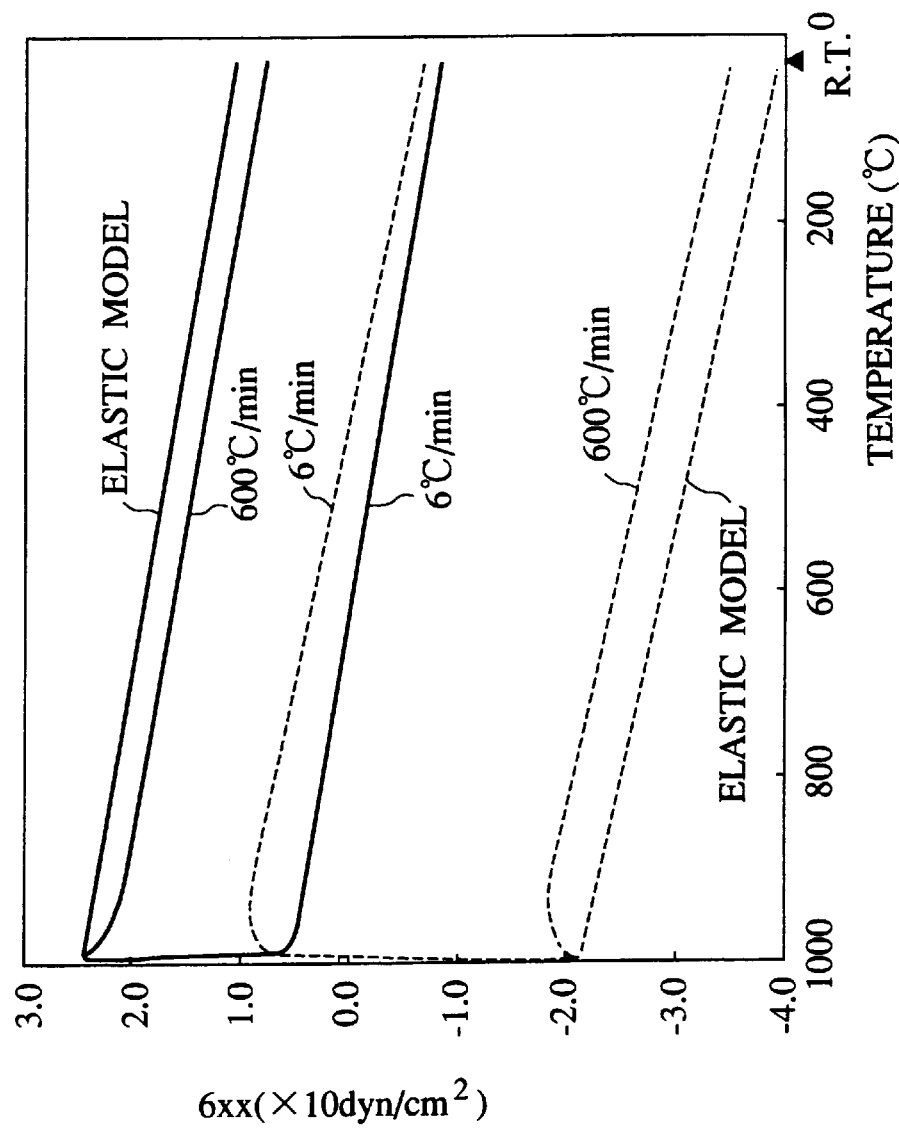

Setting of the temperature falling conditions is determined separately based on analysis of viscosity relaxation behavior of the oxide film. In general, it has been said that the oxide film becomes soft at high temperature, so that stress can be readily relaxed due to viscous flow. Therefore, the inventors have examined stress relaxation behavior because of viscosity in detail. Examples to which variation in stress relaxation characteristics owing to falling speed of the temperature has been examined are shown in FIGS. 120 and 121. In present examples, the oxidation speed is set at 1000° C.

FIG. 120 shows the results indicating the maximum value of the main stress in the direction along the surface if the substrate is kept at 1000° C. respectively, if it is quickly chilled at 600° C./min and, if it is gradually chilled at 6° C./min after typical oxidation step is carried out. From the results shown in FIG. 120, stress can be relaxed within about one min. in both cases where the substrate is kept at 1000° C. and it is gradually chilled. While, viscous relaxation is small and thermal stress is superposed on the stress in case the substrate is quickly chilled.

FIG. 121 is a view wherein the stress behavior during temperature falling process is plotted on the ordinate relative to temperature on the abscissa. It has been found that from FIG. 121 that, in the temperature range more than 950° C., stress relaxation is remarkable and the oxide film exhibits behavior like viscosity or viscoelasticity, while stress relaxation is seldom caused in the temperature range less than 950° C. and the oxide film exhibits behavior like elastic body.

As guessed from such calculation examples, using two stage temperature fall in the present embodiment, it becomes possible to suppress the viscosity relaxation by passing through the temperature range in which the viscosity relaxation is caused at as short time as possible. In addition, by changing the oxidation temperature variously, thermal stress caused by difference in thermal expansion coefficient between the silicon substrate and the oxide film can be set variously.

Figure 122:
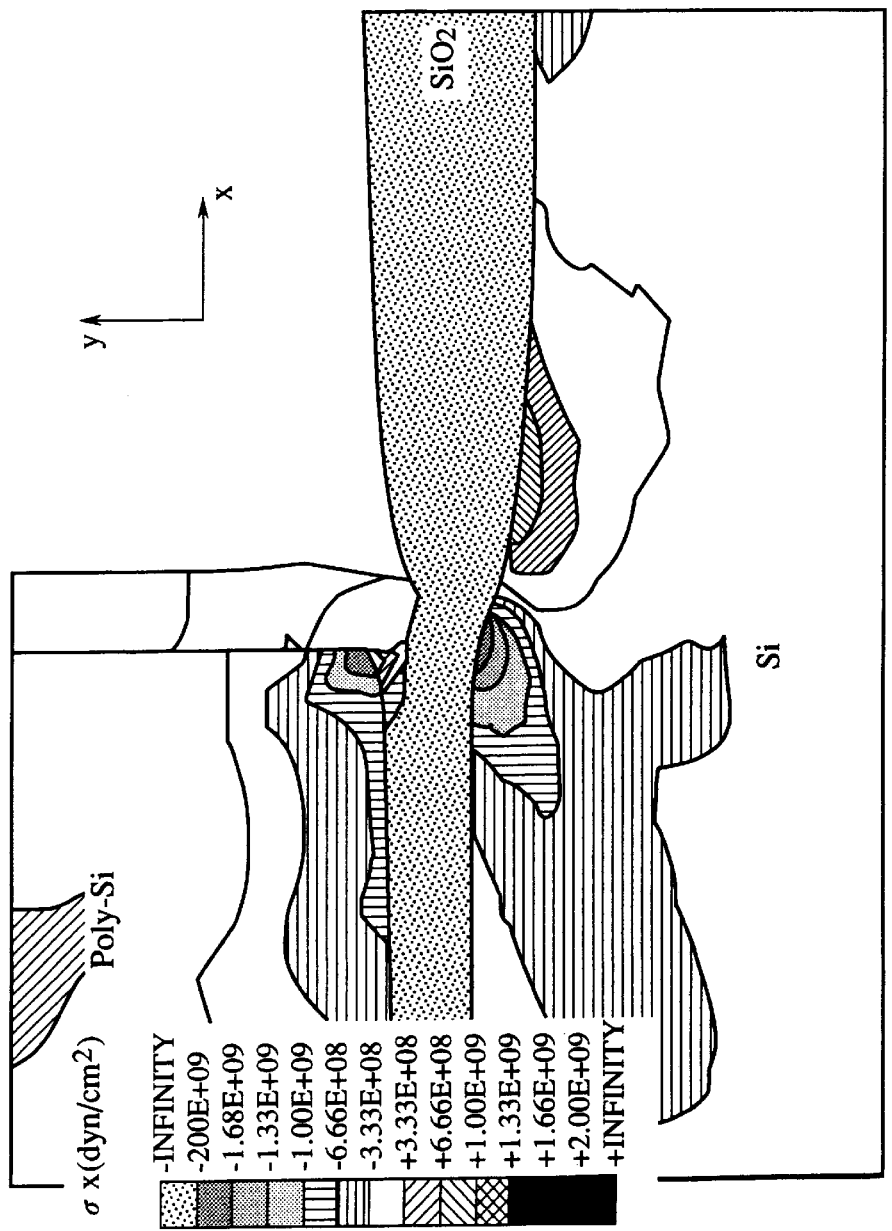
Figure 123:
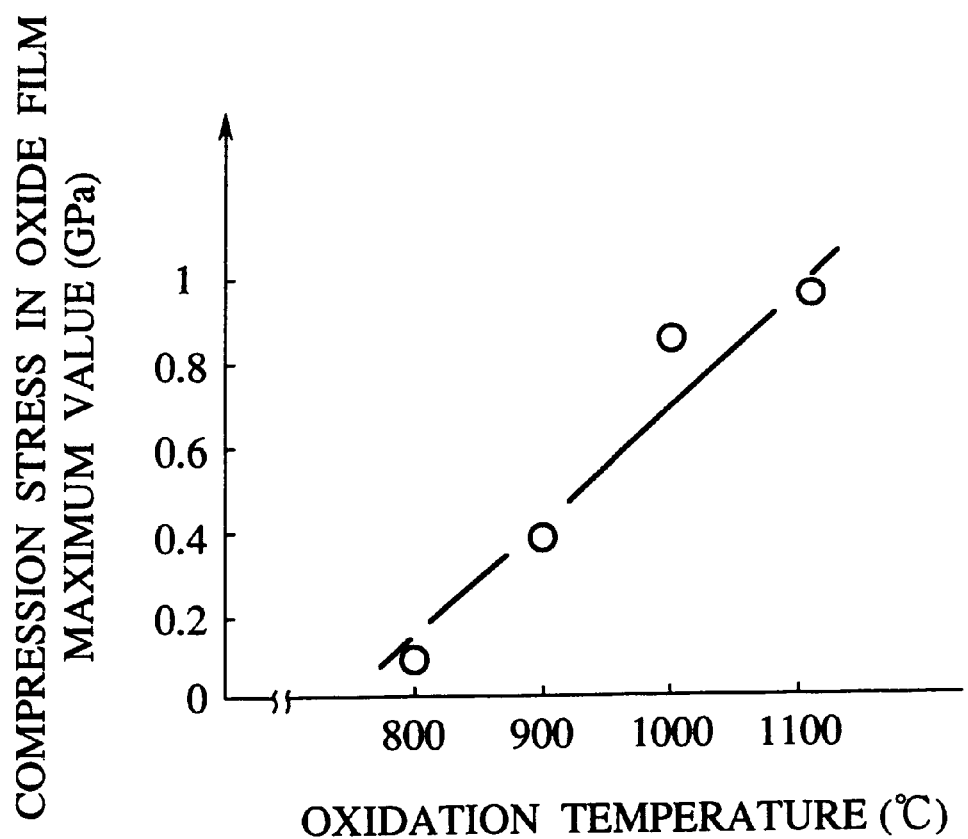

Using the sample formed as above, if tensile stress in the direction of the surface of the substrate directly beneath the silicon oxide film has been measured from the sectional face by microscopic Raman spectroscopic analysis, various thermal stresses induced in the silicon substrate have confirmed. The inventors have estimated stress values induced in the oxide film by comparing stress induced measured values in the substrate with calculation results exemplified in FIG. 122. Upon executing stress calculation, the inventors have employed the material and process prediction simulation system which includes from molecular level to general-purpose level constructed by the inventors. As a result, a relationship shown in. FIG. 123 can be derived between the oxidation temperature and compressive stress in the oxide film. It has been understood from FIG. 123 that the maximum value of compressive stress in the oxide film is increased linearly with the increase of the oxidation temperature.

Figure 124:
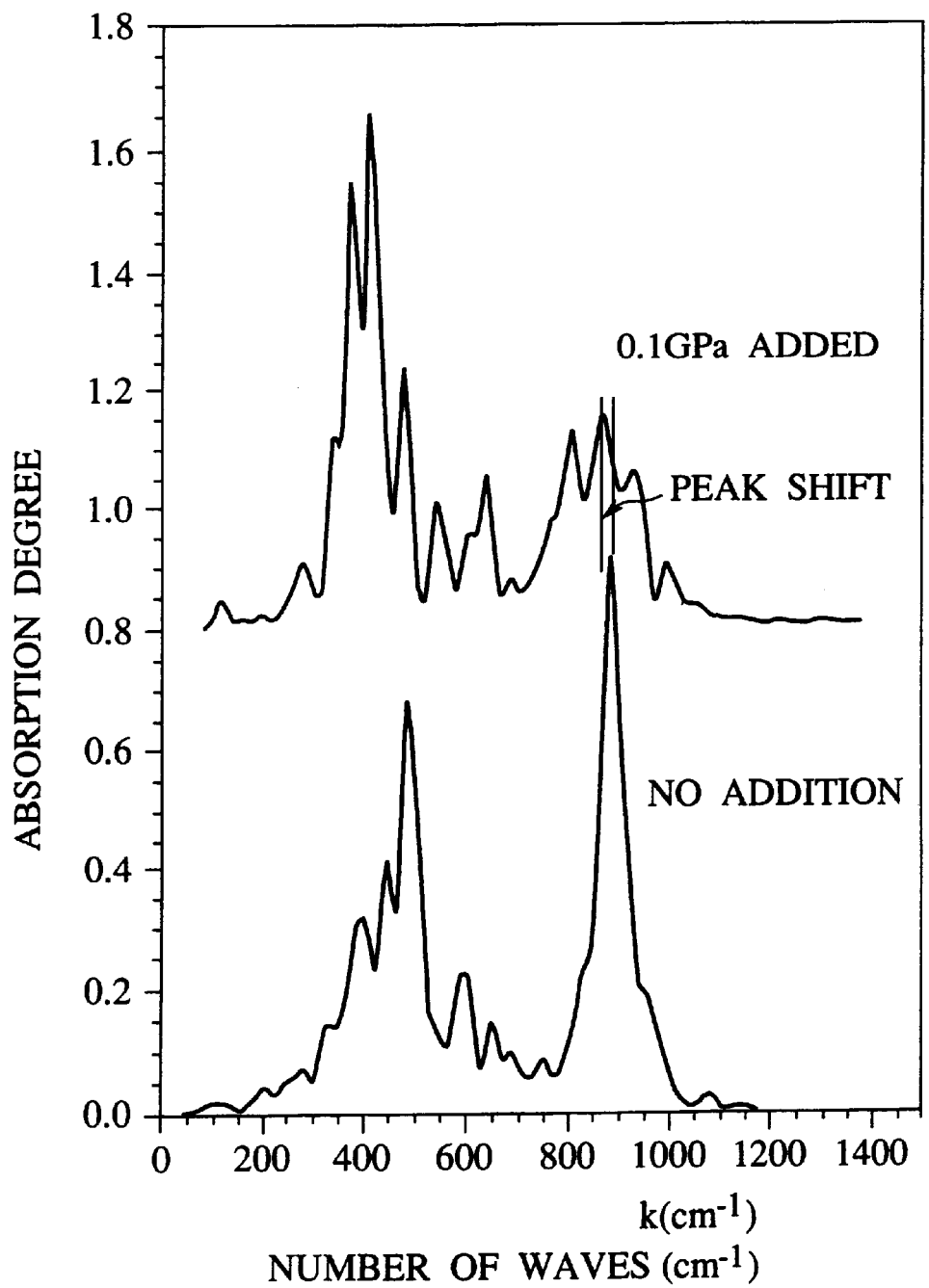

As next preparation, IR spectrum of the oxide film in which compressive stress is caused has been measured. In contrast, if compressive stress is applied, computer-prediction of the oxide film structure and IR spectrum have been executed by classical molecular dynamics method. FIG. 124 shows variation in calculation IR spectrum according to presence or absence of application of compressive stress.

Figure 125:
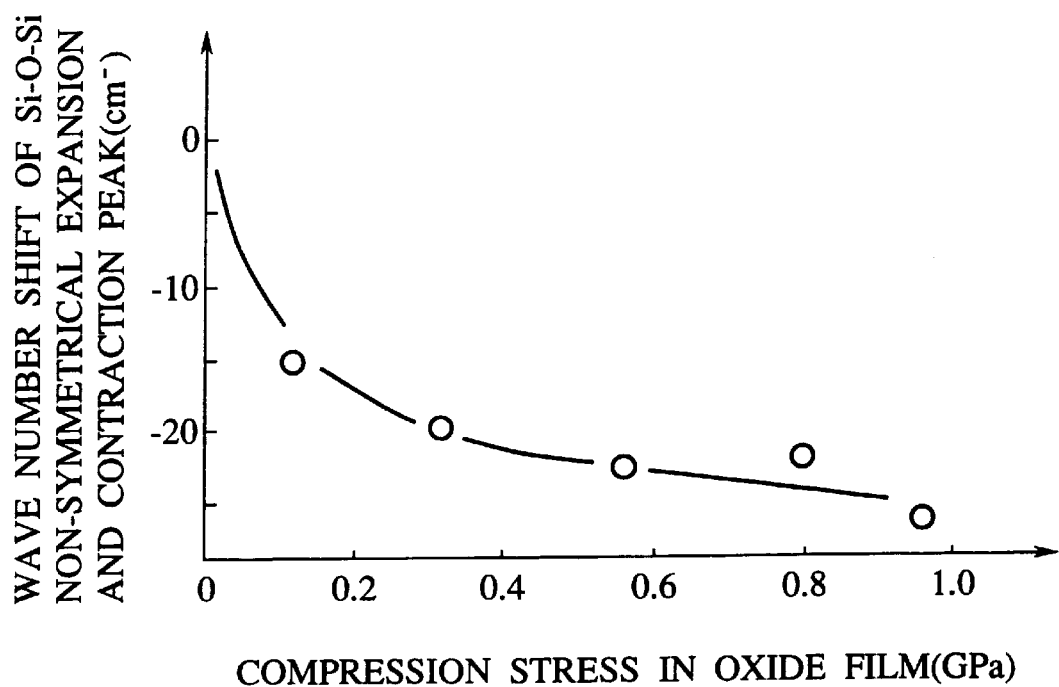

FIG. 125 is the results wherein wave number shift due to stress of Si—O—Si asymmetrical stretching peak is measured from the measured values of IR spectrum. To compare the measure values with the calculation values, such behavior can be derived from calculation IR spectrum that appearing wave number of the Si—O—Si asymmetrical stretching peak is shifted to the lower wave number side by applying the compressive stress rather than the case no stress is applied. It has been found that measured values coincide with the calculation values. Therefore, if various stresses are applied, the amorphous structure and IR spectrum are calculated and prepared.

As further preparation, relationship between stress and electric characteristics have been investigated. By using the oxide film in which various stresses are caused as the gate insulating film and depositing the gate electrode on the gate insulating film, Qbd has been measured. All steps for deposition of the gate electrodes, etc. have been executed at the temperature less than 900° C. not to generate viscocity relaxation of the oxide film. Correlation between the oxide film structure predicted by the molecular dynamics calcultion and Qbd has been examined.

Figure 126:
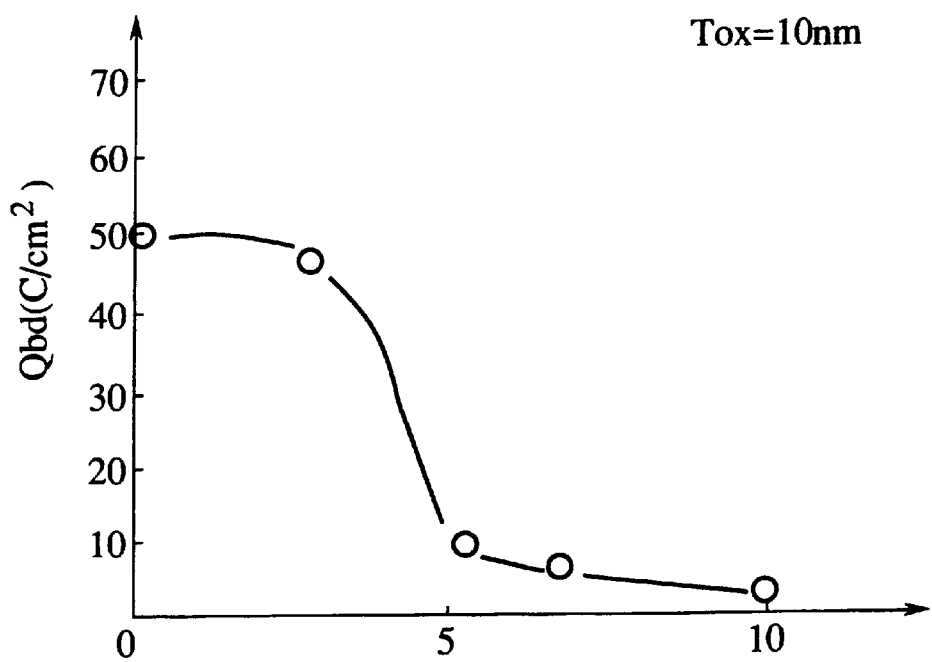

FIG. 126 is the results wherein correlation between frequency of occurrence of bond in which Si—O atomic interval of first proximity is more than 1.8 Å, and Qbd has been calculated after a radial distribution function of Si—O atoms in the oxide film has been calculated in various stress fields. It has been found from FIG. 126 that, if frequency of occurrence of bond in which Si—O atomic interval is more than 1.8 Å exceeds 5%, Qbd is reduced remarkably so that Si—O atomic interval and the oxide film insulation breakdown are corelated with each other. A shift amount of IR spectrum is about 15 1/cm.

Figure 127A:
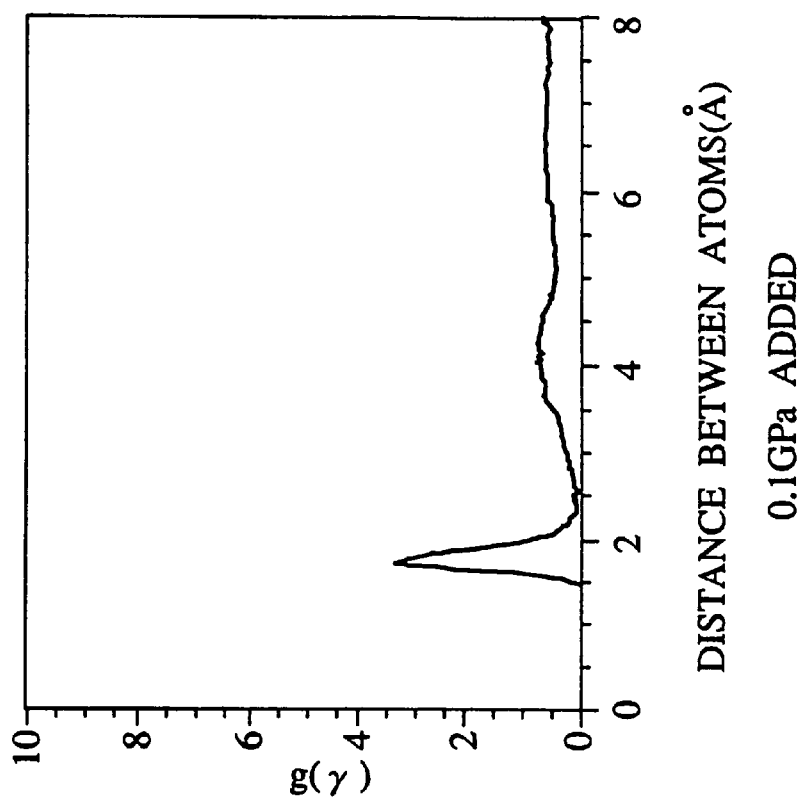
Figure 127B:
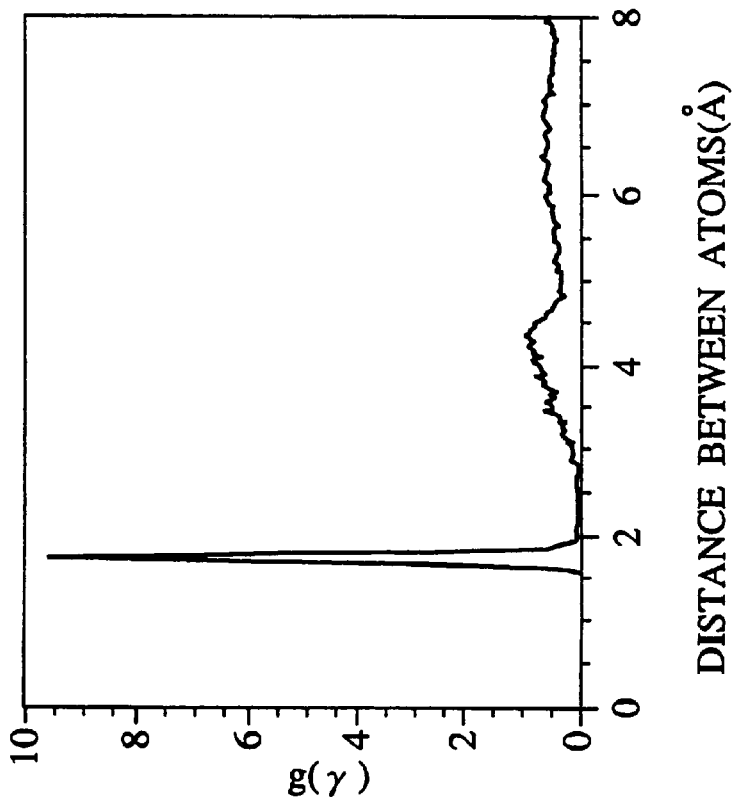
Figure 129:
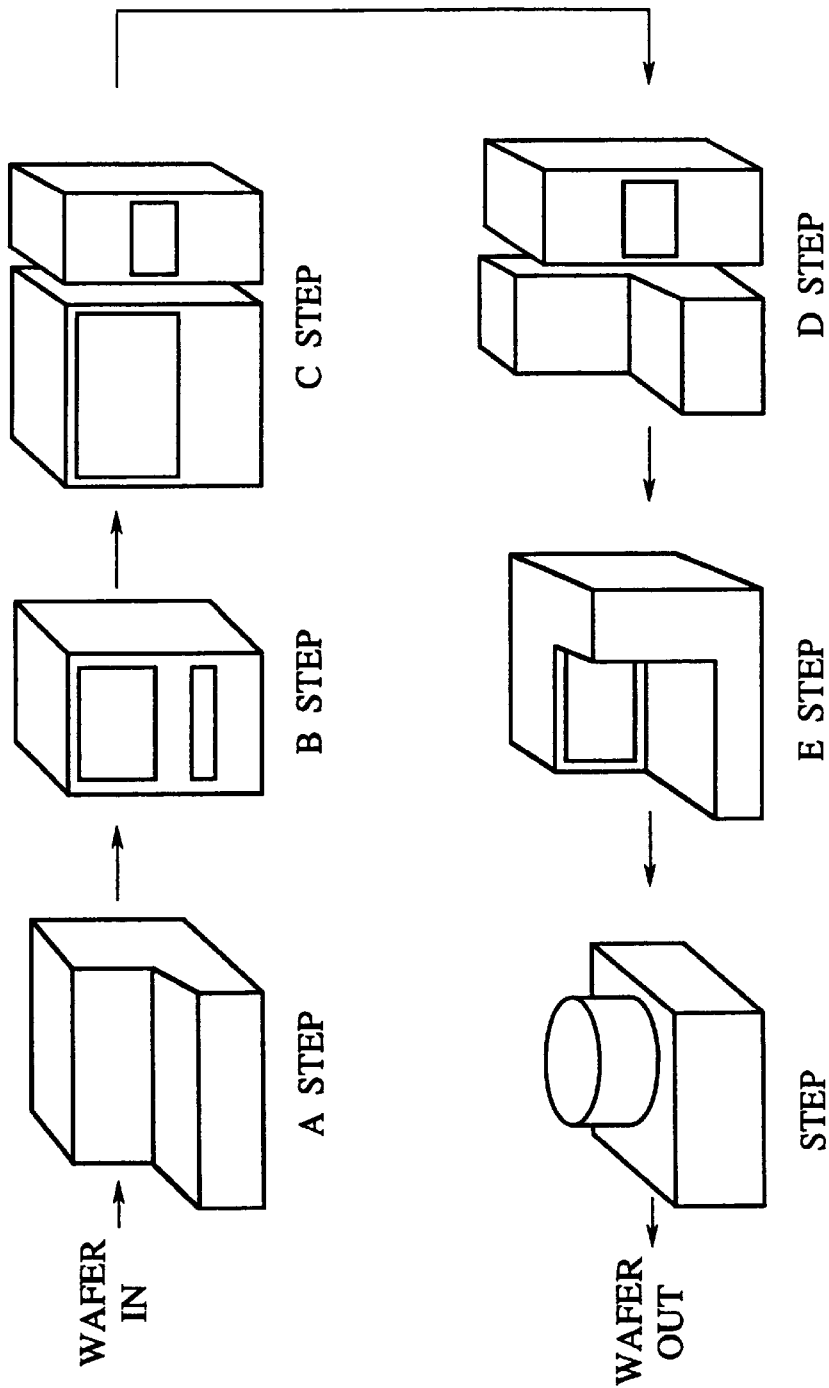
Figure 130:
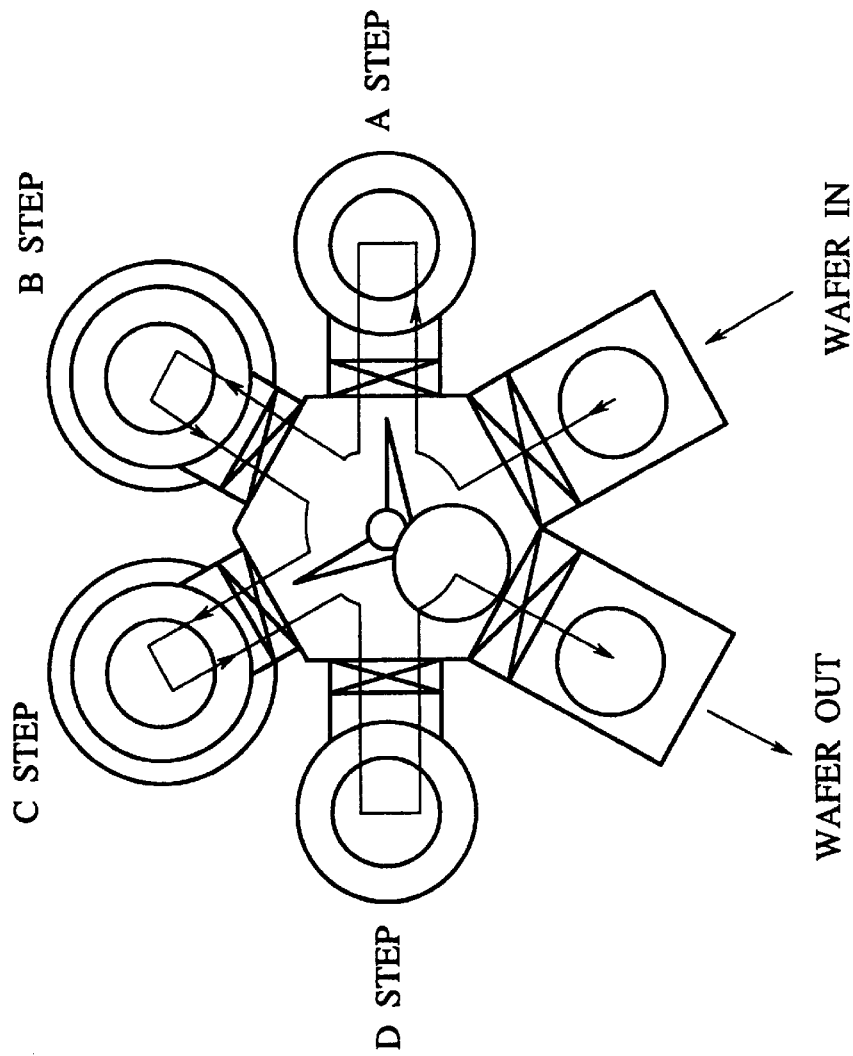

Variation in amorphous network structure if compressive stress is applied to the oxide film are supposed to two ways, i.e., (1) Si—O bond length is reduced because density of the oxide film is enhanced, and (2) Si—O—Si bond angle is reduced because of IR measurement in the thin film thermal oxide film and the central force model. However, the inventors have newly found by the originally developed simulator that increase in density of the oxide film does not linked with simple reduction in Si—O bond length, as shown in FIG. 127 rather, distribution of bond length is spread and rate of elongated bond is increased. In addition, correlation to Qbd has also been found.

Although the inventors have not analyzed physical reasons for correlation between Qbd and elongated Si—O bond yet in detail, one of such reasons may be guessed from the paper which is recently reported as follows. The paper is Kaneda, "Local Deformation in Oxide Film and Hole Trap by Impurity", Thin Film/Surface Physics Symposium Study Report, Formation/Evaluation/reliability of Ultra Thin Silicon Oxide Film, pp.101–104. According to Kaneda's calculation using the molecular orbit method program GAUSSIAN, it has been reported that "If elongated Si—O—Si exits, trapping of holes to central oxygen is induced. Since trapped holes are localized strongly to oxygen, they act as trapping centers for electrons. As a result, most of oxygens return to their original state by trapping electrons. However, a part of oxygens get energy of several eV emitted from recombinations of electrons and holes to cut off Si—O bond which being elongated and weaken, so that oxygens run out of the lattice. Therefore, for instance, two-dimensional defects such as oxygen deficiency may be generated."

According to the inventors, as shown in this report, since bonds which being elongated by application of stress are increased, oxygen deficient defects are supposed to be formed. In addition, it has been guessed that, although various structures of oxygen deficient defects can be considered, electron states are significantly varied in the structure wherein Si atoms on both sides of the oxygen deficient defects are largely separated, so that levels are formed in the band gap and electron distribution to enable electric conduction is varied.

By preparing as above, since IR spectrum of the oxide film can be predicted in the stress fields and also correlation between the structure at atomic level and electric properties can be obtained, the inventors have tried "to correct manufacturing processes".

The Si wafer processed in the predetermined processes is introduced into the oxide film forming equipment, and then the oxide film having a predetermined film thickness at dry $O^2$ atmosphere including 5% hydrochloric acid at 1050° C. After the oxide film has been formed, the wafer is quickly cooled to room temperature, and then IR spectrum of the oxide film has been measured. When Si—O asymmetrical stretching oscillation peak wave number in IR spectrum can be read from the measured values and an amount of shift from the wave number when no stress occurs is calculated, a shift of 17 1/cm can be measured.

It has been predicted from this shift amount that compressive stress of about 0.2 GPa is induced in the oxide film. This shift amount has been compared with a shift critical value 15 1/cm. Since it has been detected that the shift amount exceeds the critical value in this heating step, process is ceased. As correction of manufacturing process, stress relaxation has been carried out by high temperature annealing.

In addition, to compare effect of the present embodiment, high temperature is not applied to a part of the wafer which are passed through the step as they are Annealing time, annealing temperature, temperature rise and fall speed, etc. serving as parameters for stress correction high temperature annealing are calculated with regard to analysis of relaxation time detected viscosity relaxation, and rediffusion behavior of impurity diffudion layer formed already in the substrate. In this case, annealing is executed at 1000° C. for 30 sec.

When, after annealing being completed, III spectrum is measured again to calculate a shift amount, it is below the critical value. Therefore, process is continued as it is. Qbd has been measured in both cases the process is corrected and not corrected. As a result, 45 $C/cm^2$ if correction has been made while 5 $C/cm^2$ if no correction has been made. This show advantage of process correction by the present invention clearly.

Moreover, in the wafer having another structure, a gate oxide film of a desired thickness has been formed at dry $O_2$ atmosphere at 950° C. When, after the oxide film being formed, the wafer is cooled quickly to room temperature, and IR spectrum of the oxide film has been measured, a peak shift amount is 16 1/cm. Since this amount exceeds the critical value, additional annealing is needed to relax stress. However, if rediffusion of impurity diffusion layer should be considered together, solution for appropriate annealing conditions does not exist. Therefore, it has been determined that it is impossible to continue this step to thus dispose the wafer.

As discussed above, the present invention may not only to overcome the problems in monitoring function upon clustering, but also proceed semiconductor device manufacturing processes according to predetermined schedules or while correcting them without testpieces, etc. by expanding limited quantity or quality contents of "in situ" measured values at their maximum in a semiconductor device manufacturing apparatus for MOSLSI, etc., especially a sheet type or clustered semiconductor device manufacturing apparatus. Further, according to the present invention, it becomes possible to i) diagnose a superposition phenomenon of fluctuation of respective process factors and deviation of respective factors, ii) check whether or not processes are executed along predetermined sequences, and iii) find variation factors. Furthermore, characterizing features of this system are iv) to enable variation in processes to be dealt with mathematically and statistically with good efficiency, v) to equip the system with a new inference engine, and vi) to equip the system with a new reciprocal system.

What is claimed is:

1. A method of manufacturing a semiconductor device comprising the steps of:

collecting at least one of actually observed data by measuring at least one of plural characteristics concerning at least one of a film formed in a manufacturing apparatus, a film formed on a semiconductor substrate, surface of said semiconductor substrite, and interior of said semiconductor substrate during at least one of a plurality of steps;

obtaining at least one of prediction data of said plural characteristics by selecting at least one of set values for plural manufacturing process factors and fluctuation of this set value during said at least one of a plurality of steps as input values and then executing variation calculation based on said input values by using an ab initio molecular dynamics process simulator or a molecular dynamics simulator to which empirical potential is given;

comparing and verifying said prediction data and said actually observed data sequentially at real time; and correcting and processing said plural manufacturing process factors sequentially at real time if difference in significance is recognized between at least one of said set values for said plural manufacturing process factors and at least one of said plural manufacturing process factors estimated from said actually observed data according to comparison and verification;

wherein said ab initio molecular dynamics process simulator or said molecular dynamics simulator to which empirical potential is given has functions of setting time to zero when motions of atoms constituting semiconductor material, insulating material, or conductive material being formed or processed during said plurality of steps reach equilibrium, then setting a time period from zero to time t as a sampling time, then calculating time correlation between polarizability, charge, and position vector, and then calculating optical spectrum within a predetermined time, and prediction data which are derived by said ab initio molecular dynamics process simulator or said molecular dynamics simulator to which empirical potential is given include information concerning oscillation behavior derived from momentary motion of individual atoms, natural frequency of oscillation, and distribution of said natural frequency.

2. A method of manufacturing a semiconductor device comprising the steps of:

collecting at least one of actually observed data by measuring at least one of plural characteristics concerning at least one of a film formed in a manufacturing apparatus, a film formed on a semiconductor substrate, surface of said semiconductor substrate, and interior of said semiconductor substrate during at least one of a plurality of steps;

obtaining at least one of prediction data of said plural characteristics by selecting at least one of set values for plural manufacturing process factors and fluctuation of this set value during said at least one of a plurality of steps as input values and then executing variation calculation based on said input values by using an ab initio molecular dynamics process simulator or a molecular dynamics simulator to which empirical potential is given;

comparing and verifying said prediction data and said actually observed data sequentially at real time; and correcting and processing said plural manufacturing process factors sequentially at real time if difference in significance is recognized between at least one of said set values for said plural manufacturing process factors and at least one of said plural manufacturing process factors estimated from said actually observed data according to comparison and verification;

wherein said ab initio molecular dynamics process simulator or said molecular dynamics simulator to which empirical potential is given has functions of calculating strength constant of material sequentially based on motions of atoms constituting semiconductor material, insulating material, or conductive material being formed or processed during said plurality of steps, and then calculating stress induced in said material using said strength constant of material, and at least one of said manufacturing process factors is corrected sequentially if said stress exceeds a specified value.

3. A method of manufacturing a semiconductor device according to claim 1 or 2, wherein said atoms constituting said semiconductor material, said insulating material, or said conductive material are made up of silicon atoms and oxygen atoms.

4. A method of manufacturing a field effect type SiMIS semiconductor device comprising the steps of:

employing a single crystal film as a gate insulating oxide film of said MIS semiconductor device when said field effect type MIS semiconductor device is formed on an Si single crystal semiconductor substrate;

taking free energy of all over system as evaluation function based on abinitio molecular dynamics theory representing object characteristics into a system which includes said semiconductor substrate and said single crystal ferroelectric film;

placing said single crystal ferroelectric film so as to minimize free energy under main operating conditions;

suppressing unevenness of local energy within a deviation value $3\sigma$; and suppressing oxygen deficient density in said single crystal ferroelectric film less than 0.01%.

5. A method of manufacturing a semiconductor device comprising the steps of:

collecting at least one of actually observed data by measuring at least one of plural characteristics concerning at least one of a film formed in a manufacturing apparatus, a film formed on a semiconductor substrate, surface of said semiconductor substrate, and interior of said semiconductor substrate during at least one of a plurality of steps;

obtaining at least one of prediction data of said plural characteristics by selecting at least one of set values for plural manufacturing process factors and fluctuation of this set value during said at least one of a plurality of steps as input values and then executing variation calculation based on said input values by using an ab initio molecular dynamics process simulator or a molecular dynamics simulator to which empirical potential is given;

comparing and verifying said prediction data and said actually observed data sequentially at real time; and correcting and processing said plural manufacturing process factors sequentially at real time if difference in significance is recognized between at least one of said set values for said plural manufacturing process factors and at least one of said plural manufacturing process factors estimated from said actually observed data according to comparison and verification;

wherein said molecular dynamics simulator to which empirical potential is given has functions of setting time to zero when motions of atoms constituting semiconductor material, insulating material, or conductive material being formed or processed during said plurality of steps reach equilibrium, then setting a time period from zero to time t as a sampling time, then calculating time correlation between charge and position vector, and then calculating optical spectrum within a predetermined time, and prediction data which are derived by said molecular dynamics simulator to which empirical potential is given to include information concerning oscillation behavior derived from momentary motion of individual atoms, natural frequency of oscillation, and distribution of said natural frequency.

6. A method of manufacturing a semiconductor device comprising the steps of:
  collecting at least one of actually observed data by measuring at least one of plural characteristics concerning at least one of a film formed in a manufacturing apparatus, a film formed on a semiconductor substrate, surface of said semiconductor substrate, and interior of said semiconductor substrate during at least one of a plurality of steps;
  obtaining at least one of prediction data of said plural characteristics by selecting at least one of set values for plural manufacturing process factors and fluctuation of this set value during said at least one of a plurality of steps as input values and then executing variation calculation based on said input values by using an ab initio molecular dynamics process simulator or a molecular dynamics simulator to which empirical potential is given;
  comparing and verifying said prediction data and said actually observed data sequentially at real time; and
  correcting and processing said plural manufacturing process factors sequentially at real time if difference in significance is recognized between at least one of said set values for said plural manufacturing process factors and at least one of said plural manufacturing process factors estimated from said actually observed data according to comparison and verification;
  wherein said molecular dynamics simulator to which empirical potential is given receives position vectors of atoms and electronegativity of respective elements, ionization potential and electric affinity of respective elements, then calculates change in charge based on oscillation and variation of respective atoms from these data, and then calculates said potential with including such change in charge.

7. A method for designing an electric device by simulating a physical phenomenon which would occur in a manufacturing apparatus in which said electric device is manufactured, said physical phenomenon being simulated by the steps of:
  setting a preset value of at least one manufacturing process factor with influence exerting upon a physical value of a substance as formed in said manufacturing apparatus; and
  obtaining prediction data of said physical value by molecular dynamics simulation with said preset value,
  wherein said molecular dynamics simulation is conducted based upon combination of a molecular dynamics method and a density functional theory.

8. The method for designing an electric device by simulating a physical phenomenon as claimed in claim 7, wherein said molecular dynamics method is conducted based upon higher order cyclic partial differentiation.

9. The method for designing an electric device by simulating a physical phenomenon as claimed in claim 8, wherein said higher order cyclic partial differentiation is handled as a three body problem.

10. The method for designing an electric device by simulating a physical phenomenon as claimed in claim 7, wherein said physical value is at least one of characteristics concerning a film formed on a semiconductor substrate, surface of said semiconductor substrate, and interior of said semiconductor substrate.

11. The method for designing an electric device by simulating a physical phenomenon as claimed in claim 7, further comprising means for inputting fluctuation of said at least one manufacturing process factor with influence exerting upon a physical value of a substance as formed in said manufacturing apparatus, wherein said molecular dynamics simulation is conducted by variation calculation using said fluctuation of said at least one manufacturing process factor and said preset value of at least one manufacturing process factor as set in said simulator.

12. The method for designing an electric device by simulating a physical phenomenon as claimed in claim 7, wherein said molecular dynamics simulation is conducted using an empirical potential.

13. The method for designing an electric device by simulating a physical phenomenon as claimed in claim 12, wherein said empirical potential is an ATTA potential.

14. The method for designing an electric device by simulating a physical phenomenon as claimed in claim 12, wherein said empirical potential is a BK potential.

15. The method for designing an electric device by simulating a physical phenomenon as claimed in claim 7, wherein a general-purpose process simulation is conducted in a wide region of several-micron level by the use of said prediction data of said physical value as obtained by said molecular dynamics simulation.

16. The method for designing an electric device by simulating a physical phenomenon as claimed in claim 15, wherein said molecular dynamics simulation is based upon an atomic model and said general-purpose process simulation is based upon a fluid model, and said simulations are conducted as a three-dimensional calculation.

17. The method for designing an electric device by simulating a physical phenomenon as claimed in claim 15, wherein resultants of a step induction stress calculation are transferred from said three-dimensional molecular dynamics simulation to said three-dimensional general-purpose simulation.

18. A method for manufacturing an electric device in a manufacturing apparatus, said method comprising the steps of:
  collecting actually observed data by actually measuring a physical value of a substance as formed in said manufacturing apparatus;
  setting a preset value of at least one manufacturing process factor with influence exerting upon said physical value of the substance as formed in said manufacturing apparatus;
  obtaining prediction data of said physical value by simulation with said preset value;
  comparing and verifying said prediction data and said actually observed data to calculate differential data between said prediction data and said actually observed data; and
  correcting said at least one manufacturing process factor if the differential data between said prediction data and said actually observed data is recognized as significant,
  wherein said simulation is performed based upon combination of a molecular dynamics method and a density functional theory.

19. The method for manufacturing an electric device in said manufacturing apparatus as claimed in claim 18, wherein the electric device is treated as an unacceptable device if the differential data between said three-dimensional prediction data and said actually observed data is out of a predetermined range so that said correcting step is predicted to fail.

20. The method for manufacturing an electric device in said manufacturing apparatus as claimed in claim 18, wherein said manufacturing apparatus is a clustered semiconductor device manufacturing apparatus.

21. The method for manufacturing an electric device in said manufacturing apparatus as claimed in claim 20, wherein said clustered semiconductor device manufacturing apparatus is of a type for treating wafers independently.

22. The method for manufacturing an electric device in said manufacturing apparatus as claimed in claim 18, wherein said physical value is at least one of characteristics concerning a film formed on a semiconductor substrate, surface of said semiconductor substrate, and interior of said semiconductor substrate.

23. The method for manufacturing an electric device in said manufacturing apparatus as claimed in claim 18, wherein said step for comparing and verifying said three-dimensional prediction data and said actually observed data is conducted sequentially at real time.

24. The method for manufacturing an electric device in said manufacturing apparatus as claimed in claim 18, wherein said step for correcting said at least one manufacturing process factor is conducted sequentially at real time.

25. The method for manufacturing an electric device in said manufacturing apparatus as claimed in claim 18, wherein said molecular dynamics simulation is conducted by variation calculation using fluctuation of said at least one manufacturing process factor and said preset value of at least one manufacturing process factor as set in said simulator.

26. The method for manufacturing an electric device in said manufacturing apparatus as claimed in claim 18, wherein said molecular dynamics method is conducted based upon higher order cyclic partial differentiation.

27. The method for manufacturing an electric device in said manufacturing apparatus as claimed in claim 26, wherein said higher order cyclic partial differentiation is handled as a three body problem.

28. The method for manufacturing an electric device in said manufacturing apparatus as claimed in claim 18, wherein said molecular dynamics simulation is conducted using an empirical potential.

29. The method for manufacturing an electric device in a manufacturing apparatus as claimed in claim 28, wherein said empirical potential is an ATTA potential.

30. The method for manufacturing an electric device in a manufacturing apparatus as claimed in claim 28, wherein said empirical potential is a BK potential.

31. The method for manufacturing an electric device in said manufacturing apparatus as claimed in claim 18, wherein a general-purpose process simulation is conducted in a wide region of several-micron level by the use of said prediction data of said physical value as obtained by said molecular dynamics simulation.

32. The method for manufacturing an electric device in said manufacturing apparatus as claimed in claim 31, wherein said molecular dynamics simulation is based upon an atomic model and said general-purpose process simulation is based upon a fluid model, and said simulations are conducted as a three-dimensional calculation.

33. The method for manufacturing an electric device in said manufacturing apparatus as claimed in claim 31, wherein resultants of a step induction stress calculation are transferred from said three-dimensional molecular dynamics simulation to said three-dimensional general-purpose simulation.

34. A method for designing an electric device by simulating a physical phenomenon which would occur in a manufacturing apparatus in which said electric device is manufactured, said physical phenomenon being simulated by the steps of:

setting a preset value of at least one manufacturing process factor with influence exerting upon a physical value of a substance as formed in said manufacturing apparatus; and obtaining prediction data of said physical value by molecular dynamics simulation with said preset value, wherein said molecular dynamics simulation is conducted based using an empirical potential.

35. The method for designing an electric device by simulating a physical phenomenon as claimed in claim 34, wherein said empirical potential is an ATTA potential.

36. The method for designing an electric device by simulating a physical phenomenon as claimed in claim 34, wherein said empirical potential is a BK potential.

37. The method for designing an electric device by simulating a physical phenomenon as claimed in claim 34, wherein said physical value is at least one of characteristics concerning a film formed on a semiconductor substrate, surface of said semiconductor substrate, and interior of said semiconductor substrate.

38. The method for designing an electric device by simulating a physical phenomenon as claimed in claim 34, further comprising inputting fluctuation of said at least one manufacturing process factor with influence exerting upon a physical value of a substance as formed in said manufacturing apparatus, wherein said molecular dynamics simulation is conducted by variation calculation using said fluctuation of said at least one manufacturing process factor and said preset value of at least one manufacturing process factor as set in said simulator.

39. The method for designing an electric device by simulating a physical phenomenon as claimed in claim 34, wherein said simulation is performed based upon a combination of a molecular dynamics method and a density functional theory.

40. The method for designing an electric device by simulating a physical phenomenon as claimed in claim 39, wherein said molecular dynamics method is conducted based upon higher order cyclic partial differentiation.

41. The method for designing an electric device by simulating a physical phenomenon as claimed in claim 40, wherein said higher order cyclic partial differentiation is handled as a three body problem.

42. The method for designing an electric device by simulating a physical phenomenon as claimed in claim 34, wherein a general-purpose process simulation is conducted in a wide region of several-micron level by the use of said prediction data of said physical value as obtained by said molecular dynamics simulation.

43. The method for designing an electric device by simulating a physical phenomenon as claimed in claim 42, wherein said molecular dynamics simulation is based upon an atomic model and said general-purpose process simulation is based upon a fluid model, and said simulations are conducted as a three-dimensional calculation.

44. The method for designing an electric device by simulating a physical phenomenon as claimed in claim 42, wherein resultants of a step induction stress calculation are transferred from said three-dimensional molecular dynamics simulation to said three-dimensional general-purpose simulation.

45. A method for manufacturing an electric device in a manufacturing apparatus, said method comprising the steps of:

collecting actually observed data by actually measuring a physical value of a substance as formed in said manufacturing apparatus;

setting a preset value of at least one manufacturing process factor with influence exerting upon said physical value of the substance as formed in said manufacturing apparatus;

obtaining prediction data of said physical value by simulation with said preset value;

comparing and verifying said prediction data and said actually observed data to calculate differential data between said prediction data and said actually observed data; and correcting said at least one manufacturing process factor if the differential data between said prediction data and said actually observed data is recognized as significant, wherein said simulation is performed by the use of an empirical potential.

46. The method for manufacturing an electric device in a manufacturing apparatus as claimed in claim 45, wherein said empirical potential is an ATTA potential.

47. The method for manufacturing an electric device in a manufacturing apparatus as claimed in claim 45, wherein said empirical potential is a BK potential.

48. The method for manufacturing an electric device in a manufacturing apparatus as claimed in claim 45, wherein said physical value is at least one of characteristics concerning a film formed on a semiconductor substrate, surface of said semiconductor substrate, and interior of said semiconductor substrate.

49. The method for manufacturing an electric device in said manufacturing apparatus as claimed in claim 45, wherein the electric device is treated as an unacceptable device if the differential data between said three-dimensional prediction data and said actually observed data is out of a predetermined range so that said correcting step is predicted to fail.

50. The method for manufacturing an electric device in said manufacturing apparatus as claimed in claim 45, wherein said manufacturing apparatus is a clustered semiconductor device manufacturing apparatus.

51. The method for manufacturing an electric device in said manufacturing apparatus as claimed in claim 50, wherein said clustered semiconductor device manufacturing apparatus is of a type for treating wafers independently.

52. The method for manufacturing an electric device in said manufacturing apparatus as claimed in claim 45, wherein said step for comparing and verifying said three-dimensional prediction data and said actually observed data is conducted sequentially at real time.

53. The method for manufacturing an electric device in said manufacturing apparatus as claimed in claim 45, wherein said step for correcting said at least one manufacturing process factor is conducted sequentially at real time.

54. The method for manufacturing an electric device in said manufacturing apparatus as claimed in claim 53, wherein the electric device is treated as an unacceptable device if the differential data between said three-dimensional prediction data and said actually observed data is out of a predetermined range so that said correcting step is predicted to fail.

55. The method for manufacturing an electric device in said manufacturing apparatus as claimed in claim 45, wherein said molecular dynamics simulation is conducted by variation calculation using fluctuation of said at least one manufacturing process factor and said preset value of at least one manufacturing process factor as set in said simulator.

56. The method for manufacturing an electric device in said manufacturing apparatus as claimed in claim 45, wherein said molecular dynamics simulation is conducted based upon a combination of a molecular dynamics method and a density functional theory.

57. The method for manufacturing an electric device in said manufacturing apparatus as claimed in claim 56, wherein said molecular dynamics method is conducted based upon higher order cyclic partial differentiation.

58. The method for manufacturing an electric device in said manufacturing apparatus as claimed in claim 57, wherein said higher order cyclic partial differentiation is handled as a three body problem.

59. The method for manufacturing an electric device in said manufacturing apparatus as claimed in claim 45, wherein a general-purpose process simulation is conducted in a wide region of several-micron level by the use of said prediction data of said physical value as obtained by said molecular dynamics simulation.

60. The method for manufacturing an electric device in said manufacturing apparatus as claimed in claim 59, wherein said molecular dynamics simulation is based upon an atomic model and said general-purpose process simulation is based upon a fluid model, and said simulations are conducted as a three-dimensional calculation.

61. The method for manufacturing an electric device in said manufacturing apparatus as claimed in claim 59, wherein resultants of a step induction stress calculation are transferred from said three-dimensional molecular dynamics simulation to said three-dimensional general-purpose simulation.

62. A method for designing an electric device by simulating a physical phenomenon which would occur in a manufacturing apparatus in which said electric device is manufactured, said physical phenomenon being simulated by the steps of:

setting a preset value of at least one manufacturing process factor with influence exerting upon a physical value of a substance as formed in said manufacturing apparatus and fluctuation of said at least one manufacturing process factor; and obtaining prediction data of said physical value by molecular dynamics simulation with said preset value, wherein said molecular dynamics simulation is conducted based upon variation calculation using said fluctuation of said process factor.

63. The method for designing an electric device by simulating a physical phenomenon as claimed in claim 62, wherein said simulation is performed based upon combination of a molecular dynamics method and a density functional theory.

64. The method for designing an electric device by simulating a physical phenomenon as claimed in claim 63, wherein said molecular dynamics method is conducted based upon higher order cyclic partial differentiation.

65. The method for designing an electric device by simulating a physical phenomenon as claimed in claim 64, wherein said higher order cyclic partial differentiation is handled as a three body problem.

66. The method for designing an electric device by simulating a physical phenomenon as claimed in claim 62, wherein said physical value is at least one of characteristics concerning a film formed on a semiconductor substrate, surface of said semiconductor substrate, and interior of said semiconductor substrate.

67. The method for designing an electric device by simulating a physical phenomenon as claimed in claim 62, wherein said molecular dynamics simulation is conducted using an empirical potential.

68. The method for designing an electric device by simulating a physical phenomenon as claimed in claim 67, wherein said empirical potential is an ATTA potential.

69. The method for designing an electric device by simulating a physical phenomenon as claimed in claim 67, wherein said empirical potential is a BK potential.

70. The method for designing an electric device by simulating a physical phenomenon as claimed in claim 62, wherein a general-purpose process simulation is conducted in a wide region of several-micron level by the use of said prediction data of said physical value as obtained by said molecular dynamics simulation.

71. The method for designing an electric device by simulating a physical phenomenon as claimed in claim 70, wherein said molecular dynamics simulation is based upon an atomic model and said general-purpose process simulation is based upon a fluid model, and said simulations are conducted as a three-dimensional calculation.

72. The method for designing an electric device by simulating a physical phenomenon as claimed in claim 70, wherein resultants of a step induction stress calculation are transferred from said three-dimensional molecular dynamics simulation to said three-dimensional general-purpose simulation.

73. A method for manufacturing an electric device in a manufacturing apparatus, said method comprising the steps of:

collecting actually observed data by actually measuring a physical value of a substance as formed in said manufacturing apparatus;

inputting fluctuation of said at least one manufacturing process factor with influence exerting upon a physical value of a substance as formed in said manufacturing apparatus, wherein said molecular dynamics simulation is conducted by variation calculation using said fluctuation of said at least one manufacturing process factor and said preset value of at least one manufacturing process factor as set in said simulator;

setting a preset value of at least one manufacturing process factor with influence exerting upon said physical value of the substance as formed in said manufacturing apparatus and fluctuation of said at least one manufacturing process factor;

obtaining prediction data of said physical value by simulation with said preset value;

comparing and verifying said prediction data and said actually observed data to calculate differential data between said prediction data and said actually observed data; and correcting said at least one manufacturing process factor if the differential data between said prediction data and said actually observed data is recognized as significant.

74. The method for manufacturing an electric device in a manufacturing apparatus as claimed in claim 73, wherein said physical value is at least one of characteristics concerning a film formed on a semiconductor substrate, surface of said semiconductor substrate, and interior of said semiconductor substrate.

75. The method for manufacturing an electric device in said manufacturing apparatus as claimed in claim 73, wherein the electric device is treated as an unacceptable device if the differential data between said three-dimensional prediction data and said actually observed data is out of a predetermined range so that said correcting step is predicted to fail.

76. The method for manufacturing an electric device in said manufacturing apparatus as claimed in claim 73, wherein said manufacturing apparatus is a clustered semiconductor device manufacturing apparatus.

77. The method for manufacturing an electric device in said manufacturing apparatus as claimed in claim 76, wherein said clustered semiconductor device manufacturing apparatus is of a type for treating wafers independently.

78. The method for manufacturing an electric device in said manufacturing apparatus as claimed in claim 73, wherein said step for comparing and verifying said three-dimensional prediction data and said actually observed data is conducted sequentially at real time.

79. The method for manufacturing an electric device in said manufacturing apparatus as claimed in claim 73, wherein said step for correcting said at least one manufacturing process factor is conducted sequentially at real time.

80. The method for manufacturing an electric device in said manufacturing apparatus as claimed in claim 79, wherein the electric device is treated as an unacceptable device if the differential data between said three-dimensional prediction data and said actually observed data is out of a predetermined range so that said correcting step is predicted to fail.

81. The method for manufacturing an electric device in said manufacturing apparatus as claimed in claim 73, wherein said molecular dynamics simulation is conducted based upon a combination of a molecular dynamics method and a density functional theory.

82. The method for manufacturing an electric device in said manufacturing apparatus as claimed in claim 81, wherein said molecular dynamics method is conducted based upon higher order cyclic partial differentiation.

83. The method for manufacturing an electric device in said manufacturing apparatus as claimed in claim 82, wherein said higher order cyclic partial differentiation is handled as a three body problem.

84. The method for manufacturing an electric device in said manufacturing apparatus as claimed in claim 73, wherein said molecular dynamics simulation is conducted using an empirical potential.

85. The method for manufacturing an electric device in a manufacturing apparatus as claimed in claim 84, wherein said empirical potential is an ATTA potential.

86. The method for manufacturing an electric device in a manufacturing apparatus as claimed in claim 84, wherein said empirical potential is a BK potential.

87. The method for manufacturing an electric device in said manufacturing apparatus as claimed in claim 73, wherein a general-purpose process simulation is conducted in a wide region of several-micron level by the use of said prediction data of said physical value as obtained by said molecular dynamics simulation.

88. The method for manufacturing an electric device in said manufacturing apparatus as claimed in claim 87, wherein said molecular dynamics simulation is based upon an atomic model and said general-purpose process simulation is based upon a fluid model, and said simulations are conducted as a three-dimensional calculation.

89. The method for manufacturing an electric device in said manufacturing apparatus as claimed in claim 87, wherein resultants of a step induction stress calculation are transferred from said three-dimensional molecular dynamics simulation to said three-dimensional general-purpose simulation.

90. A method for designing an electric device by simulating with a simulator a physical phenomenon which would occur in a manufacturing apparatus in which said electric device is manufactured, said physical phenomenon being simulated by the steps of:

setting a preset value of at least one manufacturing process factor with influence exerting upon a physical value of a substance as formed in said manufacturing apparatus; and obtaining prediction data of said physical value by simulation with said preset value, wherein said simulation is performed based upon combination of a molecular dynamics simulation based upon an atomic model and a general purpose process simulation conducted in a wide region of several-micron level with said preset value of at least one manufacturing process factor, at least one of said molecular dynamics simulation and said general-purpose process simulation receiving and making use of a physical value predicted as a simulation result of the other of said molecular dynamics simulation and said general-purpose process simulation.

91. The method for designing an electric device by simulating a physical phenomenon as claimed in claim 90, wherein said molecular dynamics simulation based upon an atomic model and said general-purpose process simulation based upon a fluid model are conducted as a three-dimensional calculation.

92. The method for designing an electric device by simulating a physical phenomenon as claimed in claim 91, wherein resultants of a step induction stress calculation are transferred from said three-dimensional molecular dynamics simulation to said three-dimensional general-purpose simulation.

93. The method for designing an electric device by simulating a physical phenomenon as claimed in claim 90, wherein resultants of the step induction stress calculation are transferred from said three-dimensional general-purpose simulation to said three-dimensional molecular dynamics simulation.

94. The method for designing an electric device by simulating a physical phenomenon as claimed in claim 90, wherein said physical value is at least one of characteristics concerning a film formed on a semiconductor substrate, surface of said semiconductor substrate, and interior of said semiconductor substrate.

95. The method for designing an electric device by simulating a physical phenomenon as claimed in claim 90, further comprising inputting fluctuation of said at least one manufacturing process factor with influence exerting upon a physical value of a substance as formed in said manufacturing apparatus, wherein said molecular dynamics simulation is conducted by variation calculation using said fluctuation of said at least one manufacturing process factor and said preset value of at least one manufacturing process factor as set in said simulator.

96. The method for designing an electric device by simulating by a simulator a three-dimensional physical phenomenon which would occur in a manufacturing apparatus as claimed in claim 90, wherein said molecular dynamics simulation is conducted based upon a combination of a molecular dynamics method and a density functional theory.

97. The method for designing an electric device by simulating by a simulator a three-dimensional physical phenomenon which would occur in a manufacturing apparatus as claimed in claim 96, wherein said molecular dynamics method is conducted based upon higher order cyclic partial differentiation.

98. The method for designing an electric device by simulating by a simulator a three-dimensional physical phenomenon which would occur in a manufacturing apparatus as claimed in claim 97, wherein said higher order cyclic partial differentiation is handled as a three body problem.

99. The method for designing an electric device by simulating by a simulator a three-dimensional physical phenomenon which would occur in a manufacturing apparatus as claimed in claim 90, wherein said molecular dynamics simulation is conducted using an empirical potential.

100. The method for designing an electric device by simulating by a simulator a three-dimensional physical phenomenon which would occur in a manufacturing apparatus as claimed in claim 99, wherein said empirical potential is an ATTA potential.

101. The method for designing an electric device by simulating by a simulator a three-dimensional physical phenomenon which would occur in a manufacturing apparatus as claimed in claim 99, wherein said empirical potential is a BK potential.

102. A method for manufacturing an electric device in a manufacturing apparatus, said method comprising the steps of:

collecting actually observed data by actually measuring a physical value of a substance as formed in said manufacturing apparatus;

setting a preset value of at least one manufacturing process factor with influence exerting upon said physical value of the substance as formed in said manufacturing apparatus;

obtaining prediction data of said physical value by simulation with said preset value;

comparing and verifying said prediction data and said actually observed data to calculate differential data between said prediction data and said actually observed data; and correcting said at least one manufacturing process factor if the differential data between said prediction data and said actually observed data is recognized as significant, wherein said simulation is performed based upon combination of a molecular dynamics simulation based upon an atomic model and a general purpose process simulation conducted in a wide region of several-micron level with said preset value of at least one manufacturing process factor, at least one of said molecular dynamics simulation and said general-purpose process simulation receiving and making use of a physical value predicted as a simulation result of the other of said molecular dynamics simulation and said general-purpose process simulation.

103. The method for manufacturing an electric device in said manufacturing apparatus as claimed in claim 102, wherein the electric device is treated as an unacceptable device if the differential data between said three-dimensional prediction data and said actually observed data is out of a predetermined range so that said correcting step is predicted to fall.

104. The method for manufacturing an electric device in said manufacturing apparatus as claimed in claim 103, wherein said manufacturing apparatus is a clustered semiconductor device manufacturing apparatus.

105. The method for manufacturing an electric device in said manufacturing apparatus as claimed in claim 102, wherein said molecular dynamics simulation is based upon an atomic model and said general-purpose process simulation is based upon a fluid model, and said simulations are conducted as a three-dimensional calculation.

106. The method for manufacturing an electric device in said manufacturing apparatus as claimed in claim 102, wherein resultants of a step induction stress calculation are transferred from said three-dimensional molecular dynamics simulation to said three-dimensional general-purpose simulation.

107. The method for manufacturing an electric device in said manufacturing apparatus as claimed in claim 102, wherein resultants of a step induction stress calculation are transferred from said three-dimensional general-purpose simulation to said three-dimensional molecular dynamics simulation.

108. The method for manufacturing an electric device in a manufacturing apparatus as claimed in claim 102, wherein said physical value is at least one of characteristics concerning a film formed on a semiconductor substrate, surface of said semiconductor substrate, and interior of said semiconductor substrate.

109. The method for manufacturing an electric device in said manufacturing apparatus as claimed in claim 102, wherein said step for comparing and verifying said three-dimensional prediction data and said actually observed data is conducted sequentially at real time.

110. The method for manufacturing an electric device in said manufacturing apparatus as claimed in claim 102, wherein said step for correcting said at least one manufacturing process factor is conducted sequentially at real time.

111. The method for manufacturing an electric device in said manufacturing apparatus as claimed in claim 110, wherein the electric device is treated as an unacceptable device if the differential data between said three-dimensional prediction data and said actually observed data is out of a predetermined range so that said correcting step is predicted to fail.

112. The method for manufacturing an electric device in said manufacturing apparatus as claimed in claim 102, wherein said molecular dynamics simulation is conducted based upon a combination of a molecular dynamics method and a density functional theory.

113. The method for manufacturing an electric device in said manufacturing apparatus as claimed in claim 112, wherein said molecular dynamics method is conducted based upon higher order cyclic partial differentiation.

114. The method for manufacturing an electric device in said manufacturing apparatus as claimed in claim 113, wherein said higher order cyclic partial differentiation is handled as a three body problem.

115. The method for manufacturing an electric device in said manufacturing apparatus as claimed in claim 102, wherein said molecular dynamics simulation is conducted using an empirical potential.

116. The method for manufacturing an electric device in a manufacturing apparatus as claimed in claim 115, wherein said empirical potential is an ATTA potential.

117. The method for manufacturing an electric device in a manufacturing apparatus as claimed in claim 115, wherein said empirical potential is a BK potential.

118. The method for manufacturing an electric device in said manufacturing apparatus as claimed in claim 102, wherein a general-purpose process simulation is conducted in a wide region of several-micron level by the use of said prediction data of said physical value as obtained by said molecular dynamics simulation.

119. The method for manufacturing an electric device in said manufacturing apparatus as claimed in claim 118, wherein said molecular dynamics simulation is based upon an atomic model and said general-purpose process simulation is based upon a fluid model, and said simulations are conducted as a three-dimensional calculation.

120. The method for manufacturing an electric device in said manufacturing apparatus as claimed in claim 118, wherein resultants of a step induction stress calculation are transferred from said three-dimensional molecular dynamics simulation to said three-dimensional general-purpose simulation.

\* \* \* \* \*